US009153697B2

(12) United States Patent
Masuoka et al.

(10) Patent No.: US 9,153,697 B2
(45) Date of Patent: Oct. 6, 2015

(54) SURROUNDING GATE TRANSISTOR (SGT) STRUCTURE

(75) Inventors: Fujio Masuoka, Tokyo (JP); Hiroki Nakamura, Tokyo (JP); Shintaro Arai, Tokyo (JP); Tomohiko Kudo, Tokyo (JP); King-Jien Chui, Tokyo (JP); Yisuo Li, Tokyo (JP); Yu Jiang, Tokyo (JP); Xiang Li, Singapore (SG); Zhixian Chen, Singapore (SG); Nansheng Shen, Singapore (SG); Vladimir Bliznetsov, Singapore (SG); Kavitha Devi Buddharaju, Singapore (SG); Navab Singh, Singapore (SG)

(73) Assignee: UNISANTIS ELECTRONICS SINGAPORE PTE LTD., Peninsula Plaza (SG)

( * ) Notice: Subject to any disclaimer, the term of this patent is extended or adjusted under 35 U.S.C. 154(b) by 526 days.

(21) Appl. No.: 13/116,506

(22) Filed: May 26, 2011

(65) Prior Publication Data

US 2011/0303973 A1 Dec. 15, 2011

Related U.S. Application Data

(60) Provisional application No. 61/354,866, filed on Jun. 15, 2010.

(30) Foreign Application Priority Data

Jun. 15, 2010 (JP) ................................ 2010-136470

(51) Int. Cl.
*H01L 21/70* (2006.01)
*H01L 29/786* (2006.01)
(Continued)

(52) U.S. Cl.
CPC .. *H01L 29/78642* (2013.01); *H01L 21/823885* (2013.01); *H01L 29/42384* (2013.01);
(Continued)

(58) Field of Classification Search
CPC ................................................ H01L 29/42392
USPC .......................................... 257/369, E29.131
See application file for complete search history.

(56) References Cited

U.S. PATENT DOCUMENTS 5,017,977 A 5/1991 Richardson
5,258,635 A 11/1993 Nitayama et al.
(Continued)

FOREIGN PATENT DOCUMENTS

CN 1507035 6/2004
CN 1610126 A 4/2005
(Continued)

OTHER PUBLICATIONS

Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.
(Continued)

*Primary Examiner* — Hsin-Yi Hsieh
(74) *Attorney, Agent, or Firm* — Brinks Gilson & Lione

(57) ABSTRACT

The semiconductor device according to the present invention is an nMOS SGT and is composed of a first n+ type silicon layer, a first gate electrode containing metal and a second n+ type silicon layer arranged on the surface of a first columnar silicon layer positioned vertically on a first planar silicon layer. Furthermore, a first insulating film is positioned between the first gate electrode and the first planar silicon layer, and a second insulating film is positioned on the top surface of the first gate electrode. In addition, the first gate electrode containing metal is surrounded by the first n+ type silicon layer, the second n+ type silicon layer, the first insulating film and the second insulating film.

11 Claims, 352 Drawing Sheets

(51) Int. Cl.

| | |
|---|---|
| ***H01L 21/8238*** | (2006.01) |
| ***H01L 29/423*** | (2006.01) |
| ***H01L 29/49*** | (2006.01) |
| ***H01L 29/66*** | (2006.01) |
| *H01L 21/265* | (2006.01) |

(52) U.S. Cl.
CPC ...... *H01L29/42392* (2013.01); *H01L 29/4908* (2013.01); *H01L 29/4958* (2013.01); *H01L 29/66666* (2013.01); *H01L 29/66772* (2013.01); *H01L 21/26586* (2013.01)

(56) References Cited

U.S. PATENT DOCUMENTS

| | | | |
|---|---|---|---|
| 5,308,782 | A | 5/1994 | Mazure et al. |
| 5,312,767 | A | 5/1994 | Shimizu et al. |
| 5,382,816 | A | 1/1995 | Mitsui |
| 5,416,350 | A | 5/1995 | Watanabe |
| 5,480,838 | A | 1/1996 | Mitsui |
| 5,627,390 | A | 5/1997 | Maeda et al. |
| 5,656,842 | A | 8/1997 | Iwamatsu et al. |
| 5,703,386 | A | 12/1997 | Yasuda et al. |
| 5,707,885 | A | 1/1998 | Lim |
| 5,710,447 | A | 1/1998 | Tohyama |
| 5,767,549 | A | 6/1998 | Chen et al. |
| 5,780,888 | A | 7/1998 | Maeda et al. |
| 5,811,336 | A | 9/1998 | Kasai |
| 5,872,037 | A | 2/1999 | Iwamatsu et al. |
| 5,905,283 | A | 5/1999 | Kasai |
| 5,994,735 | A | 11/1999 | Maeda et al. |
| 6,121,086 | A | 9/2000 | Kuroda et al. |
| 6,127,209 | A | 10/2000 | Maeda et al. |
| 6,175,138 | B1 | 1/2001 | Noda |
| 6,294,418 | B1 | 9/2001 | Noble |
| 6,373,099 | B1 | 4/2002 | Kikuchi et al. |
| 6,392,271 | B1 | 5/2002 | Alavi et al. |
| 6,406,962 | B1 | 6/2002 | Agnello et al. |
| 6,420,751 | B1 | 7/2002 | Maeda et al. |
| 6,461,900 | B1 | 10/2002 | Sundaresan et al. |
| 6,483,171 | B1 | 11/2002 | Forbes et al. |
| 6,624,459 | B1 | 9/2003 | Dachtera et al. |
| 6,658,259 | B2 | 12/2003 | McIntosh |
| 6,740,937 | B1 | 5/2004 | Sushihara |
| 6,747,314 | B2 | 6/2004 | Sundaresan et al. |
| 6,815,277 | B2 | 11/2004 | Fried et al. |
| 6,849,903 | B2 | 2/2005 | Sushihara |
| 6,861,684 | B2 | 3/2005 | Skotnicki et al. |
| 6,878,991 | B1 | 4/2005 | Forbes |
| 6,891,225 | B2 | 5/2005 | Horiguchi et al. |
| 6,943,407 | B2 | 9/2005 | Ouyang et al. |
| 7,052,941 | B2 | 5/2006 | Lee |
| 7,193,278 | B2 | 3/2007 | Song |
| 7,198,976 | B2 | 4/2007 | Hirata |
| 7,233,033 | B2 | 6/2007 | Koyama et al. |
| 7,241,655 | B2 | 7/2007 | Tang et al. |
| 7,271,052 | B1 | 9/2007 | Forbes |
| 7,368,334 | B2 | 5/2008 | Yeo et al. |
| 7,374,990 | B2 | 5/2008 | Tang et al. |
| 7,413,480 | B2 | 8/2008 | Thomas |
| 7,579,214 | B2 | 8/2009 | Yamazaki et al. |
| 7,619,675 | B2 | 11/2009 | Horii |
| 7,829,952 | B2 | 11/2010 | Moniwa et al. |
| 7,872,287 | B2 | 1/2011 | Masuoka et al. |
| 7,977,736 | B2 | 7/2011 | Kim et al. |
| 7,977,738 | B2 | 7/2011 | Minami et al. |
| 7,981,738 | B2 | 7/2011 | Moniwa et al. |
| 8,039,893 | B2 | 10/2011 | Masuoka et al. |
| 8,058,683 | B2 | 11/2011 | Yoon et al. |
| 8,067,800 | B2 | 11/2011 | Hsieh |
| 8,110,869 | B2 | 2/2012 | Bhalla |
| 8,154,076 | B2 | 4/2012 | Takaishi |
| 8,188,537 | B2 | 5/2012 | Masuoka et al. |
| 8,227,305 | B2 | 7/2012 | Forbes |
| 8,378,400 | B2 | 2/2013 | Masuoka et al. |
| 8,482,047 | B2 | 7/2013 | Abbott et al. |
| 2001/0052614 | A1 | 12/2001 | Ishibashi |
| 2002/0000624 | A1 | 1/2002 | Takemura et al. |
| 2002/0034853 | A1 | 3/2002 | Alavi et al. |
| 2002/0110039 | A1 | 8/2002 | Forbes et al. |
| 2002/0195652 | A1 | 12/2002 | Maeda et al. |
| 2003/0002093 | A1 | 1/2003 | Hynecek |
| 2003/0075758 | A1 | 4/2003 | Sundaresan et al. |
| 2004/0005755 | A1 | 1/2004 | Moniwa et al. |
| 2004/0113207 | A1 | 6/2004 | Hsu et al. |
| 2004/0135215 | A1 | 7/2004 | Song |
| 2004/0169293 | A1 | 9/2004 | Sushihara |
| 2004/0256639 | A1 | 12/2004 | Ouyang et al. |
| 2004/0262681 | A1 | 12/2004 | Masuoka et al. |
| 2005/0127404 | A1 | 6/2005 | Sushihara |
| 2005/0145911 | A1 | 7/2005 | Forbes et al. |
| 2005/0263821 | A1 | 12/2005 | Cho et al. |
| 2005/0281119 | A1 | 12/2005 | Shibata et al. |
| 2006/0006444 | A1 | 1/2006 | Leslie |
| 2006/0007333 | A1 | 1/2006 | Horii |
| 2006/0033524 | A1 | 2/2006 | Sushihara |
| 2006/0043520 | A1 | 3/2006 | Jerdev et al. |
| 2006/0046391 | A1 | 3/2006 | Tang et al. |
| 2006/0261406 | A1 | 11/2006 | Chen |
| 2007/0007601 | A1 | 1/2007 | Hsu et al. |
| 2007/0075359 | A1 | 4/2007 | Yoon et al. |
| 2007/0117324 | A1 | 5/2007 | Previtali |
| 2007/0138557 | A1 | 6/2007 | Ipposhi |
| 2007/0173006 | A1 | 7/2007 | Moniwa et al. |
| 2008/0048245 | A1 | 2/2008 | Kito et al. |
| 2008/0173936 | A1 | 7/2008 | Yoon et al. |
| 2008/0210985 | A1 | 9/2008 | Ogawa et al. |
| 2008/0227241 | A1 | 9/2008 | Nakabayashi et al. |
| 2009/0032955 | A1 | 2/2009 | Tanaka et al. |
| 2009/0057722 | A1 | 3/2009 | Masuoka et al. |
| 2009/0065832 | A1 | 3/2009 | Masuoka et al. |
| 2009/0085088 | A1 | 4/2009 | Takaishi |
| 2009/0114989 | A1 | 5/2009 | Hamamoto |
| 2009/0159964 | A1 | 6/2009 | Lee |
| 2009/0174024 | A1 | 7/2009 | Kim |
| 2009/0197379 | A1 | 8/2009 | Leslie |
| 2009/0290082 | A1 | 11/2009 | Yamazaki et al. |
| 2009/0291551 | A1 | 11/2009 | Cho |
| 2010/0052029 | A1 | 3/2010 | Huang |
| 2010/0200731 | A1 | 8/2010 | Masuoka et al. |
| 2010/0200913 | A1 | 8/2010 | Masuoka et al. |
| 2010/0207172 | A1 | 8/2010 | Masuoka et al. |
| 2010/0207201 | A1 | 8/2010 | Masuoka et al. |
| 2010/0207213 | A1 | 8/2010 | Tan et al. |
| 2010/0213525 | A1 | 8/2010 | Masuoka et al. |
| 2010/0213539 | A1 | 8/2010 | Masuoka et al. |
| 2010/0219457 | A1 | 9/2010 | Masuoka et al. |
| 2010/0219483 | A1 | 9/2010 | Masuoka et al. |
| 2010/0270611 | A1 | 10/2010 | Masuoka et al. |
| 2010/0276750 | A1 | 11/2010 | Tu |
| 2010/0295123 | A1 | 11/2010 | Lung et al. |
| 2011/0073925 | A1 | 3/2011 | Park et al. |
| 2011/0215381 | A1 | 9/2011 | Masuoka et al. |
| 2011/0254067 | A1 | 10/2011 | Abbott et al. |
| 2011/0275207 | A1 | 11/2011 | Moniwa et al. |
| 2011/0303973 | A1 | 12/2011 | Masuoka et al. |
| 2011/0303985 | A1 | 12/2011 | Masuoka et al. |
| 2012/0086051 | A1 | 4/2012 | Wang et al. |
| 2012/0196415 | A1 | 8/2012 | Masuoka et al. |

FOREIGN PATENT DOCUMENTS

| | | | |
|---|---|---|---|
| CN | 1983601 | A | 6/2007 |
| CN | 101542733 | A | 9/2009 |
| DE | 4443968 | | 11/1995 |
| EP | 1770769 | A1 | 4/2007 |
| EP | 2197032 | A1 | 6/2010 |
| EP | 2239770 | A1 | 10/2010 |
| EP | 2239771 | A1 | 10/2010 |
| EP | 2244305 | A1 | 10/2010 |
| EP | 2246895 | A1 | 11/2010 |
| JP | 60-070757 | A | 4/1985 |
| JP | 61-013661 | | 1/1986 |
| JP | 62-045058 | A | 2/1987 |

(56) References Cited

FOREIGN PATENT DOCUMENTS

| | | | |
|---|---|---|---|
| JP | 62-190751 | A | 8/1987 |
| JP | 63-037633 | A | 2/1988 |
| JP | 63-158866 | A | 7/1988 |
| JP | 64-089560 | A | 4/1989 |
| JP | 01-175775 | A | 7/1989 |
| JP | 02-066969 | A | 3/1990 |
| JP | 02-071556 | A | 3/1990 |
| JP | 02-089368 | A | 3/1990 |
| JP | 02-188966 | A | 7/1990 |
| JP | 03-114233 | A | 5/1991 |
| JP | 03-145761 | | 6/1991 |
| JP | 03-225873 | A | 10/1991 |
| JP | 04-234166 | A | 8/1992 |
| JP | 05-276442 | A | 10/1993 |
| JP | 06-021467 | A | 1/1994 |
| JP | 06-069441 | | 3/1994 |
| JP | 06-237003 | A | 8/1994 |
| JP | 07-099311 | A | 4/1995 |
| JP | 07-321228 | | 12/1995 |
| JP | 08-078533 | A | 3/1996 |
| JP | 09-008295 | | 1/1997 |
| JP | 10-079482 | A | 3/1998 |
| JP | 10-223777 | A | 8/1998 |
| JP | 11-087649 | | 3/1999 |
| JP | 2000-012705 | A | 1/2000 |
| JP | 2000-068516 | A | 3/2000 |
| JP | 2000-208434 | | 7/2000 |
| JP | 2000-243085 | | 9/2000 |
| JP | 2000-244818 | A | 9/2000 |
| JP | 2000-357736 | | 12/2000 |
| JP | 2001-028399 | | 1/2001 |
| JP | 2001-237421 | A | 8/2001 |
| JP | 2001-339057 | A | 12/2001 |
| JP | 2001-352047 | A | 12/2001 |
| JP | 2002-009257 | | 1/2002 |
| JP | 2002-033399 | A | 1/2002 |
| JP | 2002-231951 | A | 8/2002 |
| JP | 2002-246580 | A | 8/2002 |
| JP | 2002-246581 | A | 8/2002 |
| JP | 2003-068883 | A | 3/2003 |
| JP | 2003-142684 | | 5/2003 |
| JP | 2003-179160 | A | 6/2003 |
| JP | 2003-224211 | A | 8/2003 |
| JP | 2004-079694 | | 3/2004 |
| JP | 2004-096065 | A | 3/2004 |
| JP | 2004-153246 | | 5/2004 |
| JP | 2004-193588 | A | 7/2004 |
| JP | 2004-259733 | A | 9/2004 |
| JP | 2004-319808 | A | 11/2004 |
| JP | 2005-012213 | A | 1/2005 |
| JP | 2005-135451 | | 5/2005 |
| JP | 2006-024799 | A | 1/2006 |
| JP | 2006-514392 | | 4/2006 |
| JP | 2006-294995 | A | 10/2006 |
| JP | 2007-0250652 | A | 9/2007 |
| JP | 2008-177565 | | 7/2008 |
| JP | 2008-205168 | A | 9/2008 |
| JP | 2008-300558 | A | 12/2008 |
| JP | 2009-110049 | A | 5/2009 |
| JP | 2009-182316 | A | 8/2009 |
| JP | 2009-182317 | A | 8/2009 |
| JP | 2010-171055 | | 8/2010 |
| JP | 2010-0213539 | A | 9/2010 |
| JP | 2010-258345 | | 11/2010 |
| JP | 2011-066105 | | 3/2011 |
| JP | 2011-071235 | | 4/2011 |
| JP | 2011-077437 | | 4/2011 |
| JP | 2011-211161 | A | 10/2011 |
| KR | 10-0132560 | | 12/1997 |
| KR | 10-0200222 | | 6/1999 |
| KR | 10-0327875 | B1 | 9/2002 |
| KR | 2004-0063348 | A | 7/2004 |
| WO | WO 94/14198 | A1 | 6/1994 |
| WO | WO 01/22494 | A1 | 3/2001 |
| WO | WO 2005/036651 | | 4/2005 |
| WO | WO 2006/127586 | | 11/2006 |
| WO | WO 2009/034623 | A1 | 3/2009 |
| WO | WO 2009/034731 | A1 | 3/2009 |
| WO | WO 2009/057194 | A1 | 5/2009 |
| WO | WO 2009/095997 | A1 | 8/2009 |
| WO | WO 2009/096001 | A1 | 8/2009 |
| WO | WO 2009/096464 | A1 | 8/2009 |
| WO | WO 2009/096465 | A1 | 8/2009 |
| WO | WO 2009/096466 | A1 | 8/2009 |
| WO | WO 2009/096470 | A1 | 8/2009 |
| WO | WO 2009/102059 | A1 | 8/2009 |
| WO | WO 2009/133957 | A1 | 11/2009 |
| WO | WO 2011/111662 | A1 | 9/2011 |

OTHER PUBLICATIONS

Examination Report for European Application No. 08722595.9, dated Jul. 11, 2012, 4 pages.

Examination Report in corresponding European Application No. 07 807 139.6, dated Jun. 11, 2012, 4 pages.

Extended European Search Report for European Application No. 07807139.6, dated Jun. 24, 2011, 10 pages.

Extended European Search Report for European Application No. 12001395.8, dated Apr. 26, 2012, 7 pages.

International Preliminary Report on Patentability for International Application No. PCT/JP2011/055264, dated Oct. 11, 2012, 7 pages.

International Search Report for International Application No. PCT/JP2007/067732, dated Dec. 11, 2007, 2 pages.

International Search Report for International Application No. PCT/JP2008/051304, dated Apr. 15, 2008, 2 pages.

International Search Report for International Application No. PCT/JP2008/058412, dated Jun. 10, 2008, 2 pages.

International Search Report for International Application No. PCT/JP2009/051463, dated Feb. 24, 2009, 2 pages.

International Search Report for International Application No. PCT/JP2009/058629, dated Jun. 2, 2009, 2 pages.

International Search Report for International Application No. PCT/JP2011/070534, dated Dec. 6, 2011, 10 pages.

International Search Report for International Application No. PCT/JP2011/071162, dated Dec. 13, 2011, 18 pages.

Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.

Nakamura, Jun-ichi et al., "Nondestructive Readout Mode Static Induction Transistor (SIT) Photo Sensors," IEEE Transactions on Electron Devices, 1993, vol. 40, pp. 334-341.

Non-Certified Partial Translation of Office Action from counterpart Korean Application No. 10-2010-7018204, dated Mar. 29, 2012, 1 page.

Notice of Allowance for U.S. Appl. No. 13/447,721, dated Nov. 2, 2012, 9 pages.

Notice of Allowance for U.S. Appl. No. 12/700,294, dated Oct. 5, 2012, 7 pages.

Office Action from counterpart Korean Application No. 10-2010-7018204, dated Mar. 29, 2012, 7 pages.

Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.

Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.

Watanabe, S. et al., "A Nobel Circuit Technology with Surrounding Gate Transistors (SGT's) for Ultra High Density DRAM's", IEEE Journal of Solid-State Circuits, vol. 30, No. 9, Sep. 1995, pp. 960-971.

Written Opinion of the International Searching Authority for International Application No. PCT/JP2007/067732, dated Dec. 11, 2007, 4 pages.

Written Opinion of the International Searching Authority for International Application No. PCT/JP2008/058412, dated Jun. 10, 2008, 4 pages.

Written Opinion of the International Searching Authority for International Application No. PCT/JP2009/058629, dated Jun. 2, 2009, 4 pages.

(56) References Cited

OTHER PUBLICATIONS

Wuu, S.G. et al., "A Leading-Edge 0.9 µm Pixel CMOS Image Sensor Technology with Backside Illumination: Future Challenges for Pixel Scaling", *IEDM2010 Digest Papers*, 14.1.1, pp. 332-335, 2010.

Yonemoto, Kazuya, "A CMOS Image Sensor with a Simple FPN-Reduction Technology and a Hole Accumulated Diode," 2000 IEEE International Solid-State Circuites Conference, 9 pages.

Notice of Allowance for U.S. Appl. No. 12/894,923, dated Feb. 21, 2013, 5 pages.

Notice of Allowance for U.S. Appl. No. 12/894,923, dated Mar. 14, 2013, 5 pages.

Office Action for U.S. Appl. No. 13/412,959, dated Mar. 13, 2013, 7 pages.

Office Action for Korean Patent Application Serial No. 9-5-2013-010869116, dated Feb. 18, 2013, 4 pages.

International Search Report for PCT/JP2011/079300, dated Mar. 13, 2012, 5 pages.

Lee, et al., "An Active Pixel Sensor Fabricated Using CMOS/CCD Process Technology" in Program IEEE Workshop on Charge-Coupled Devices and Advanced Image Sensors, 1995, 5 pages.

Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.

Takahashi et al., "A 3.9-µm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.

Yasutomi et al, "A High-Speed CMOS Image Sensor with Global Electronic Shutter Pixel Using Pinned Diodes", IEEJ Trans. SM, vol. 129, No. 10, 2009, pp. 321-327.

Notice of Allowance for U.S. Appl. No. 13/043,081, dated Mar. 18, 2013, 6 pages.

Notice of Allowance for U.S. Appl. No. 13/113,482, dated Apr. 4, 2013, 10 pages.

Notice of Allowance for U.S. Appl. No. 12/768,290, dated Apr. 18, 2013, 9 pages.

Choi, Yang-Kyu et al., "FinFET Process Refinements for Improved Mobility and Gate Work Function Engineering," IEEE, 2002, 4 pages.

Maeda, Shigenobu et al., "Impact of a Vertical ϕ-Shape Transistor (VϕT) Cell for 1 Gbit DRAM and Beyond," IEEE Transactions on Electron Devices, vol. 42, No. 12, Dec. 1995, pp. 2117-2124.

International Search Report for International Application No. PCT/JP2008/051300, dated May 13, 2008, 4 pages.

Written Opinion of the International Searching Authority for International Application No. PCT/JP2008/051300, dated Aug. 30, 2010, 8 pages.

International Preliminary Report on Patentability for International Application No. PCT/JP2008/051300, dated Aug. 31, 2010, 9 pages.

International Search Report for International Application No. PCT/JP2009/051459, dated Apr. 14, 2009, 4 pages.

Written Opinion of the International Searching Authority for International Application No. PCT/JP2009/051459, dated Aug. 30, 2010, 8 pages.

International Preliminary Report on Patentability for International Application No. PCT/JP2009/051459, dated Aug. 31, 2010, 9 pages.

Office Action from co-pending U.S. Appl. No. 12/704,935, dated Nov. 18, 2011, 9 pages.

Office Action from co-pending U.S. Appl. No. 12/704,955, dated Dec. 8, 2011, 12 pages.

Notice of Allowance from co-pending U.S. Appl. No. 12/704,955, dated Mar. 15, 2012, 8 pages.

Extended European Search Report for European Application No. 10004492.4, dated Jun. 21, 2012, 10 pages.

Chen, Yijian et al., "Vertical integrated-gate CMOS for ultra-dense IC", *Microelectronic Engineering*, vol. 83, 2006, pp. 1745-1748.

Office Action for Chinese Patent Application Serial No. 200980103454.9, dated Oct. 31, 2012, 7 pages.

Office Action for Chinese Patent Application Serial No. 200980103505.8, dated Nov. 1, 2012, 5 pages.

Office Action for Chinese Patent Application Serial No. 201010171435.4, dated Dec. 21, 2012, 7 pages.

Office Action for Chinese Patent Application Serial No. 2011100647037, dated Nov. 14, 2012, 6 pages.

Office Action for Japanese Patent Application Serial No. 2009-538870, dated Nov. 8, 2012, 4 pages.

Restriction Requirement for U.S. Appl. No. 13/412,959, dated Nov. 8, 2012, 6 pages.

European Search Report for counterpart European Application No. 09705485.2, dated Feb. 14, 2011, 5 pages.

Extended European Search Report for European Application No. 10009574.4, dated May 15, 2012, 6 pages.

Extened European Search Report for European Application No. 10009579.3, dated Jun. 11, 2012, 11 pages.

Guidash, R.M. et al. "A 0.6 µm CMOS Pinned Photodiode Color Imager Technology", *IEDM Digest Papers*, pp. 927-929, 1997.

Hieda, K. et al., "New Effects of Trench Isolated Transistor Using Side-Wall Gates", *VLSI Research Center*, Toshiba Corporation, 1987, 4 pages.

International Search Report for International Application No. PCT/JP2007/071052, dated Jan. 29, 2008, 6 pages.

International Search Report for International Application No. PCT/JP2008/051302, dated Apr. 8, 2008, 2 pages.

International Search Report for International Application No. PCT/JP2009/051460, dated Apr. 21, 2009, 2 pages.

International Search Report for International Application No. PCT/JP2009/051461, dated Apr. 21, 2009, 2 pages.

Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.

Mendis, Sunetra K. et al. "A 128 × 128 CMOS Active Pixel Image Sensor for Highly Integrated Imaging System", *IEDM93, Digest Papers*, 22.6.1, pp. 583-586, 1993.

Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.

Nitayama, Akihiro et al., "Multi-Pillar Surrounding Gate Transistor (M-SGT) for Compact and High-Speed Circuits", IEEE Transactions on Electron Devices, vol. 3, No. 3, Mar. 1991, pp. 679-583.

Office Action from co-pending U.S. Appl. No. 12/894,923, dated Oct. 2, 2012, 21 pages.

Office Action from co-pending U.S. Appl. No. 13/043,081, dated Jul. 16, 2012, 6 pages.

Office Action from co-pending U.S. Appl. No. 13/046,113, dated Jan. 9, 2013, 6 pages.

Office Action from co-pending U.S. Appl. No. 13/113,482, dated Jan. 2, 2013, 9 pages.

Office Action from co-pending U.S. Appl. No. 13/412,959, dated Dec. 7, 2012, 9 pages.

Written Opinion of the International Searching Authority for International Application No. PCT/JP2007/071052, dated Jan. 29, 2008, 9 pages.

Written Opinion of the International Searching Authority for International Application No. PCT/JP2008/051301, dated Apr. 1, 2008, 5 pages.

Written Opinion of the International Searching Authority for International Application No. PCT/JP2008/051302, dated Apr. 8, 2008, 5 pages.

Written Opinion of the International Searching Authority for International Application No. PCT/JP2009/051460, dated Apr. 21, 2009, 5 pages.

Written Opinion of the International Searching Authority for International Application No. PCT/JP2009/051461, dated Apr. 21,2009, 6 pages.

E129 Wu et al., "High Performance 22/20nm FinFET CMOS Devices with Advanced High-K/Metal Gate Scheme", IEEE, pp. 27.1.1-27.1.4, 2010.

Office Action for U.S. Appl. No. 13/917,040 dated Aug. 6, 2013, 5 pages.

Notice of Allowance for U.S. Appl. No. 12/704,935, dated May 16, 2013, 10 pages.

Notice of Allowance for U.S. Appl. No. 13/046,113, dated May 13, 2013, 10 pages.

(56) References Cited

OTHER PUBLICATIONS

Notice of Allowance for U.S. Appl. No. 13/412,959, dated May 8, 2013, 9 pages.
Notice of Allowance for U.S. Appl. No. 12/894,923, dated Jul. 2, 2013, 9 pages.
Notice of Allowance for U.S. Appl. No. 13/606,823, dated Jul. 8, 2013, 12 pages.
English translation of previously cited International Search Report for PCT/JP2011/070534, dated Dec. 6, 2011, 2 pages.
English translation of previously cited International Search Report for PCT/JP2011/071162, dated Dec. 13, 2011, 5 pages.
International Search Report for International Application No. PCT/JP2008/051301, dated Apr. 1, 2008, 2 pages.

SURROUNDING GATE TRANSISTOR (SGT) STRUCTURE

RELATED APPLICATIONS

Pursuant to 35 U.S.C. §119(e), this application claims the benefit of the filing date of Provisional U.S. Patent Application Ser. No. 61/354,866 filed on Jun. 15, 2010. This application also claims priority under 35 U.S.C. §119(a) to JP2010-136470 filed on Jun. 15, 2010. The entire contents of these applications are hereby incorporated by reference.

BACKGROUND OF THE INVENTION

1. Field of the Invention

This application relates generally to a semiconductor device and a method of producing such.

2. Description of the Related Art

Semiconductor devices, particularly integrated circuits using MOS transistors, are increasingly being highly integrated. MOS transistors in integrated circuits have been downsized to nano sizes as the integration level is increased. As MOS transistors are downsized, problems arise such as difficulty in leaking current control. For that reason, further downsizing is difficult. In order to resolve these problems, a surrounding gate transistor (SGT) structure has been proposed in which the source, gate and drain are provided on a substrate in the vertical direction and the gate surrounds an island-shaped semiconductor layer.

In order to reduce power consumption in SGTs, it is preferable for resistance to be reduced in the source, gate and drain. In particular, in reducing the resistance of the gate electrode, it is desirable to use metal in the gate electrode. However, contamination of manufacturing equipment by metal and contamination of semiconductor devices produced by that manufacturing equipment is not desirable. Accordingly, processes subsequent to the forming of the metal gate electrode need to be special processes such as those that constantly control such metal contamination.

Patent Literature 1 discloses a method for producing an SGT satisfying to a certain extent the various conditions stated above.

[Patent Literature 1] International Laid-Open Patent Publication 2009/110049

However, in Patent Literature 1 the protection of semiconductor manufacturing equipment and semiconductor devices from metal contamination is imperfect. For example, in Patent Literature 1 the gate electrode is formed by planarizing the gate metal using CMP (Chemical Mechanical Polishing) and then etching this material. At this time, the gate metal is not covered by other materials and is exposed. In addition, the gate metal is similarly exposed during the process of wet etching the nitride film hard mask and nitride film sidewall. Consequently, there is a concern that the CMP device, the gate etching device and the nitride film wet etching device could be contaminated by metal in the course of producing the SGT. Hence, there is a possibility that a semiconductor device produced through such a metal device could be contaminated by metal.

In addition, when forming a metal-semiconductor compound through etching in Patent Literature 1, the gate metal is exposed. Consequently, per Patent Literature 1, the gate metal needs to be tantalum or some other material that is not etched by the chemicals used when forming the metal-semiconductor compound.

In addition, another problem is that similar to MOS transistors, as SGTs are downsized parasitic capacitance occurs in the multi-layered wiring and through this the operating speed of the SGT declines.

In consideration of the foregoing, it is an objective of the present invention to provide a semiconductor device having a structure that controls metal contamination of semiconductor manufacturing equipment and semiconductor devices in semiconductor manufacturing processes while having good characteristics, and a method of producing such a device.

SUMMARY OF THE INVENTION

The semiconductor device according to a first aspect of the present invention is a semiconductor device provided with:

a first planar semiconductor layer;

a first columnar semiconductor layer formed on the first planar semiconductor layer;

a first high concentration semiconductor layer formed on the first planar semiconductor layer and the lower region of the first columnar semiconductor layer;

a second high concentration semiconductor layer of the same conductive type as the first high concentration semiconductor layer, formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film;

a first insulating film formed between the first gate electrode and the first planar semiconductor layer;

a second insulating film formed in sidewall shape contacting the upper sidewall of the first columnar semiconductor layer and the top surface of the first gate electrode so as to surround the upper region of the first columnar semiconductor layer;

a third insulating film formed in a sidewall shape contacting the sidewall of the first insulating film and the first gate electrode so as to surround the first gate electrode and the first insulating film;

a first contact formed above the first columnar semiconductor layer;

a second contact formed above the first planar semiconductor layer; and a third contact formed above the first gate electrode;

wherein the first gate insulating film and the first metal film are covered by the first columnar semiconductor layer, the first semiconductor film, the first insulating film and the second insulating film.

It is preferable for the thickness of the second insulating film to be thicker than the sum of the thickness of the first gate insulating film and the thickness of the first metal film.

It is preferable for the semiconductor device to further have a first metal-semiconductor compound formed on the upper surface of the first high concentration semiconductor layer.

It is preferable for the length from the center of the first columnar semiconductor layer to the edge of the first planar semiconductor layer to be larger than the sum of the length from the center to the sidewall of the first columnar semiconductor layer, the thickness of the first gate insulating film, the thickness of the first gate electrode and the thickness of the third insulating film.

It is also possible for the semiconductor device to further have a third metal-semiconductor compound formed on the top surface of the first gate electrode.

It is also possible for the semiconductor device to further have a second metal-semiconductor compound formed on the top surface of the second high concentration semiconductor layer.

The semiconductor device according to a second aspect of the present invention is provided with a first transistor and a second transistor, wherein:

the first transistor has:

a first planar semiconductor layer;

a first columnar semiconductor layer formed on the first planar semiconductor layer;

a first high concentration semiconductor layer of second conductive type formed on the lower region of the first columnar semiconductor layer and on the region of the first planar semiconductor layer below the first columnar semiconductor layer;

a second high concentration semiconductor layer of second conductive type formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film;

a first insulating film formed between the first gate electrode and the first planar semiconductor layer;

a second insulating film formed in sidewall shape contacting the upper sidewall of the first columnar semiconductor layer and the top surface of the first gate electrode so as to surround upper region of the first columnar semiconductor layer;

a third insulating film formed in a sidewall shape contacting the sidewall of the first insulating film and the first gate electrode so as to surround the first gate electrode and the first insulating film;

a first metal-semiconductor compound formed on the top surface of the portion of the first high concentration semiconductor layer formed in the region below the first columnar semiconductor layer;

a third metal-semiconductor compound formed on the top surface of the first gate electrode; and, a second metal-semiconductor compound formed on the top surface of the second high concentration semiconductor layer;

and the second transistor has:

a second planar semiconductor layer;

a second columnar semiconductor layer formed on the second planar semiconductor layer;

a third high concentration semiconductor layer of first conductive type formed on the lower region of the second columnar semiconductor layer and on the region of the second planar semiconductor layer below the second columnar semiconductor layer;

a fourth high concentration semiconductor layer of first conductive type formed on the upper region of the second columnar semiconductor layer;

a second gate insulating film formed on the sidewall of the second columnar semiconductor layer between the third high concentration semiconductor layer and the fourth high concentration semiconductor layer, so as to surround the second columnar semiconductor layer;

a second metal film formed on the second gate insulating film so as to surround the second gate insulating film;

a second semiconductor film formed on the second metal film so as to surround the second metal film;

a second gate electrode composed of the second metal film and the second semiconductor film;

a fourth insulating film formed between the second gate electrode and the second planar semiconductor layer;

a fifth insulating film formed in sidewall shape contacting the upper sidewall of the second columnar semiconductor layer and the top surface of the second gate electrode so as to surround the top region of the second columnar semiconductor layer;

a sixth insulating film formed in a sidewall shape contacting the sidewall of the fourth insulating film and the second gate electrode so as to surround the second gate electrode and the fourth insulating film;

a fourth metal-semiconductor compound formed on the top surface of the portion of the third high concentration semiconductor layer formed in the region below the second columnar semiconductor layer;

a fifth metal-semiconductor compound formed on the top surface of the second gate electrode; and, a sixth metal-semiconductor compound formed on the top surface of the fourth high concentration semiconductor layer;

wherein the first gate insulating film and the first metal film are covered by the first columnar semiconductor layer, the first semiconductor film, the first insulating film and the second insulating film, and the second gate insulating film and the second metal film are covered by the second columnar semiconductor layer, the second semiconductor film, the fourth insulating film and the fifth insulating film.

It is preferable for the first gate insulating film and the first metal film to be formed from materials that make the first transistor enhancement-type, and the second gate insulating film and the second metal film to be formed from materials that make the second transistor enhancement-type.

It is preferable for the thickness of the second insulating film to be thicker than the sum of the thickness of the first gate insulating film and the thickness of the first metal film.

It is also possible for the semiconductor device to be such that the length from the center of the first columnar semiconductor layer to the edge of the first planar semiconductor layer is larger than the sum of the length from the center to the sidewall of the first columnar semiconductor layer, the thickness of the first gate insulating film, the thickness of the first gate electrode and the thickness of the third insulating film.

It is also possible for the semiconductor device to be such that:

the first conductive type is n+ type, the second conductive type is p+ type, and the first and second columnar semiconductor layers and the first and second planar semiconductor layers are made of silicon The method of producing a semiconductor device according to a third aspect of the present invention is a method of producing the semiconductor device according to the present invention and includes:

a process for preparing a first structure having:

a first planar semiconductor layer;

a first columnar semiconductor layer formed on the first planar semiconductor layer and a hard mask formed on the top surface of the first columnar semiconductor;

a first high concentration semiconductor layer formed on the lower region of the first columnar semiconductor layer and on the region of the first planar semiconductor layer below the first columnar semiconductor layer; and a first insulating film formed on the first planar semiconductor layer;

a process for forming a seventh insulating film, a third metal film and a third semiconductor film, in that order, on the first structure;

a process for etching the third semiconductor film and leaving a sidewall shape on the sidewall on the first columnar semiconductor layer;

a process for etching the third metal film and leaving a sidewall shape on the sidewall of the first columnar semiconductor layer;

a seventh insulating film etching process for etching the seventh insulating film and leaving a sidewall shape on the sidewall of the first columnar semiconductor layer; and a fourth semiconductor film formation process for forming a fourth semiconductor film on the result of the seventh insulating film etching process.

It is also possible for the semiconductor device production method according to the present invention to include:

a process for planarizing the fourth semiconductor film and the third semiconductor film in the result of the fourth semiconductor film formation process and exposing the upper region of the first metal film;

a first metal film and first gate insulating film formation process for etching the third metal film and the seventh insulating film so that the upper sidewall of the first columnar semiconductor layer is exposed to form the first metal film and the first gate insulating film; and, a process for forming a first oxide film on the result of the first metal film and first gate insulating film formation process.

The method of producing a semiconductor device according to a fourth aspect of the present invention is a method of producing the semiconductor device according to the present invention and includes:

a process for preparing a second structure having:

a first planar semiconductor layer;

a first columnar semiconductor layer formed on the first planar semiconductor layer;

a first high concentration semiconductor layer formed on the lower region of the first columnar semiconductor layer and on the region of the first planar semiconductor layer below the first columnar semiconductor layer;

a first gate insulating film formed on the sidewall in the middle region of the first columnar semiconductor layer so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film; and a first insulating film formed between the first gate electrode and the first planar semiconductor layer; and a process for forming a second high concentration semiconductor layer of the same conductive type as the first high concentration semiconductor layer on the upper region of the first columnar semiconductor layer on the second structure by injecting a dopant at an angle of 10 degrees to 60 degrees, with a line orthogonal to the substrate being 0 degrees.

The method of producing a semiconductor device according to a fifth aspect of the present invention is a method of producing the semiconductor device according to the present invention and includes:

a process for preparing a third structure having:

a first planar semiconductor layer;

a first columnar semiconductor layer formed on the first planar semiconductor layer;

a first high concentration semiconductor layer formed on the lower region of the first columnar semiconductor layer and on the region of the first planar semiconductor layer below the first columnar semiconductor layer;

a second high concentration semiconductor layer of the same conductive type as the first semiconductor layer, formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film; and a first insulating film formed between the first gate electrode and the first planar semiconductor layer;

a process for forming an eighth insulating film on the third structure; and a process for forming a second insulating film by etching the eighth insulating film in a sidewall shape so the eighth insulating film remains on the top surface of the first gate electrode and the upper sidewall of the first columnar semiconductor layer.

The method of producing a semiconductor device according to a fifth aspect of the present invention is a method of producing the semiconductor device according to the present invention and includes:

a process for preparing a fourth structure having:

a first planar semiconductor layer;

a first columnar semiconductor layer formed on the first planar semiconductor layer;

a first high concentration semiconductor layer formed on the lower region of the first columnar semiconductor layer and on the region of the first planar semiconductor layer below the first columnar semiconductor layer;

a second high concentration semiconductor layer of the same conductive type as the first semiconductor layer, formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film;

a first insulating film formed between the first gate electrode and the first planar semiconductor layer;

a second insulating film formed in sidewall shape contacting the upper sidewall of the first columnar semiconductor layer and the top surface of the first gate electrode so as to surround the top region of the first columnar semiconductor layer;

a third insulating film formed in a sidewall shape contacting the sidewall of the first insulating film and the first gate electrode so as to surround the first gate electrode and the first insulating film; and a first gate wire connected to the first gate electrode;

a contact stopper formation process for forming a contact stopper on the fourth structure;

a process for forming an interlayer insulating film so as to bury the result of the contact stopper formation process;

a process for forming a first resist on the interlayer insulating film, excluding on top of the first columnar semiconductor layer;

a process for etching the interlayer insulating film and forming a first contact hole on the interlayer insulating film;

a first resist removal process for removing the first resist;

a process for forming a second resist on the result of the first resist removal process, excluding on the first planar semiconductor layer and on the first gate wire;

a process for etching the interlayer insulating film and forming a second contact hole on top of the first planar semiconductor layer and forming a third contact hole on top of the first gate wire, on the interlayer insulating film;

a process for removing the second resist; and a process for forming a first contact positioned above the first columnar semiconductor layer, a second contact positioned above the first planar semiconductor layer and a third contact positioned above the first gate wire on the first contact hole, the second contact hole and the third contact hole, respectively.

EFFICACY OF THE INVENTION

In the present invention, the semiconductor device is provided with:

a first planar semiconductor layer;

a first columnar semiconductor layer formed on the first planar semiconductor layer;

a first high concentration semiconductor layer formed on the first planar semiconductor layer and the lower region of the first columnar semiconductor layer;

a second high concentration semiconductor layer of the same conductive type as the first high concentration semiconductor layer, formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film;

a first insulating film formed between the first gate electrode and the first planar semiconductor layer;

a second insulating film formed in sidewall shape contacting the upper sidewall of the first columnar semiconductor layer and the top surface of the first gate electrode so as to surround the upper region of the first columnar semiconductor layer;

a third insulating film formed in a sidewall shape contacting the sidewall of the first insulating film and the first gate electrode so as to surround the first gate electrode and the first insulating film;

a first contact formed above the first columnar semiconductor layer;

a second contact formed above the first planar semiconductor layer; and a third contact formed above the first gate electrode;

and the first gate insulating film and the first metal film are covered by the first columnar semiconductor layer, the first semiconductor film, the first insulating film and the second insulating film.

Through this, an SGT structure is provided that uses metal in the gate electrode while controlling metal contamination, lowers the resistance of the gate, source and drain, and reduces parasitic capacitance.

The first gate insulating film and the first metal film are covered by the first columnar semiconductor layer, the first semiconductor film, the first insulating film and the second insulating film.

If the metal film is exposed when the metal-semiconductor compound is formed, the metal film is etched by a mixture, such as, a sulfuric acid hydrogen peroxide mixture or an ammonia hydrogen peroxide mixture when the metal-semiconductor compound is formed. However, in the structure of the present invention, the first gate insulating film and the first metal film are covered by the first columnar semiconductor layer, the first semiconductor film, the first insulating film and the second insulating film, so the first metal film is not etched by the sulfuric acid hydrogen peroxide mixture or the ammonia hydrogen peroxide mixture when the compound of metal and semiconductor is formed. Through this, it is possible to form a metal-semiconductor compound on the first high concentration semiconductor layer, the first gate electrode and the second high concentration semiconductor layer, it is possible to control depletion of the channel region by using metal in the gate electrode, to reduce gate electrode resistance and to reduce the resistance of the gate, source and drain through a compound of metal and silicon. In addition, it is possible to reduce parasitic capacitance between the gate electrode and the planar semiconductor layer by means of the first insulating film.

In addition, the first gate insulating film and the first metal film are formed only surrounding the first columnar semiconductor layer, and the first metal film is covered by a semiconductor film such as polysilicon, so when the semiconductor film is planarized using a CMP device during gate formation, it is possible to prevent metal contamination of the CMP device.

In addition, the first gate insulating film and the first metal film are formed only surrounding the first columnar semiconductor layer, and the first metal film is covered by a semiconductor film such as polysilicon, so when the semiconductor film is etched during gate etching, it is possible to prevent metal contamination of the gate etching device.

In addition, the first gate insulating film and the first metal film are formed only surrounding the first columnar semiconductor layer, and the first metal film is covered by a semiconductor film such as polysilicon, so when the nitride film hard mask and the nitride film sidewalls are wet etched, it is possible to prevent metal contamination of the nitride film wet etching device.

In addition, with the present invention the thickness of the second insulating film is thicker than the sum of the thickness of the first gate insulating film and the thickness of the first metal film.

Through this, the first gate insulating film and the first metal film are covered by the first columnar semiconductor layer, the first semiconductor film, the first insulating film and the second insulating film, so the first metal film is not etched by the sulfuric acid hydrogen peroxide mixture or the ammonia hydrogen peroxide mixture when the compound of metal and semiconductor is formed. Through this, it is possible to form a metal-semiconductor compound on the first high concentration semiconductor layer, the first gate electrode and the second high concentration semiconductor layer without any special additional processes.

By having a first metal-semiconductor compound formed on the upper surface of the first high concentration semiconductor layer, it is possible to lower the resistance of the first high concentration semiconductor layer.

Here, the length from the center of the first columnar semiconductor layer to the edge of the first planar semiconductor layer is larger than the sum of the length from the center to the sidewall of the first columnar semiconductor layer, the thickness of the first gate insulating film, the thickness of the first gate electrode and the thickness of the third insulating film.

Through this, it is possible to form the first metal-semiconductor compound on the first high concentration semiconductor layer formed on the first planar semiconductor layer, and to lower the resistance of the first high concentration semiconductor layer.

Here, by having a third metal-semiconductor compound formed on the top surface of the first gate electrode, it is possible to lower the resistance of the first gate electrode.

Here, by having a second metal-semiconductor compound formed on the top surface of the second high concentration semiconductor layer, it is possible to lower the resistance of the second high concentration semiconductor layer.

The semiconductor device according to a second aspect of the present invention is provided with a first transistor and a second transistor, wherein:

the first transistor has:

a first planar semiconductor layer;

a first columnar semiconductor layer formed on the first planar semiconductor layer;

a first high concentration semiconductor layer of second conductive type formed on the lower region of the first columnar semiconductor layer and on the region of the first planar semiconductor layer below the first columnar semiconductor layer;

a second high concentration semiconductor layer of second conductive type formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film;

a first insulating film formed between the first gate electrode and the first planar semiconductor layer;

a second insulating film formed in sidewall shape contacting the upper sidewall of the first columnar semiconductor layer and the top surface of the first gate electrode so as to surround upper region of the first columnar semiconductor layer;

a third insulating film formed in a sidewall shape contacting the sidewall of the first insulating film and the first gate electrode so as to surround the first gate electrode and the first insulating film;

a first metal-semiconductor compound formed on the top surface of the portion of the first high concentration semiconductor layer formed in the region below the first columnar semiconductor layer;

a third metal-semiconductor compound formed on the top surface of the first gate electrode; and, a second metal-semiconductor compound formed on the top surface of the second high concentration semiconductor layer;

and the second transistor has:

a second planar semiconductor layer;

a second columnar semiconductor layer formed on the second planar semiconductor layer;

a third high concentration semiconductor layer of first conductive type formed on the lower region of the second columnar semiconductor layer and on the region of the second planar semiconductor layer below the second columnar semiconductor layer;

a fourth high concentration semiconductor layer of first conductive type formed on the upper region of the second columnar semiconductor layer;

a second gate insulating film formed on the sidewall of the second columnar semiconductor layer between the third high concentration semiconductor layer and the fourth high concentration semiconductor layer, so as to surround the second columnar semiconductor layer;

a second metal film formed on the second gate insulating film so as to surround the second gate insulating film;

a second semiconductor film formed on the second metal film so as to surround the second metal film;

a second gate electrode composed of the second metal film and the second semiconductor film;

a fourth insulating film formed between the second gate electrode and the second planar semiconductor layer;

a fifth insulating film formed in sidewall shape contacting the upper sidewall of the second columnar semiconductor layer and the top surface of the second gate electrode so as to surround the top region of the second columnar semiconductor layer;

a sixth insulating film formed in a sidewall shape contacting the sidewall of the fourth insulating film and the second gate electrode so as to surround the second gate electrode and the fourth insulating film;

a fourth metal-semiconductor compound formed on the top surface of the portion of the third high concentration semiconductor layer formed in the region below the second columnar semiconductor layer;

a fifth metal-semiconductor compound formed on the top surface of the second gate electrode; and, a sixth metal-semiconductor compound formed on the top surface of the fourth high concentration semiconductor layer;

wherein the first gate insulating film and the first metal film are covered by the first columnar semiconductor layer, the first semiconductor film, the first insulating film and the second insulating film, and the second gate insulating film and the second metal film are covered by the second columnar semiconductor layer, the second semiconductor film, the fourth insulating film and the fifth insulating film.

Through this, an SGT structure is provided that uses metal in the gate electrode while controlling metal contamination, lowers the resistance of the gate, source and drain, and reduces parasitic capacitance.

The first gate insulating film and the first metal film are covered by the first columnar semiconductor layer, the first semiconductor film, the first insulating film and the second insulating film.

If the metal film is exposed when the metal-semiconductor compound is formed, the metal film is etched by a sulfuric acid hydrogen peroxide mixture or an ammonia hydrogen peroxide mixture when the metal-semiconductor compound is formed. However, in the structure of the present invention, the first gate insulating film and the first metal film are covered by the first columnar semiconductor layer, the first semiconductor film, the first insulating film and the second insulating film, so the first metal film is not etched by the sulfuric acid hydrogen peroxide mixture or the ammonia hydrogen peroxide mixture when the compound of metal and semiconductor is formed. Through this, it is possible to form a metal-semiconductor compound on the first high concentration semiconductor layer, the first gate electrode and the second high concentration semiconductor layer, and it is possible to control depletion of the channel region by using metal in the first gate electrode to reduce the resistance of the first gate electrode and to reduce the resistance of the gate, source and drain through a compound of metal and silicon. In addition, it is possible to reduce parasitic capacitance between the first gate electrode and the first planar semiconductor layer by means of the first insulating film.

In addition, the second gate insulating film and the second metal film are covered by the second columnar semiconductor layer, the second semiconductor film, the fourth insulating film and the fifth insulating film. If the metal film is exposed when the metal-semiconductor compound is formed, the metal film is etched by a sulfuric acid hydrogen peroxide mixture or an ammonia hydrogen peroxide mixture when the metal-semiconductor compound is formed. However, in the structure of the present invention, the second gate insulating film and the second metal film are covered by the second columnar semiconductor layer, the second semiconductor film, the fourth insulating film and the fifth insulating film, so the second metal film is not etched by the sulfuric acid hydrogen peroxide mixture or the ammonia hydrogen peroxide mixture when the metal-semiconductor compound is formed. Through this, it is possible to form a metal-semiconductor compound on the third high concentration semiconductor layer, the second gate electrode and the fourth high concentration semiconductor layer, to control depletion of the channel region by using metal in the second gate electrode, to reduce the resistance of the second gate electrode and to reduce the resistance of the gate, source and drain through a compound of metal and silicon. In addition, it is possible to reduce parasitic capacitance between the second gate electrode and the second planar semiconductor layer by means of the fourth insulating film.

Here, the first gate insulating film and the first metal film are formed from materials that make the first transistor enhancement-type, and the second gate insulating film and the second metal film are formed from materials that make the second transistor enhancement-type.

Through this, it is possible to reduce penetrating current that flows during operation of a semiconductor device composed of a first transistor and a second transistor.

Here, by having the thickness of the second insulating film be thicker than the sum of the thickness of the first gate insulating film and the thickness of the first metal film, the first gate insulating film and the first metal film are covered by the first columnar semiconductor layer, the first semiconductor film, the first insulating film and the second insulating film, so the first metal film is not etched by the sulfuric acid hydrogen peroxide mixture or the ammonia hydrogen peroxide mixture when the compound of metal and semiconductor is formed.

Through this, it is possible to form a metal-semiconductor compound on the third high concentration semiconductor layer, the first gate electrode and the fourth high concentration semiconductor layer.

Here, by having the length from the center of the first columnar semiconductor layer to the edge of the first planar semiconductor layer be larger than the sum of the length from the center to the sidewall of the first columnar semiconductor layer, the thickness of the first gate insulating film, the thickness of the first gate electrode and the thickness of the third insulating film, it is possible to form the first metal-semiconductor compound on the third high concentration semiconductor layer formed on the first planar semiconductor layer, and to lower the resistance of the third high concentration semiconductor layer.

It is also possible for the semiconductor device to be such that:

the first conductive type is n+ type, the second conductive type is p+ type, and the first and second columnar semiconductor layers and the first and second planar semiconductor layers are made of silicon.

Through this, it is possible to form an inverter with the first transistor being an nMOS SGT and the second transistor being a pMOS SGT.

The method of producing a semiconductor device according to the present invention includes:

a process for preparing a first structure having:

a first planar semiconductor layer;

a first columnar semiconductor layer formed on the first planar semiconductor layer and a hard mask formed on the top surface of the first columnar semiconductor;

a first high concentration semiconductor layer formed on the lower region of the first columnar semiconductor layer and on the region of the first planar semiconductor layer below the first columnar semiconductor layer; and a first insulating film formed on the first planar semiconductor layer;

a process for forming a seventh insulating film, a third metal film and a third semiconductor film, in that order, on the first structure;

a process for etching the third semiconductor film and leaving a sidewall shape on the sidewall on the first columnar semiconductor layer;

a process for etching the third metal film and leaving a sidewall shape on the sidewall of the first columnar semiconductor layer;

a seventh insulating film etching process for etching the seventh insulating film and leaving a sidewall shape on the sidewall of the first columnar semiconductor layer; and a fourth semiconductor film formation process for forming a fourth semiconductor film on the result of the seventh insulating film etching process.

Through this, the first gate insulating film and the first metal film are covered by the first columnar semiconductor layer, the first semiconductor film, the first insulating film and the hard mask. When a high-k film is used for the first gate insulating film, the high-k film is a source of metal contamination, so it is possible to control metal contamination by the first gate insulating film and the first metal film, which are sources of contamination, being covered by the first columnar semiconductor layer, the fourth semiconductor film, the first insulating film and the hard mask.

In addition, the semiconductor device production method according to the present invention may include:

a process for planarizing the fourth semiconductor film and the third semiconductor film in the result of the fourth semiconductor film formation process and exposing the upper region of the first metal film;

a first metal film and first gate insulating film formation process for etching the third metal film and the seventh insulating film so that the upper sidewall of the first columnar semiconductor layer is exposed to form the first metal film and the first gate insulating film; and, a process for forming a first oxide film on the result of the first metal film and first gate insulating film formation process.

Through this, it is possible to control metal contamination of the CMP device used in the planarization process because metal is not exposed during the process of planarizing the fourth semiconductor film and the third semiconductor film, it is possible to determine the gate length of the SGT through etching of the semiconductor film, and it is possible to control fluctuations in gate length, that is to say variances in gate length, and damage to the first gate insulating film and the first metal film from the gate electrode top surface because the gate electrode top surface is protected by the deposited first oxide film from wet processes and dry processes performed in later procedures.

In addition, the first gate insulating film and the first metal film are formed only around the first columnar silicon layer and the first metal film is covered by polysilicon, so it is possible to reduce metal contamination of the gate etching device by etching the polysilicon during gate etching.

In addition, the first gate insulating film and the first metal film are formed only around the columnar semiconductor layer and the first metal film is covered by the first columnar semiconductor layer and the third and fourth semiconductor films, so it is possible to reduce metal contamination of the nitride film wet etching device when wet etching the nitride film hard mask and the nitride film sidewall.

In addition, the method of producing a semiconductor device according to the present invention includes:

a process for preparing a second structure having:

a first planar semiconductor layer;

a first columnar semiconductor layer formed on the first planar semiconductor layer;

a first high concentration semiconductor layer formed on the lower region of the first columnar semiconductor layer and on the region of the first planar semiconductor layer below the first columnar semiconductor layer;

a first gate insulating film formed on the sidewall in the middle region of the first columnar semiconductor layer so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film; and a first insulating film formed between the first gate electrode and the first planar semiconductor layer; and a process for forming a second high concentration semiconductor layer of the same conductive type as the first high concentration semiconductor layer on the upper region of the first columnar semiconductor layer on the second structure by injecting a dopant at an angle of 10 degrees to 60 degrees, with a line orthogonal to the substrate being 0 degrees.

Through this, it is possible to cover the first gate insulating film and the first metal film with the first columnar semiconductor layer, the first semiconductor layer, the first insulating film and the second insulating film.

In addition, the method of producing a semiconductor device according to the present invention includes:

a process for preparing a third structure having:

a first planar semiconductor layer;

a first columnar semiconductor layer formed on the first planar semiconductor layer;

a first high concentration semiconductor layer formed on the lower region of the first columnar semiconductor layer and on the region of the first planar semiconductor layer below the first columnar semiconductor layer;

a second high concentration semiconductor layer of the same conductive type as the first high concentration semiconductor layer, formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film; and a first insulating film formed between the first gate electrode and the first planar semiconductor layer;

a process for forming an eighth insulating film on the third structure; and a process for forming a second insulating film by etching the eighth insulating film in a sidewall shape so the eighth insulating film remains on the top surface of the first gate electrode and the upper sidewall of the first columnar semiconductor layer.

Through this, it is possible for the second high concentration silicon layer and the first gate electrode to be separated from the first gate insulating film, to have an overlap and to minimize that overlap.

In addition, the method of producing a semiconductor device according to the present invention includes:

a process for preparing a fourth structure having:

a first planar semiconductor layer;

a first columnar semiconductor layer formed on the first planar semiconductor layer;

a first high concentration semiconductor layer formed on the lower region of the first columnar semiconductor layer and on the region of the first planar semiconductor layer below the first columnar semiconductor layer;

a second high concentration semiconductor layer of the same conductive type as the first high concentration semiconductor layer, formed on the upper region of the first columnar semiconductor layer;

a first gate insulating film formed on the sidewall of the first columnar semiconductor layer between the first high concentration semiconductor layer and the second high concentration semiconductor layer, so as to surround the first columnar semiconductor layer;

a first metal film formed on the first gate insulating film so as to surround the first gate insulating film;

a first semiconductor film formed on the first metal film so as to surround the first metal film;

a first gate electrode composed of the first metal film and the first semiconductor film;

a first insulating film formed between the first gate electrode and the first planar semiconductor layer;

a second insulating film formed in sidewall shape contacting the upper sidewall of the first columnar semiconductor layer and the top surface of the first gate electrode so as to surround the top region of the first columnar semiconductor layer;

a third insulating film formed in a sidewall shape contacting the sidewall of the first insulating film and the first gate electrode so as to surround the first gate electrode and the first insulating film; and a first gate wire connected to the first gate electrode;

a contact stopper formation process for forming a contact stopper on the fourth structure;

a process for forming an interlayer insulating film so as to bury the result of the contact stopper formation process;

a process for forming a first resist on the interlayer insulating film, excluding on top of the first columnar semiconductor layer;

a process for etching the interlayer insulating film and forming a first contact hole on the interlayer insulating film;

a first resist removal process for removing the first resist;

a process for forming a second resist on the result of the first resist removal process, excluding on the first planar semiconductor layer and on the first gate wire;

a process for etching the interlayer insulating film and forming a second contact hole on top of the first planar semiconductor layer and forming a third contact hole on top of the first gate wire, on the interlayer insulating film;

a process for removing the second resist; and a process for forming a first contact positioned above the first columnar semiconductor layer, a second contact positioned above the first planar semiconductor layer and a third contact positioned above the first gate wire on the first contact hole, the second contact hole and the third contact hole, respectively.

Through this, the contact holes on the first planar semiconductor layer and the first gate wiring are formed through different processes, so it is possible to optimize etching conditions for forming the first contact hole on the first columnar semiconductor layer and etching conditions for forming the second contact hole on the first planar semiconductor layer and the third contact hole on the first gate wiring.

BRIEF DESCRIPTION OF THE DRAWINGS

A more complete understanding of this application can be obtained when the following detailed description is considered in conjunction with the following drawings, in which:

FIG. 11D is a cross-sectional view along line Y2-Y2' in FIG. 11A;

FIG. 30C is a cross-sectional view along line Y1-Y1' in FIG. 30A;

FIG. 30D is a cross-sectional view along line Y2-Y2' in FIG. 30A;

FIG. 31A is a planar view of the semiconductor device during production, showing the method of producing the semiconductor device according to an embodiment of the present invention;

FIG. 31B is a cross-sectional view along line X-X' in FIG. 31A;

FIG. 31C is a cross-sectional view along line Y1-Y1' in FIG. 31A;

FIG. 31D is a cross-sectional view along line Y2-Y2' in FIG. 31A;

FIG. 32A is a planar view of the semiconductor device during production, showing the method of producing the semiconductor device according to an embodiment of the present invention;

FIG. 32B is a cross-sectional view along line X-X' in FIG. 32A;

FIG. 32C is a cross-sectional view along line Y1-Y1' in FIG. 32A;

FIG. 32D is a cross-sectional view along line Y2-Y2' in FIG. 32A;

FIG. 33A is a planar view of the semiconductor device during production, showing the method of producing the semiconductor device according to an embodiment of the present invention;

FIG. 33B is a cross-sectional view along line X-X' in FIG. 33A;

Figure 33A:
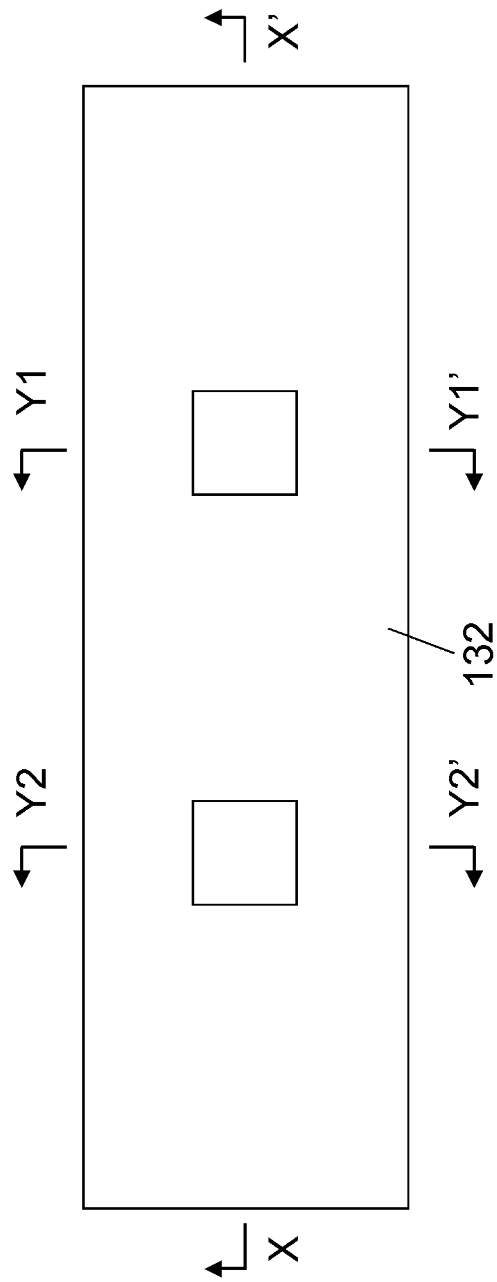
Figure 33B:
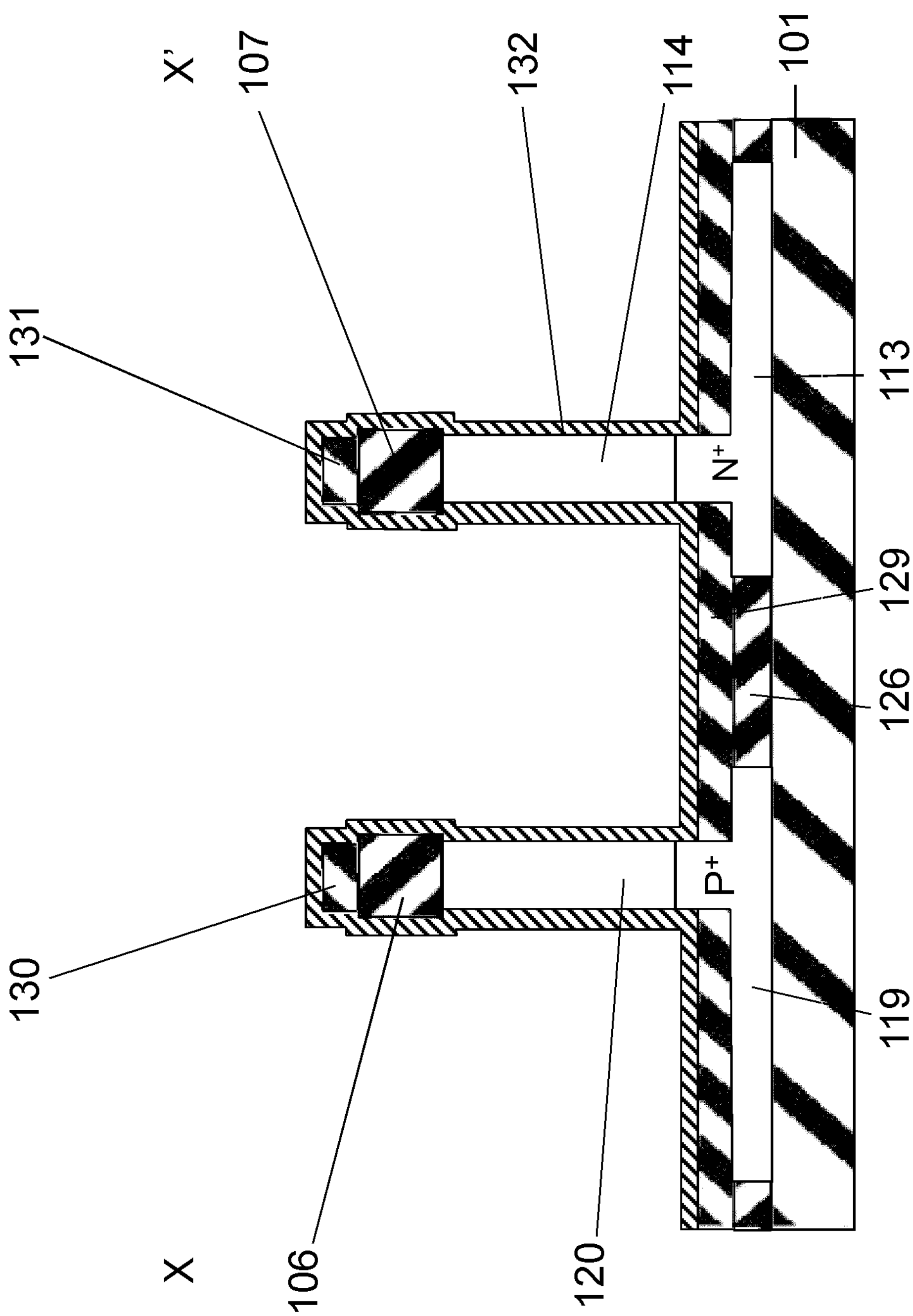
Figure 33C:
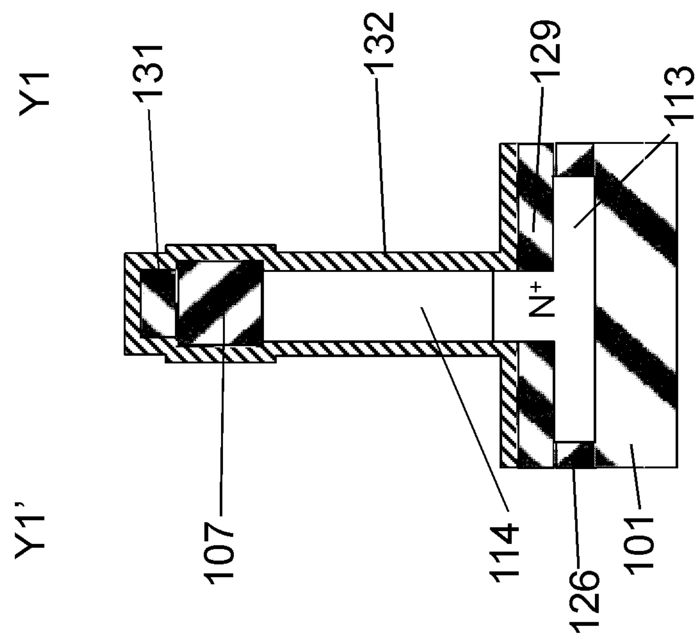
Figure 33D:
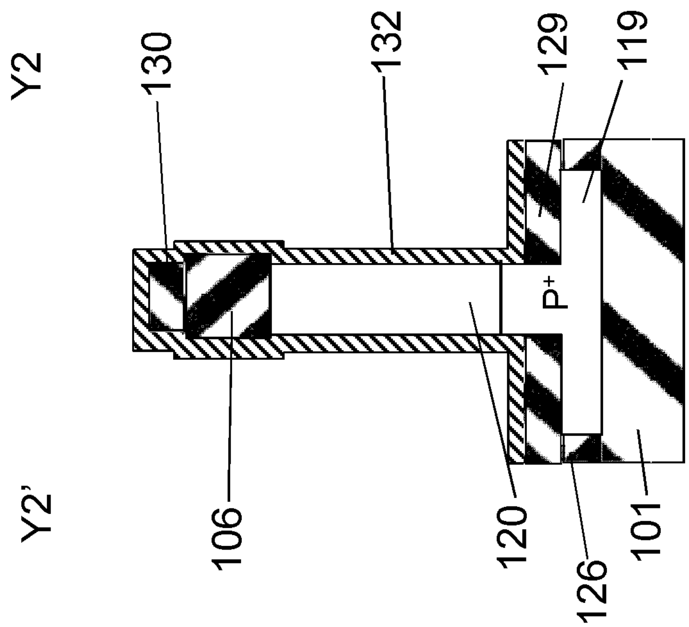
Figure 34A:
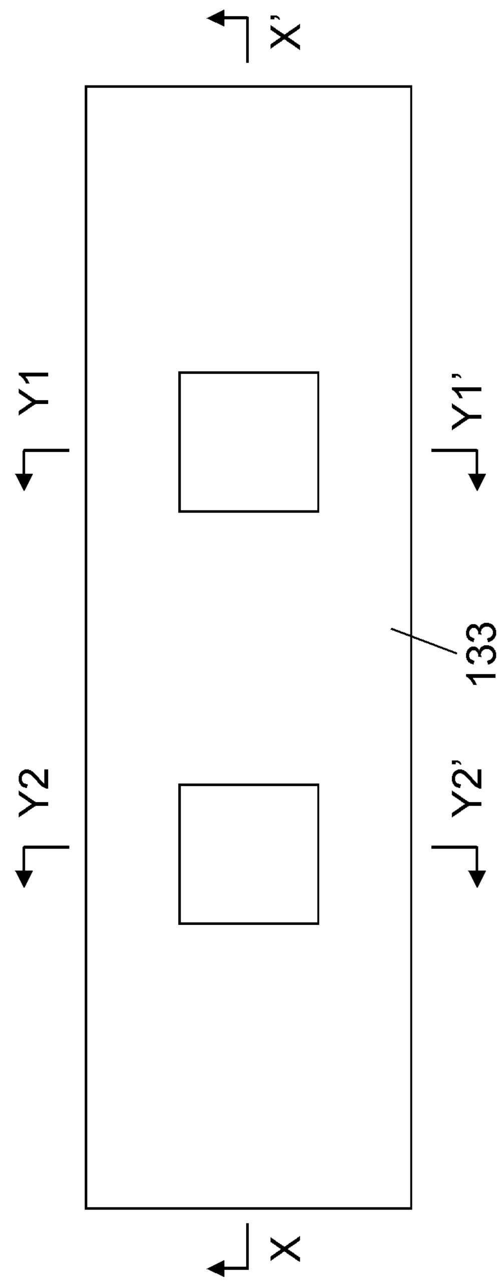
Figure 34B:
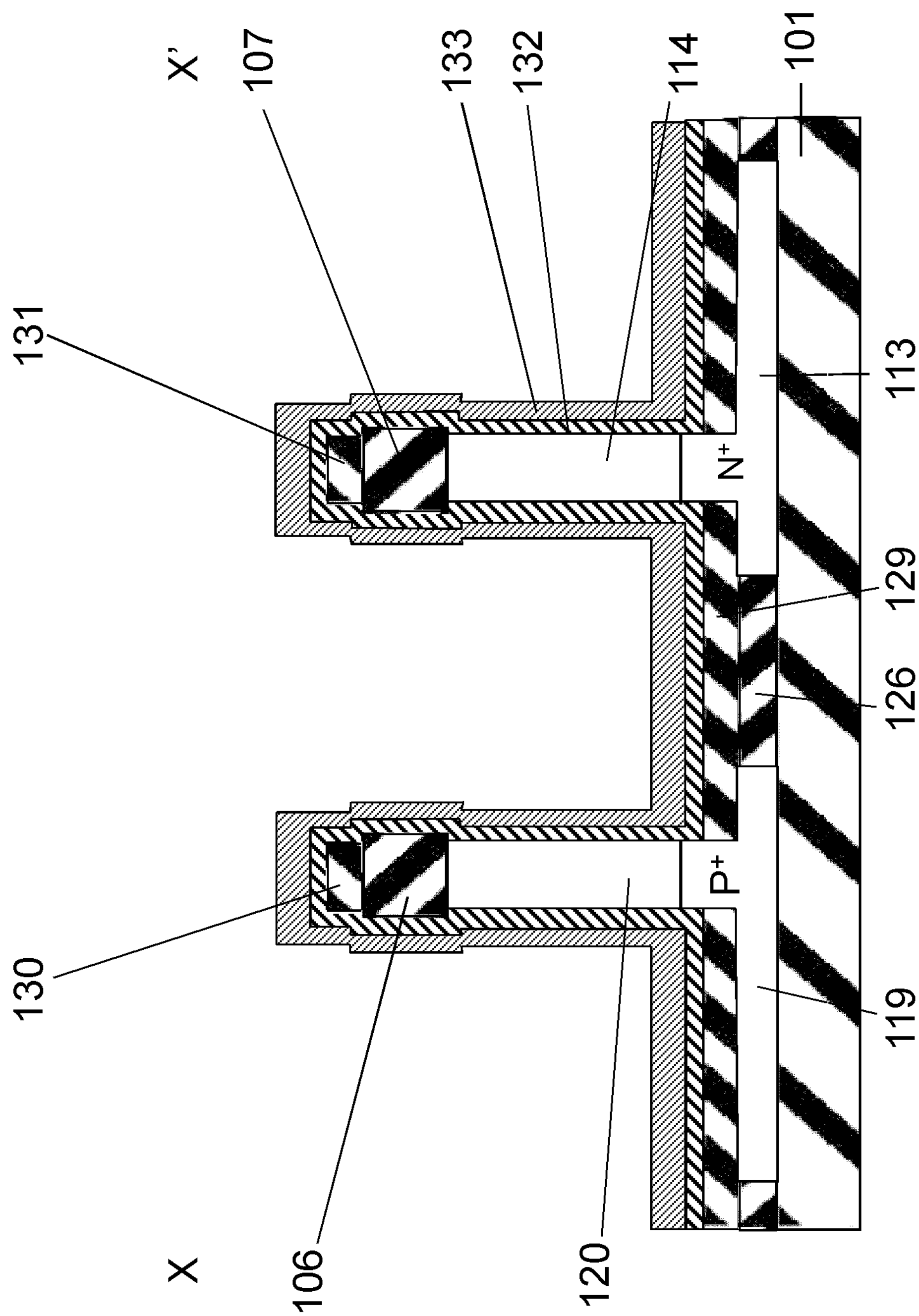
Figure 34C:
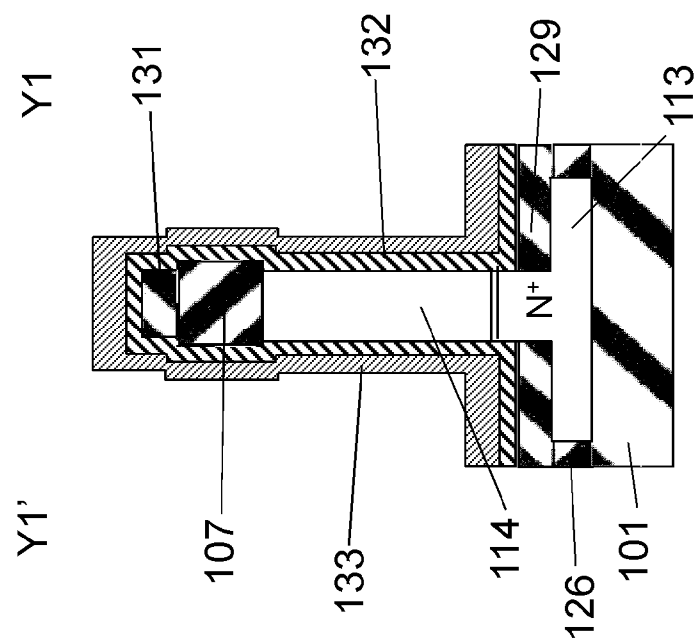
Figure 34D:
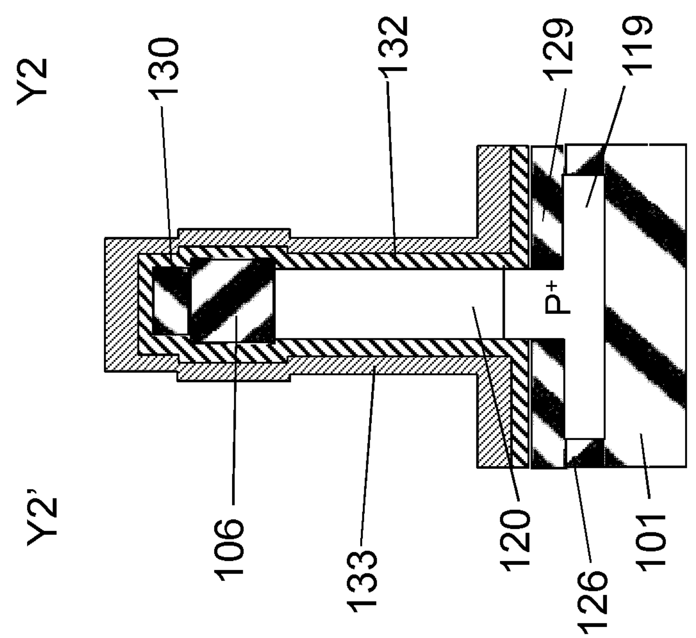
Figure 35A:
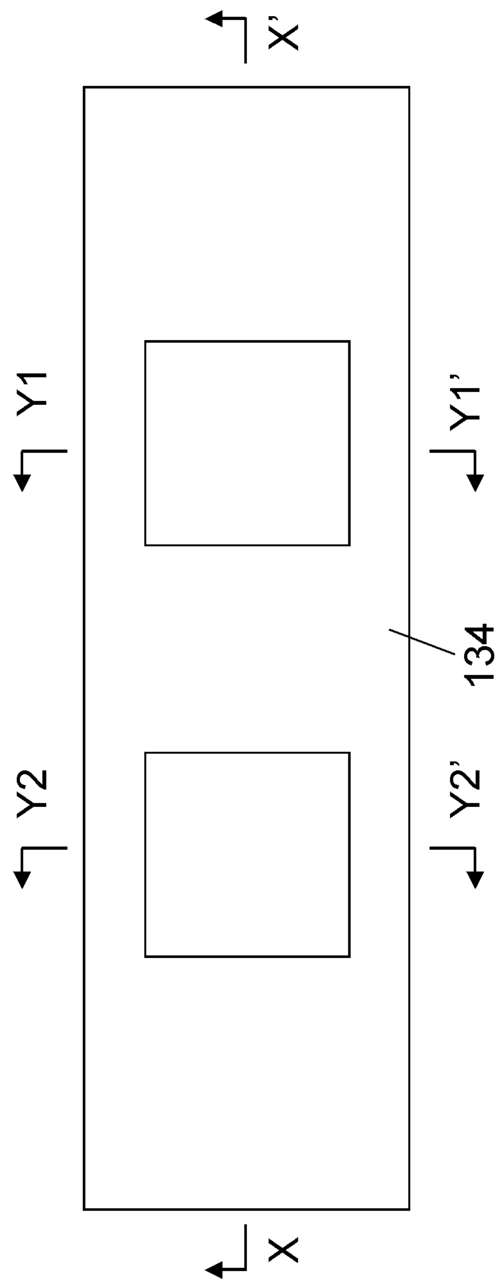
Figure 35B:
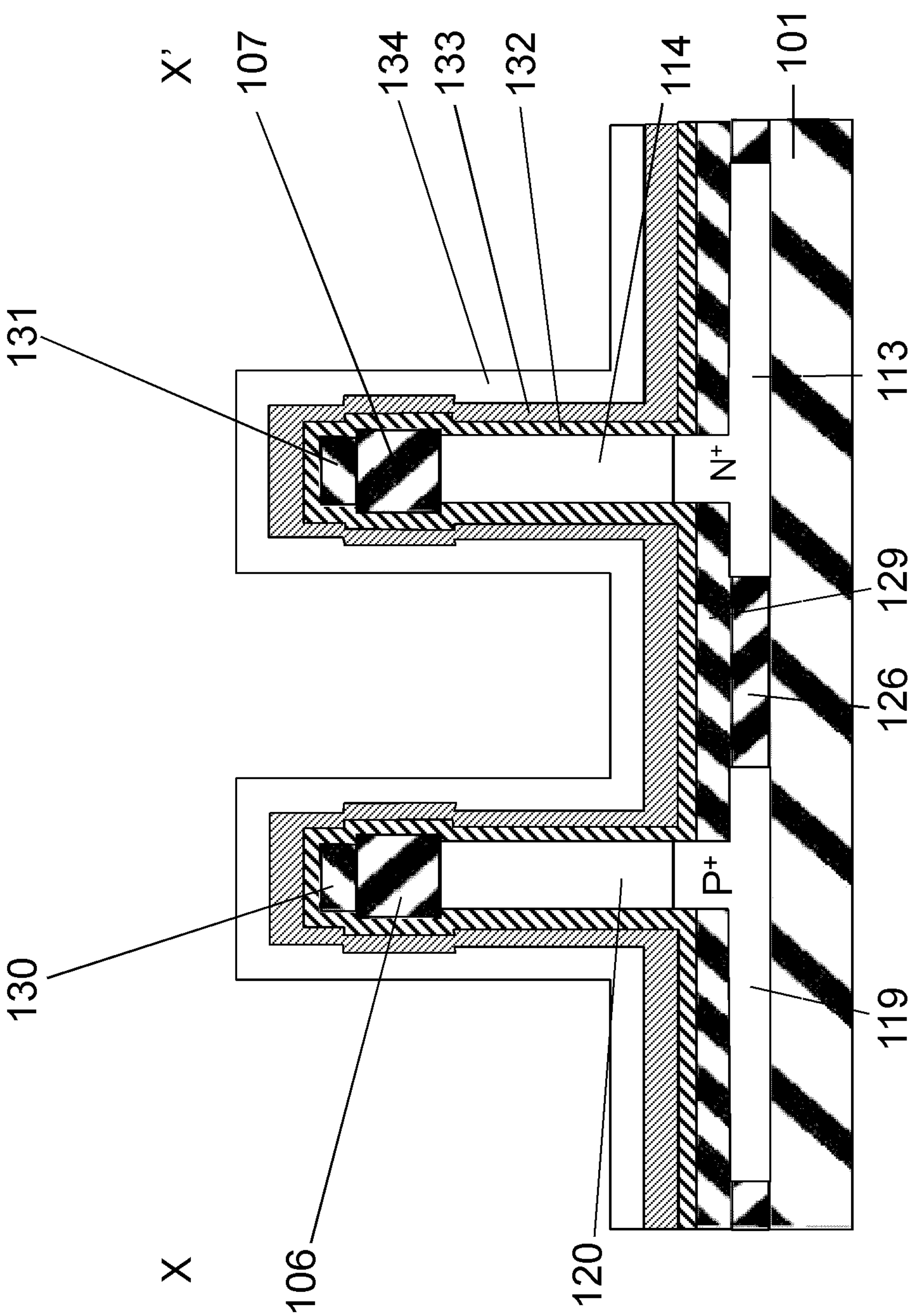
Figure 35C:
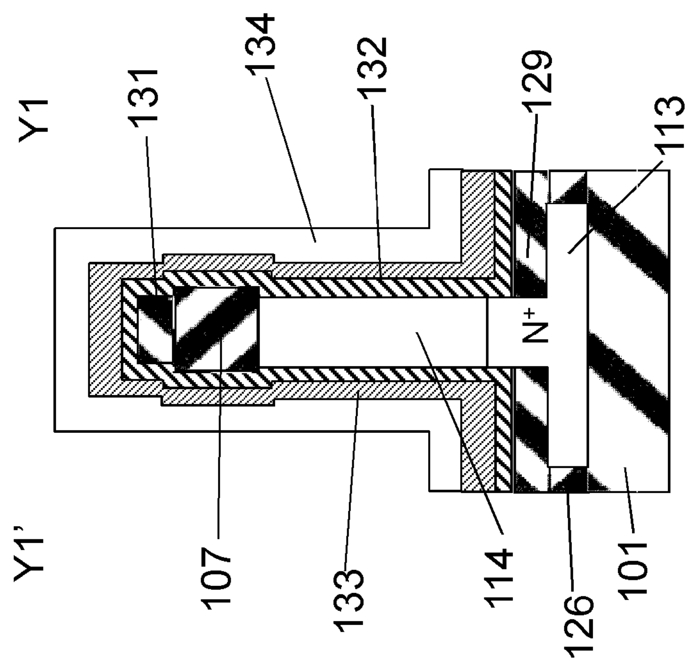
Figure 35D:
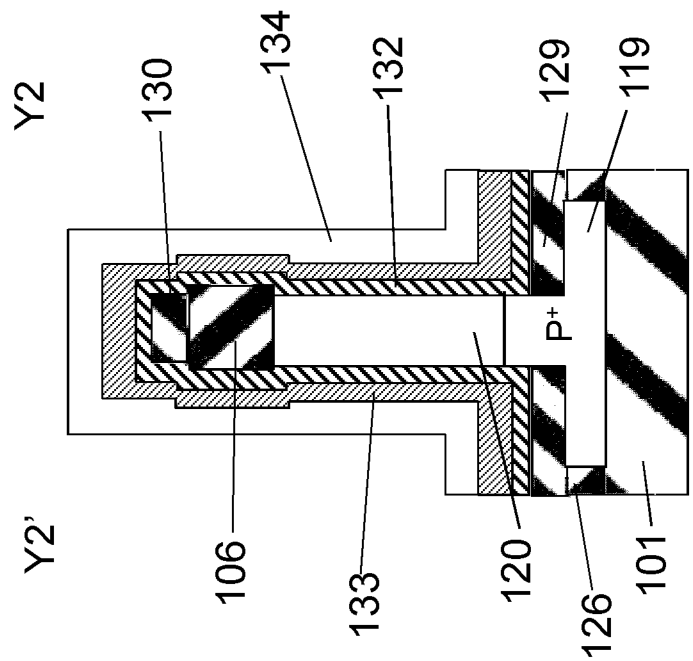
Figure 36A:
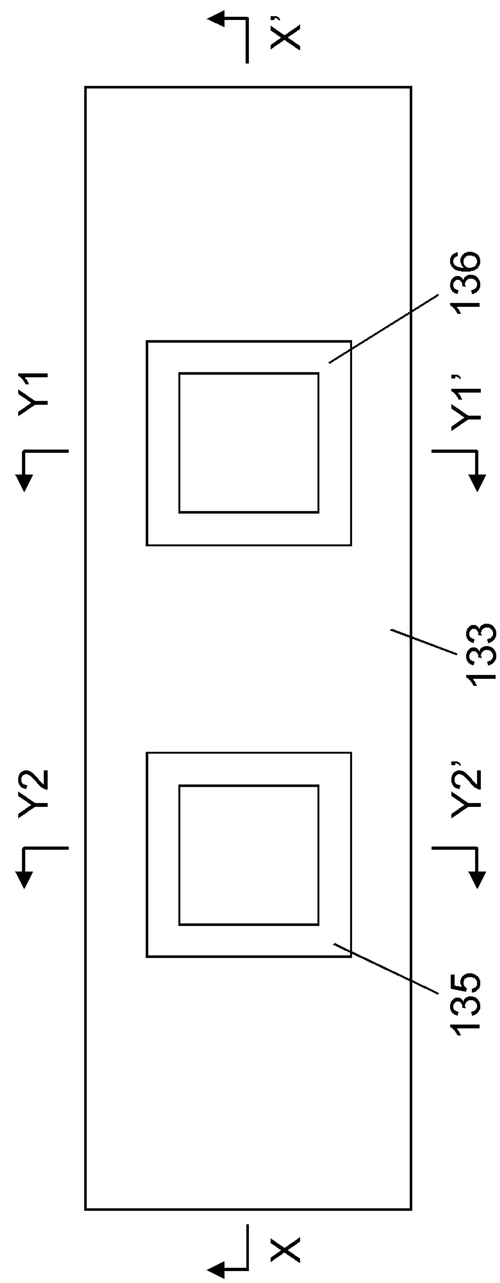
Figure 36B:
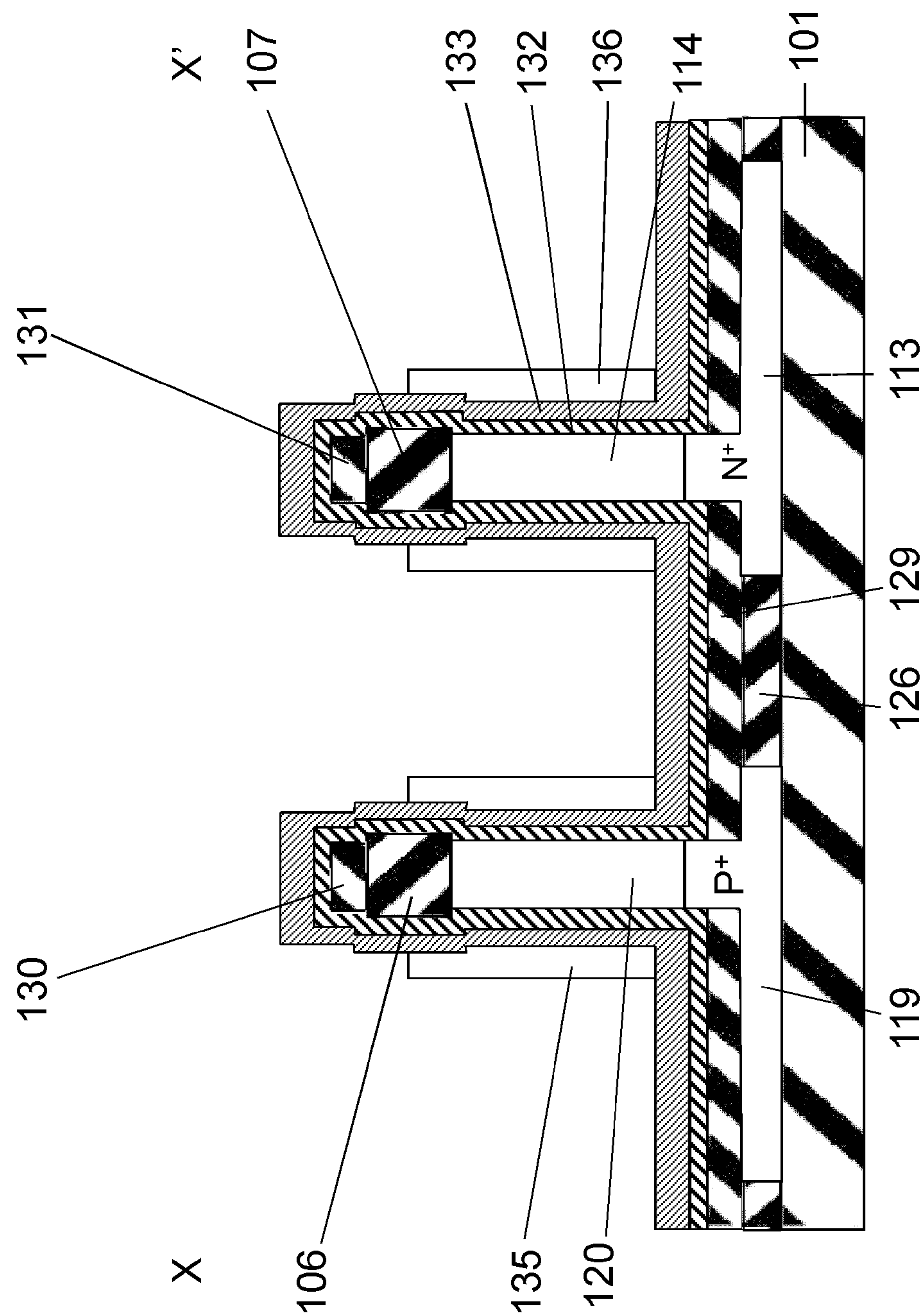
Figure 36C:
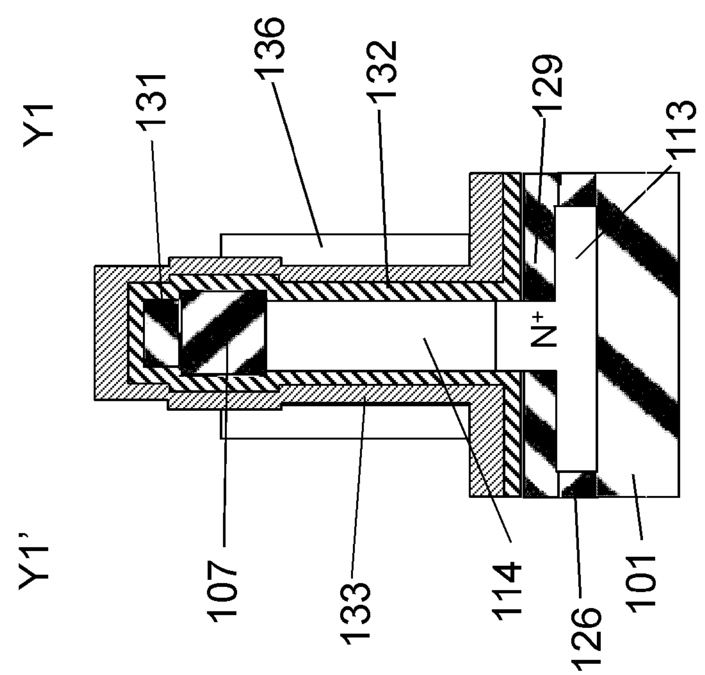
Figure 36D:
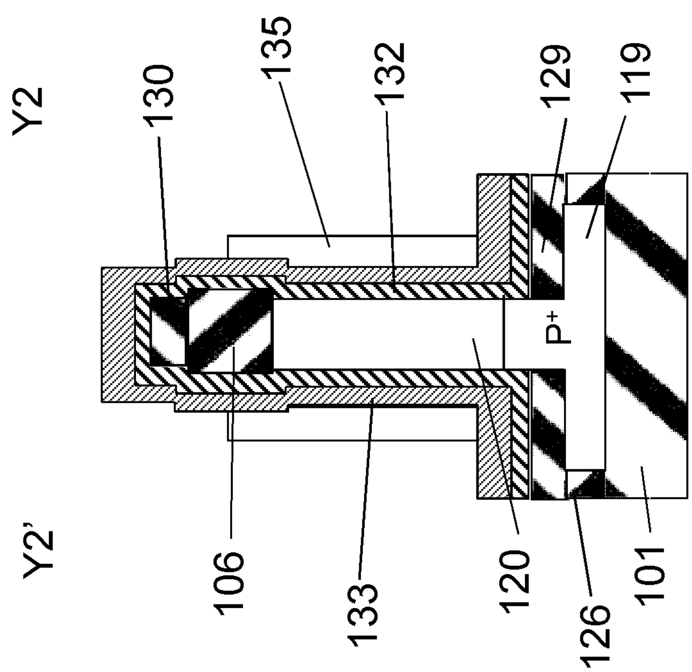
Figure 37A:
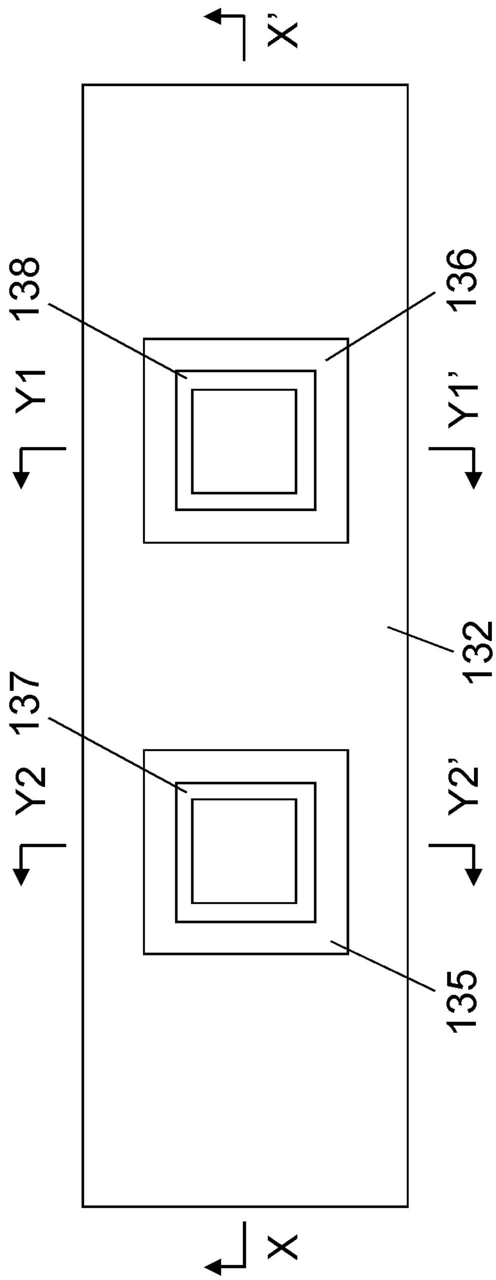
Figure 37B:
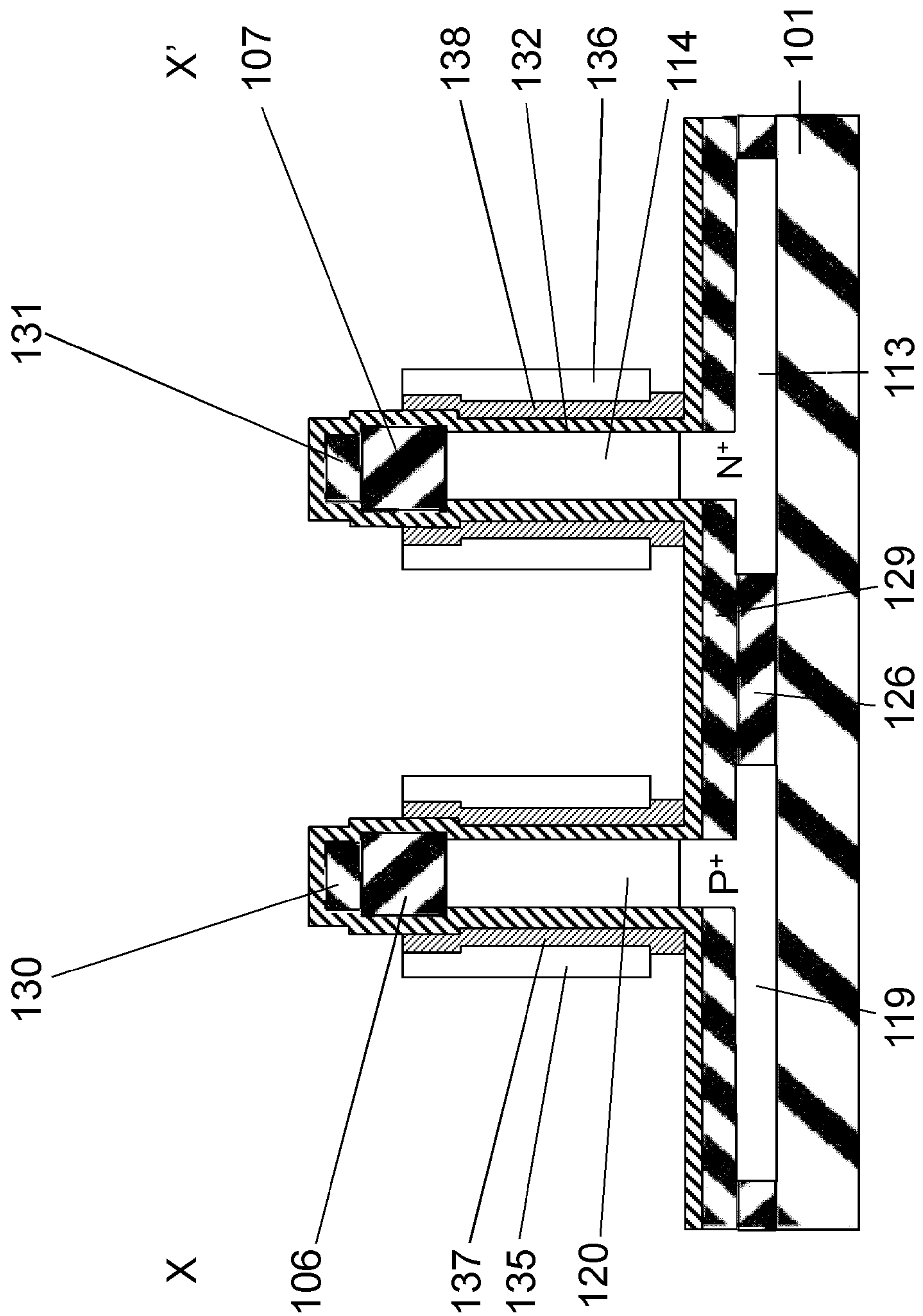
Figure 37C:
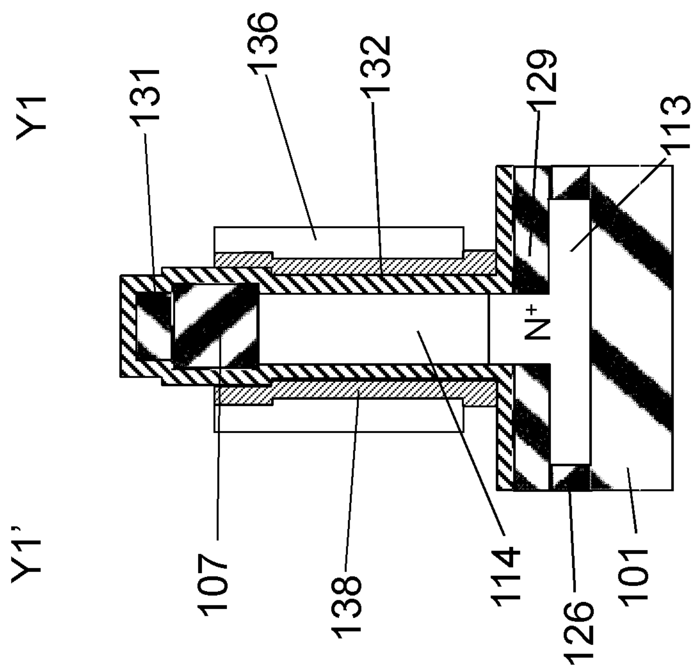
Figure 37D:
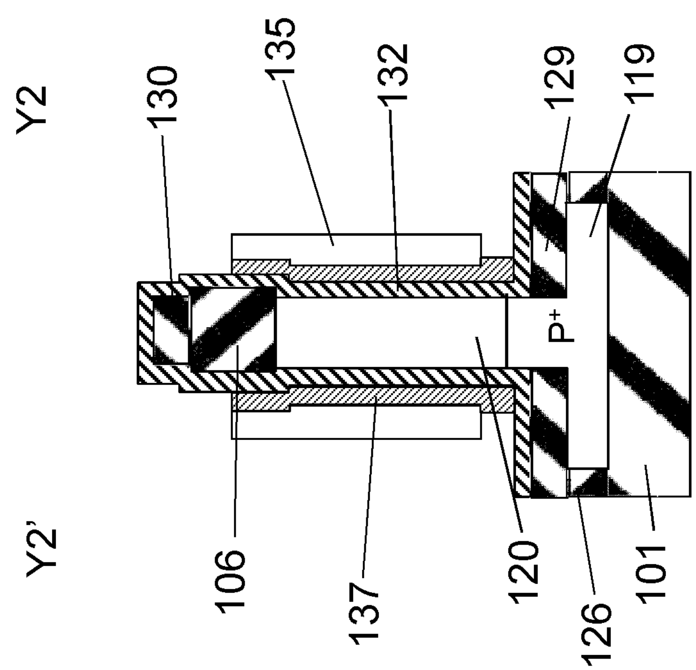
Figure 38A:
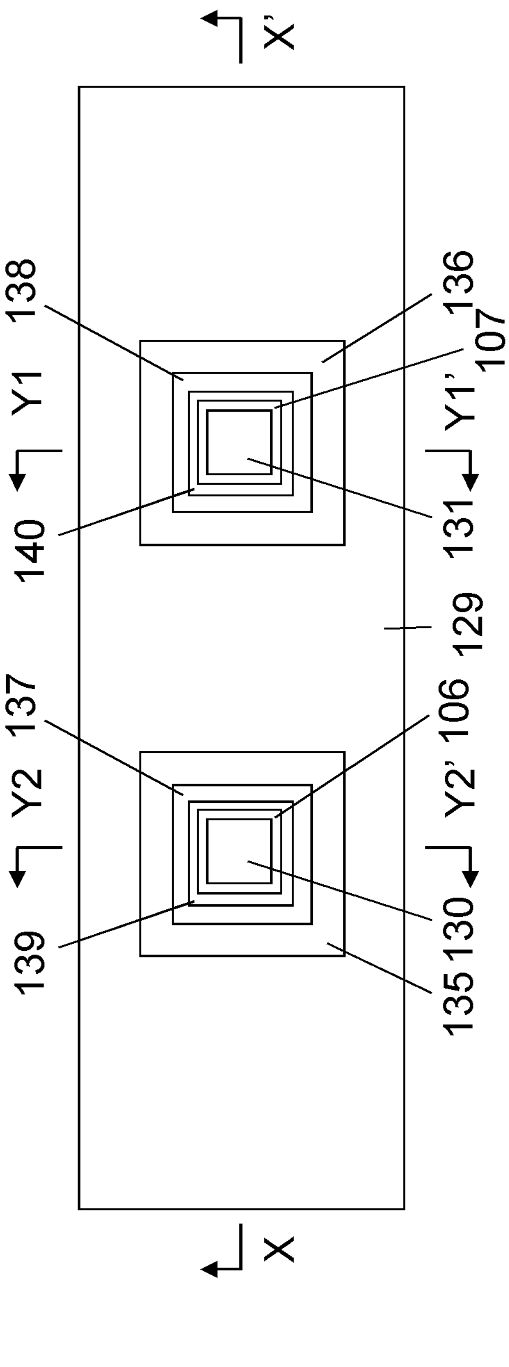
Figure 38B:
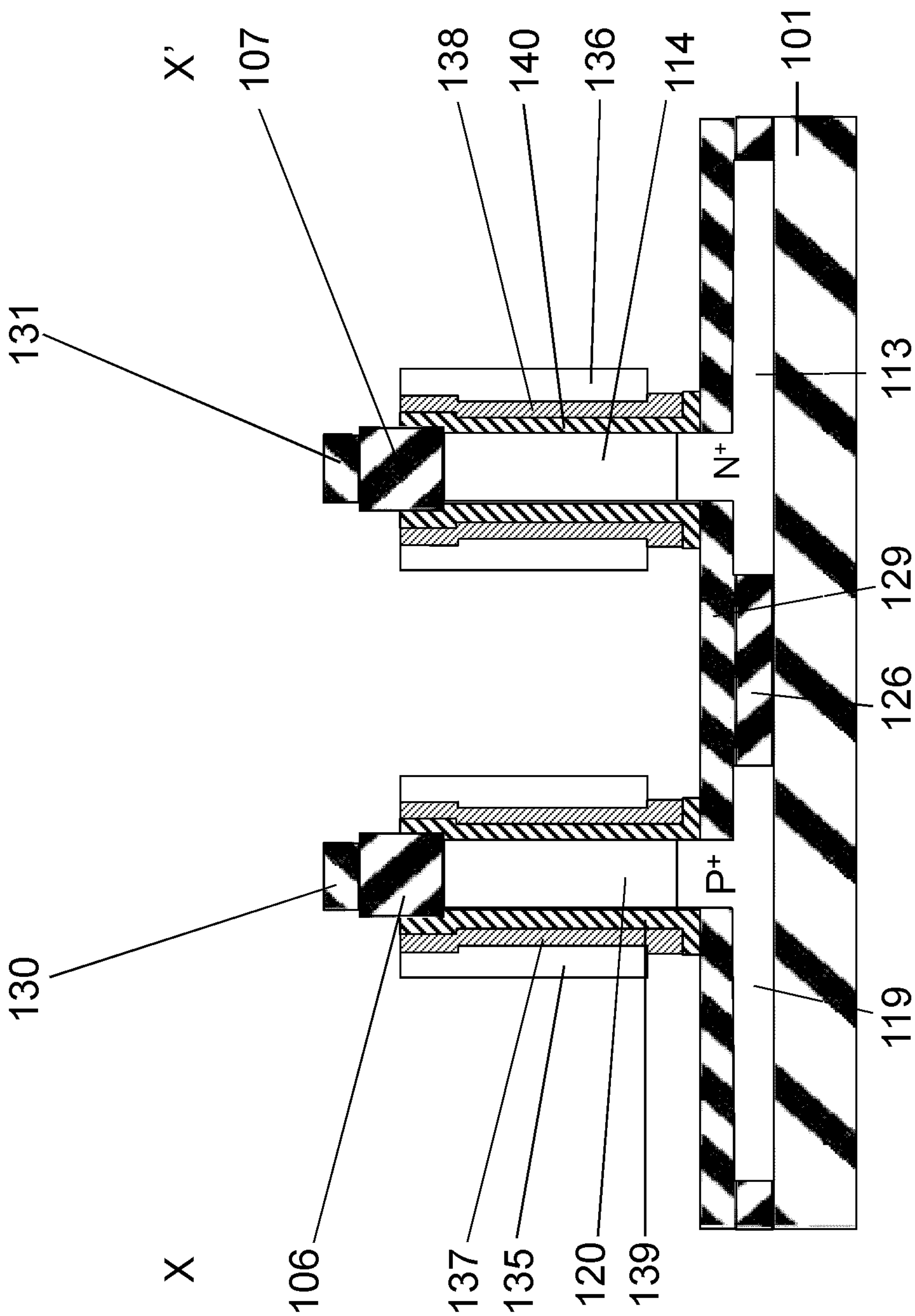
Figure 38C:
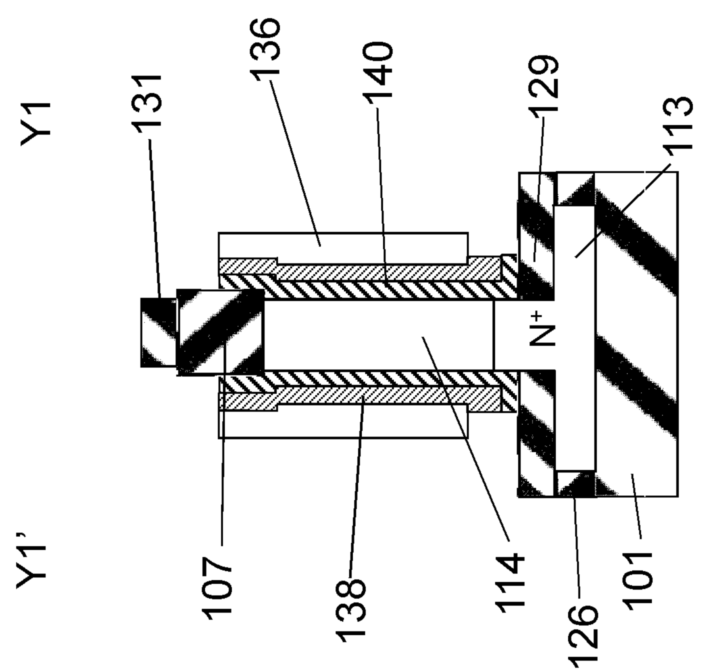
Figure 38D:
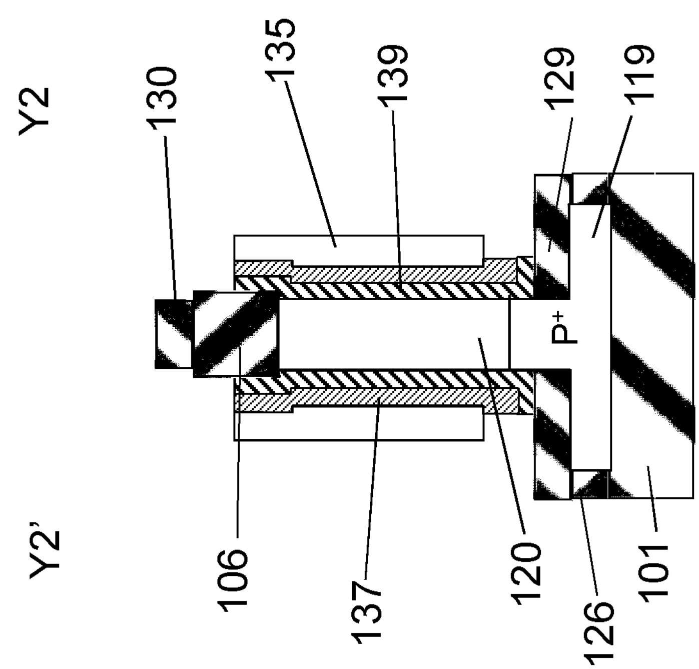
Figure 39A:
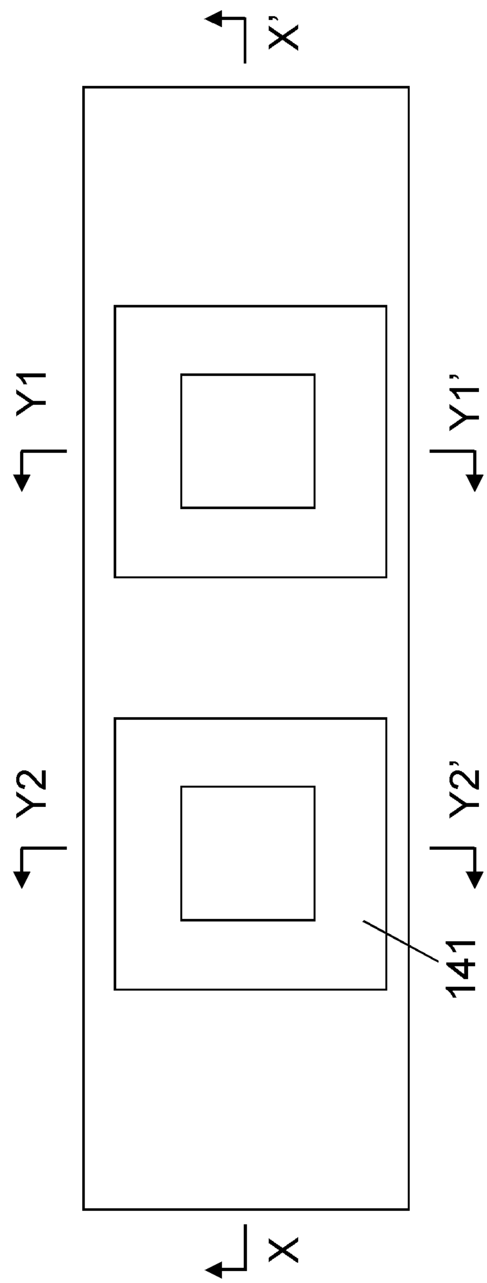
Figure 39B:
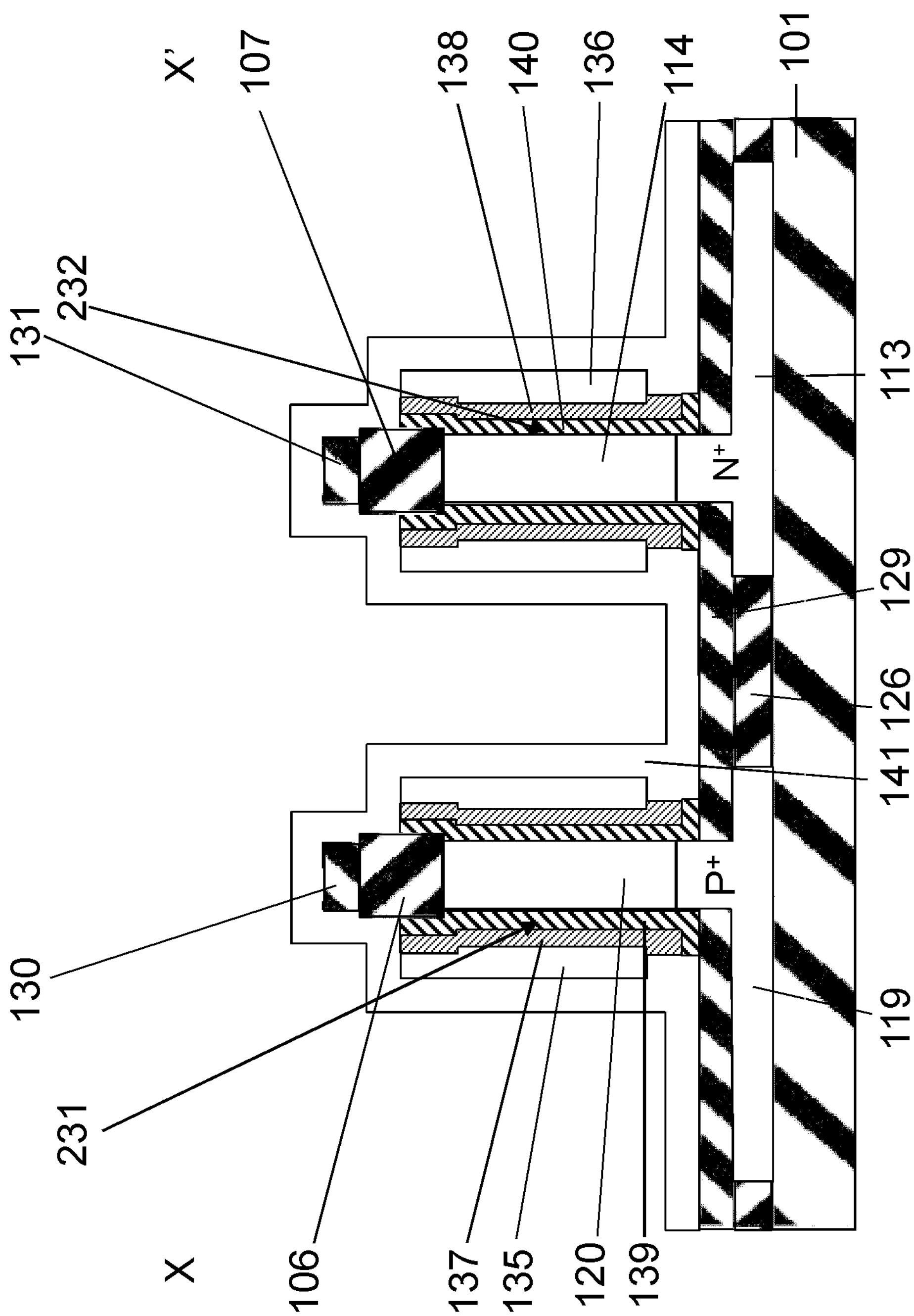
Figure 39C:
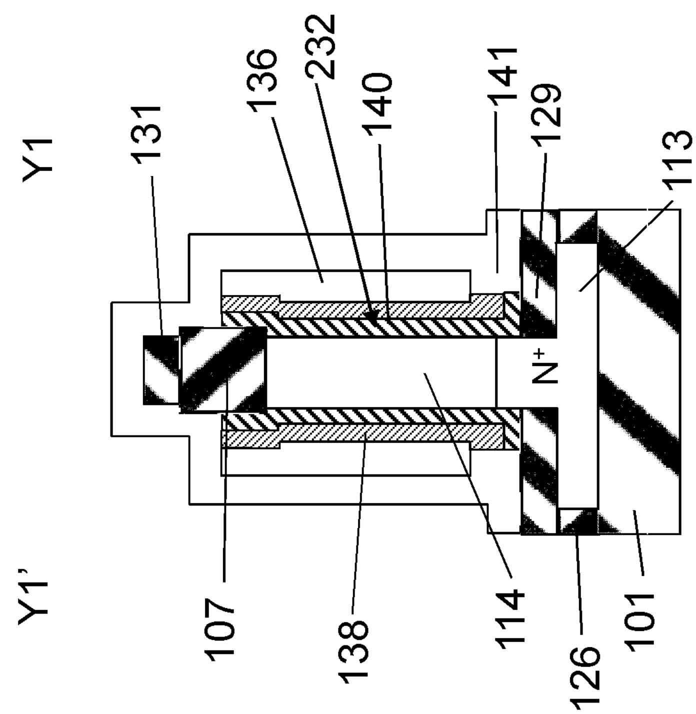
Figure 39D:
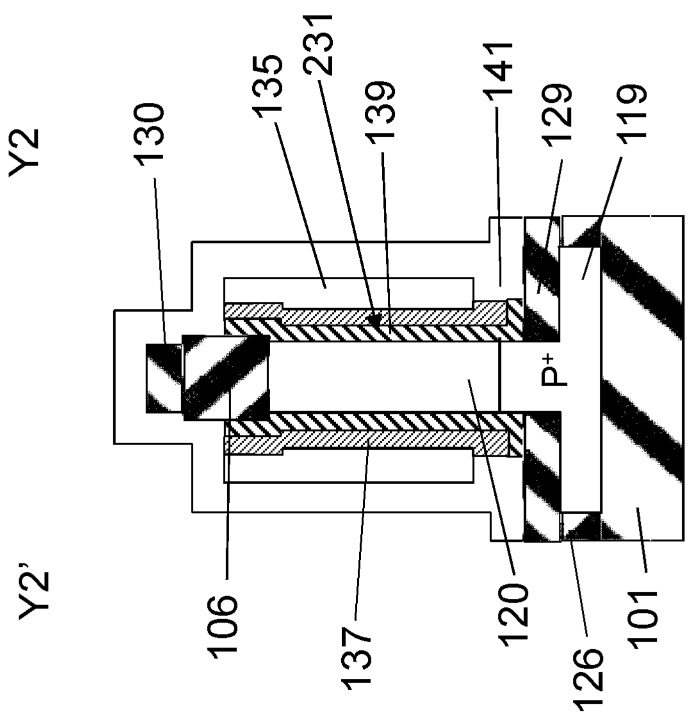
Figure 40A:
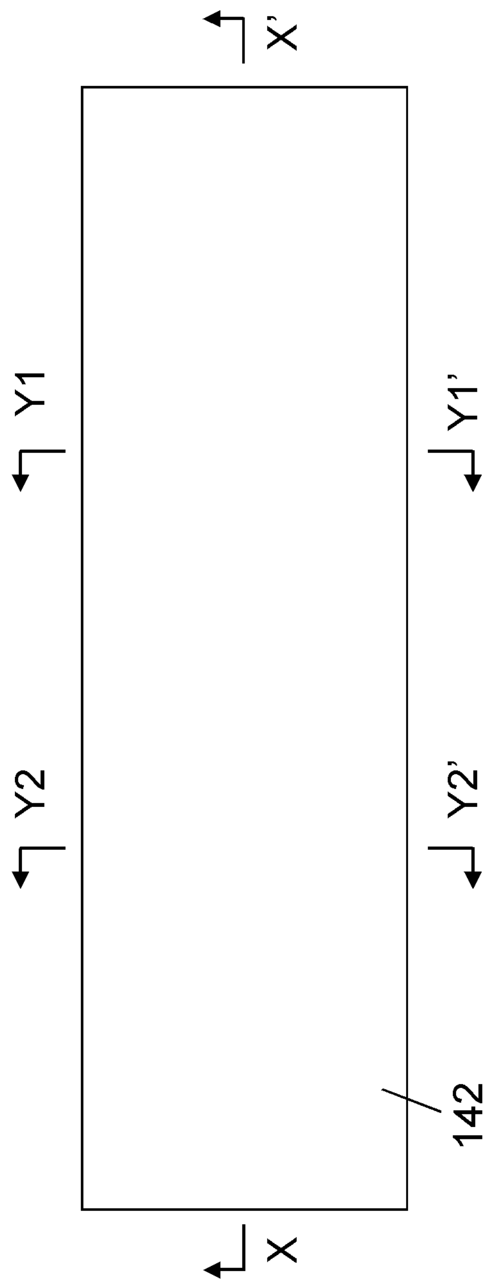
Figure 40B:
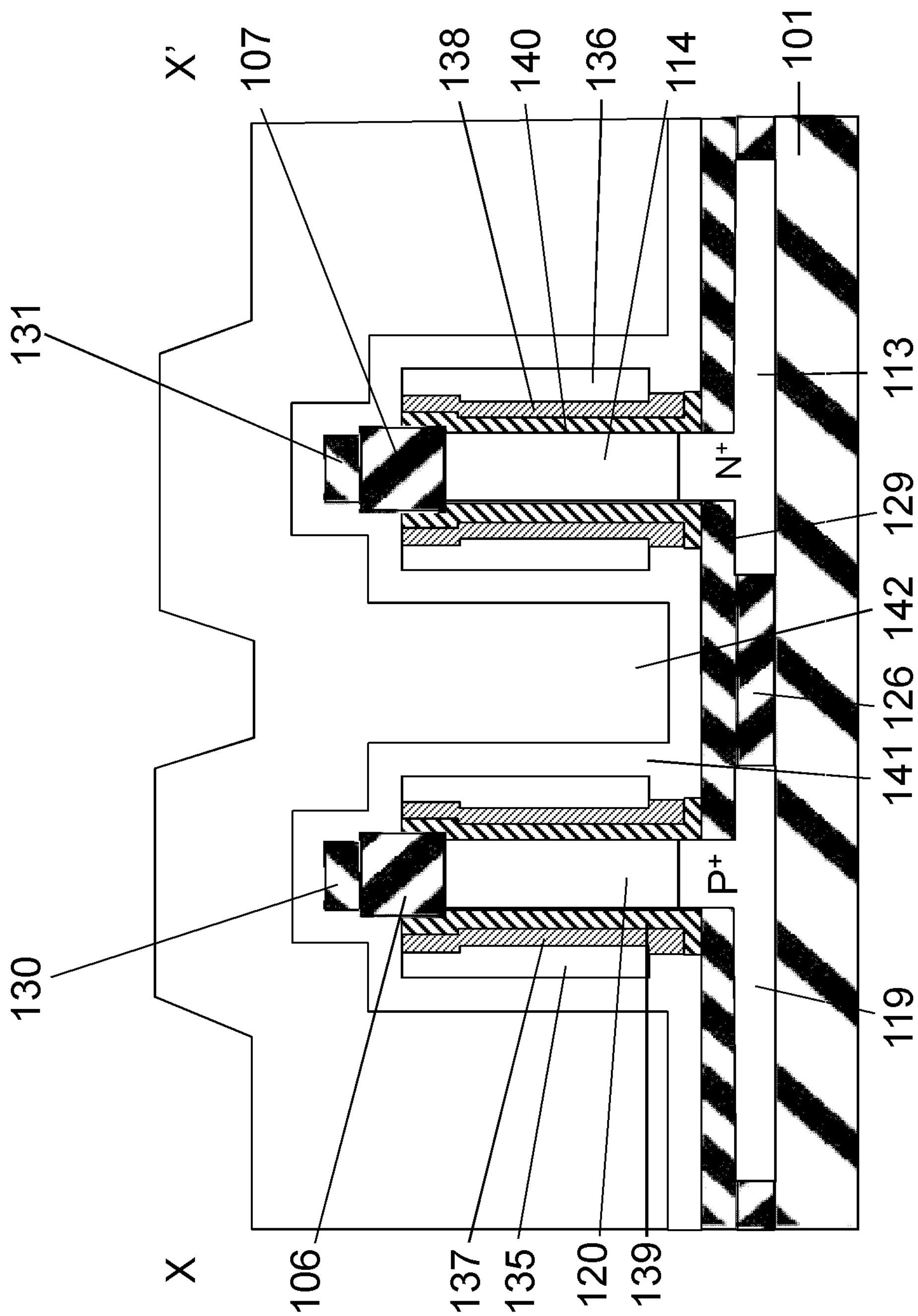
Figure 40C:
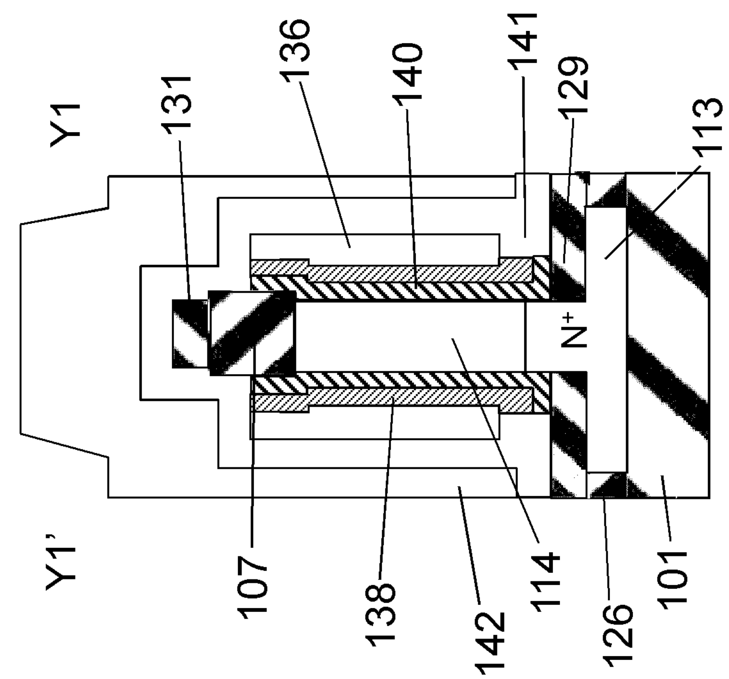
Figure 40D:
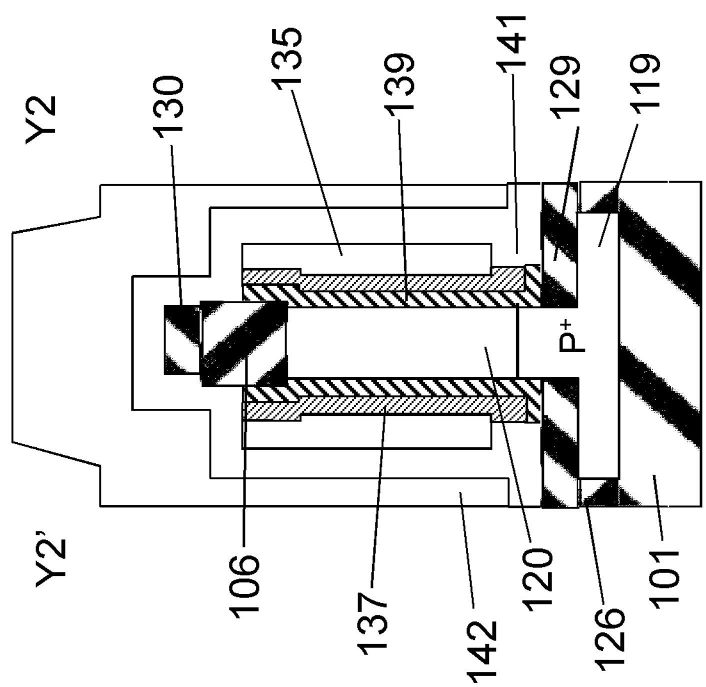
Figure 41A:
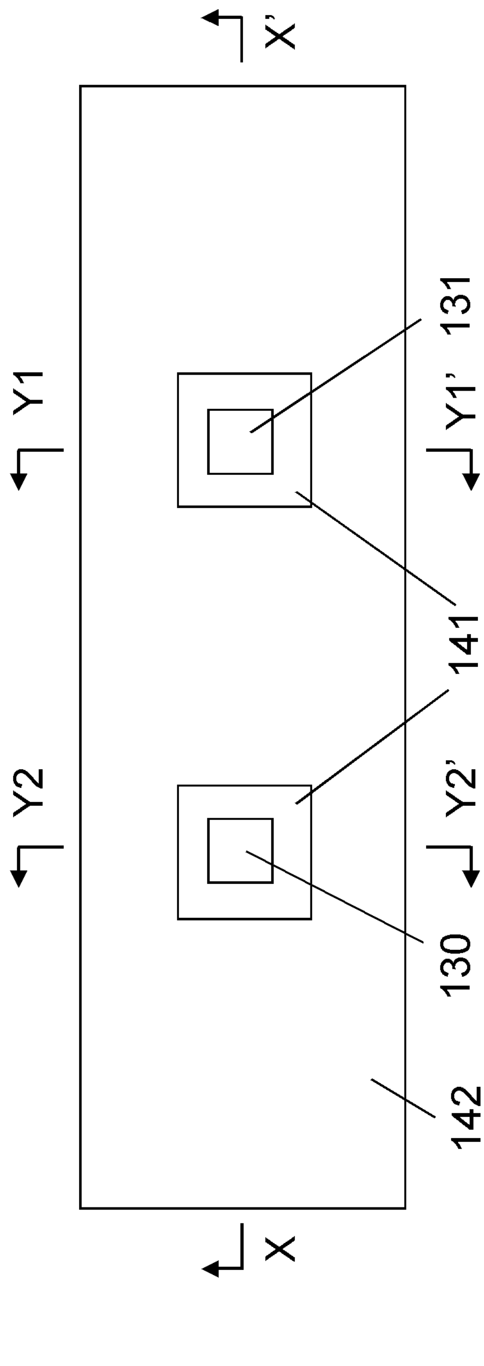
Figure 41B:
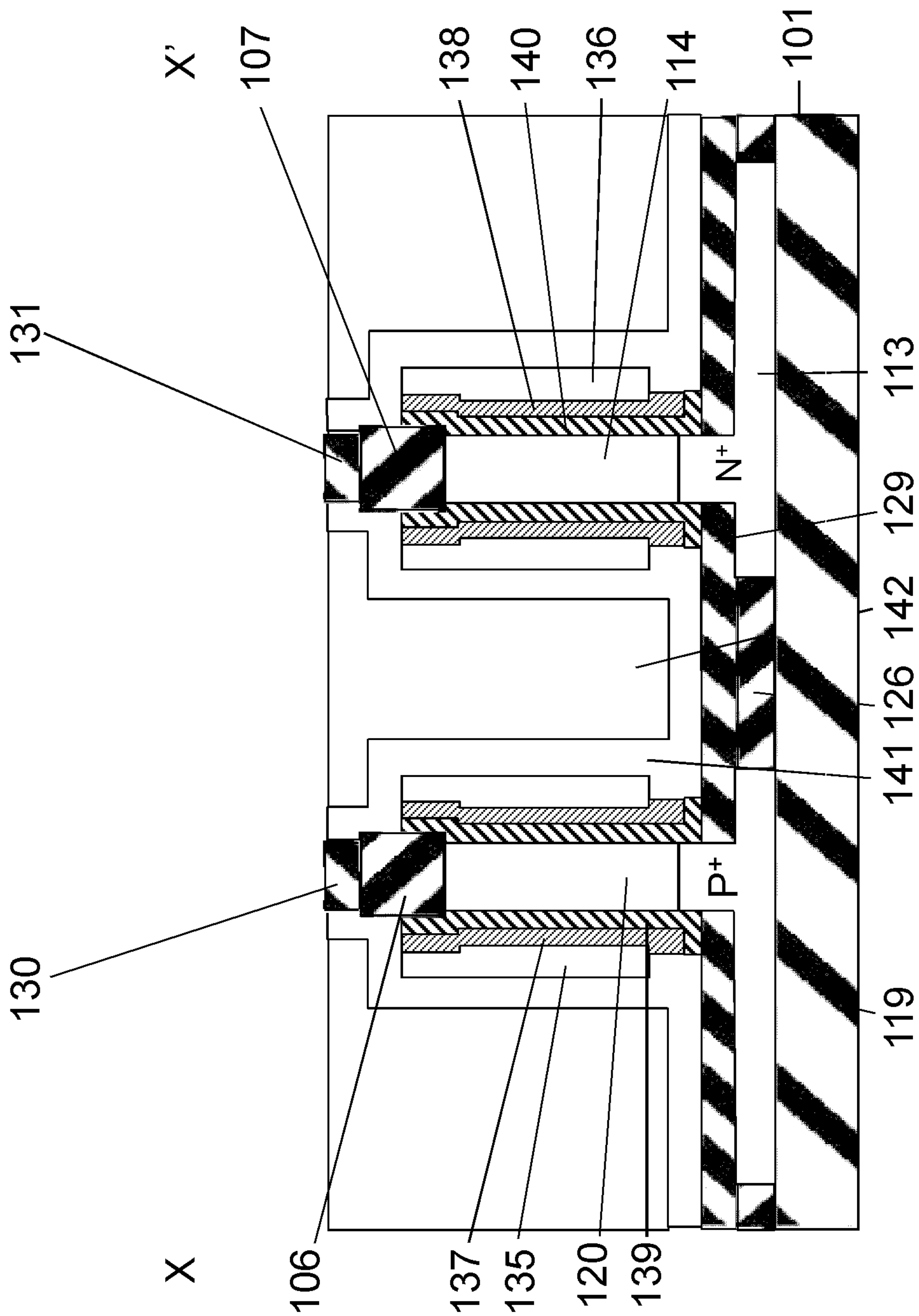
Figure 41C:
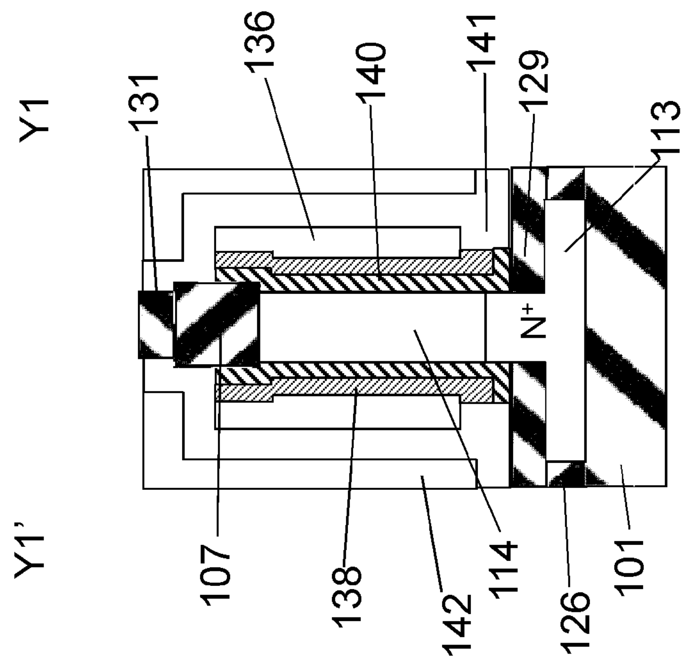
Figure 41D:
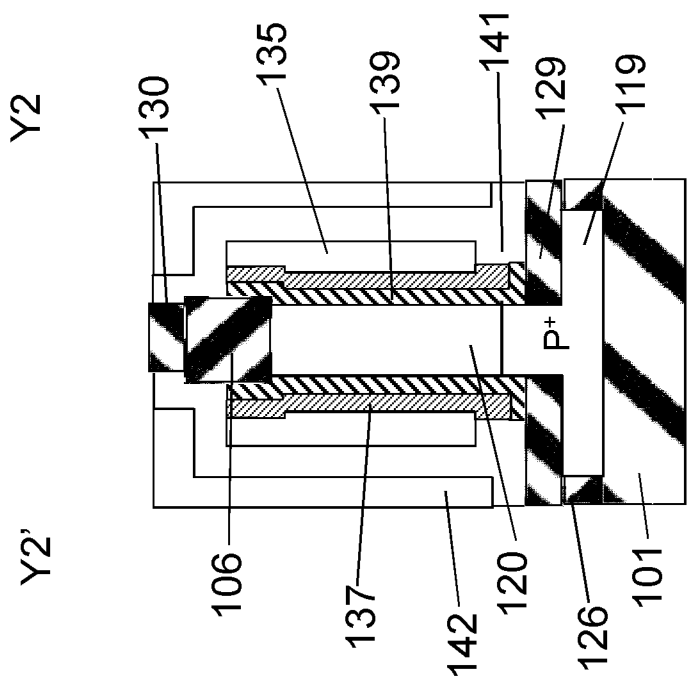
Figure 42A:
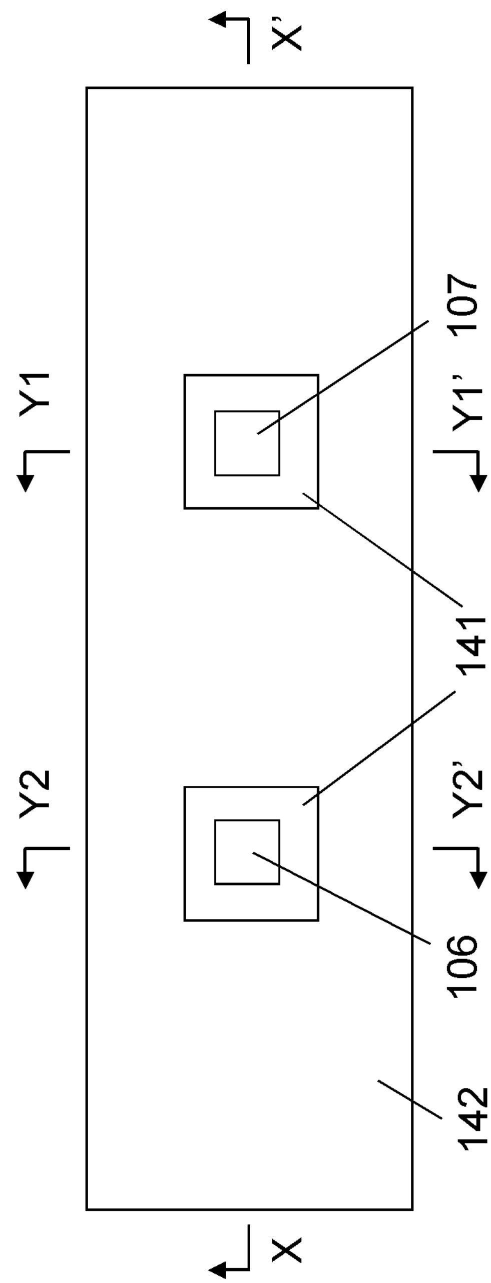
Figure 42B:
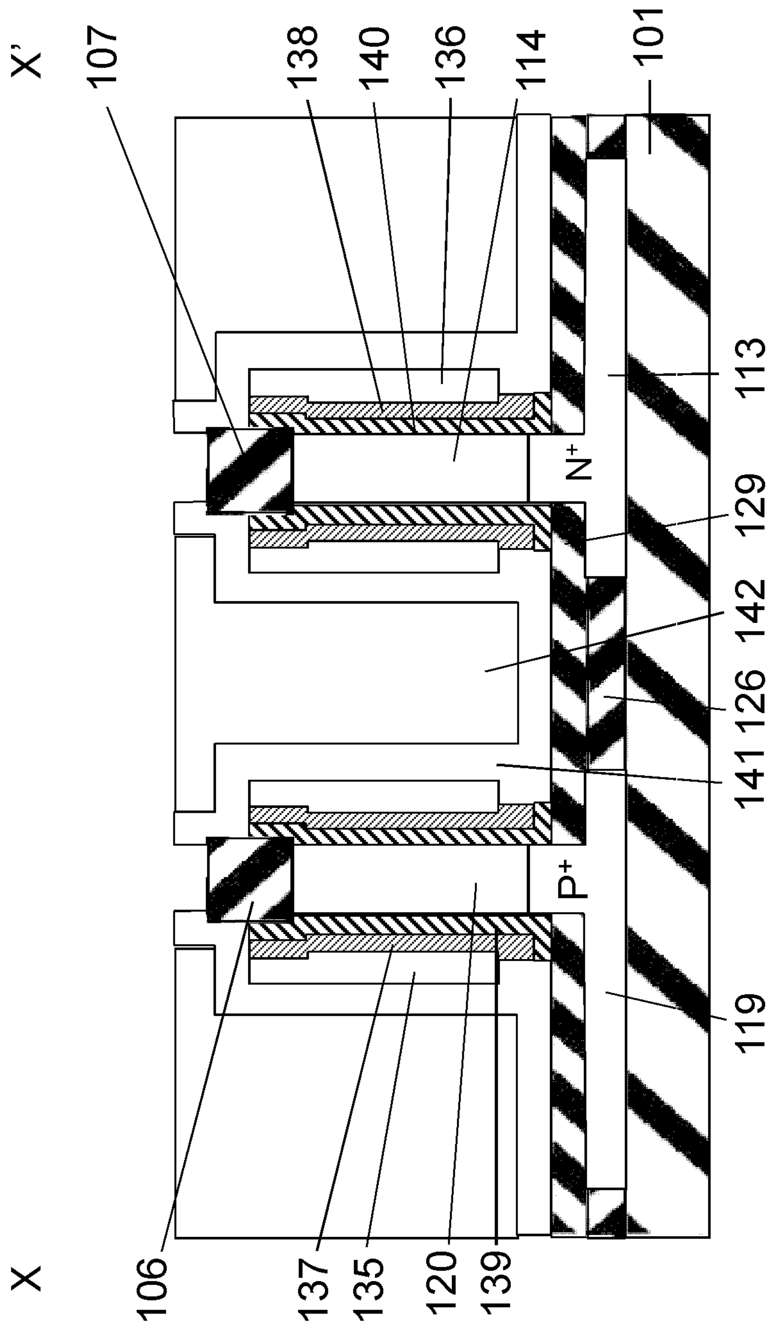
Figure 42C:
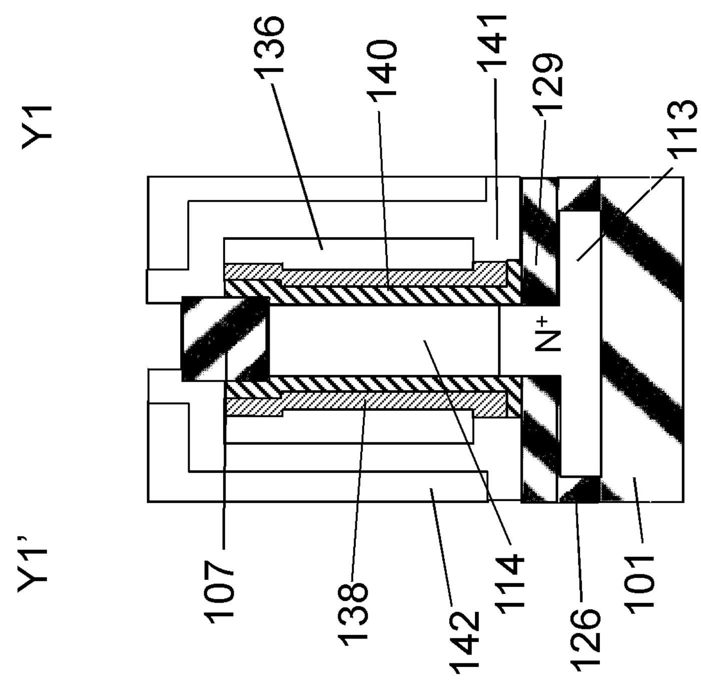
Figure 42D:
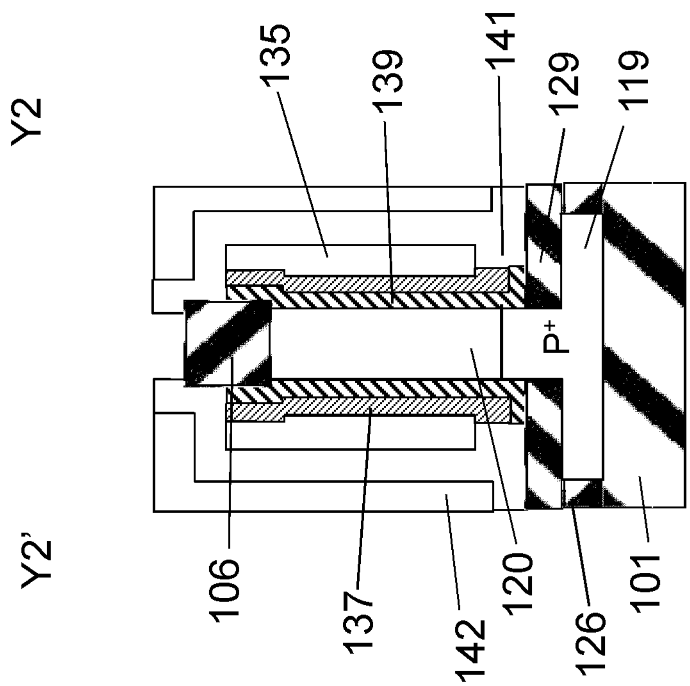
Figure 43A:
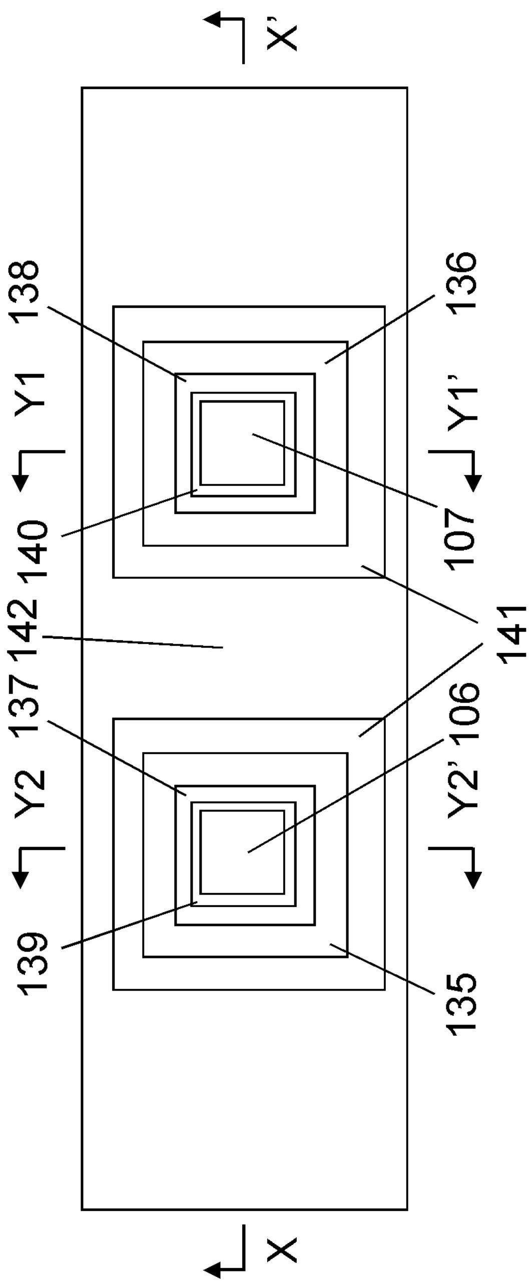
Figure 43B:
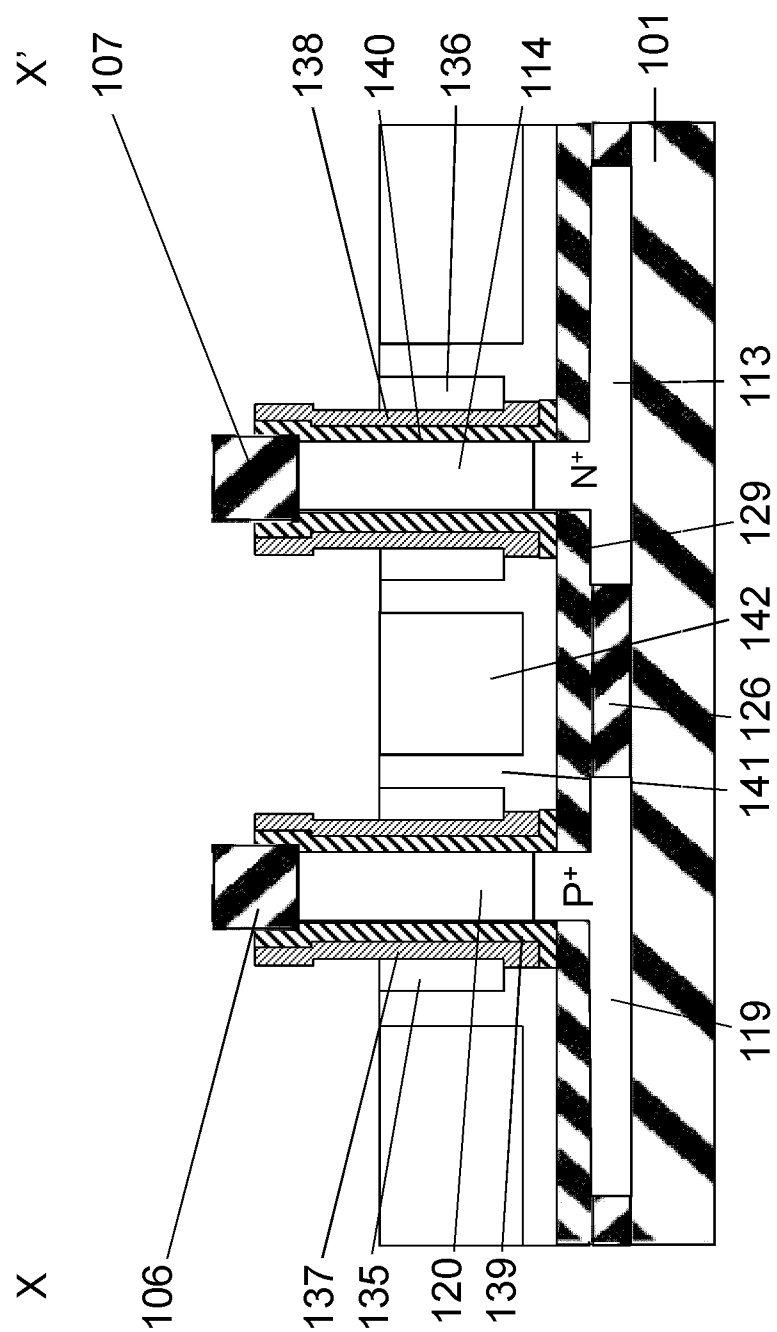
Figure 43C:
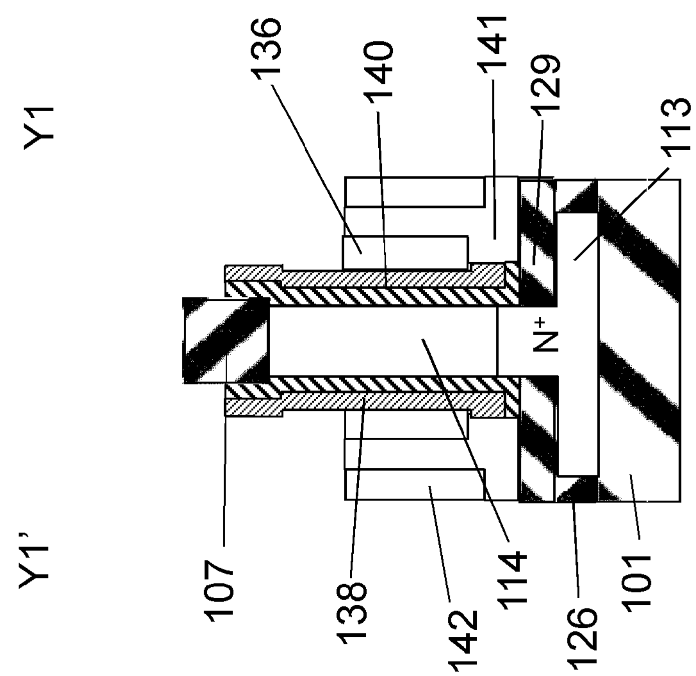
Figure 43D:
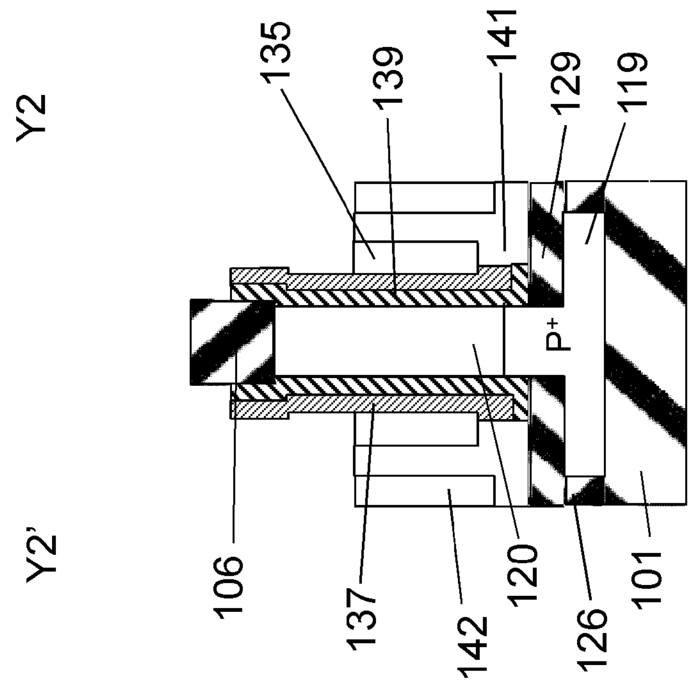
Figure 44A:
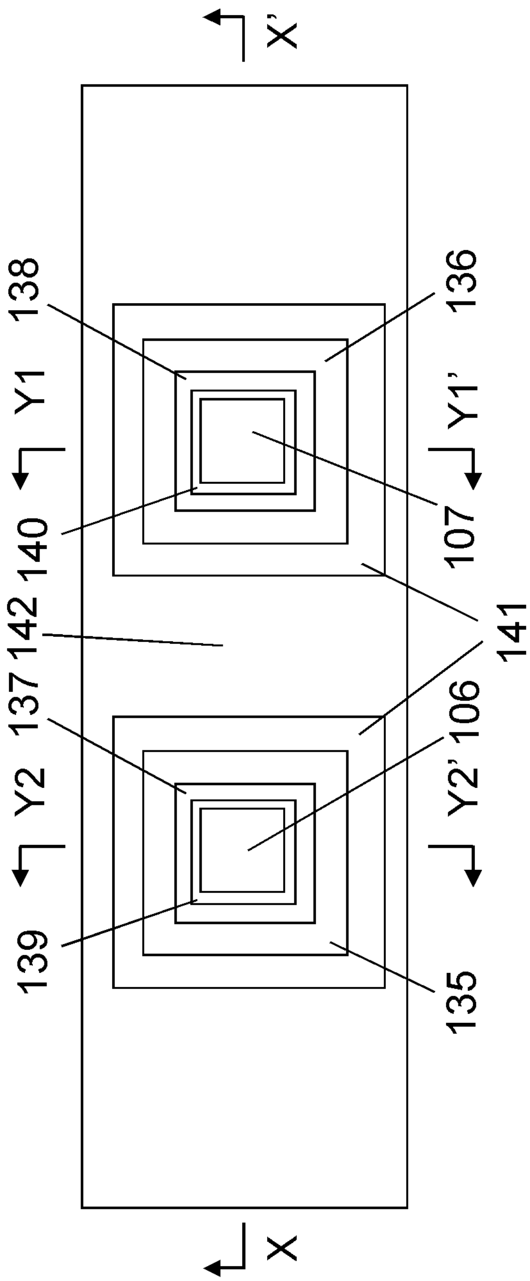
Figure 44B:
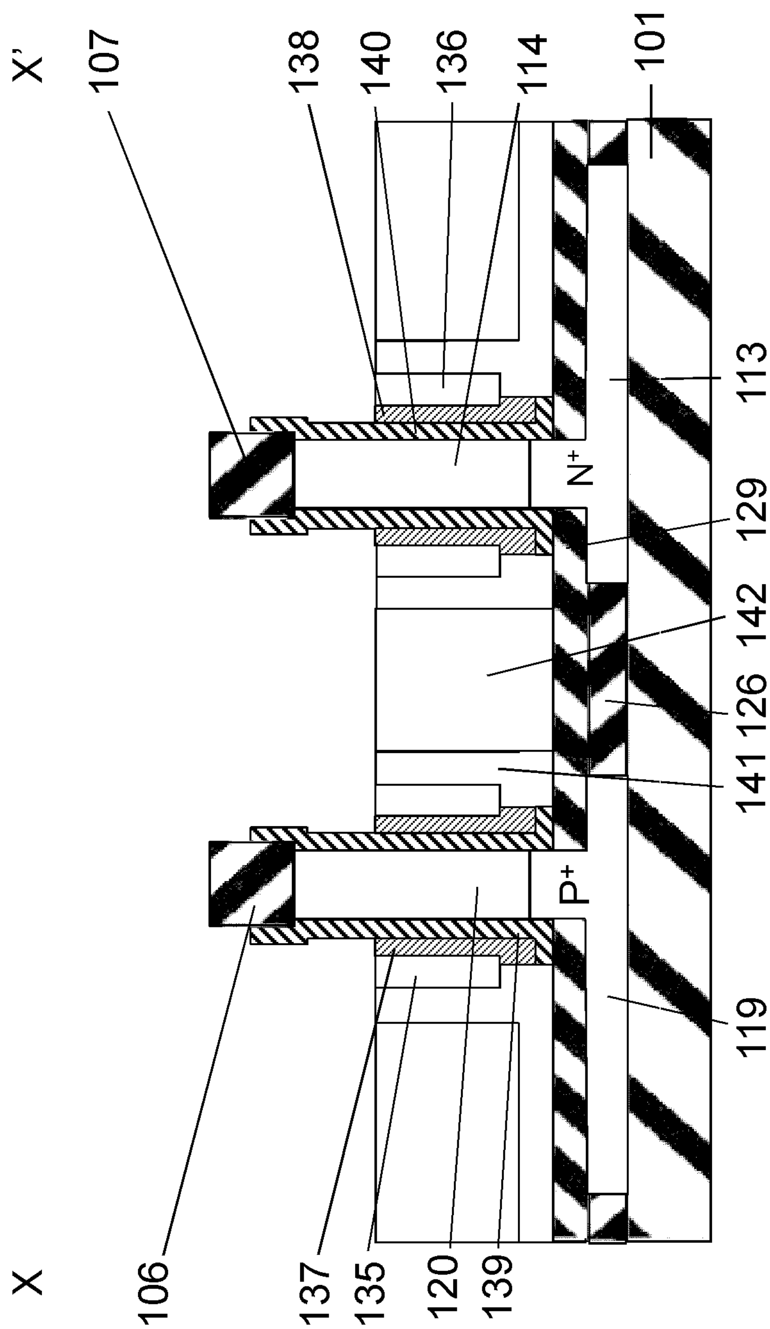
Figure 44C:
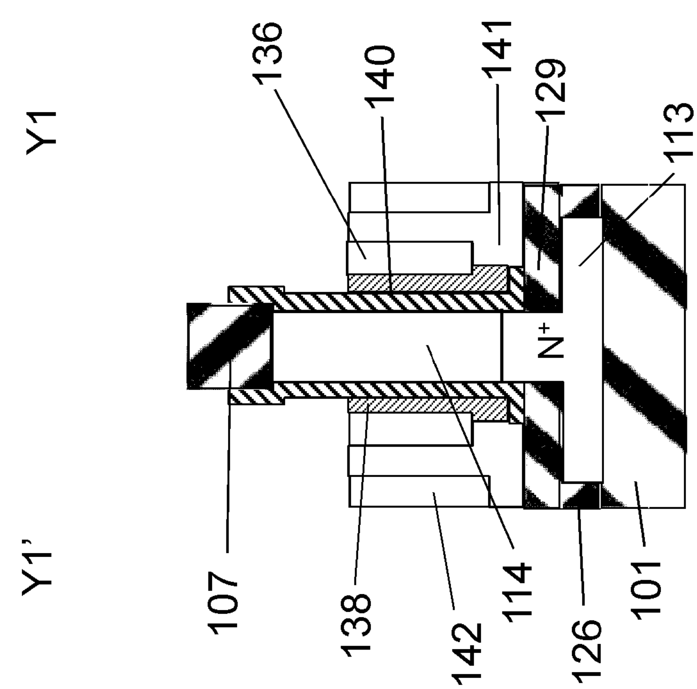
Figure 44D:
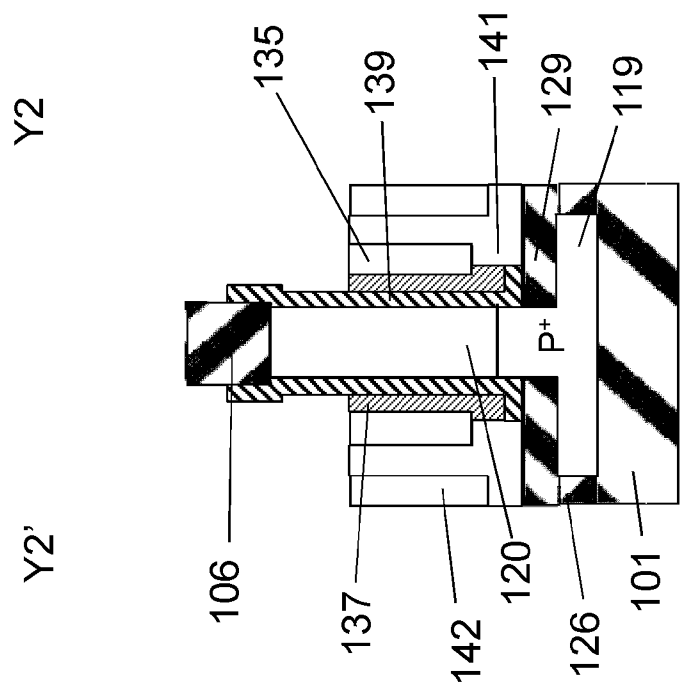
Figure 45A:
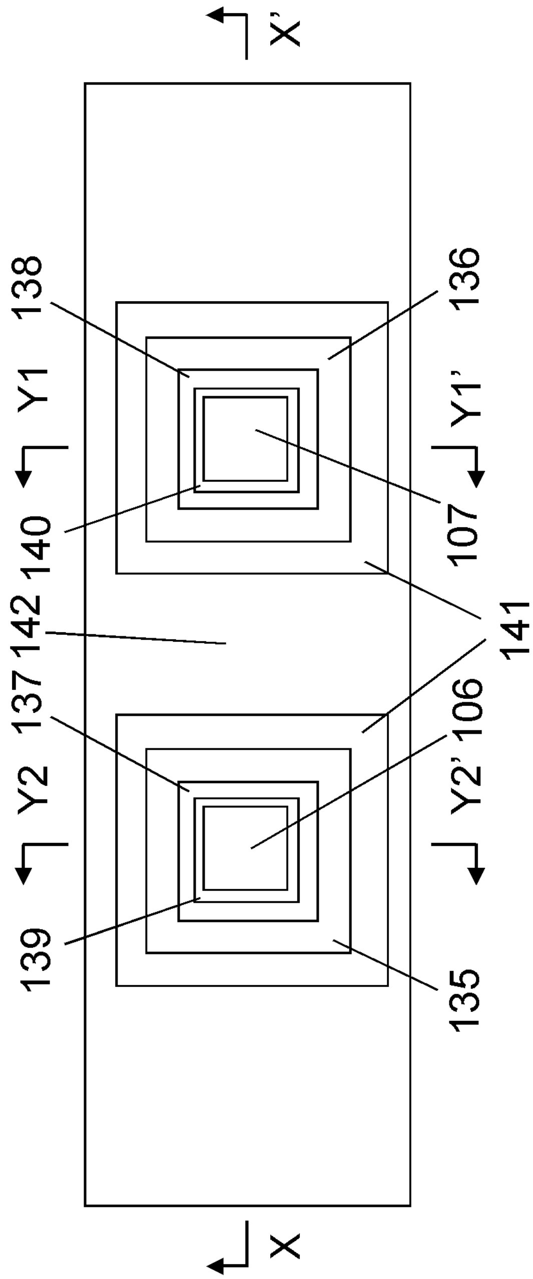
Figure 45B:
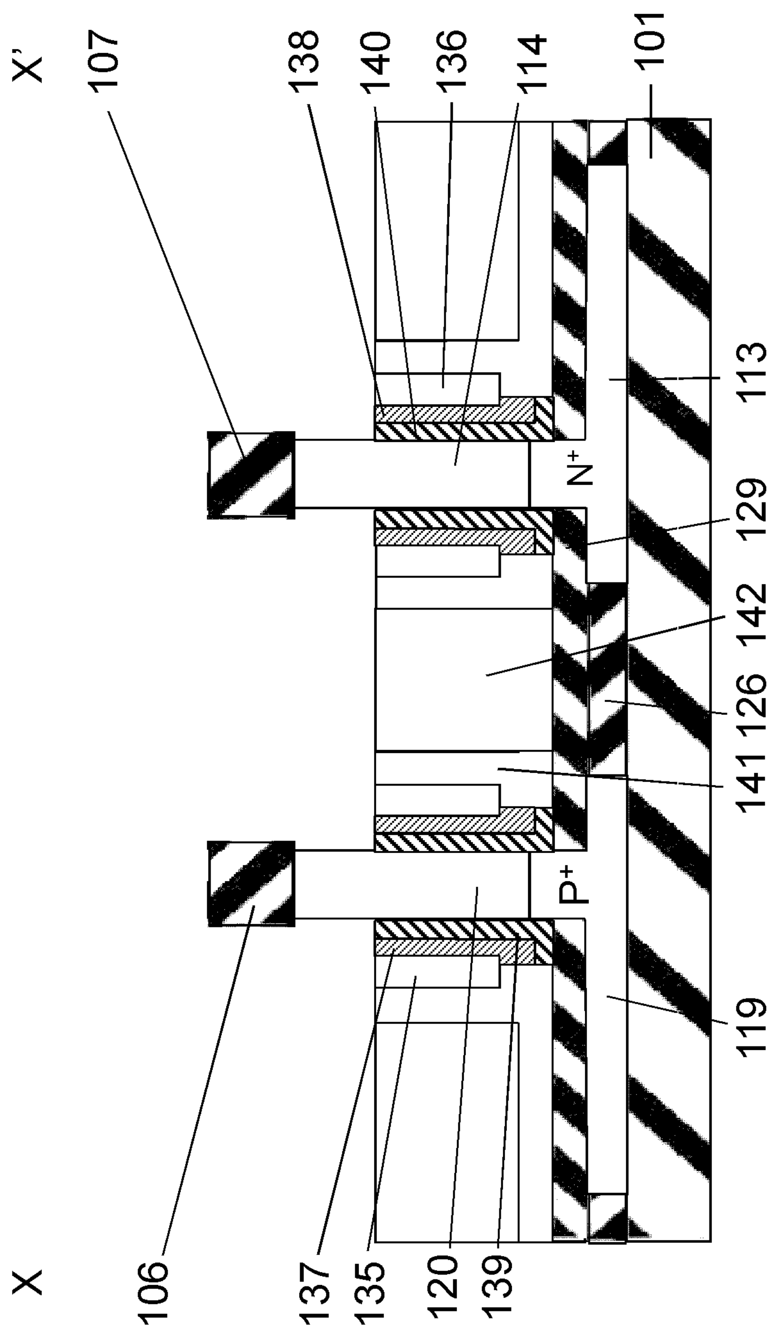
Figure 45C:
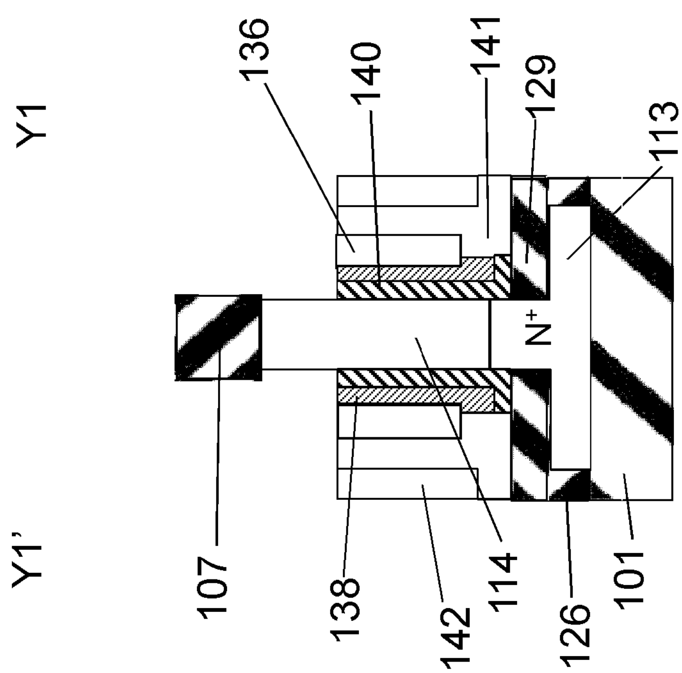
Figure 45D:
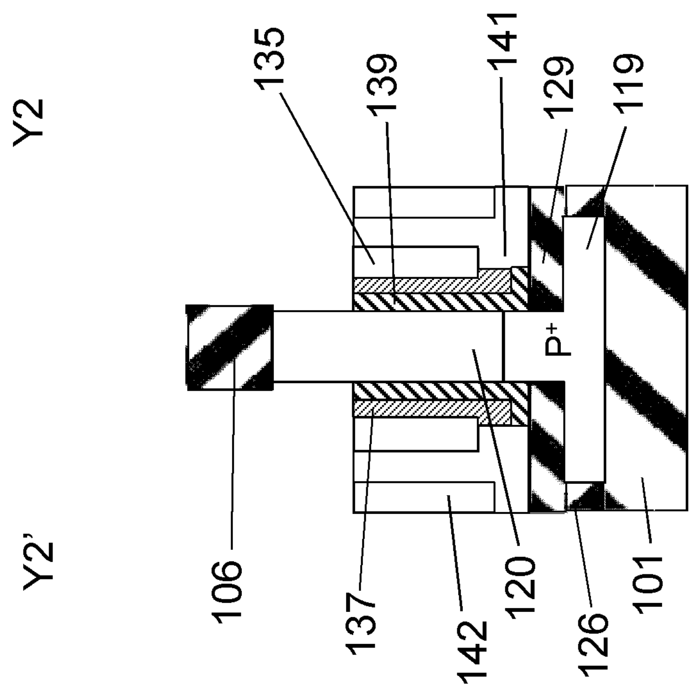
Figure 46A:
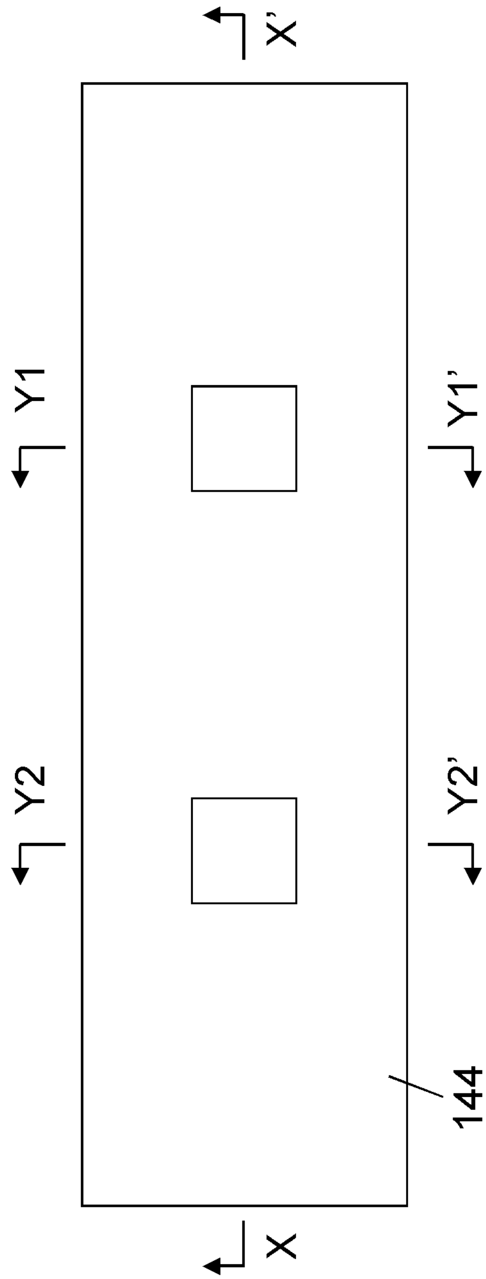
Figure 46B:
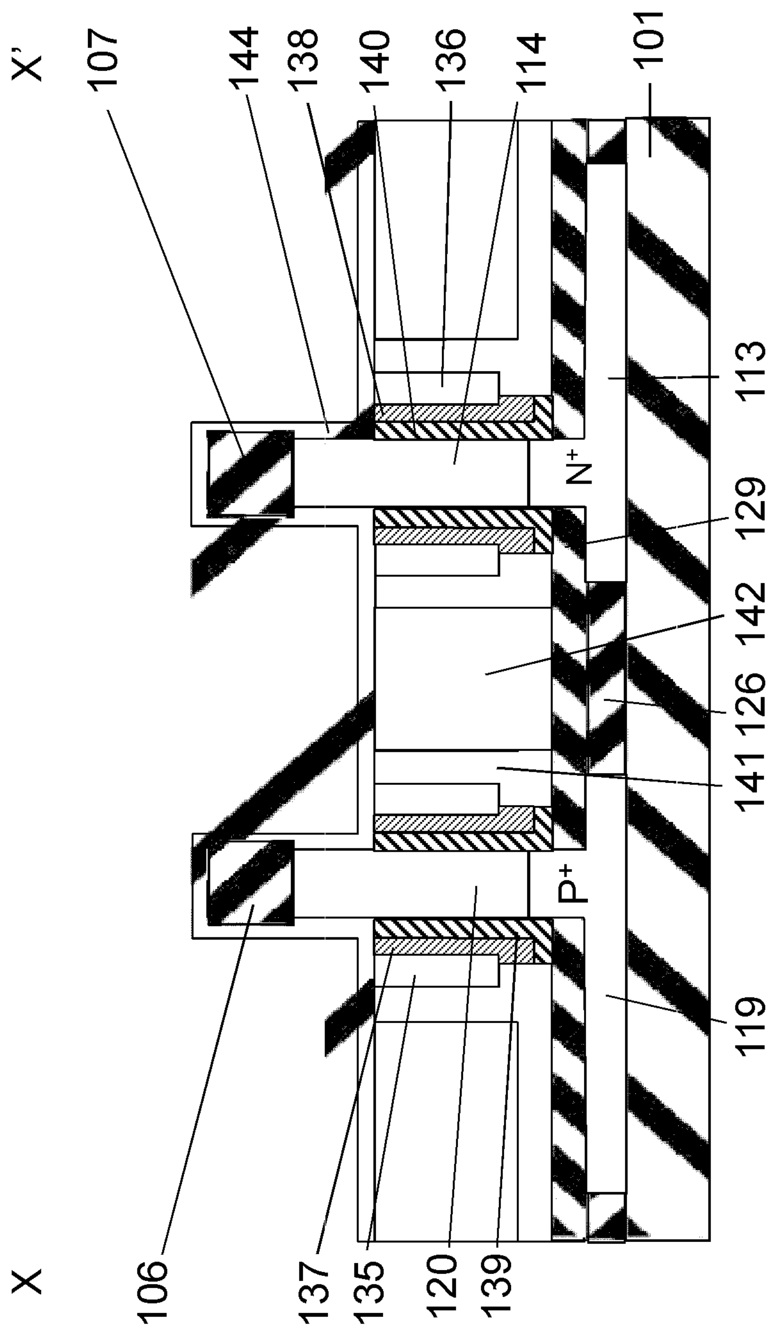
Figure 46C:
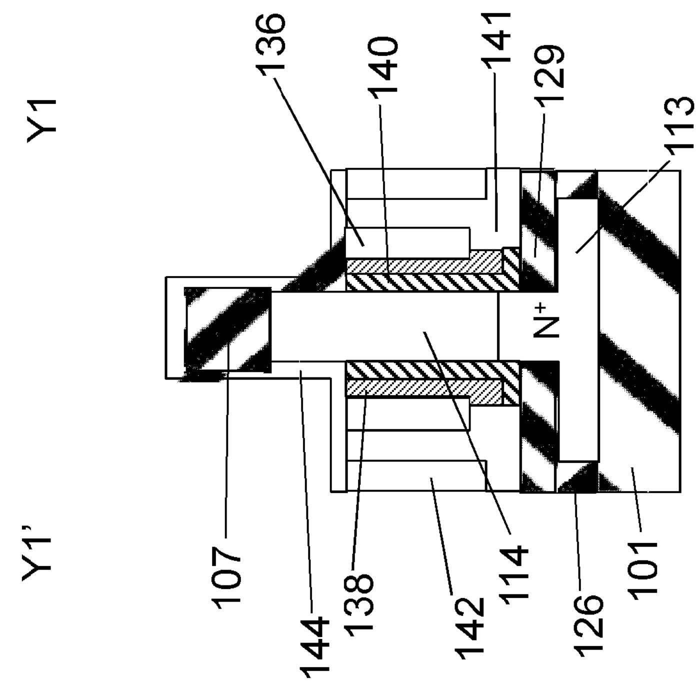
Figure 46D:
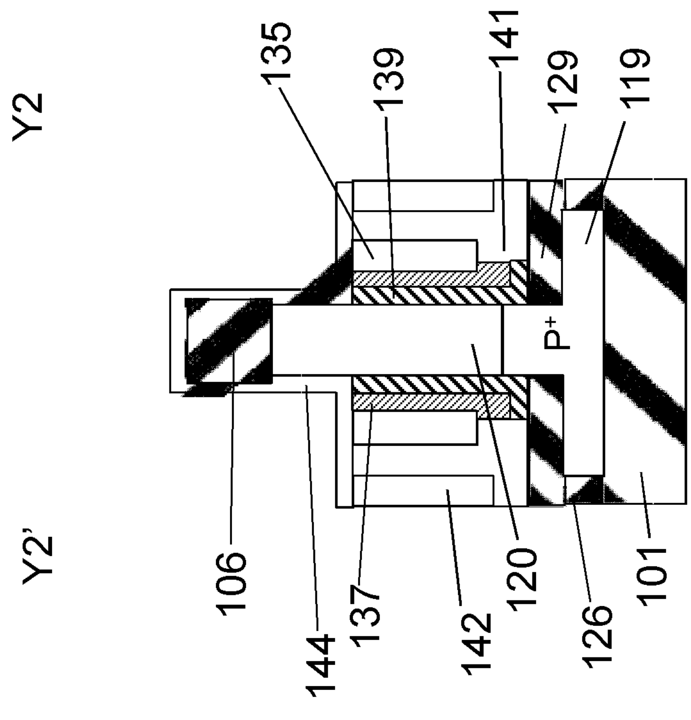
Figure 47A:
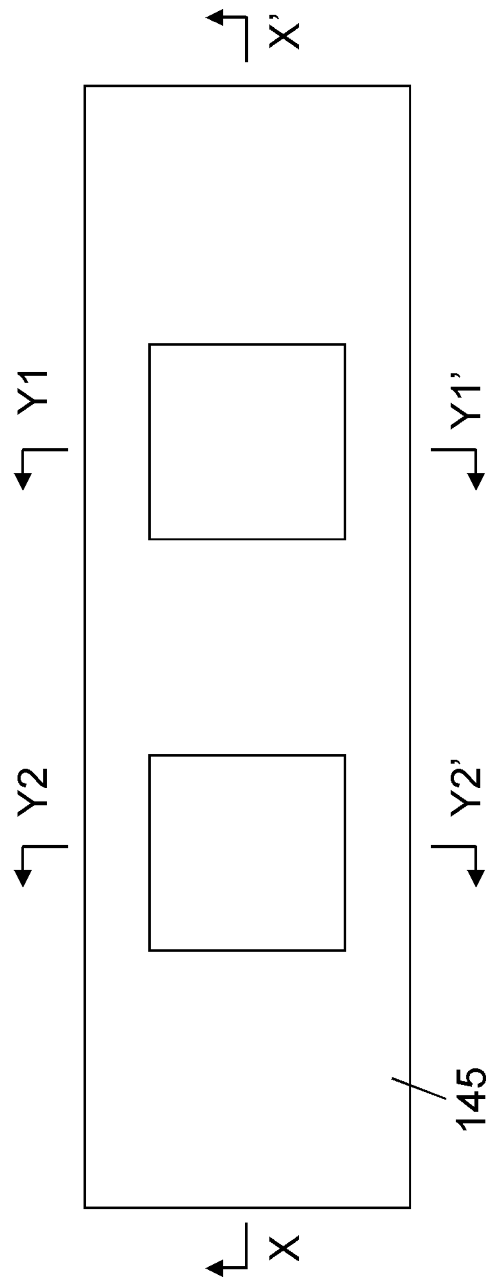
Figure 47B:
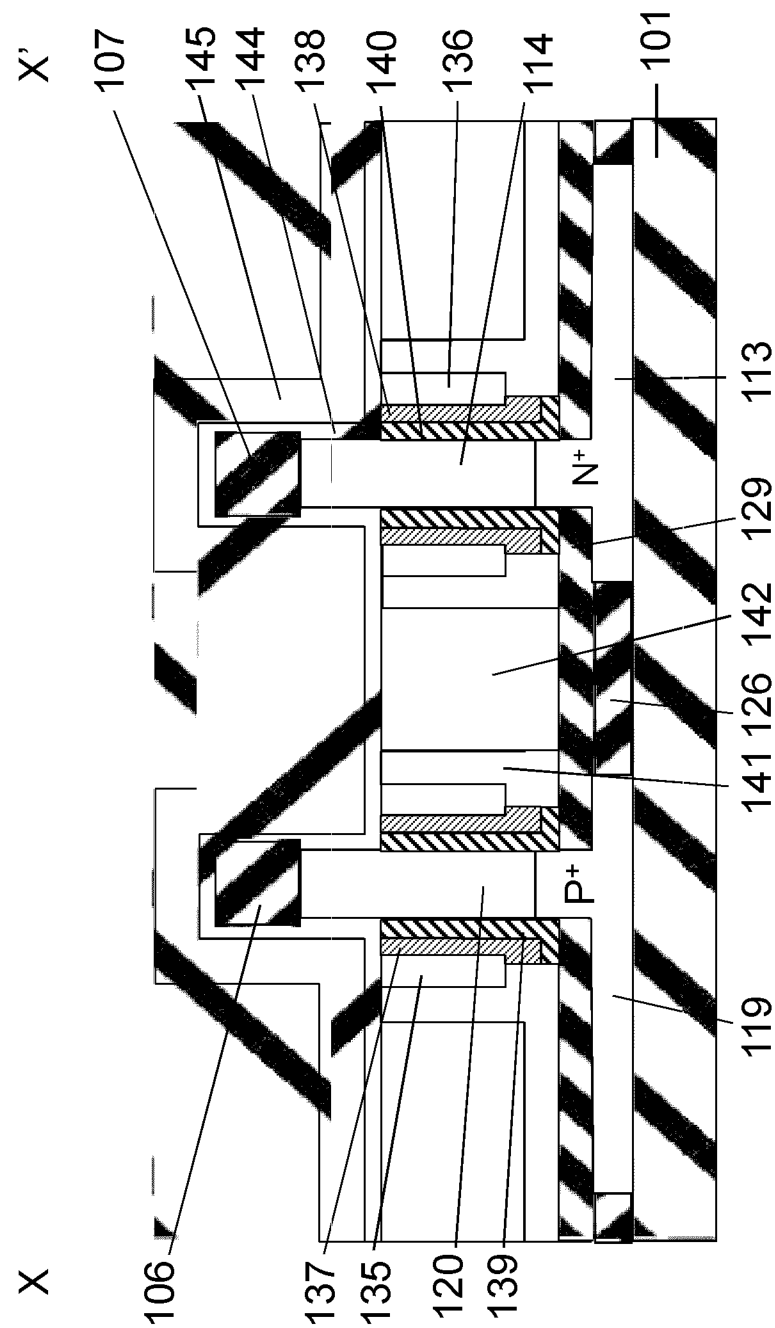
Figure 47C:
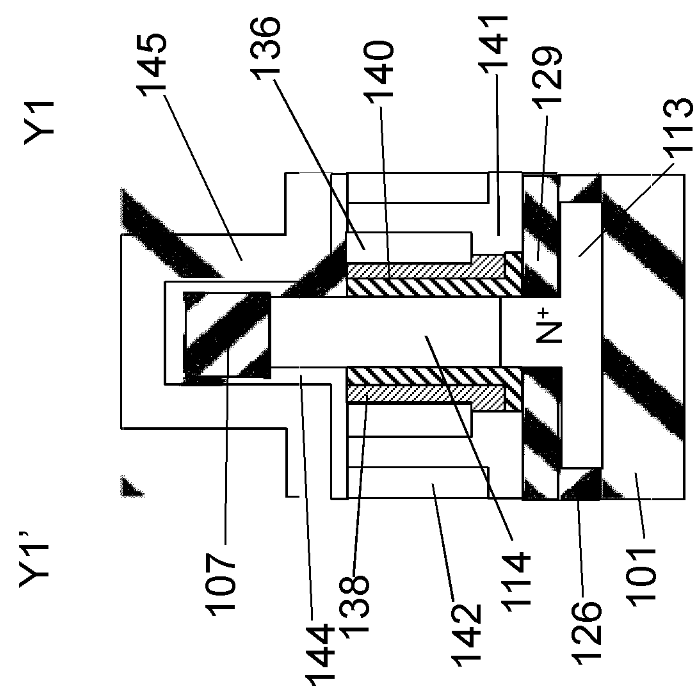
Figure 47D:
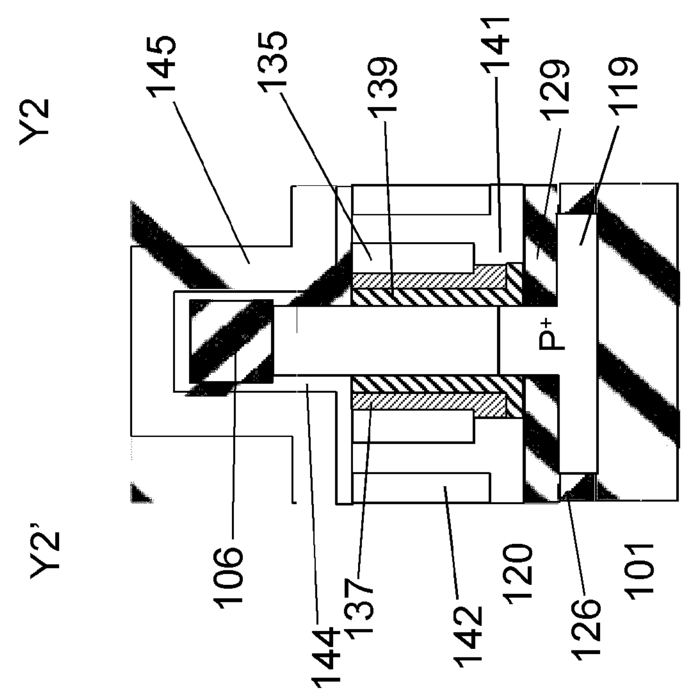
Figure 48A:
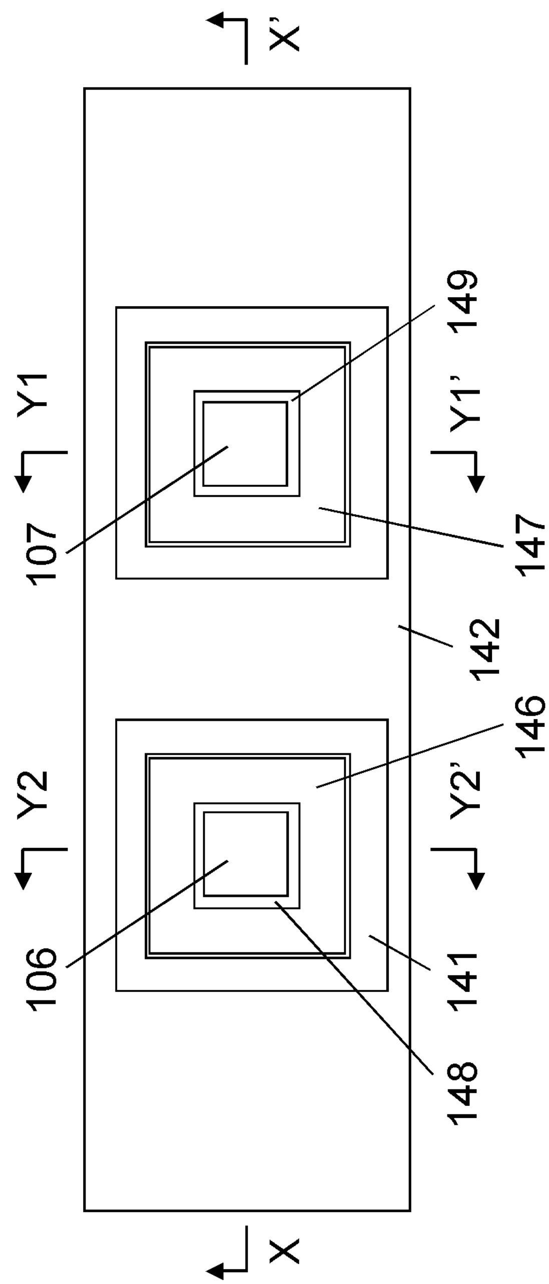
Figure 48B:
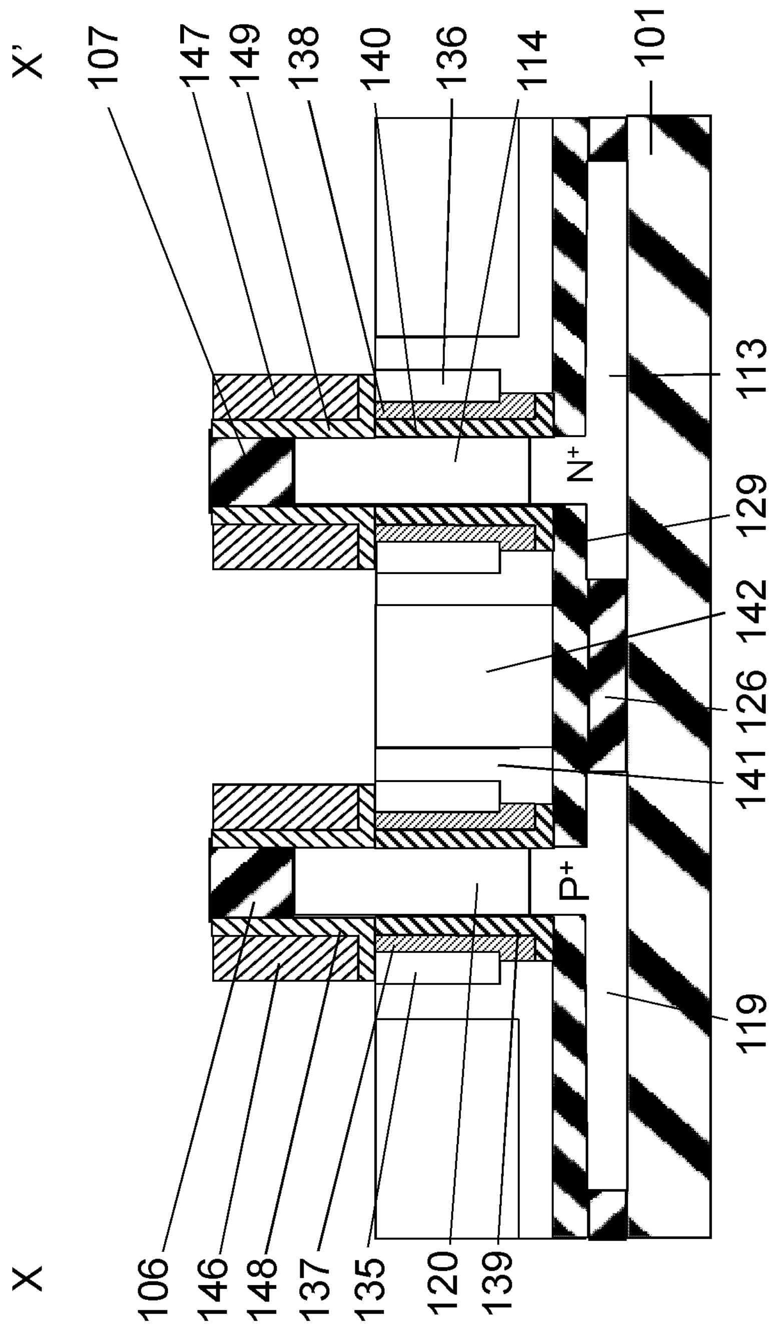
Figure 48C:
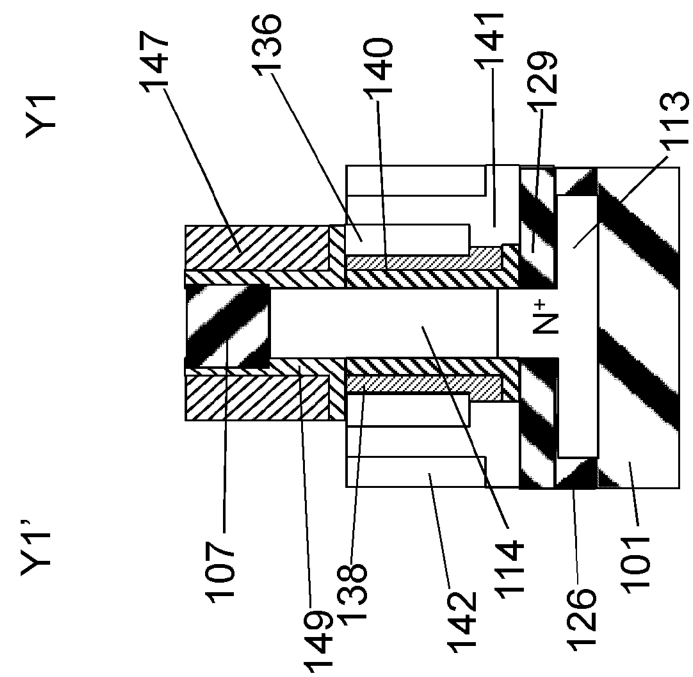
Figure 48D:
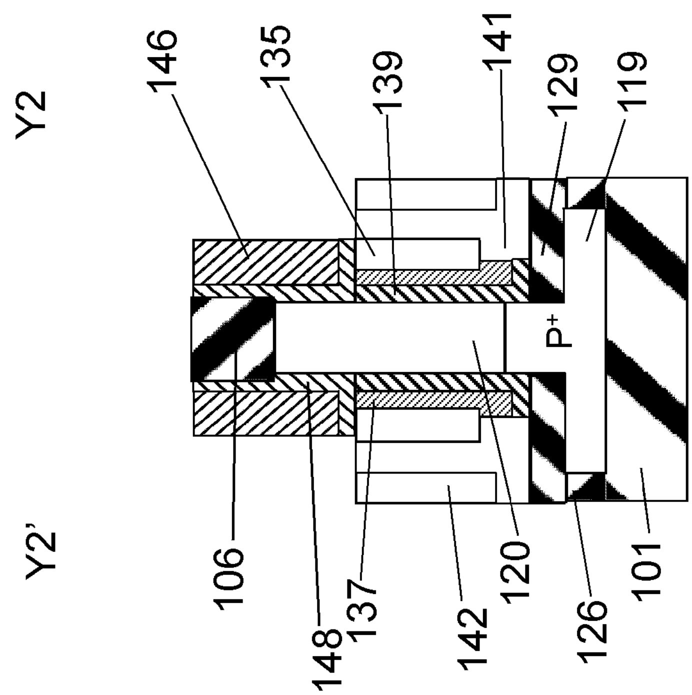
Figure 49A:
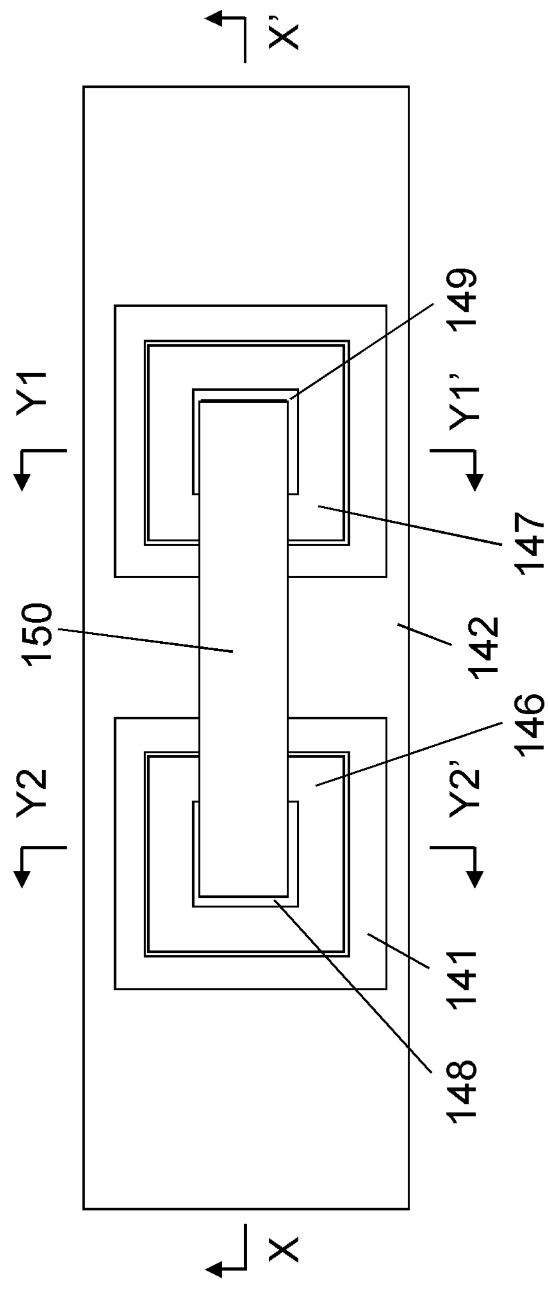
Figure 49B:
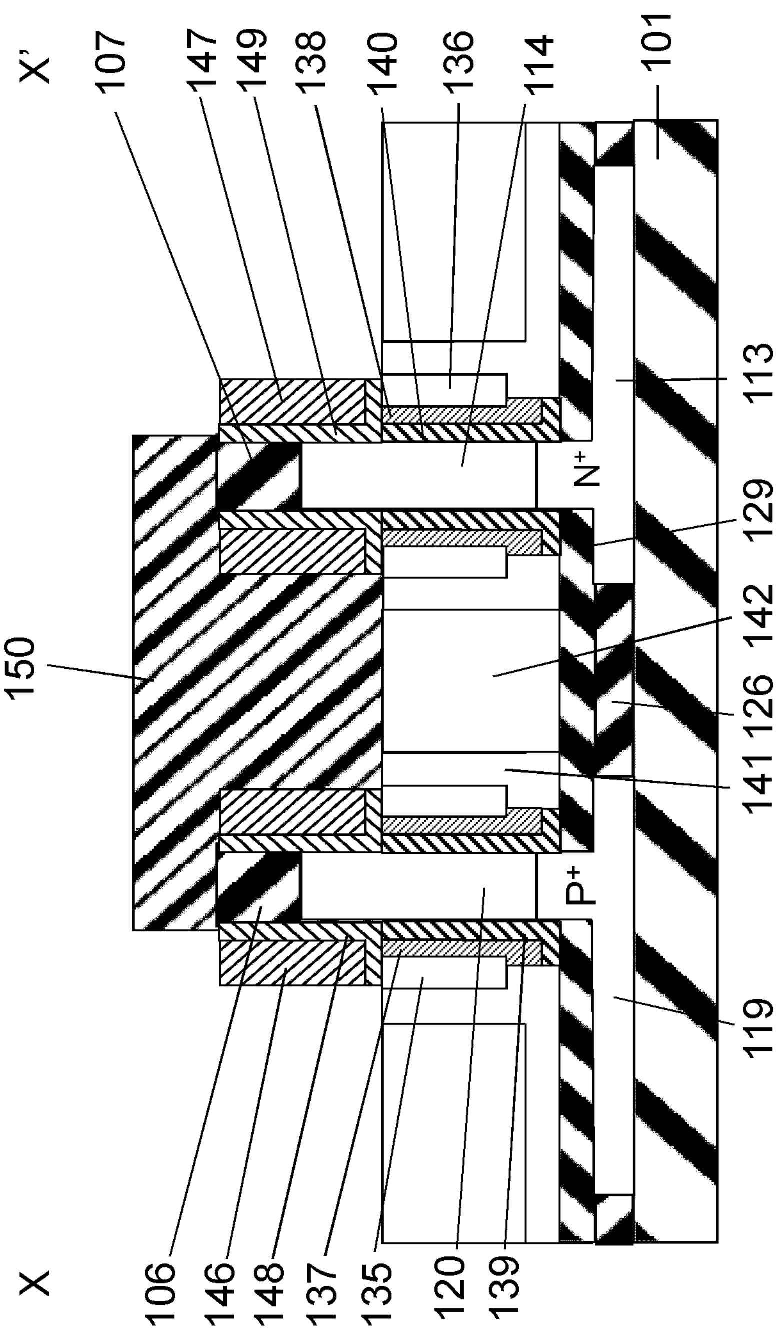
Figure 49C:
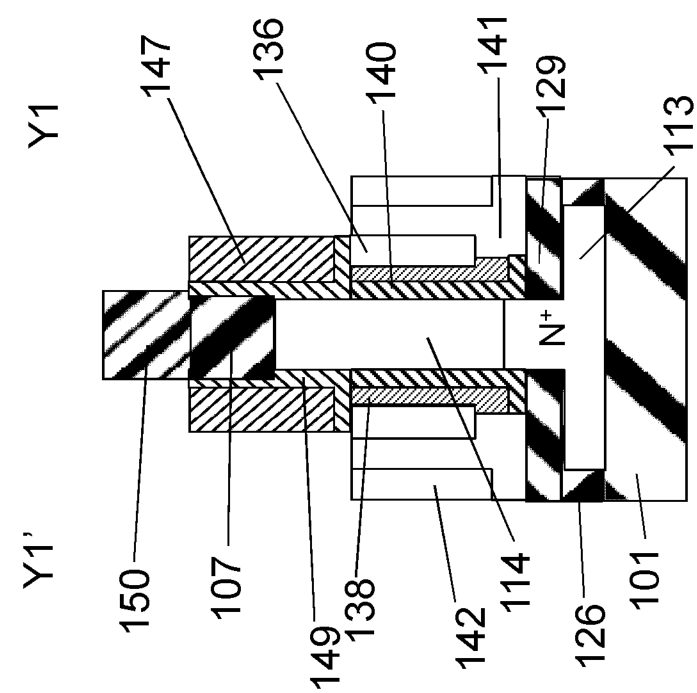
Figure 49D:
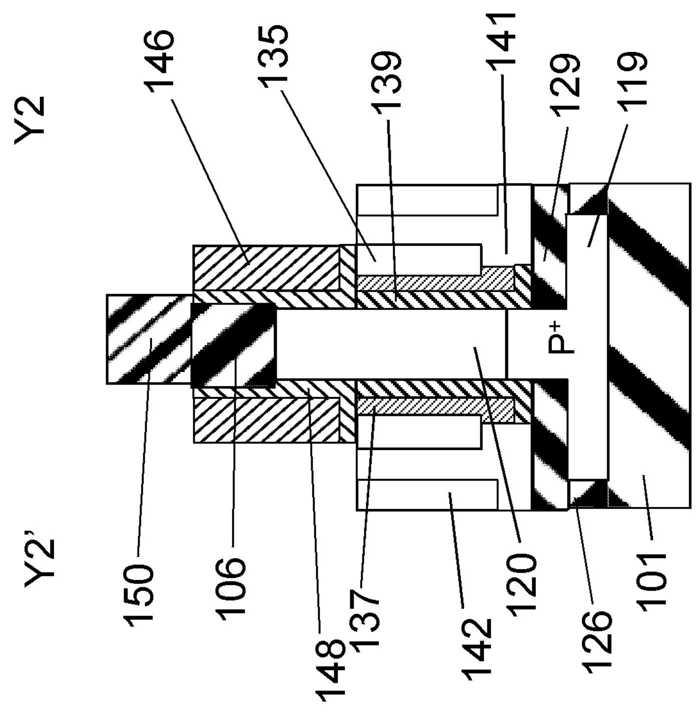
Figure 50A:
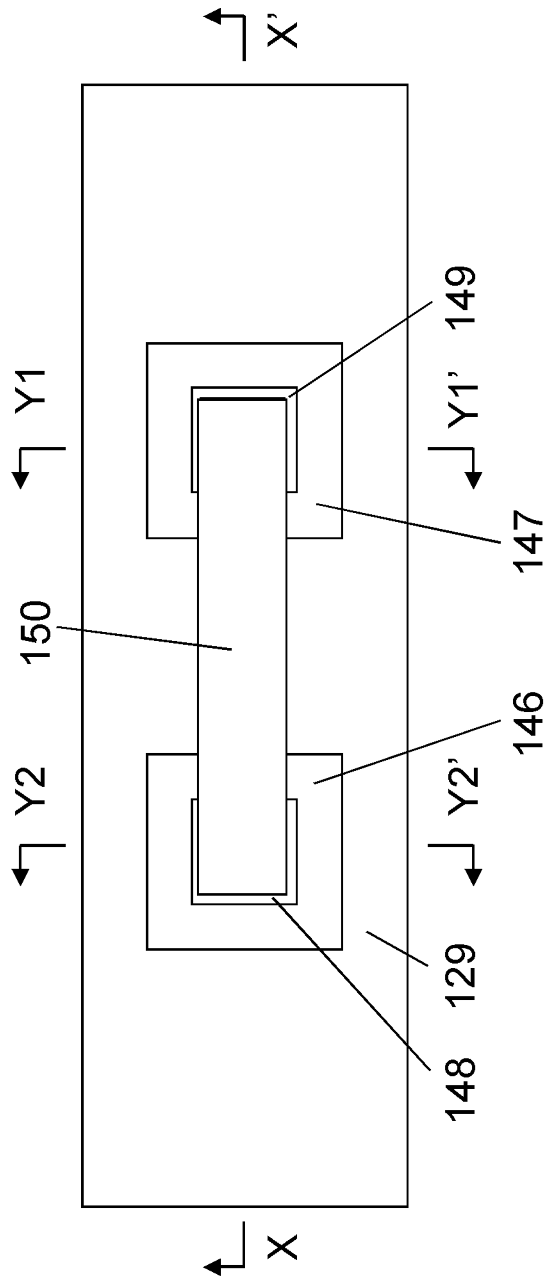
Figure 50B:
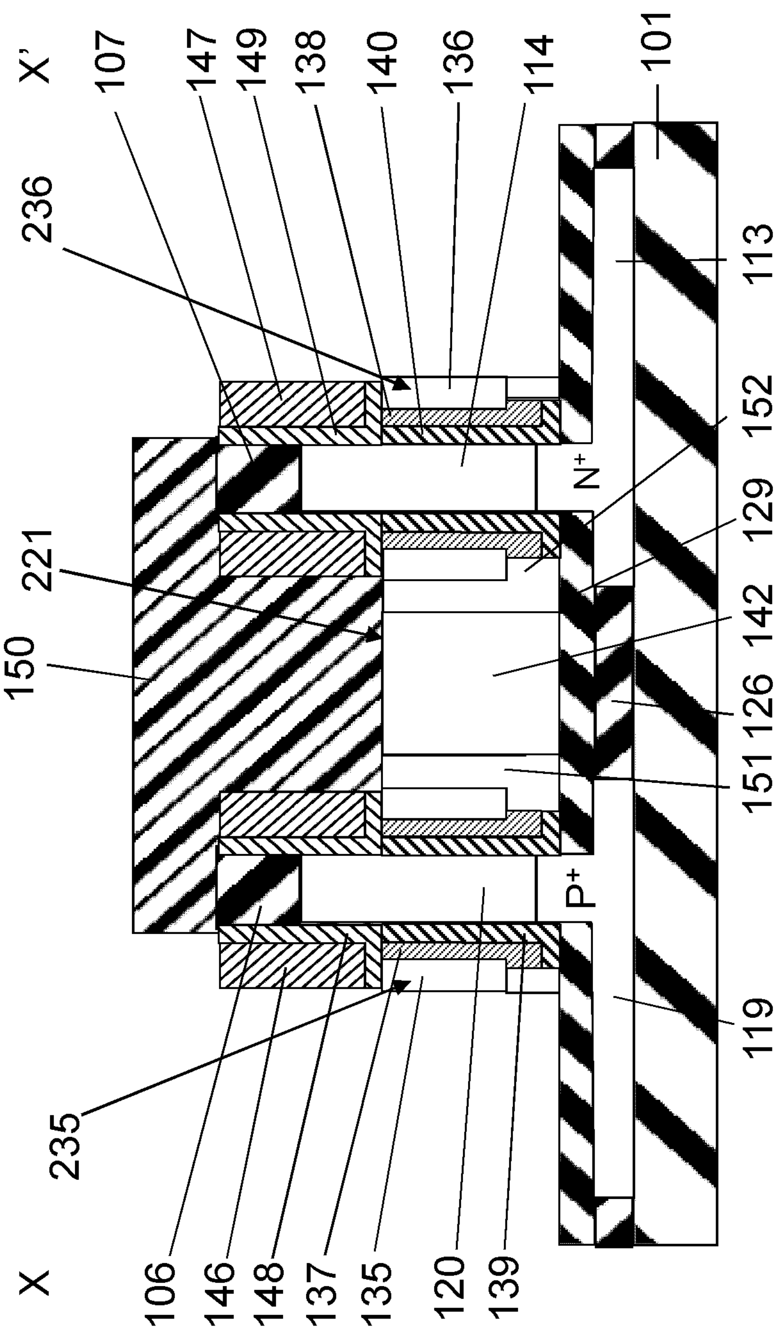
Figure 50C:
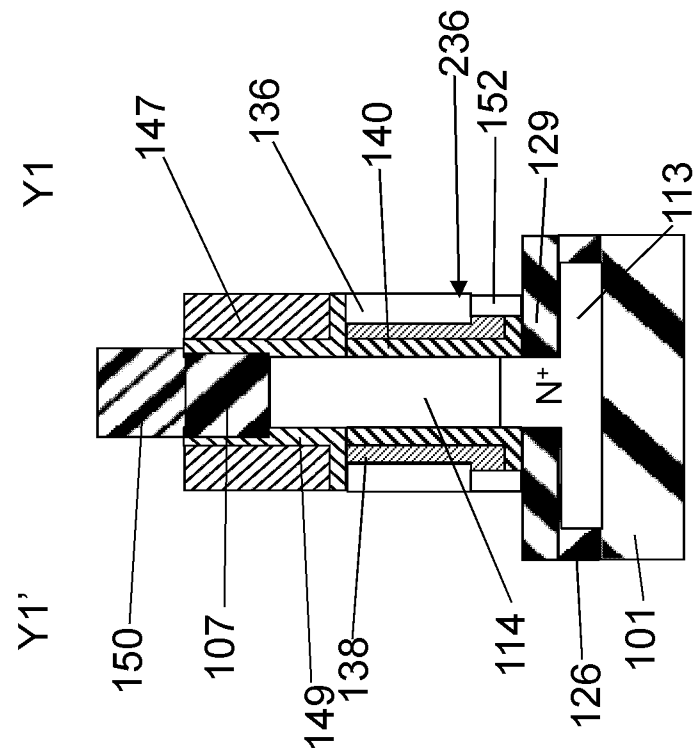
Figure 50D:
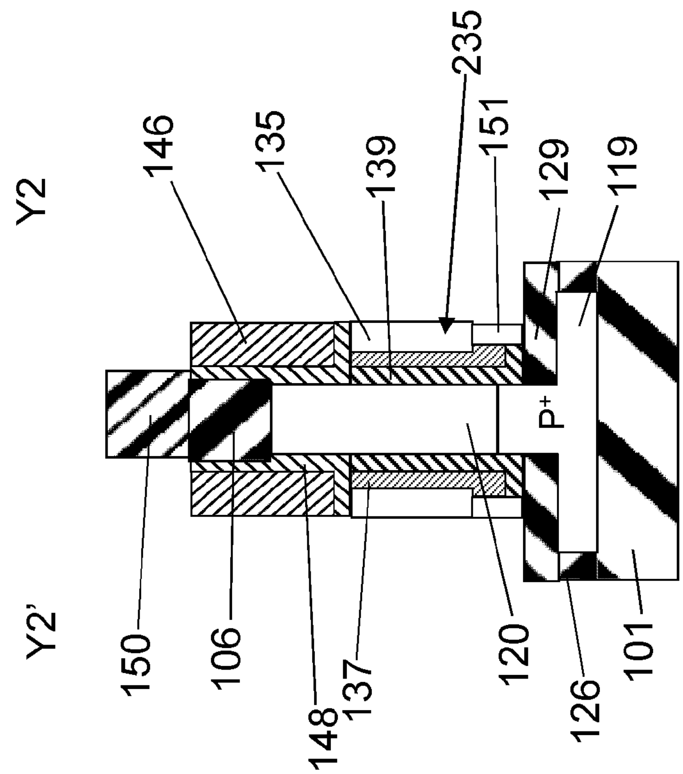
Figure 51A:
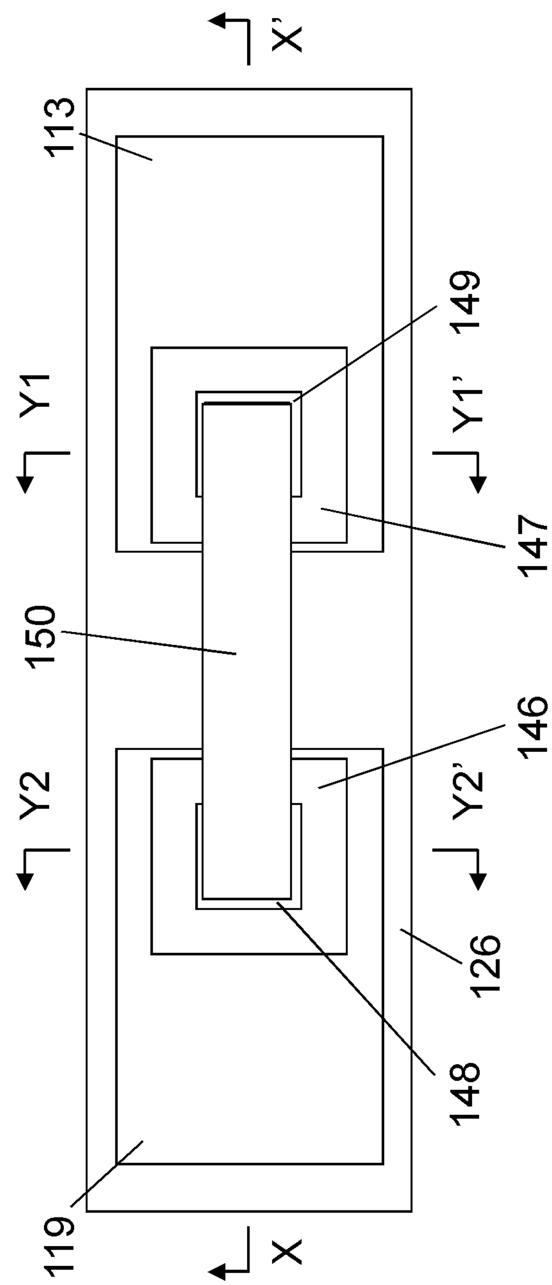
Figure 51B:
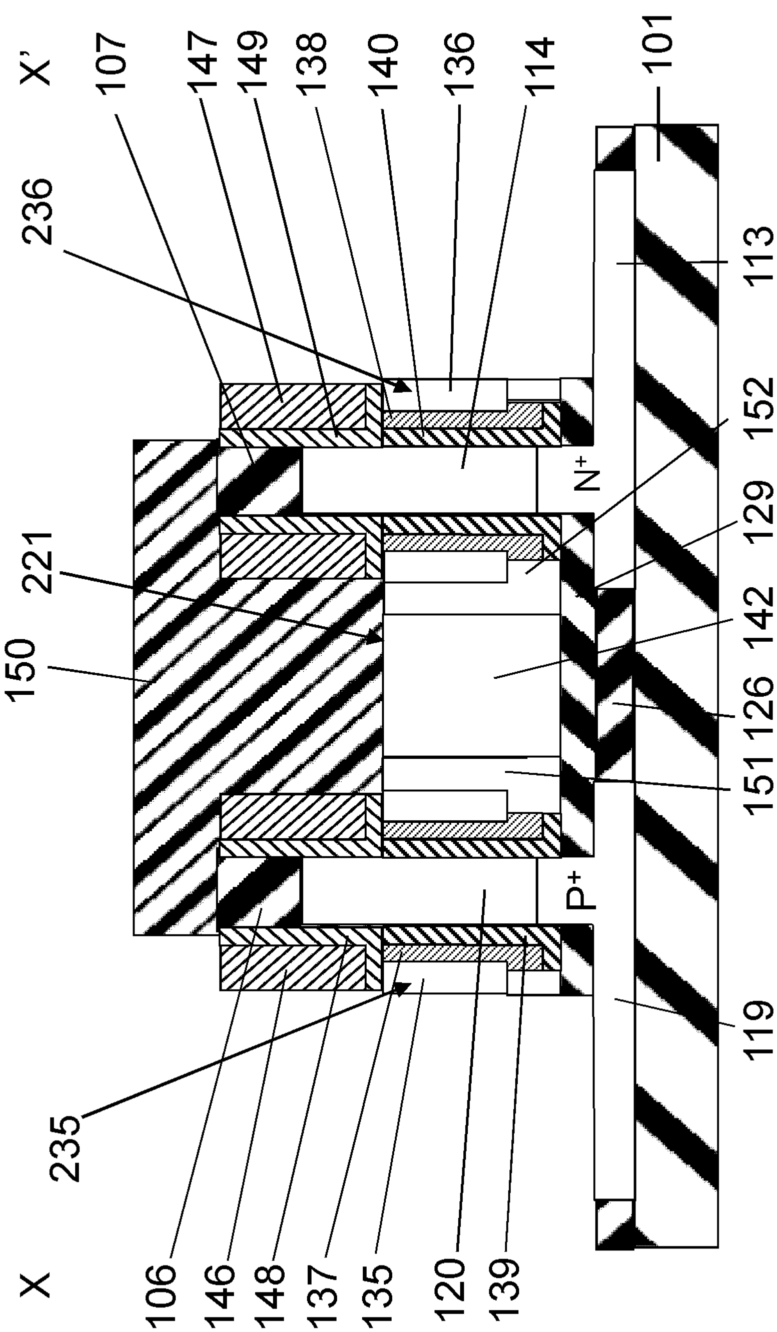
Figure 51C:
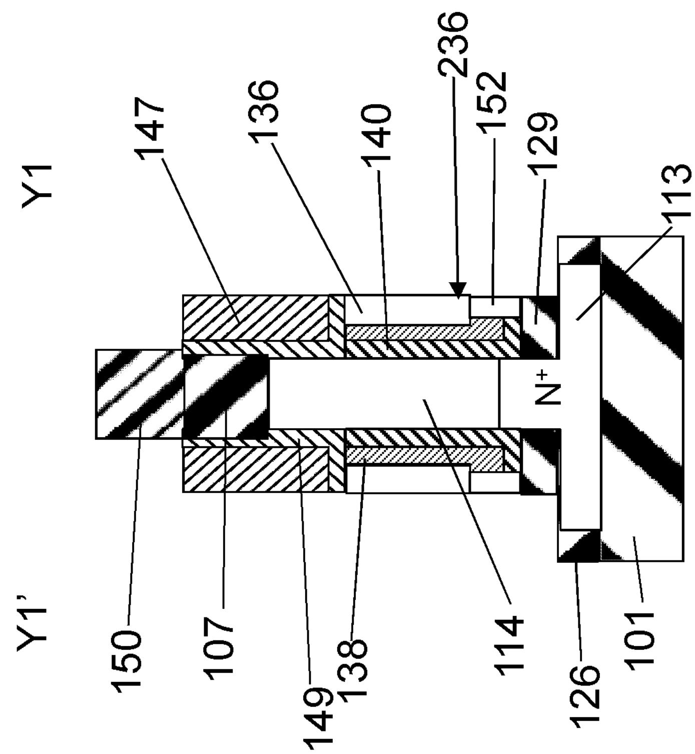
Figure 51D:
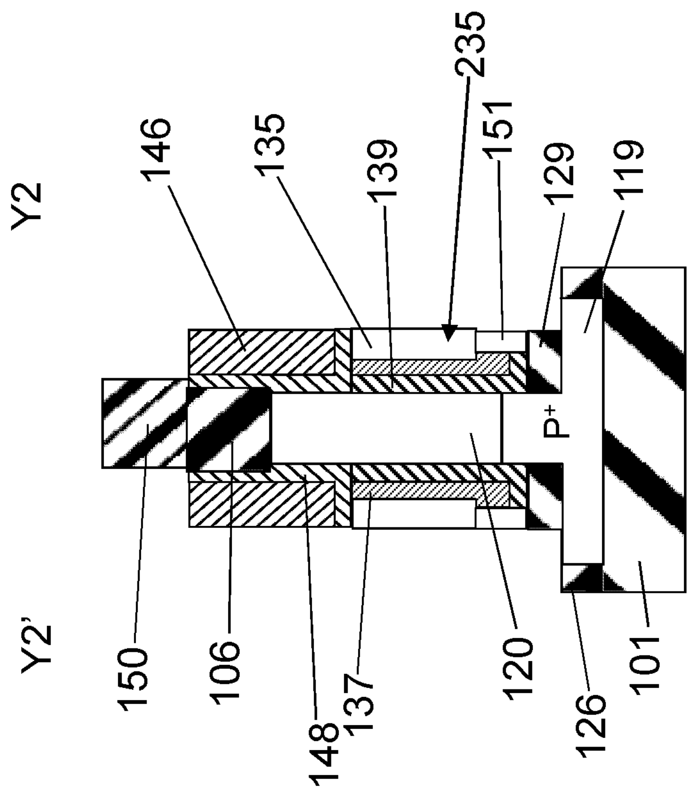
Figure 52A:
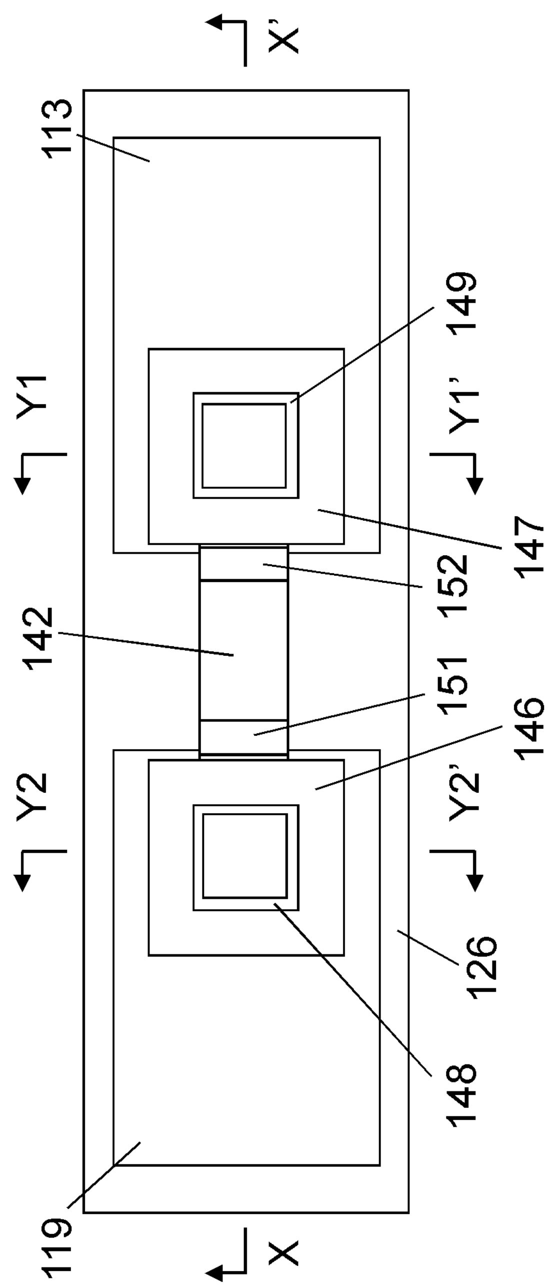
Figure 52B:
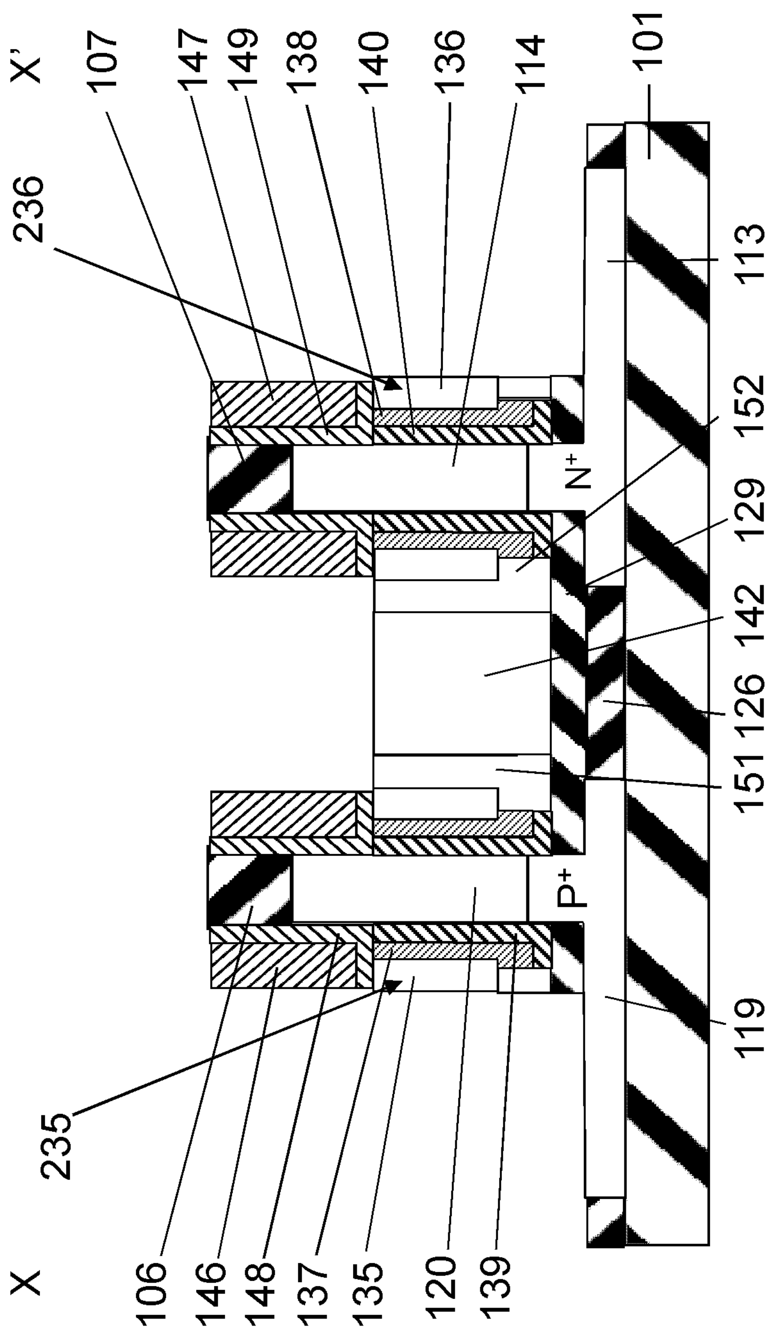
Figure 52C:
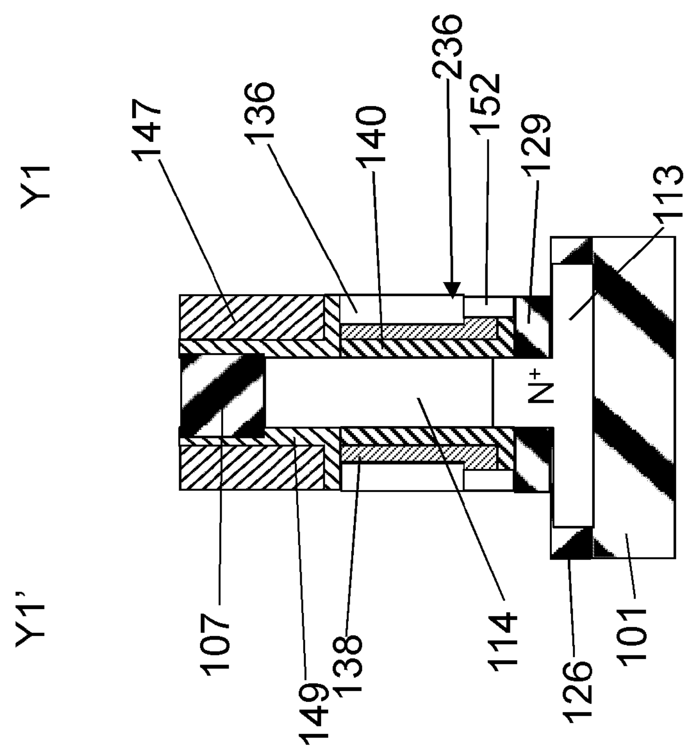
Figure 52D:
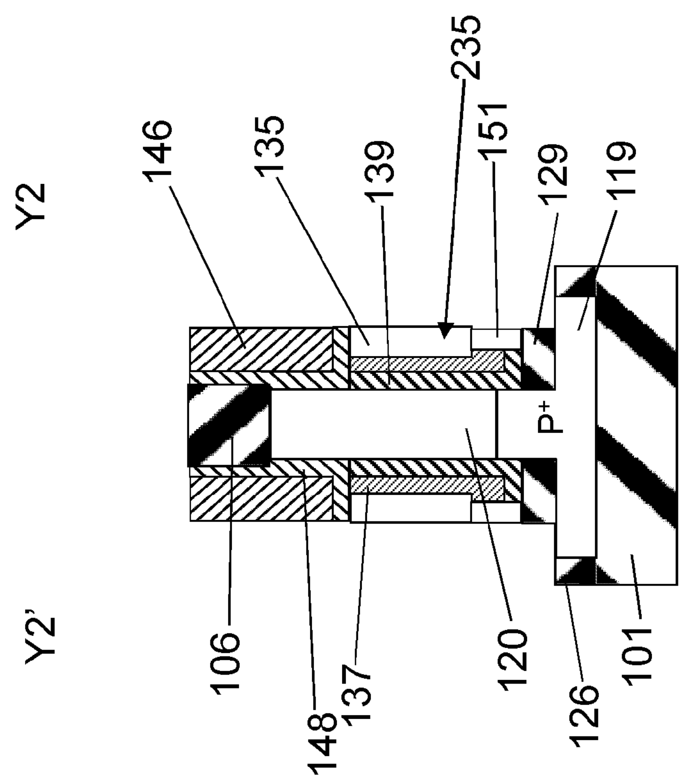
Figure 53A:
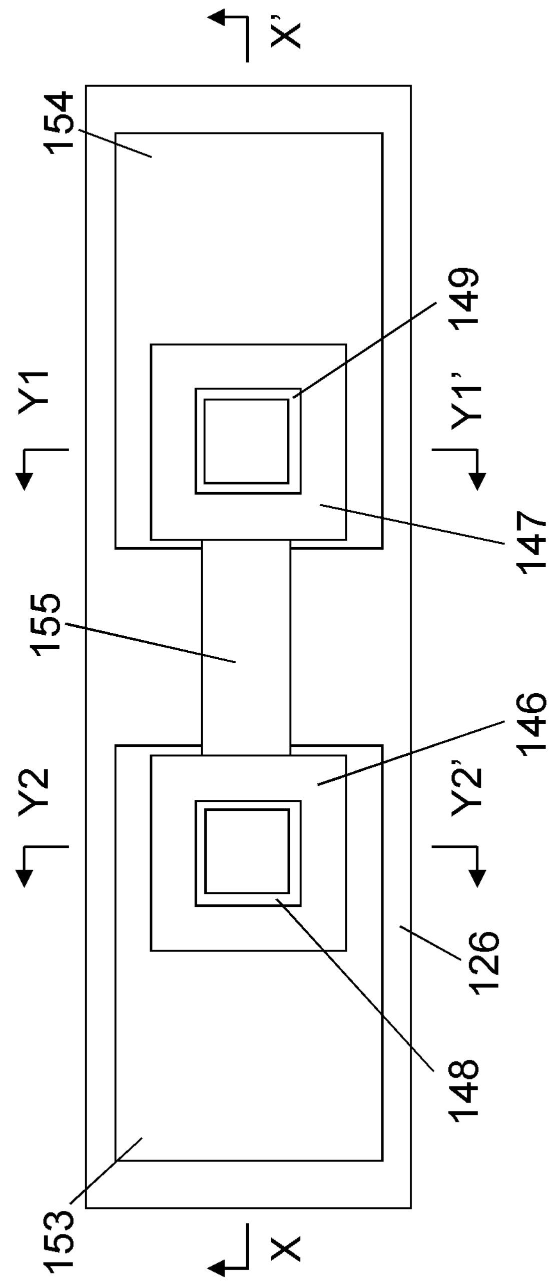
Figure 53B:
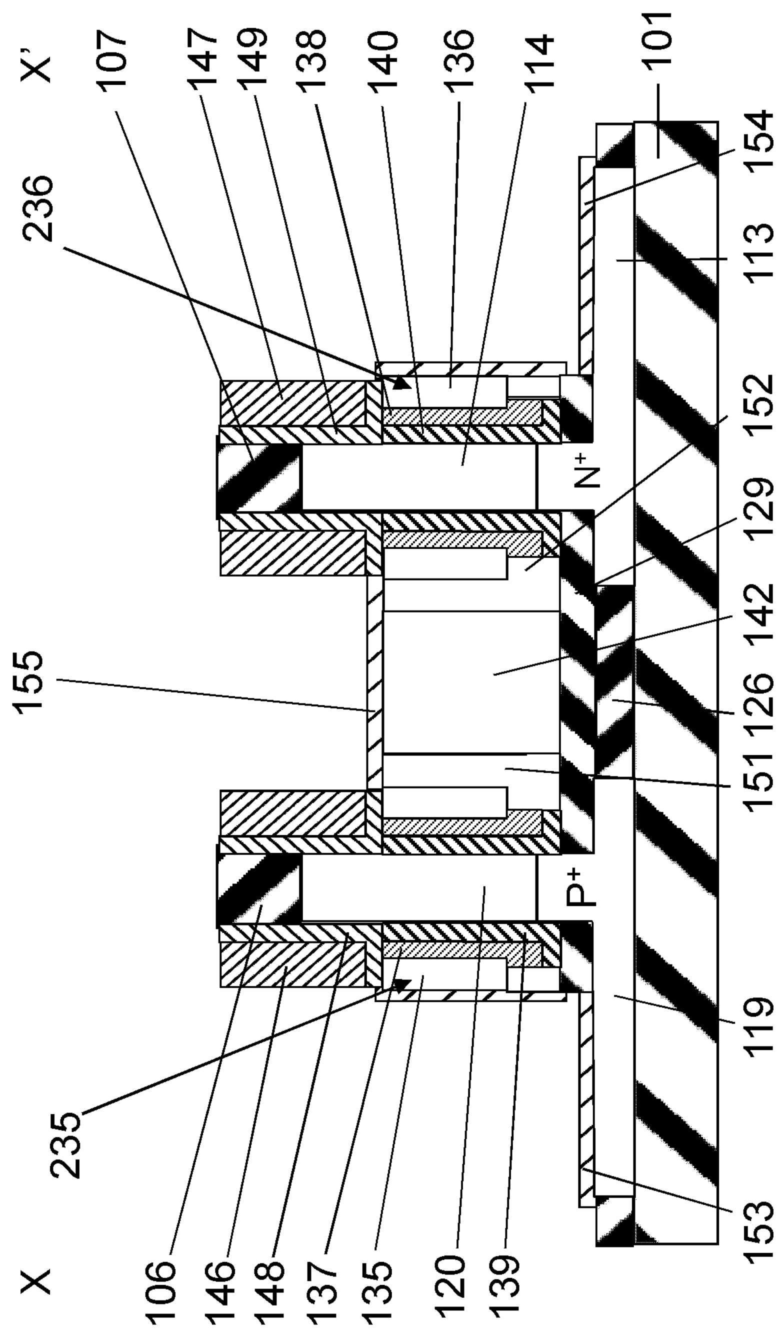
Figure 53C:
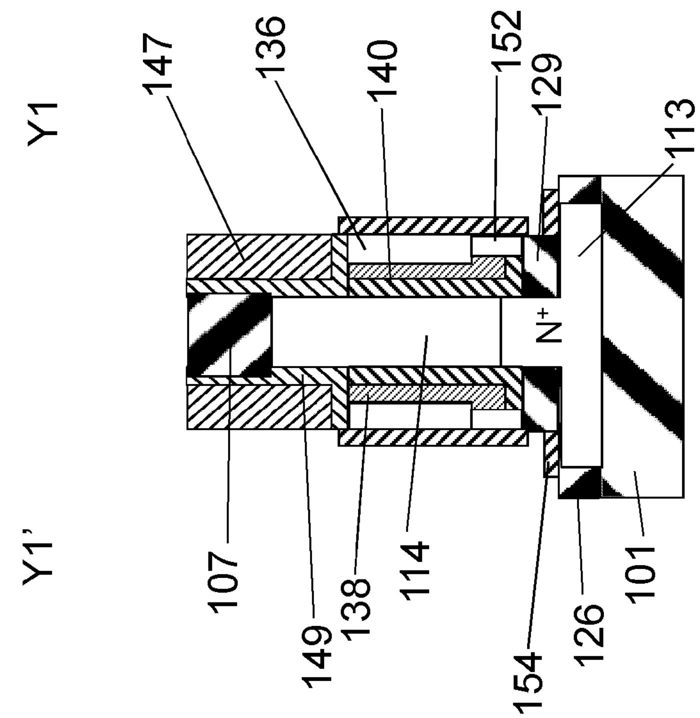
Figure 53D:
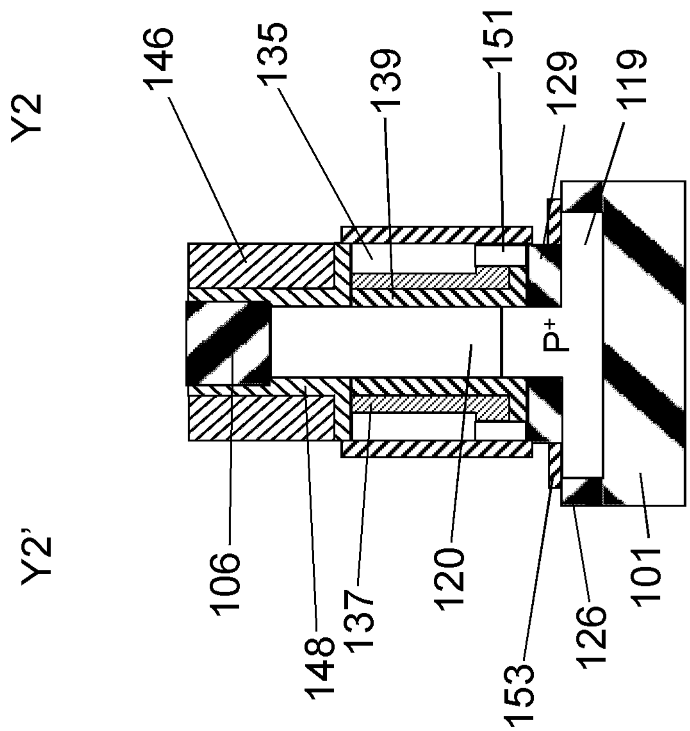
Figure 54A:
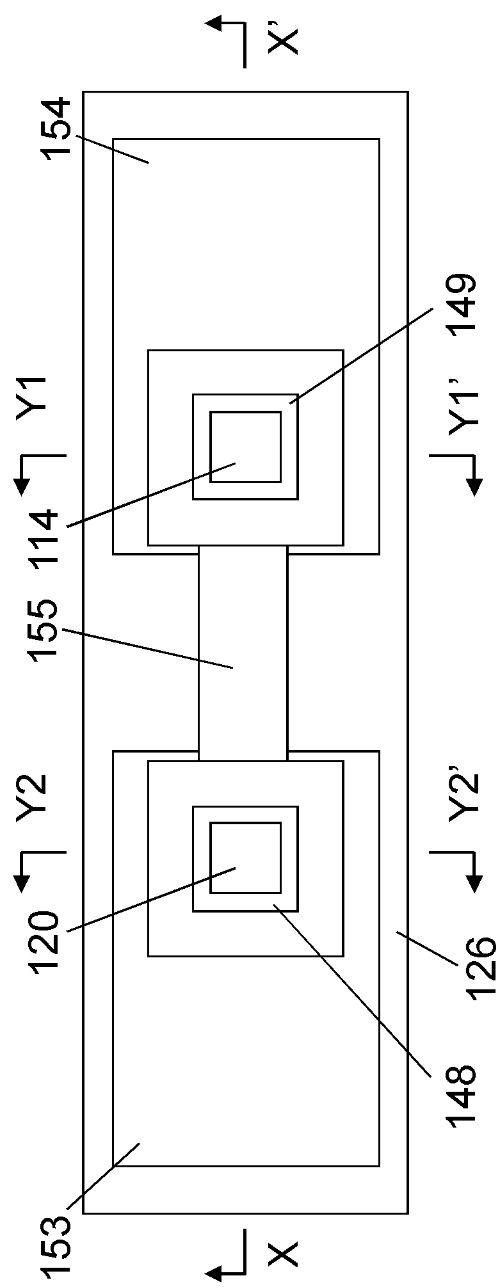
Figure 54B:
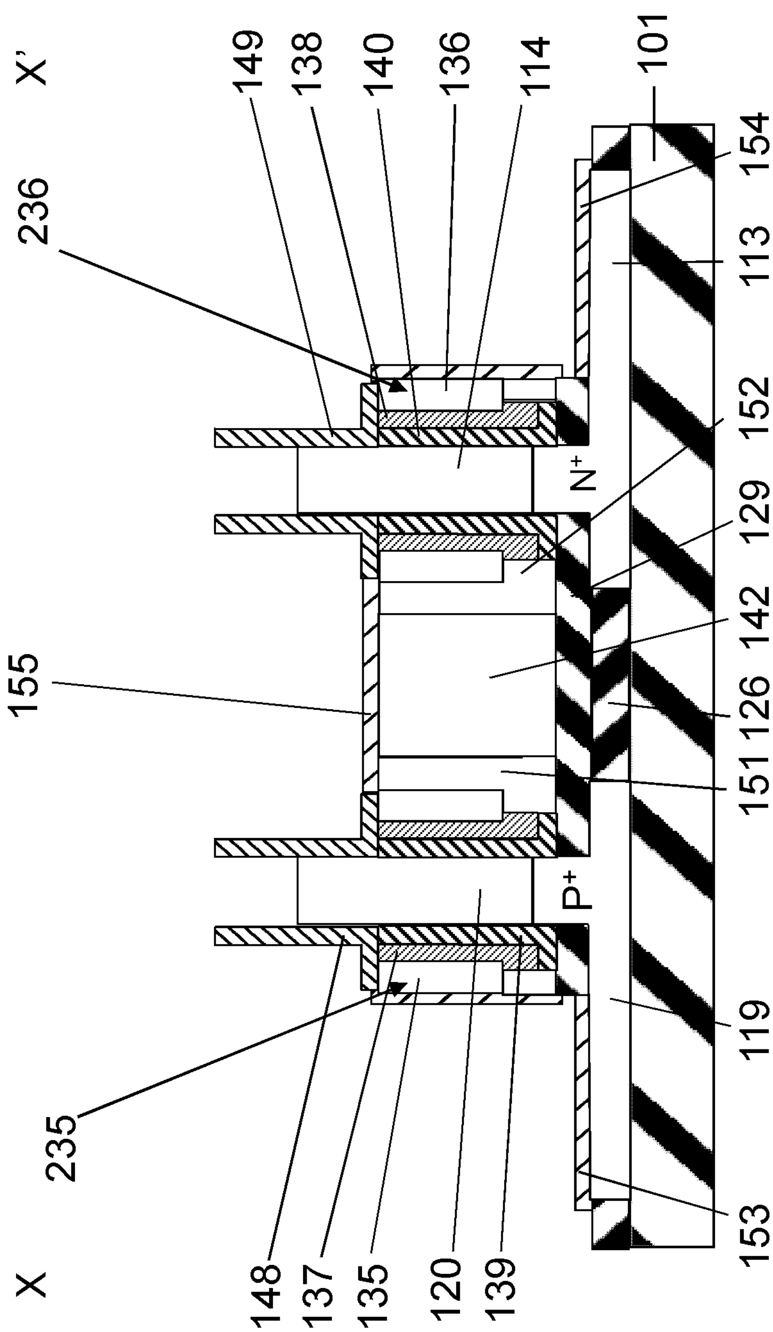
Figure 54C:
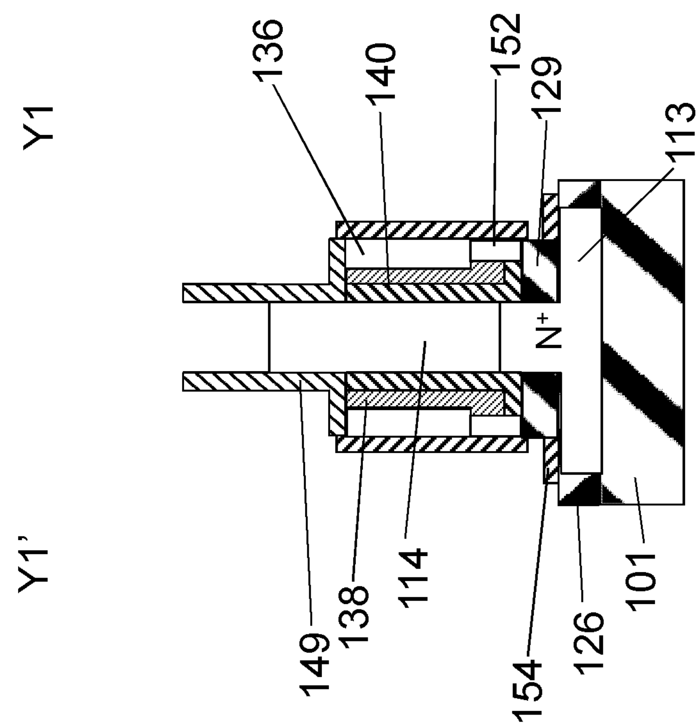
Figure 54D:
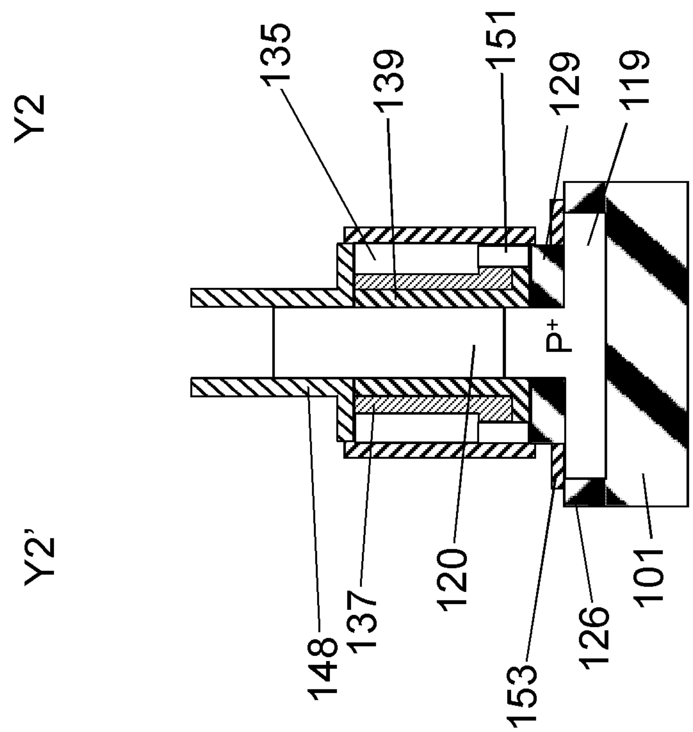
Figure 55A:
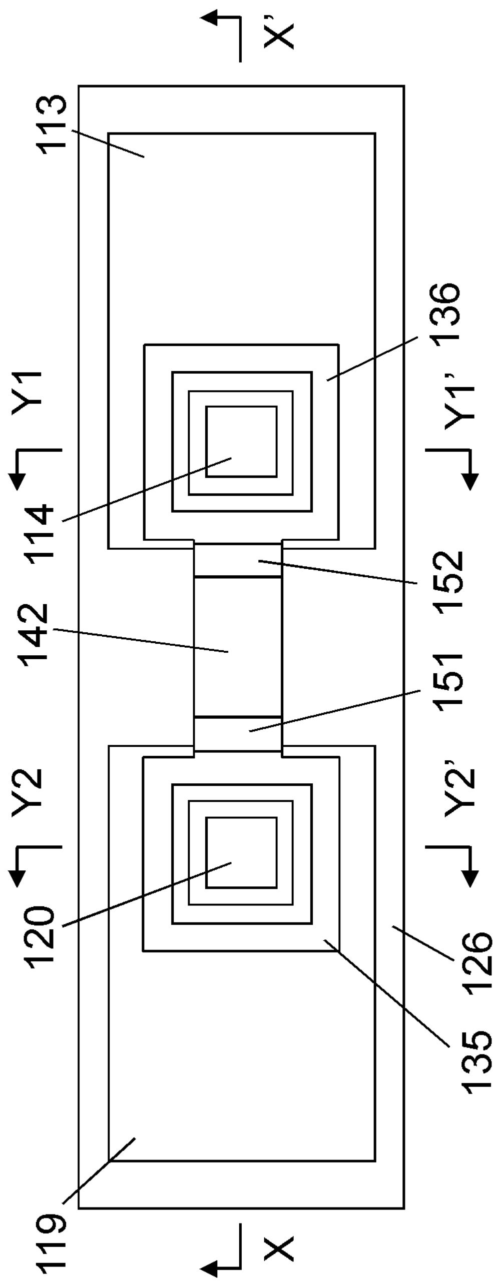
Figure 55B:
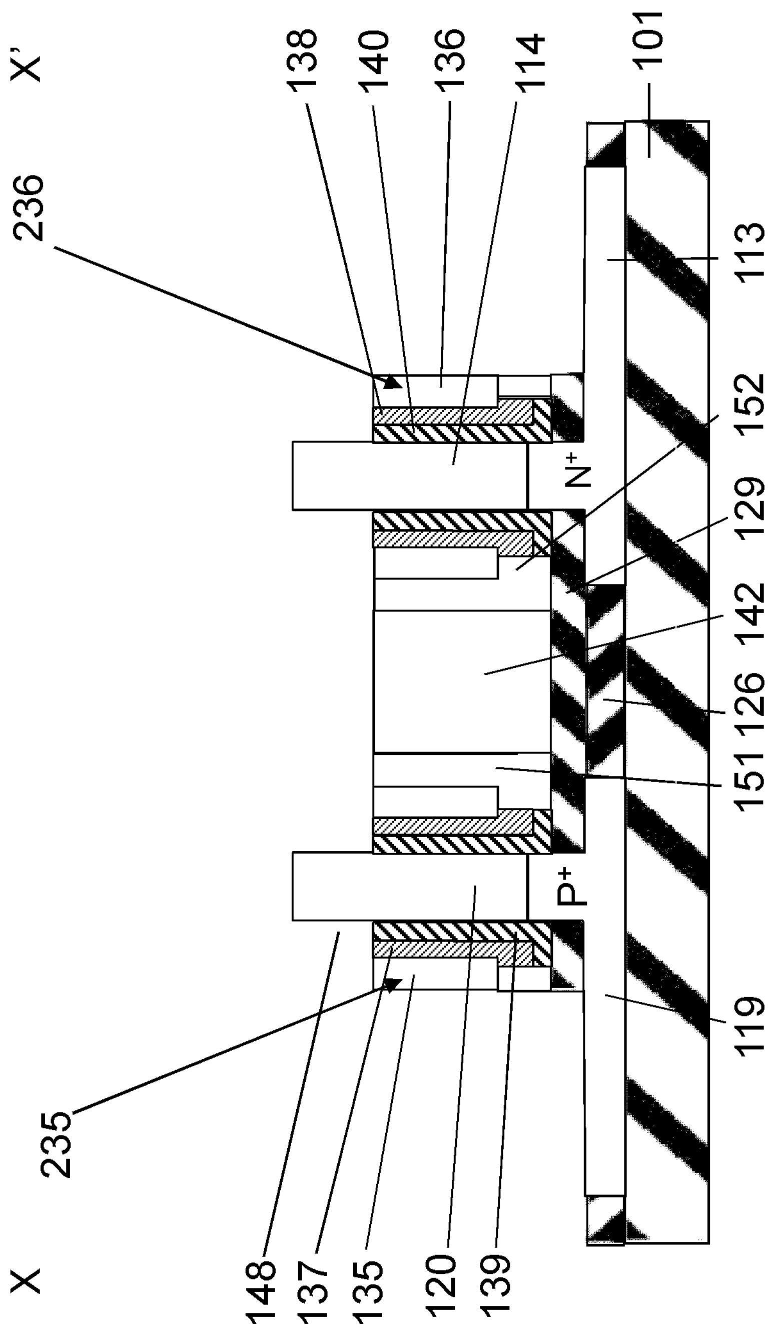
Figure 55C:
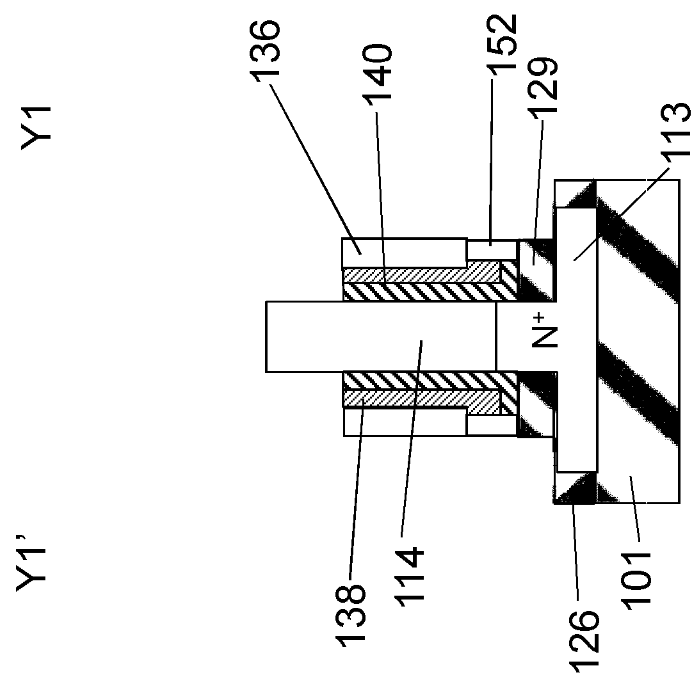
Figure 55D:
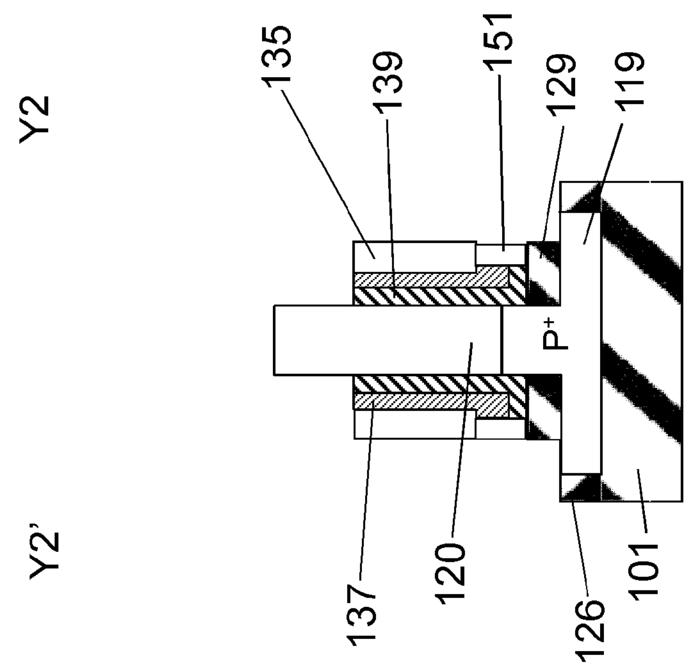
Figure 56A:
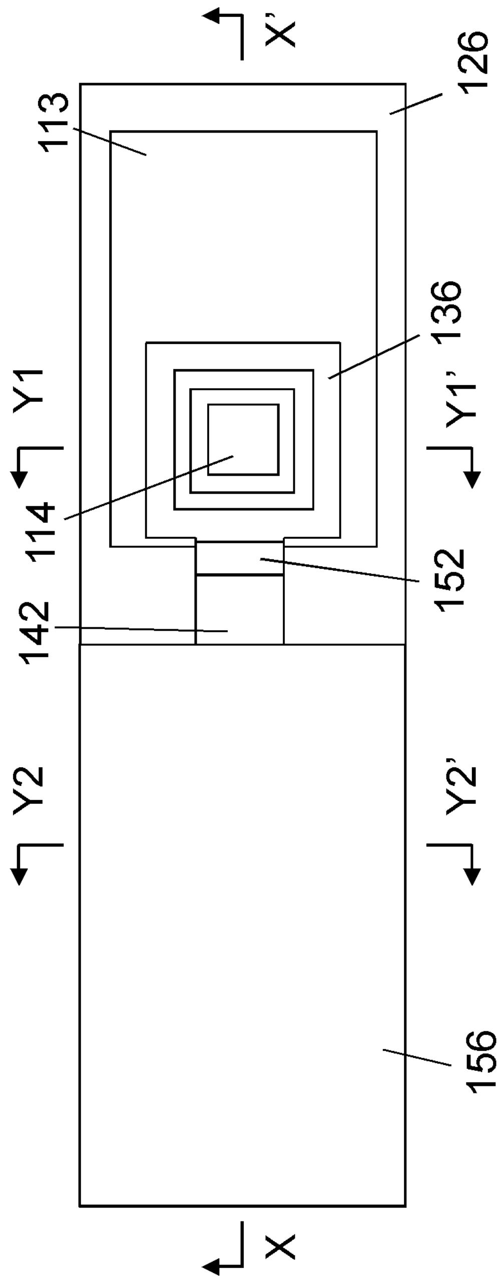
Figure 56B:
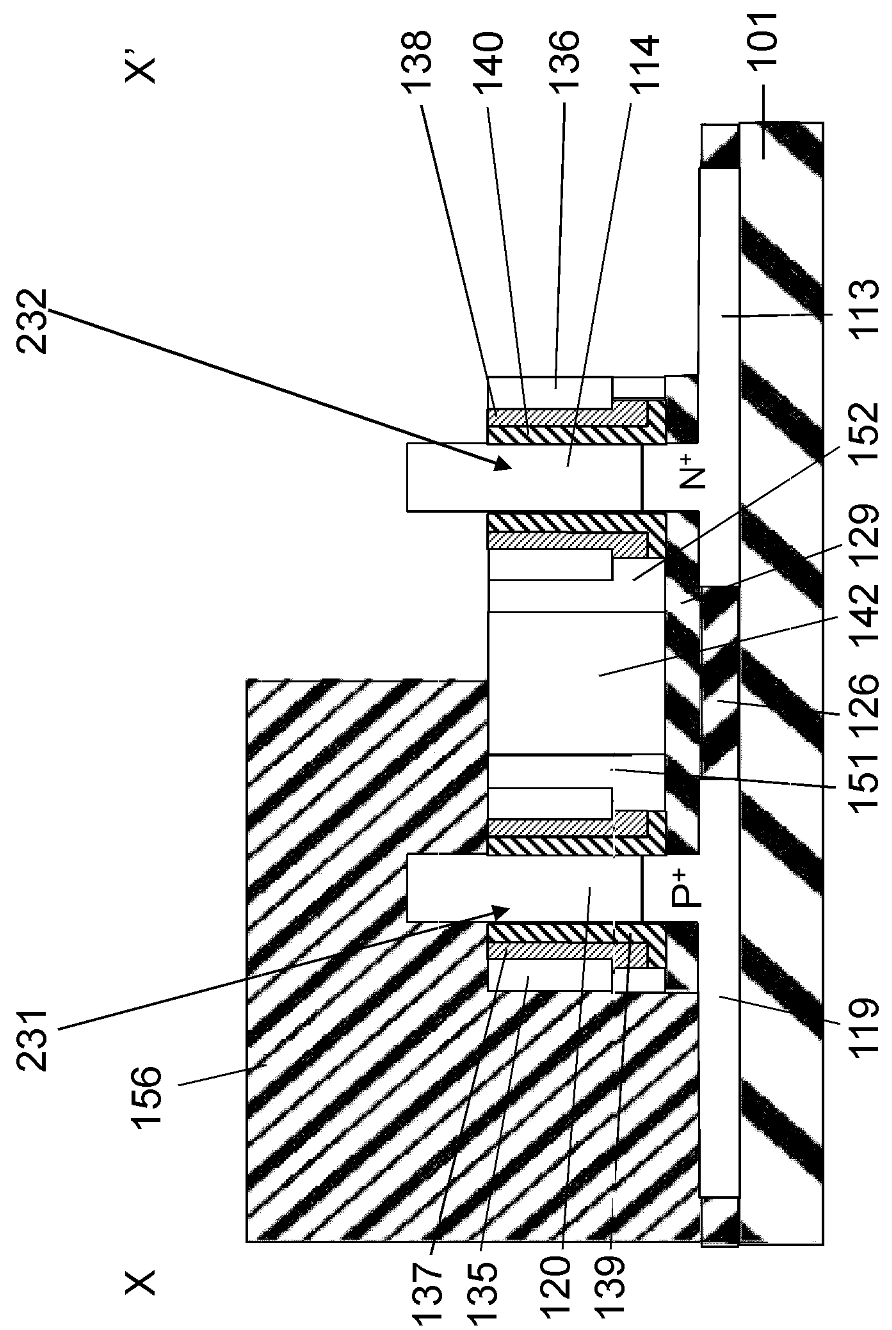
Figure 56C:
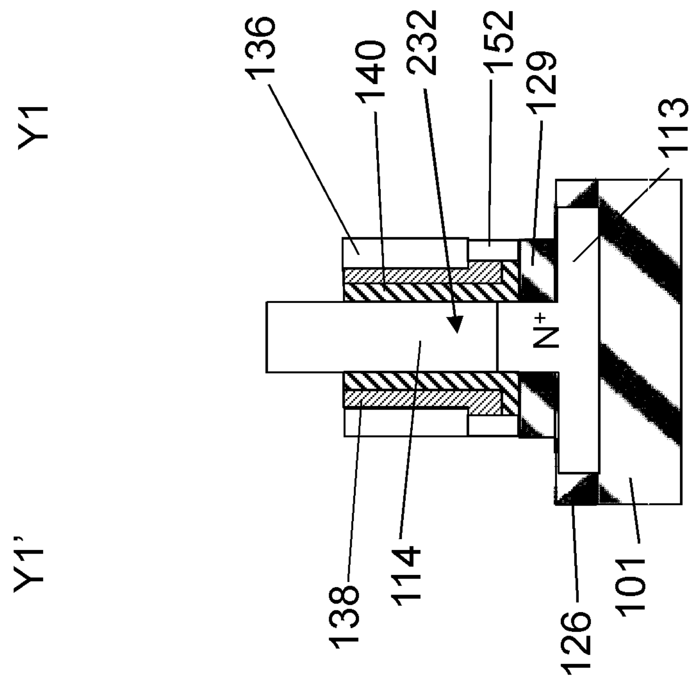
Figure 56D:
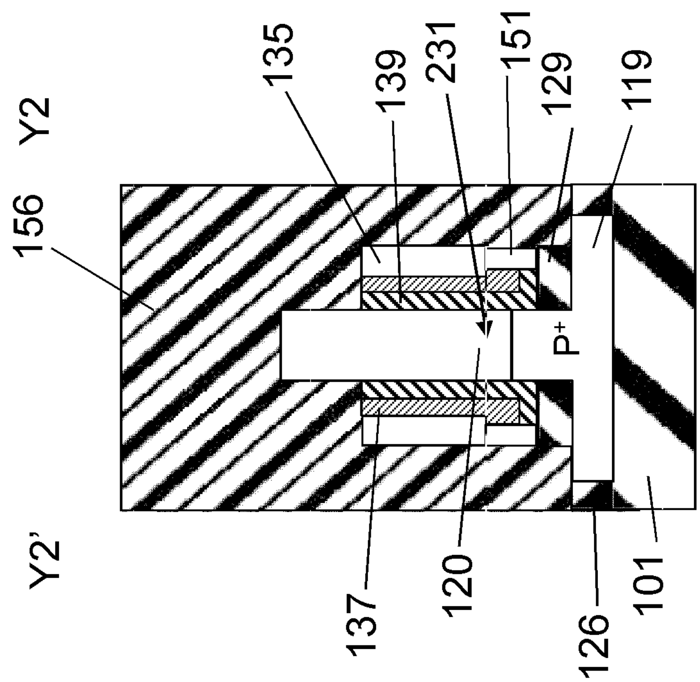
Figure 57A:
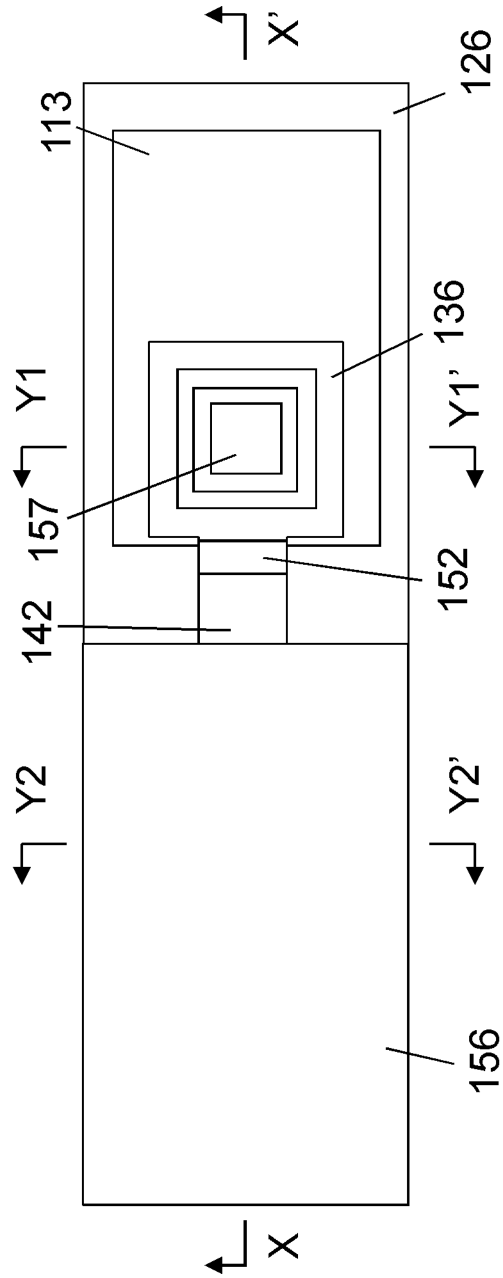
Figure 57B:
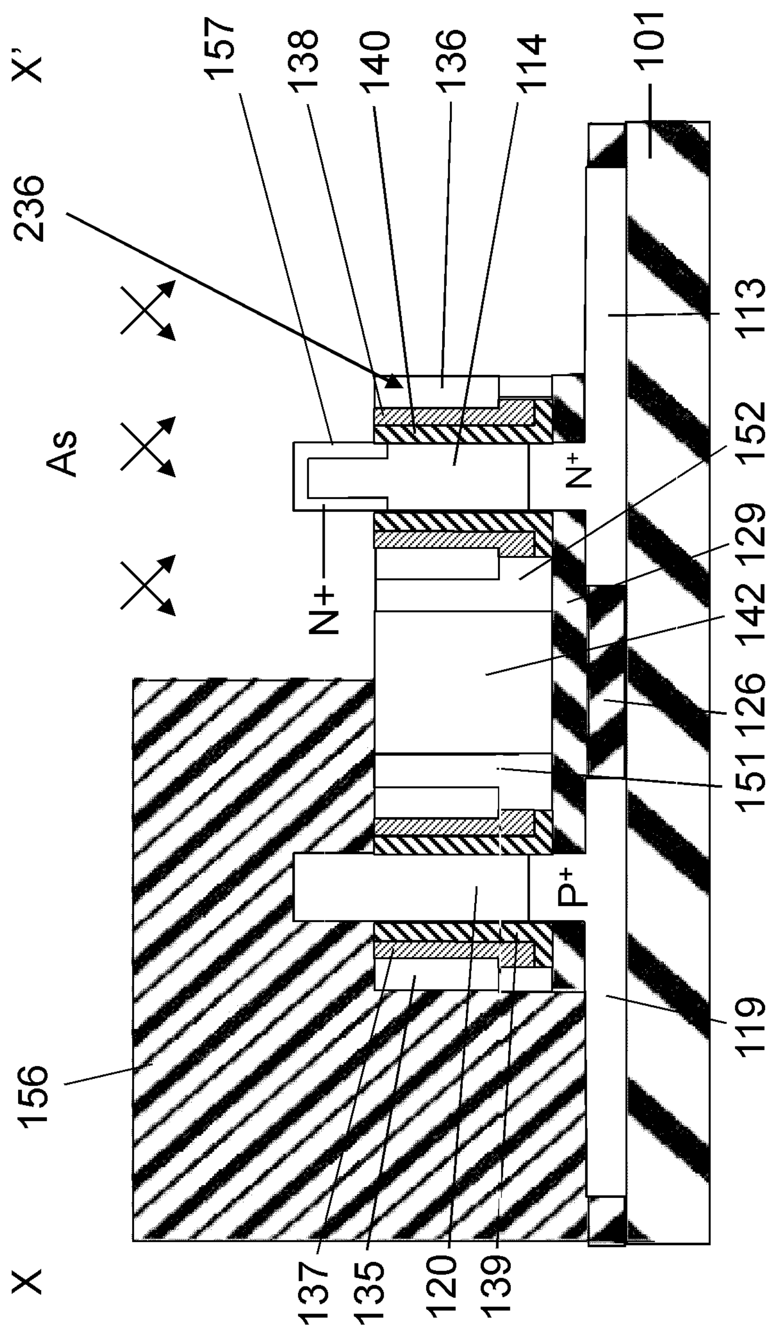
Figure 57C:
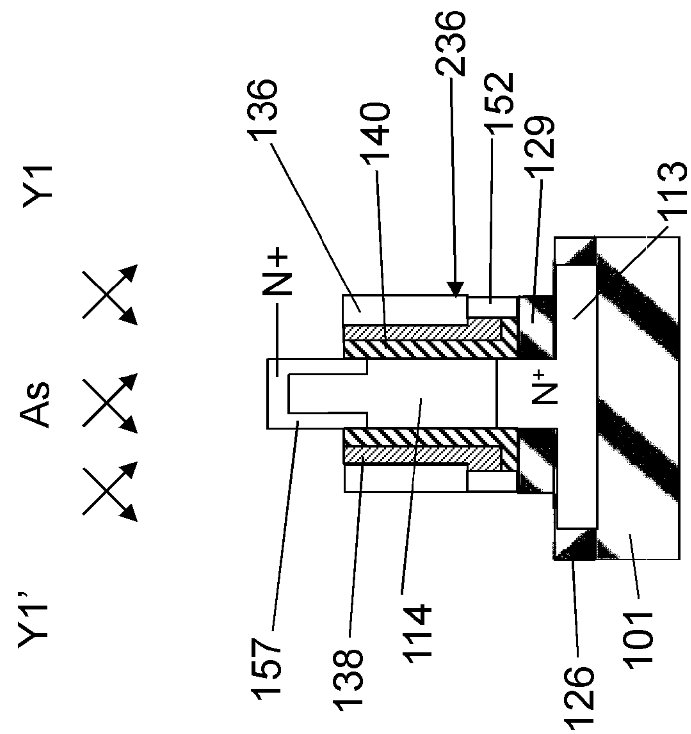
Figure 57D:
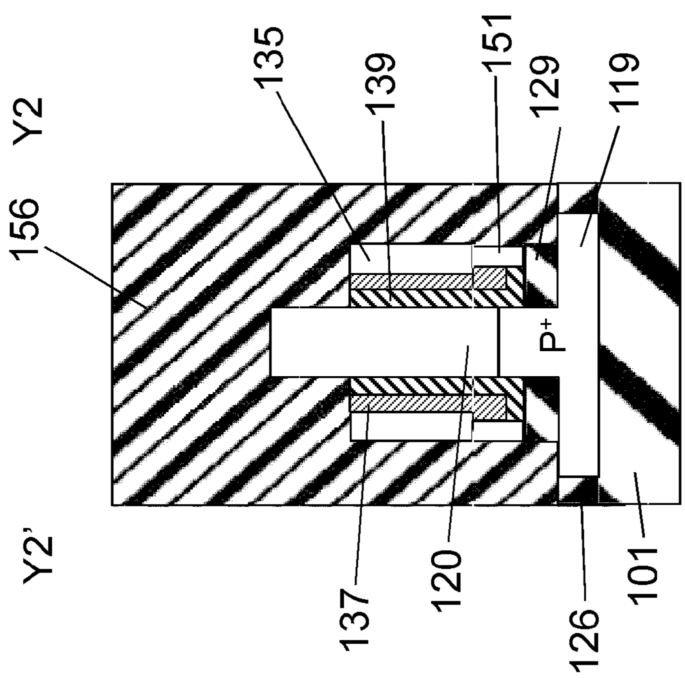
Figure 58A:
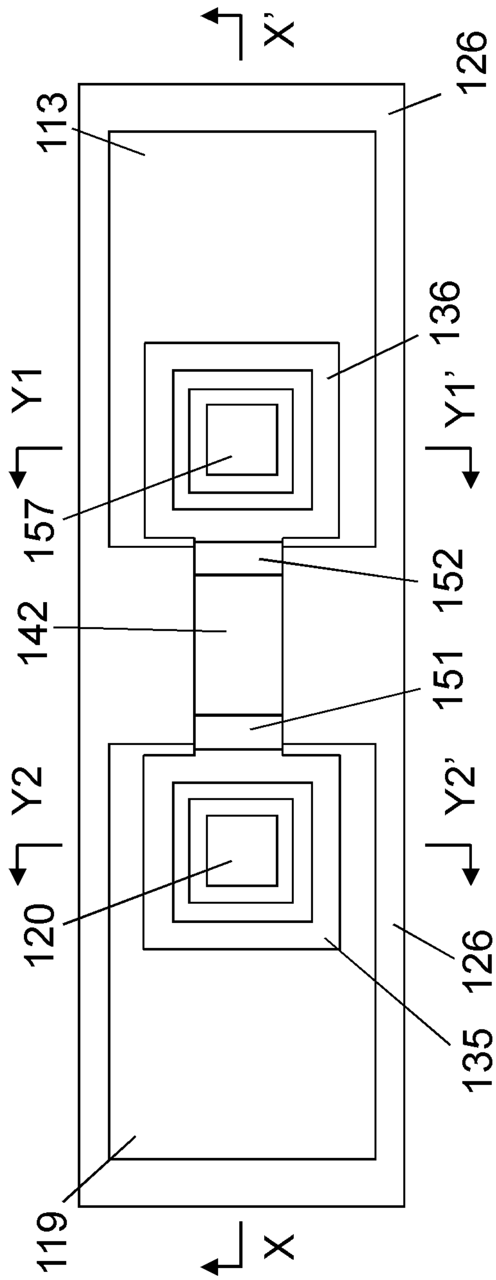
Figure 58B:
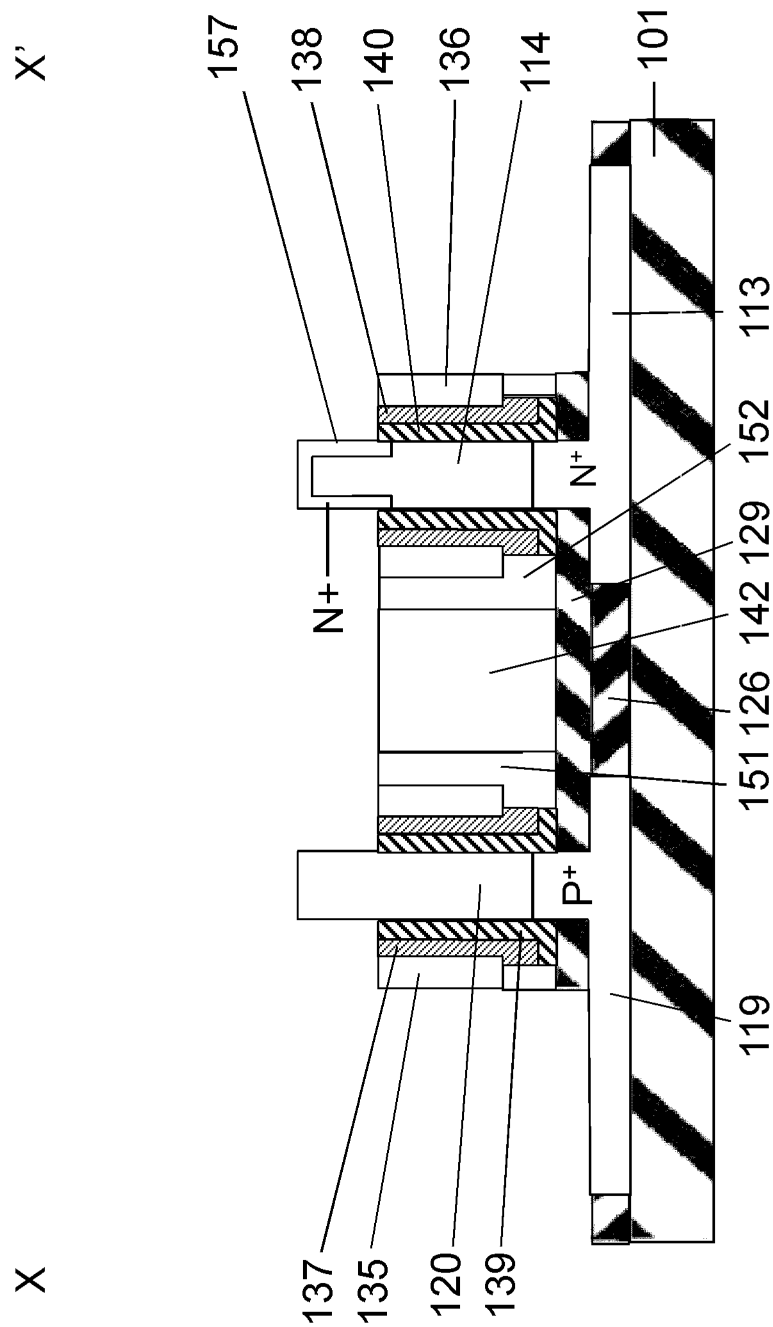
Figure 58C:
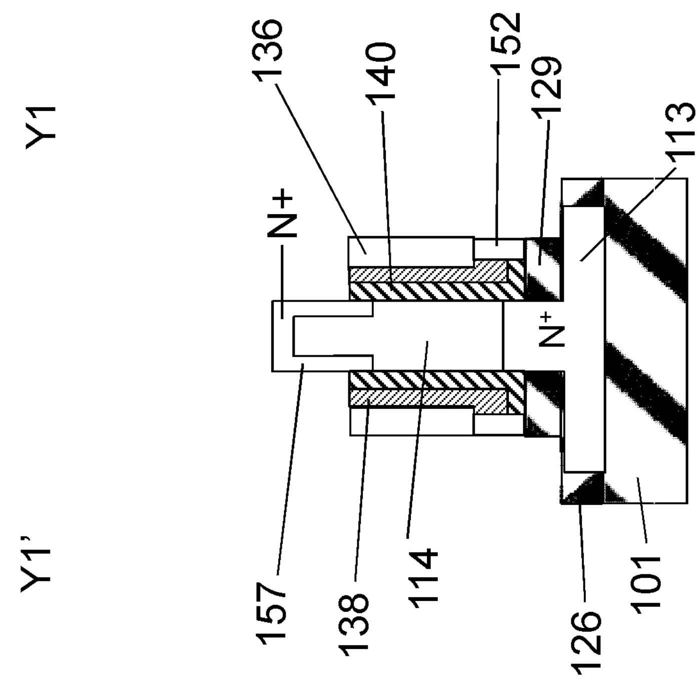
Figure 58D:
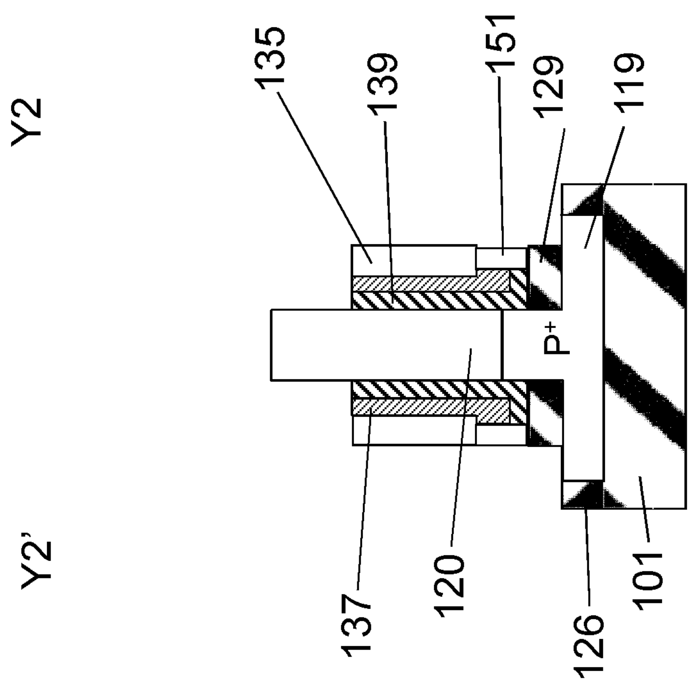
Figure 59A:
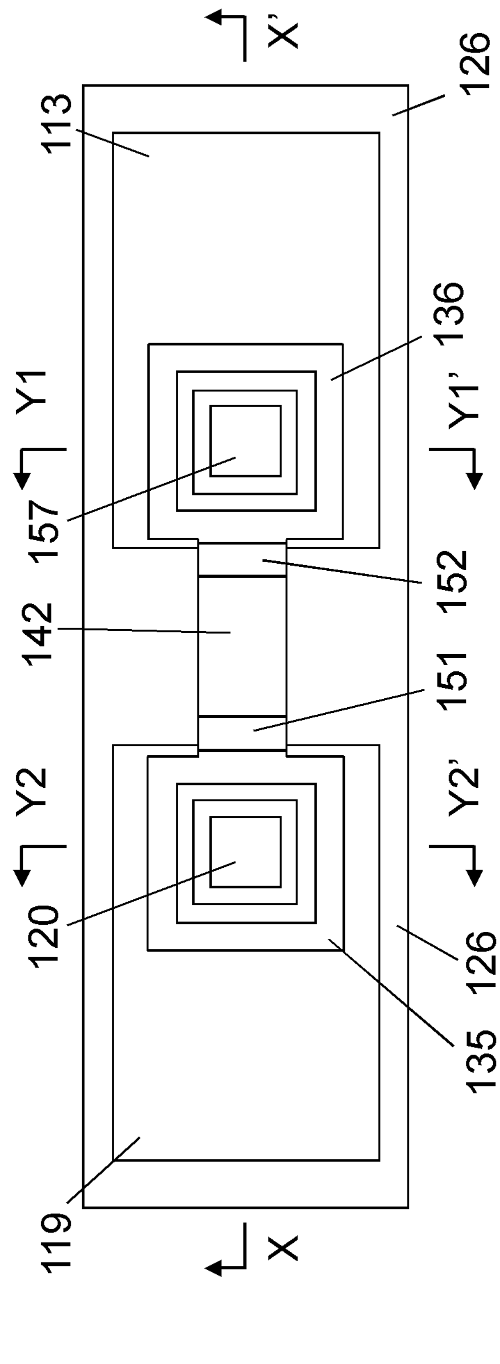
Figure 59B:
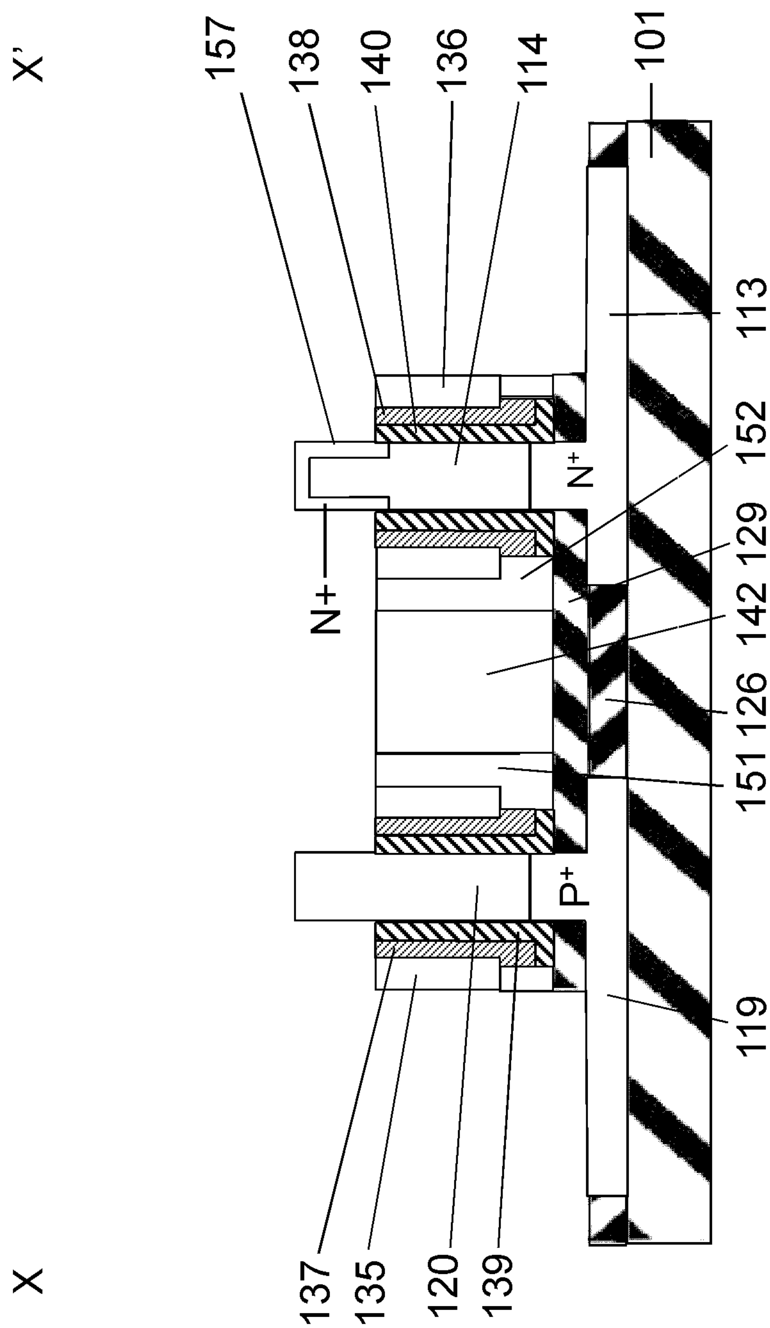
Figure 59C:
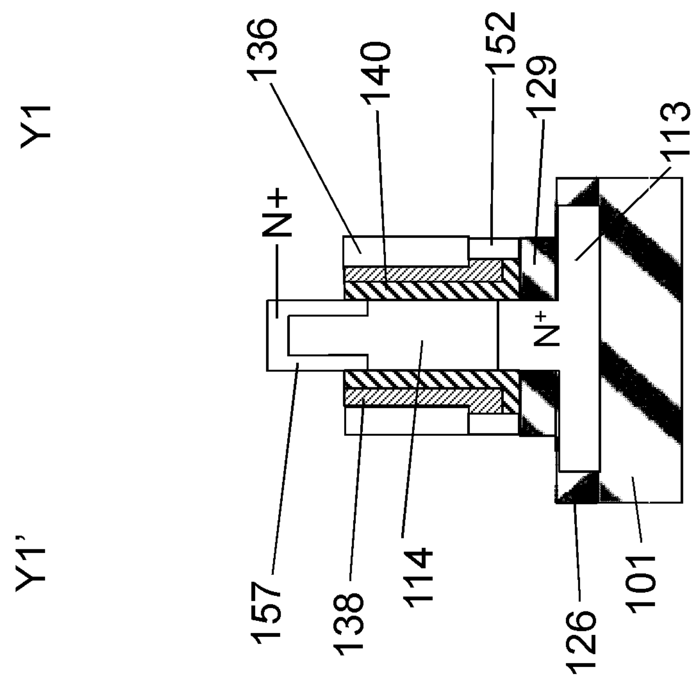
Figure 59D:
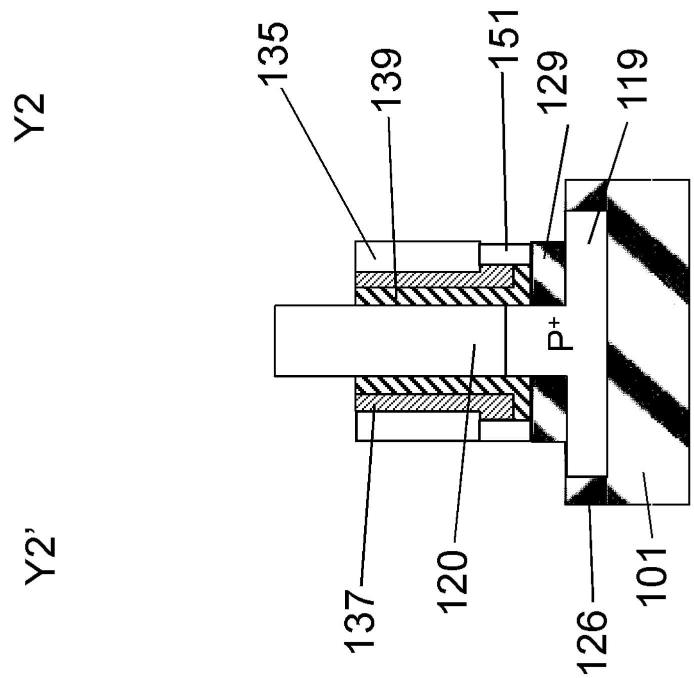
Figure 60A:
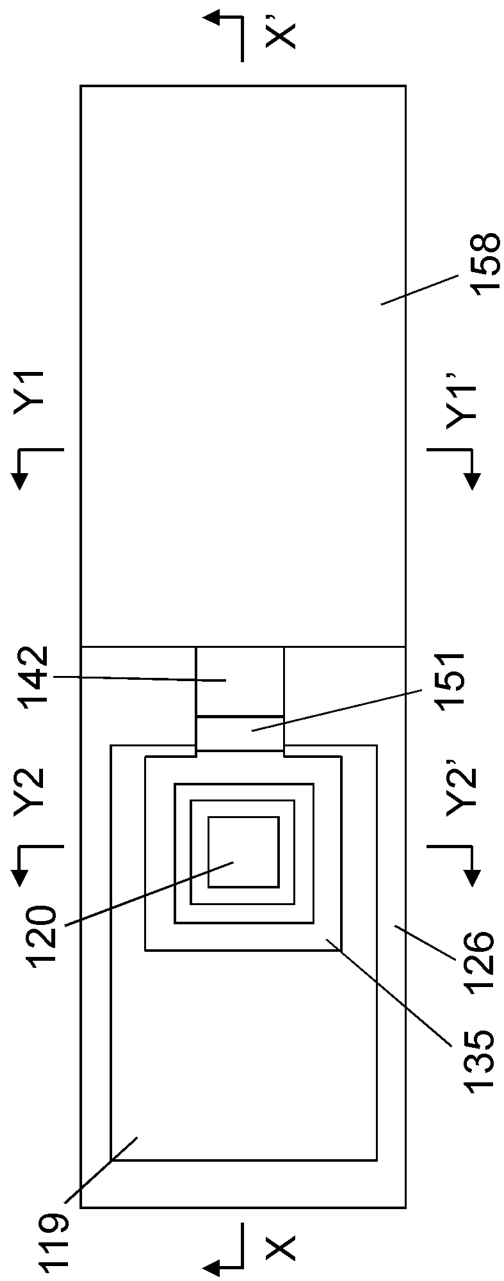
Figure 60B:
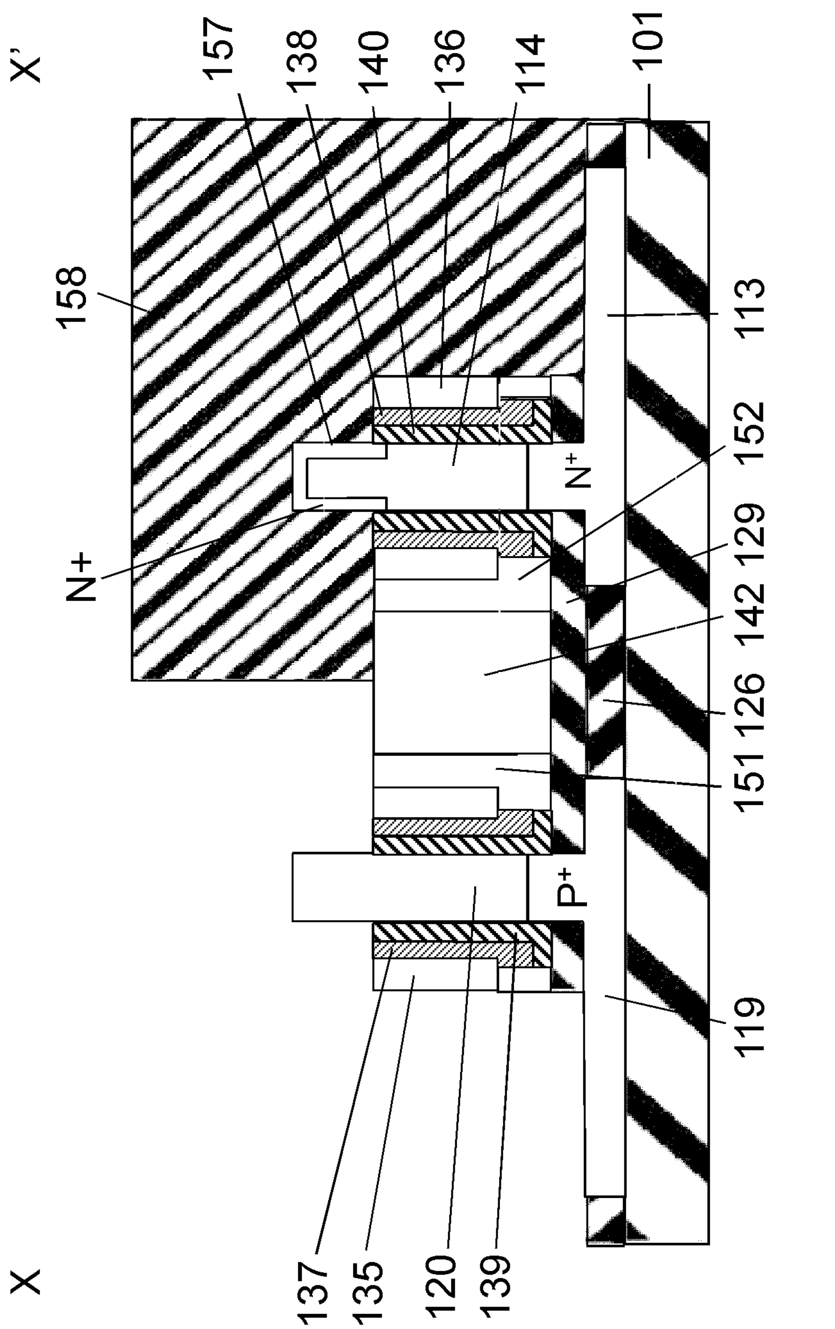
Figure 60C:
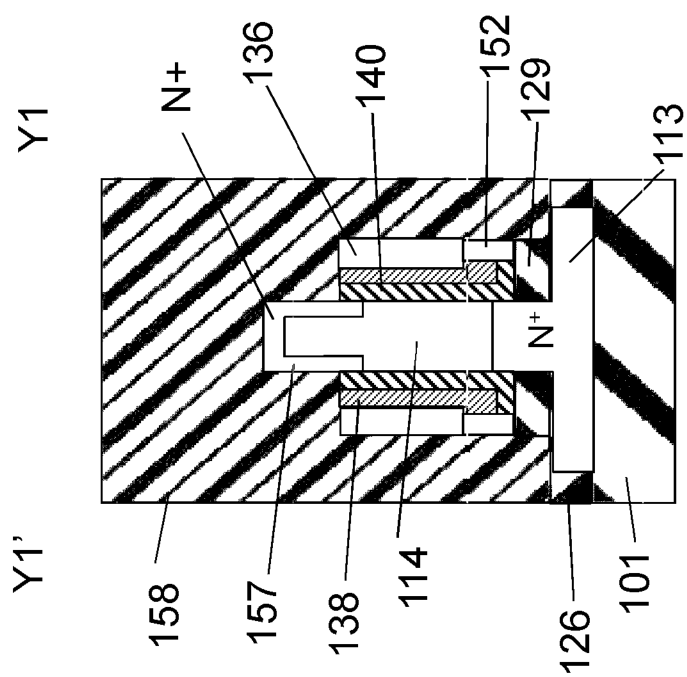
Figure 60D:
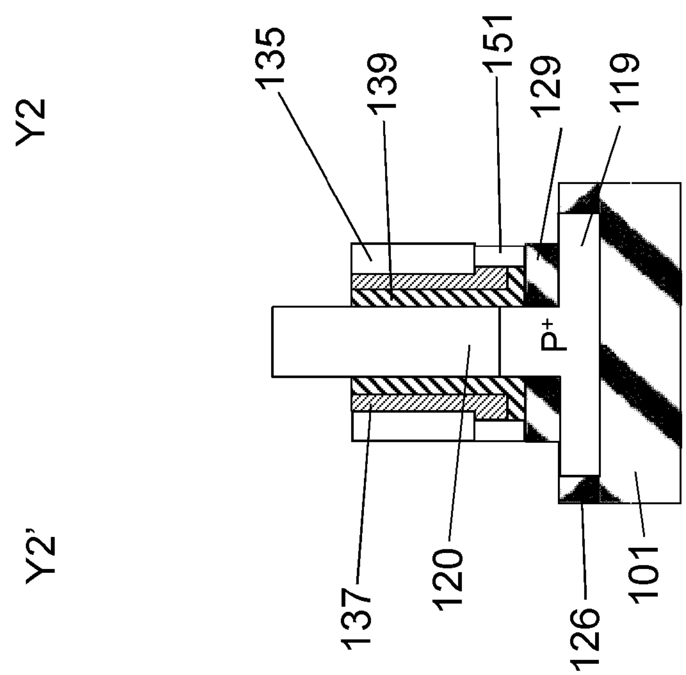
Figure 61A:
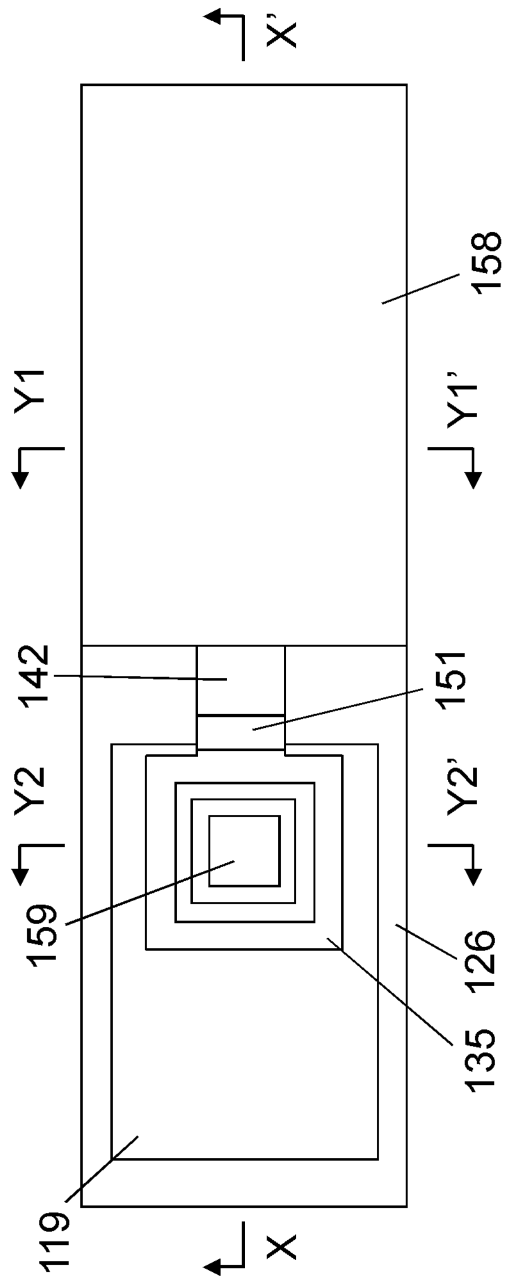
Figure 61B:
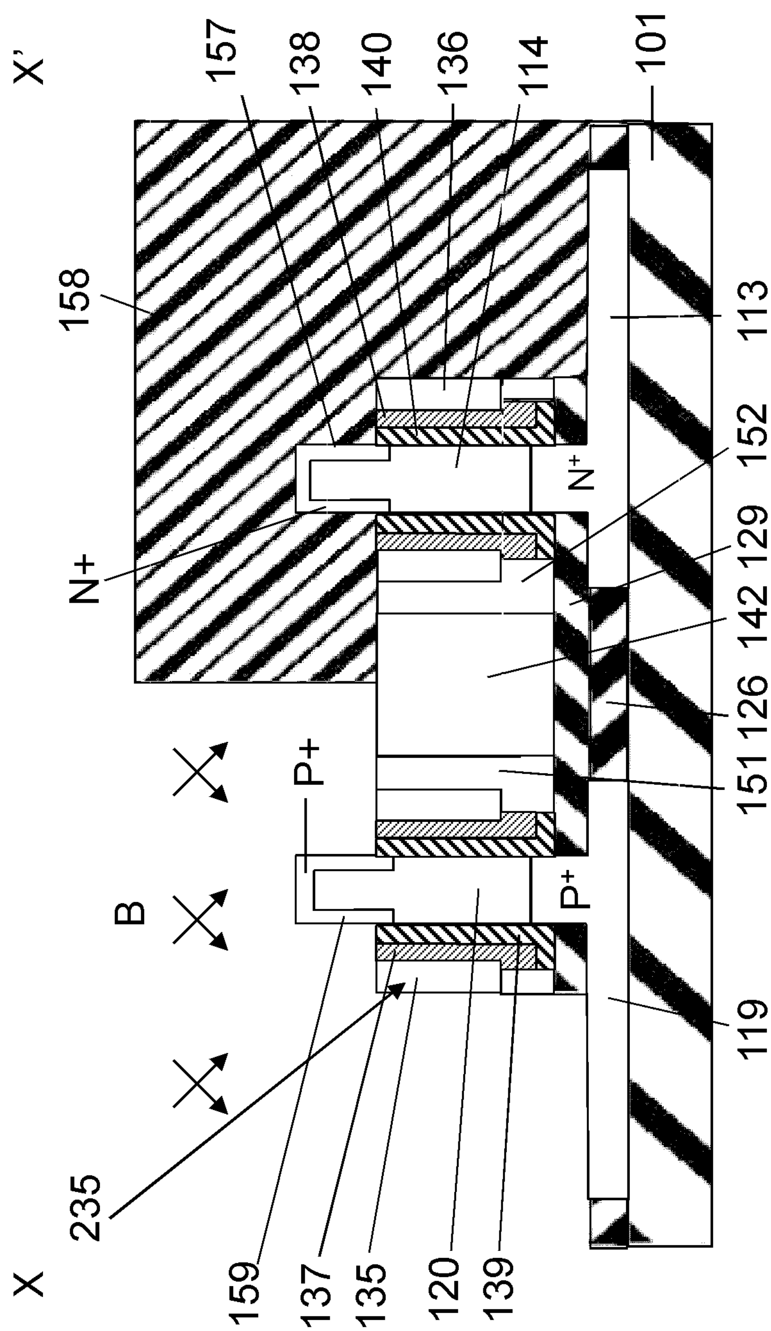
Figure 61C:
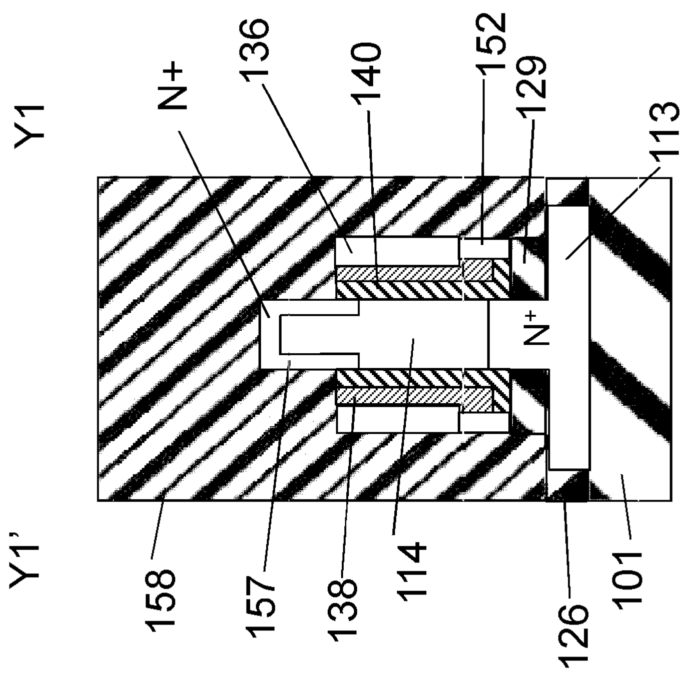
Figure 61D:
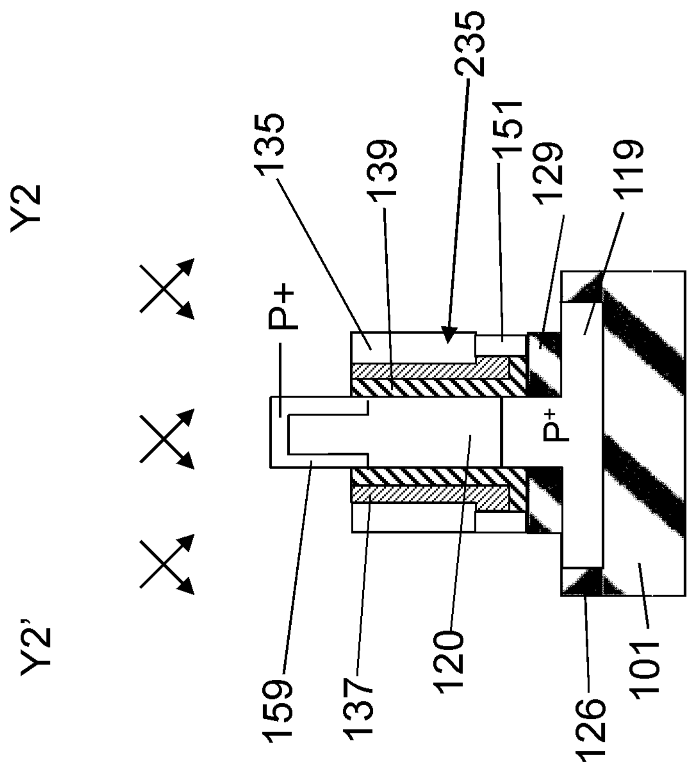
Figure 62A:
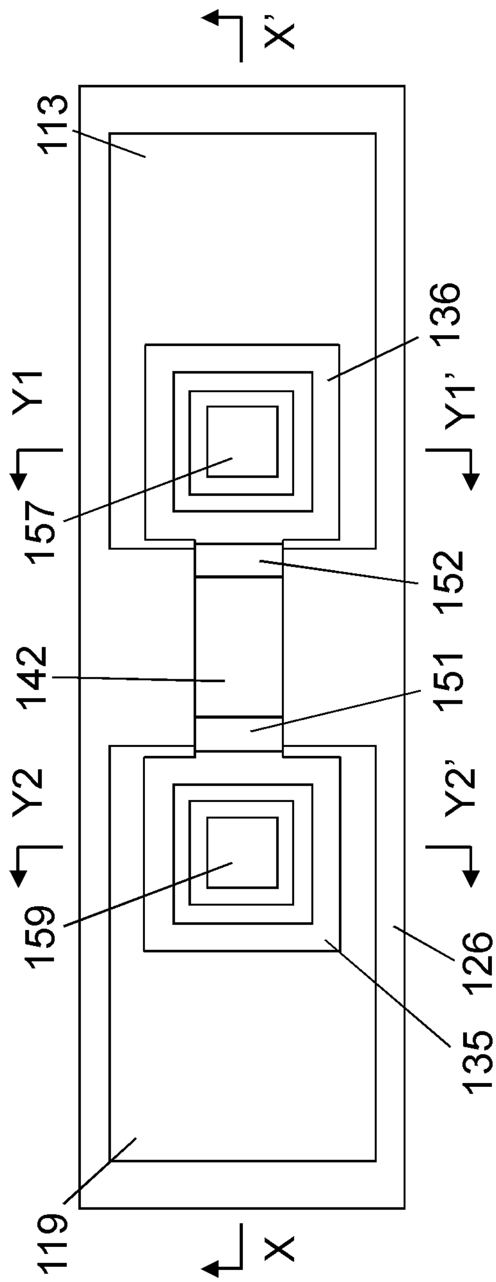
Figure 62B:
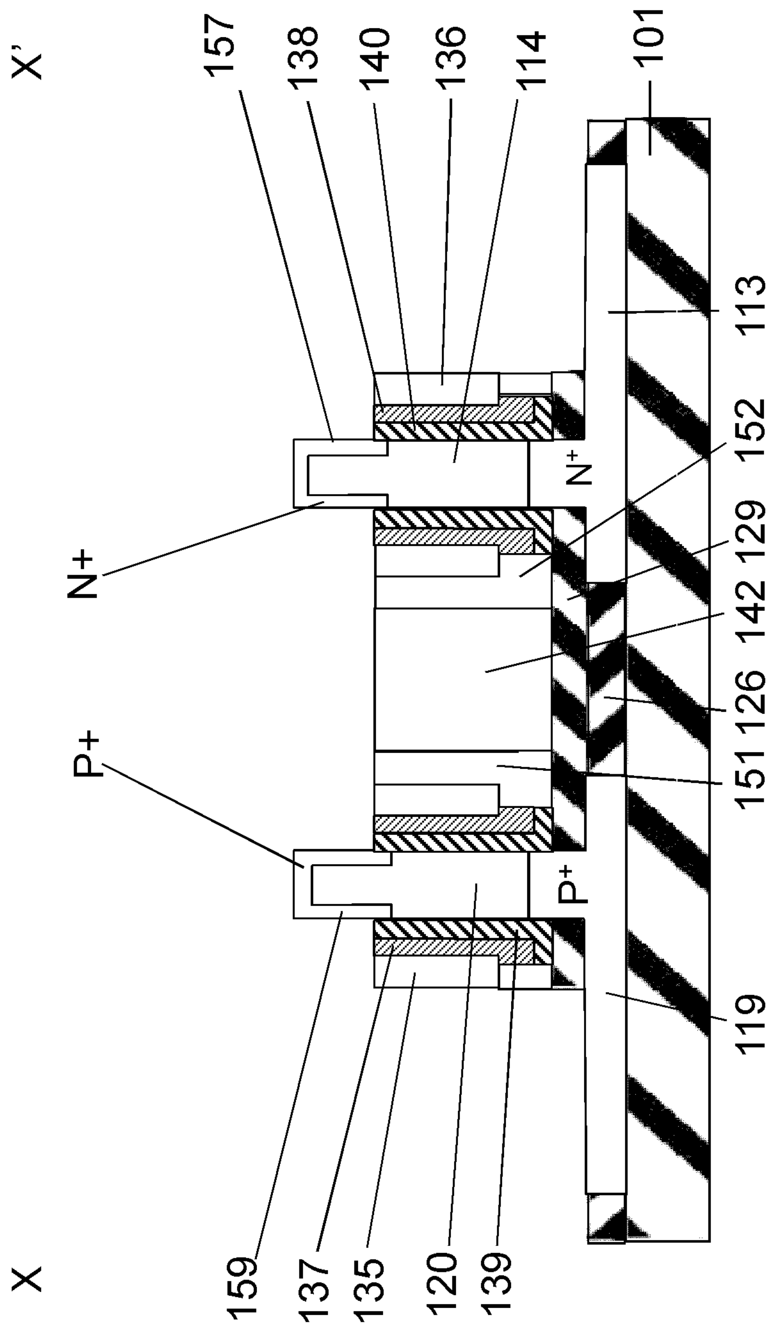
Figure 62C:
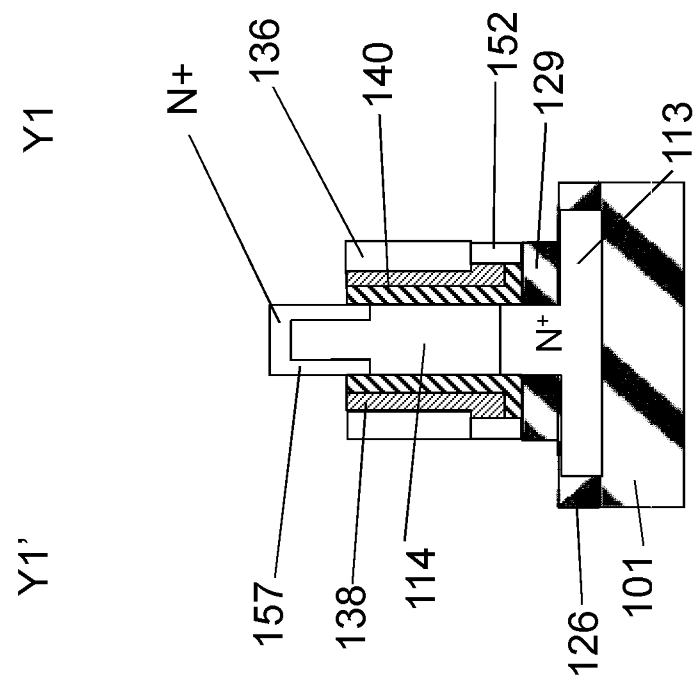
Figure 62D:
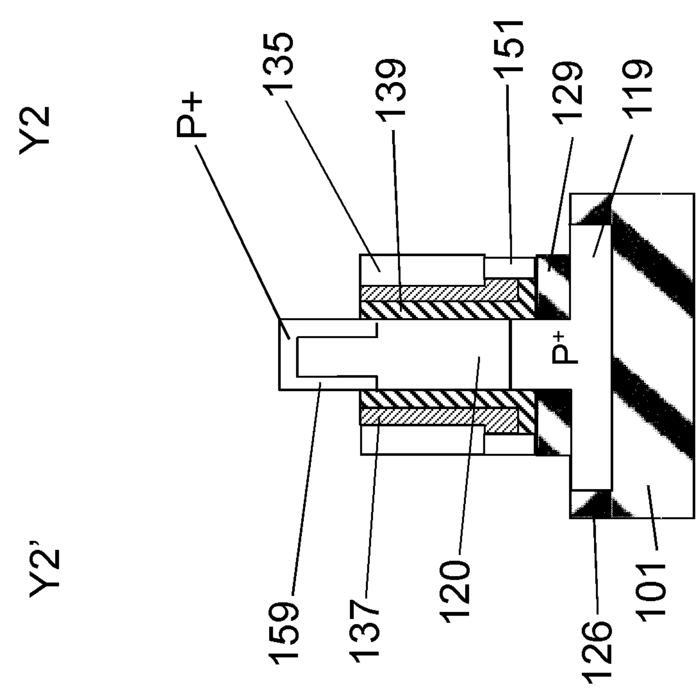
Figure 63A:
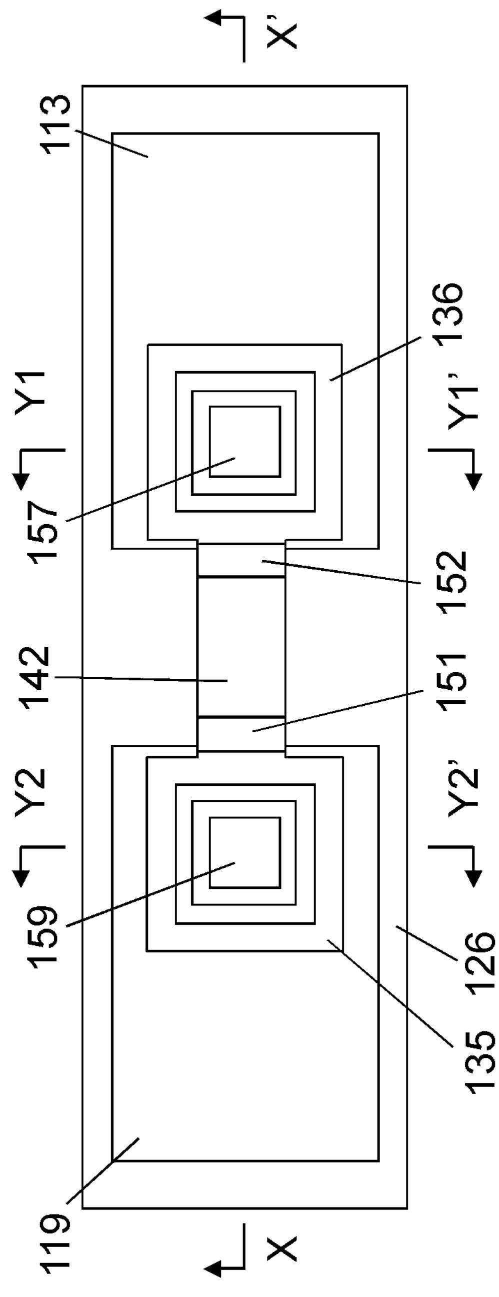
Figure 63B:
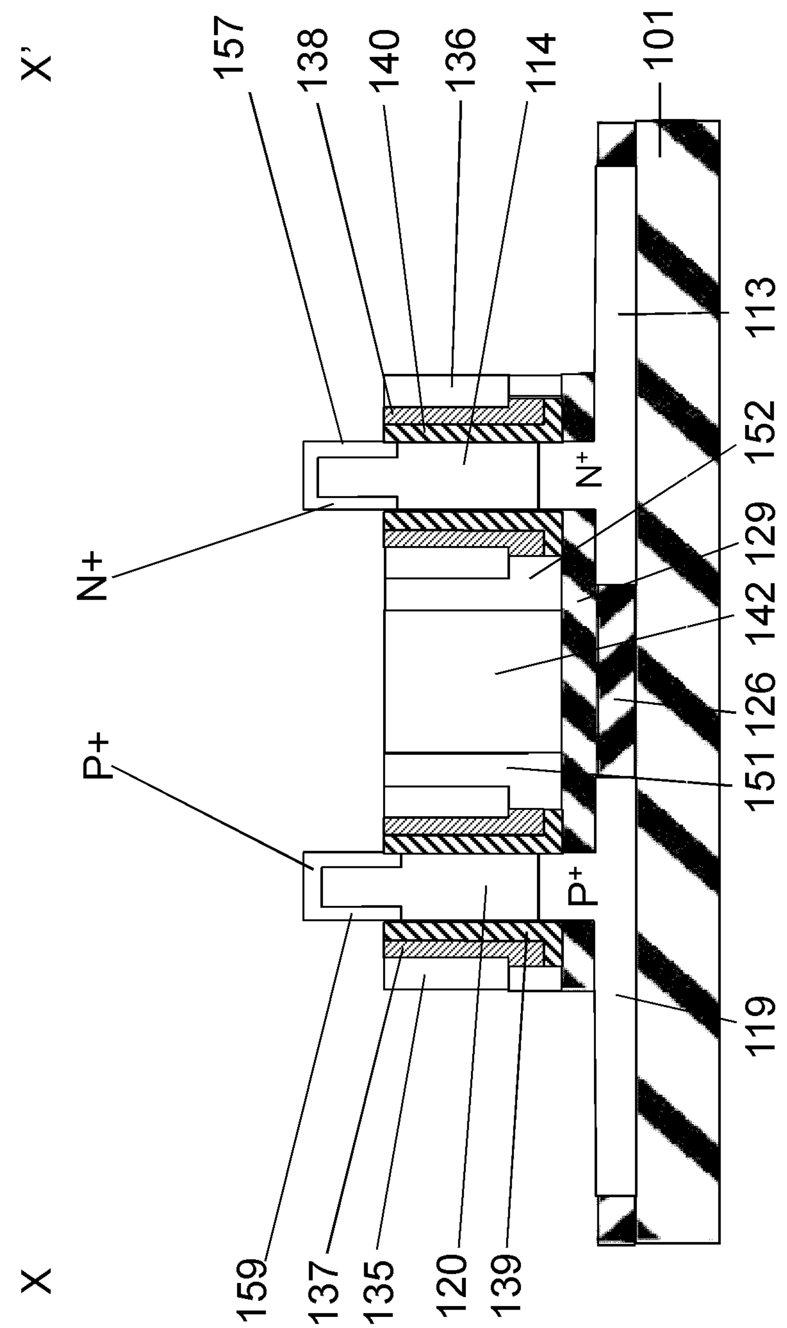
Figure 63C:
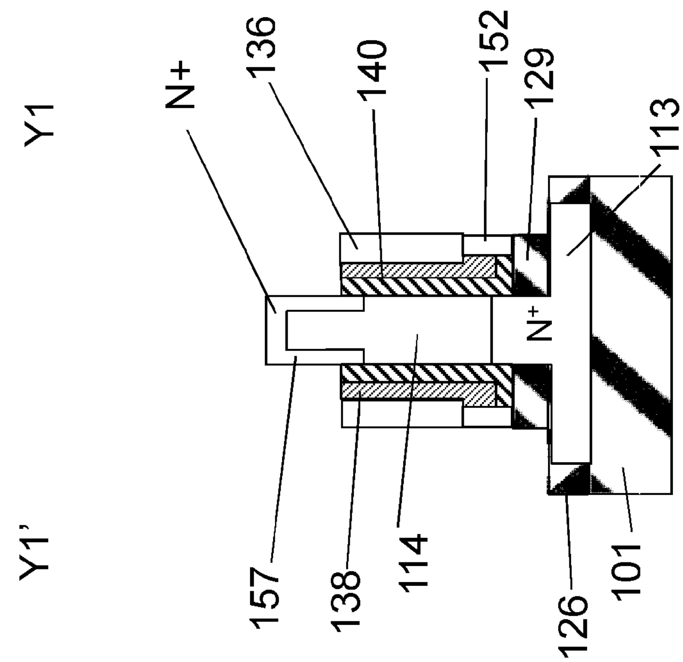
Figure 63D:
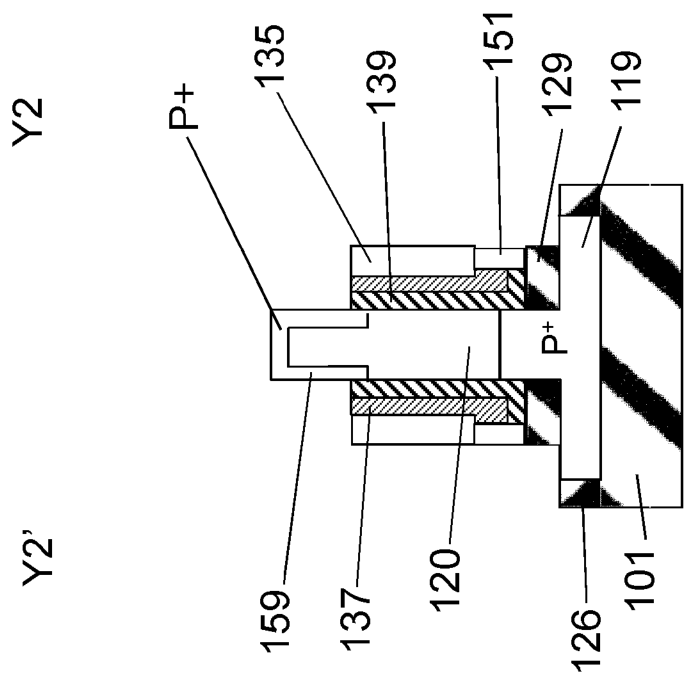
Figure 64A:
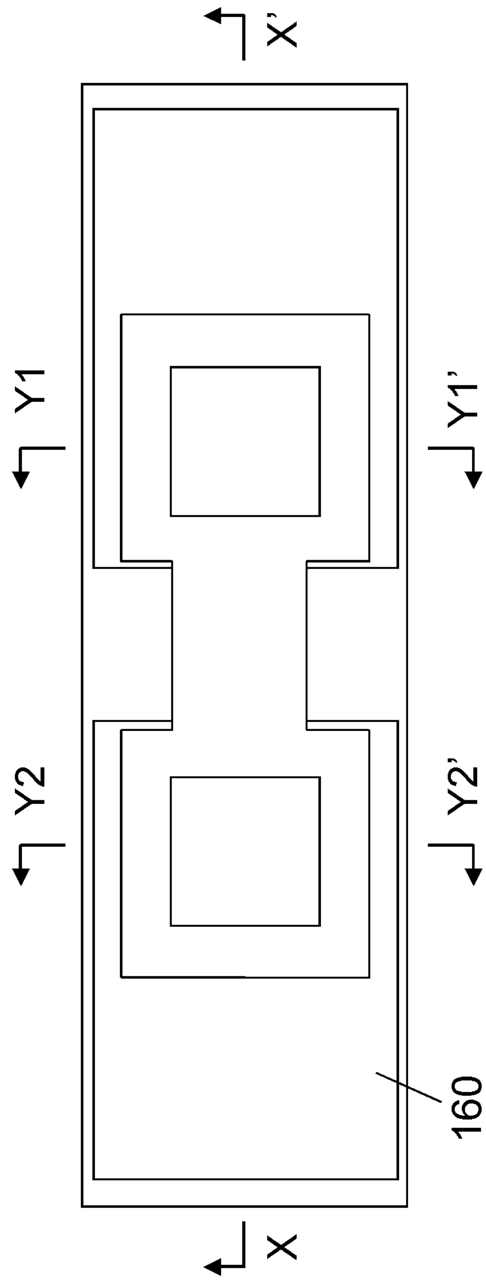
Figure 64B:
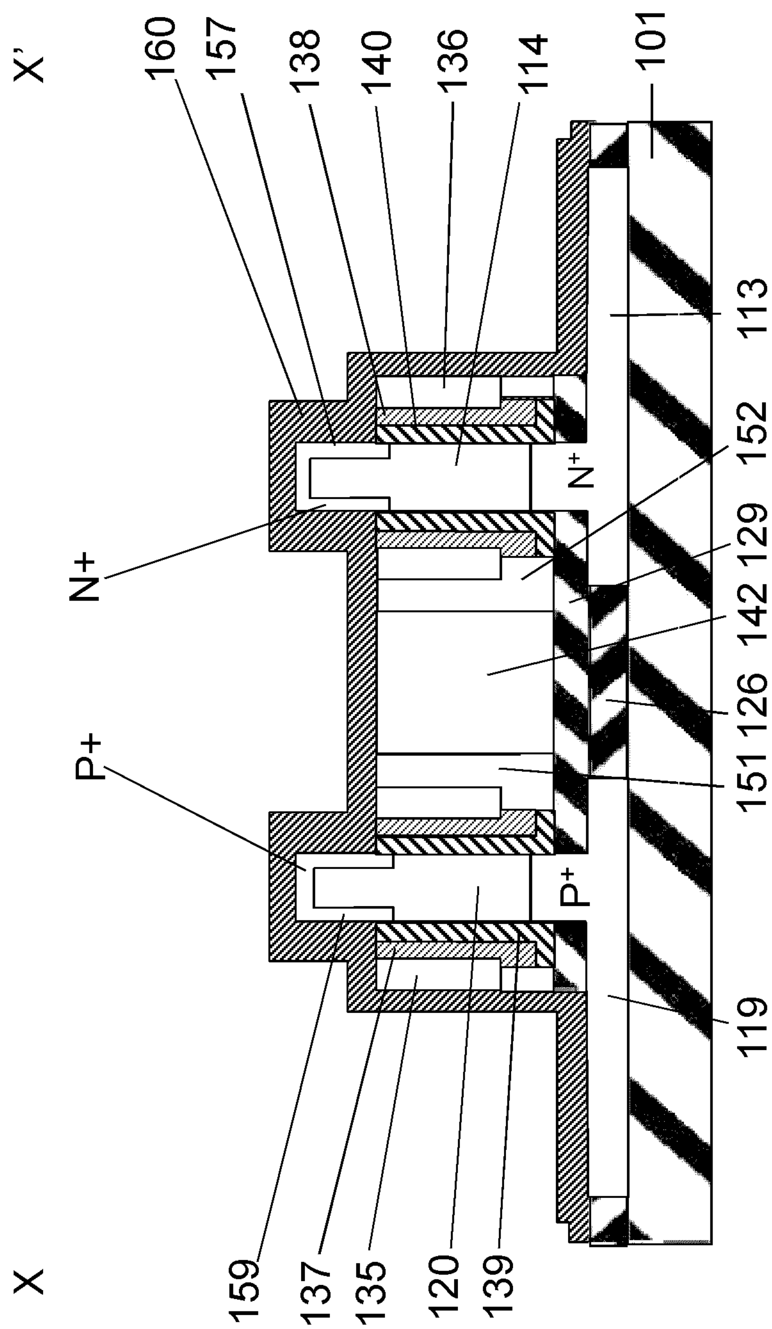
Figure 64C:
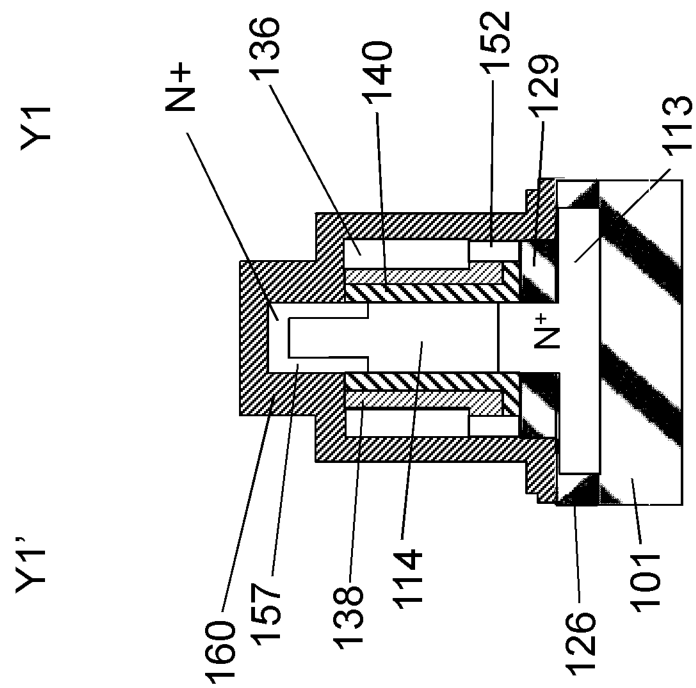
Figure 64D:
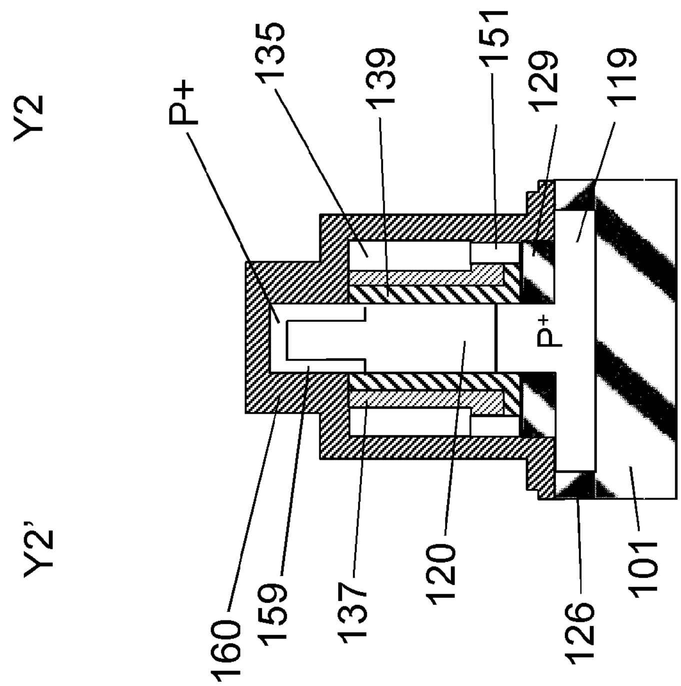
Figure 65A:
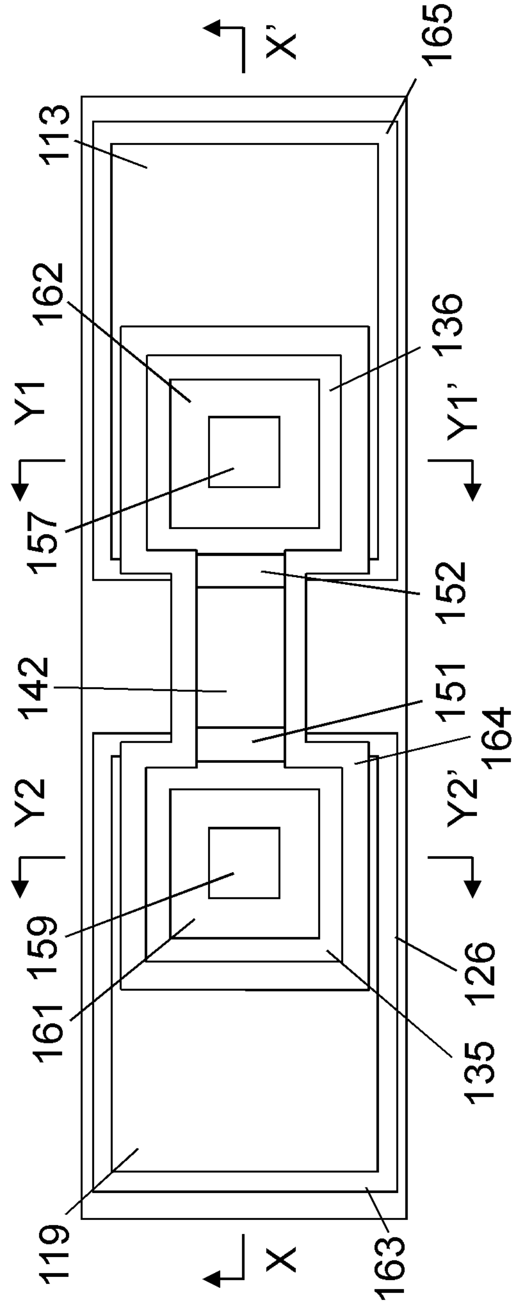
Figure 65B:
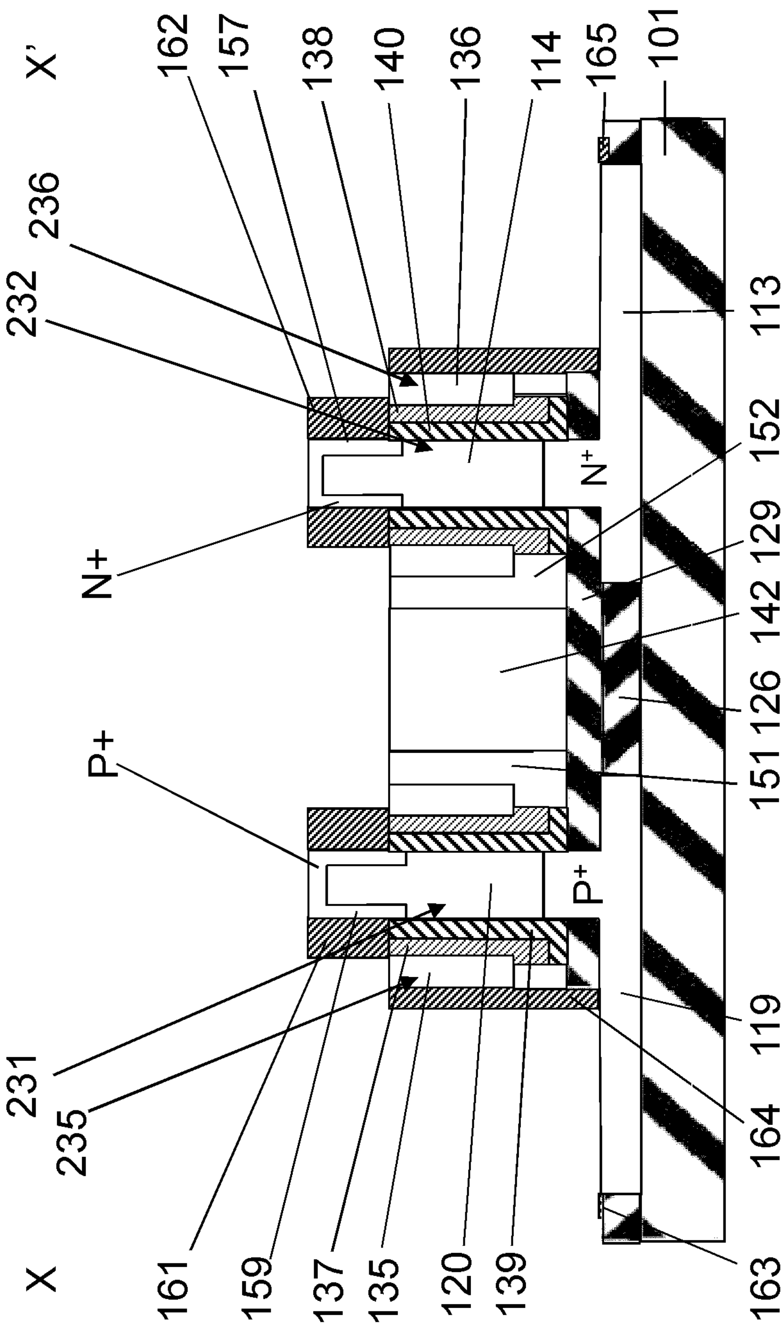
Figure 65C:
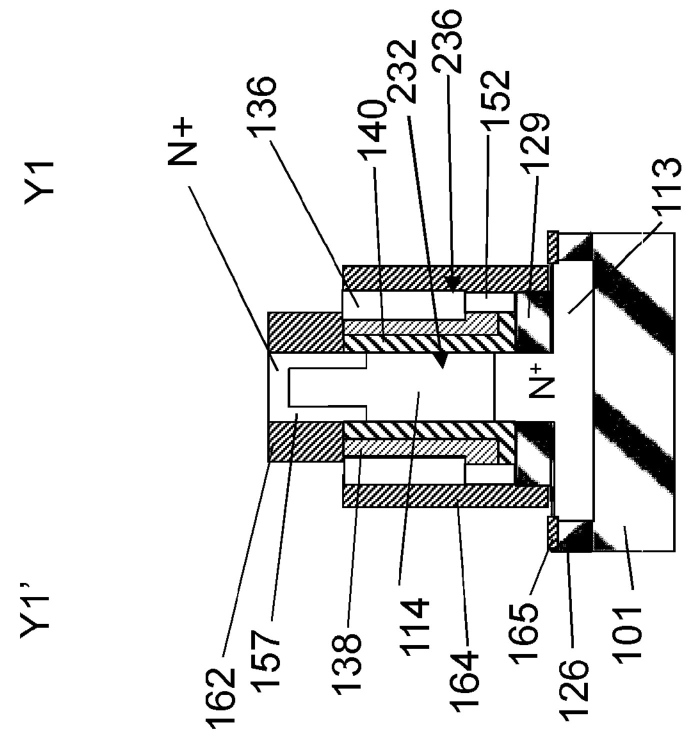
Figure 65D:
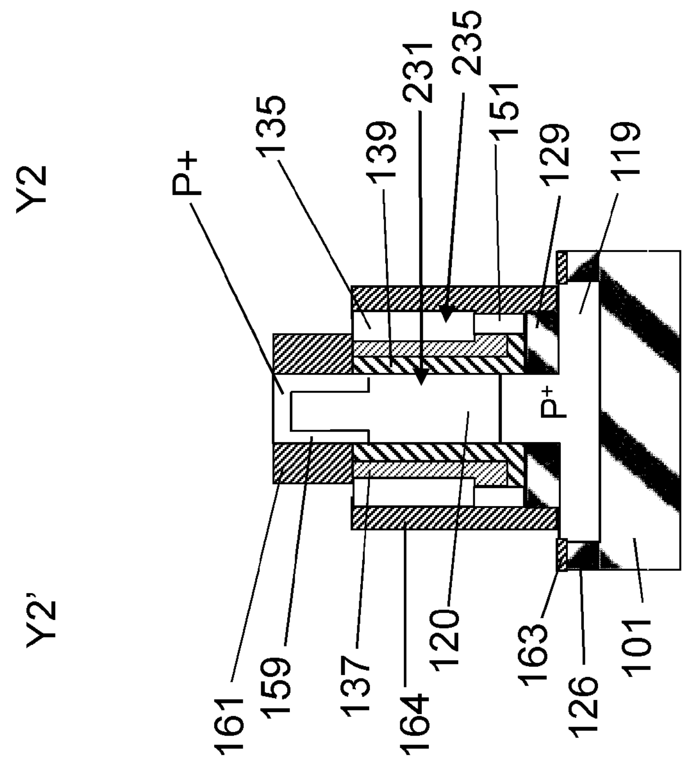
Figure 66A:
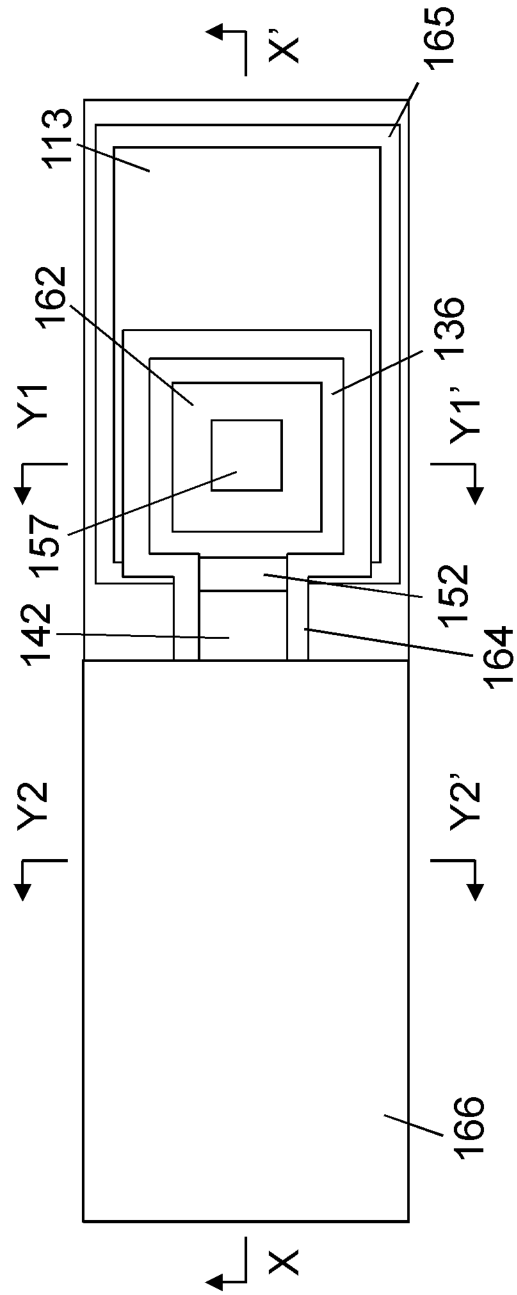
Figure 66B:
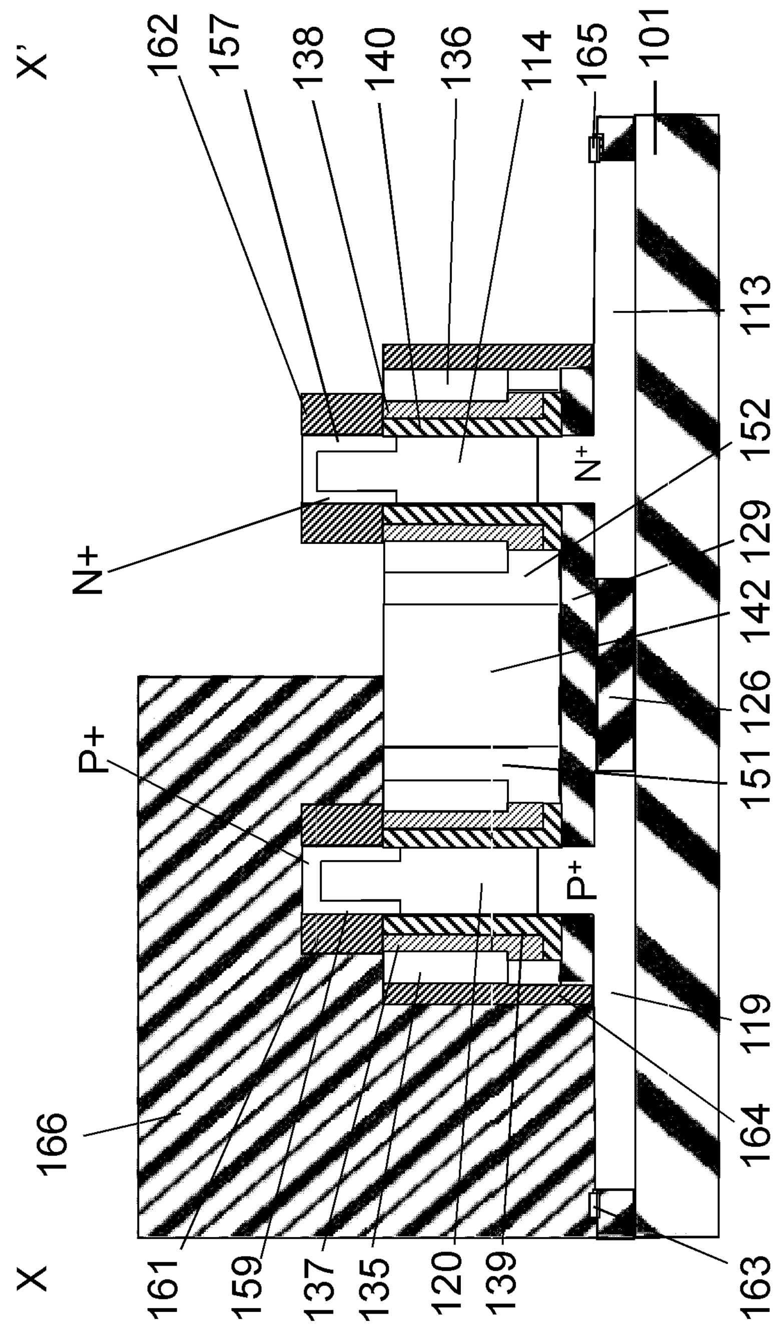
Figure 66C:
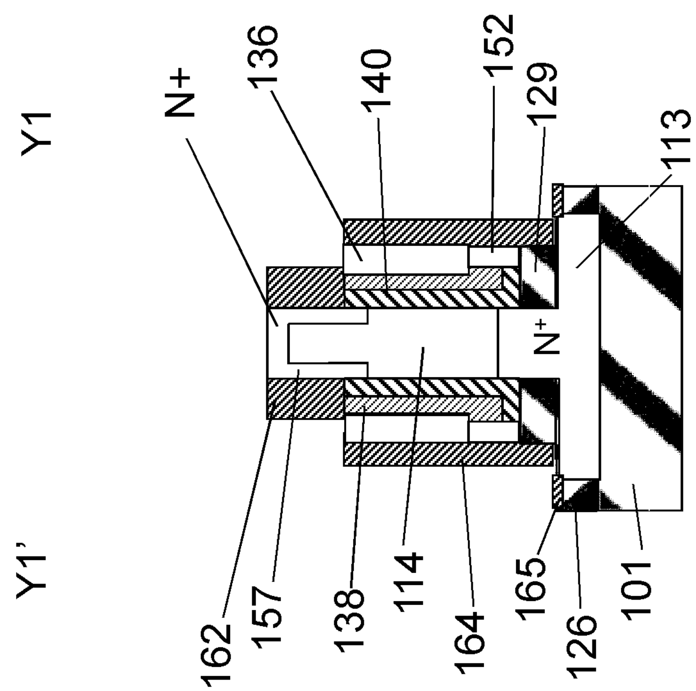
Figure 66D:
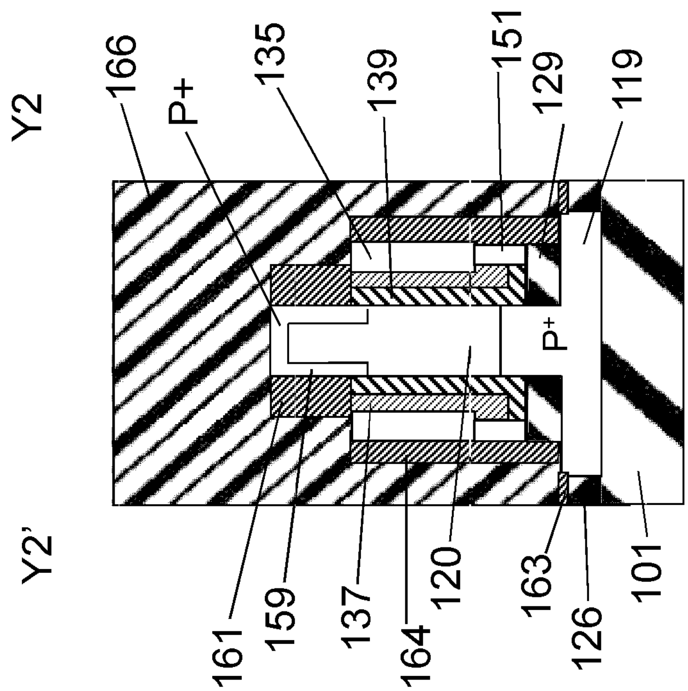
Figure 67A:
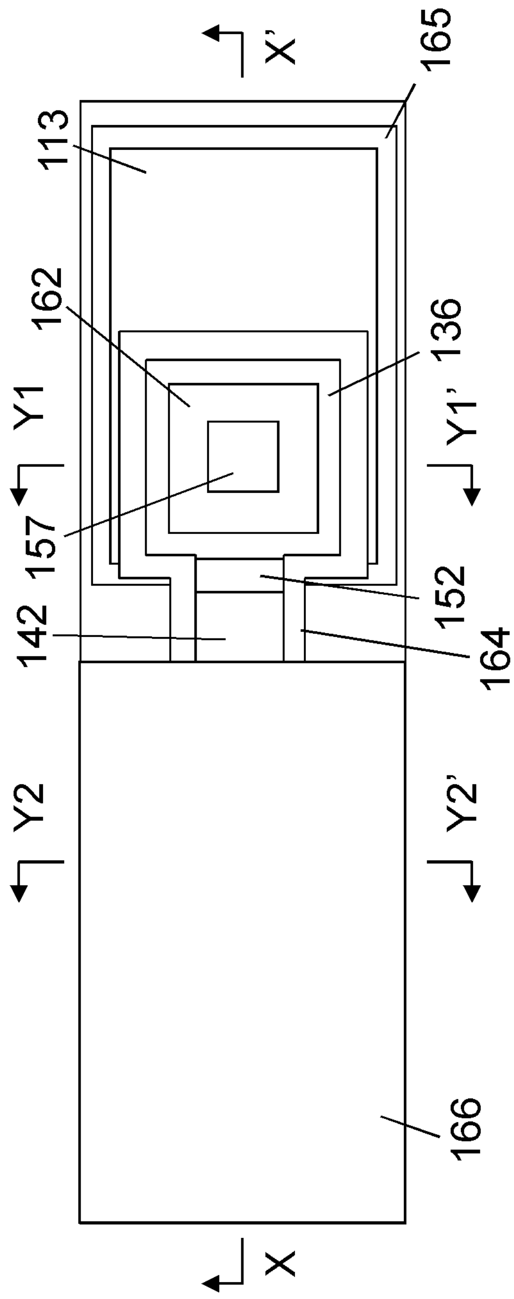
Figure 67B:
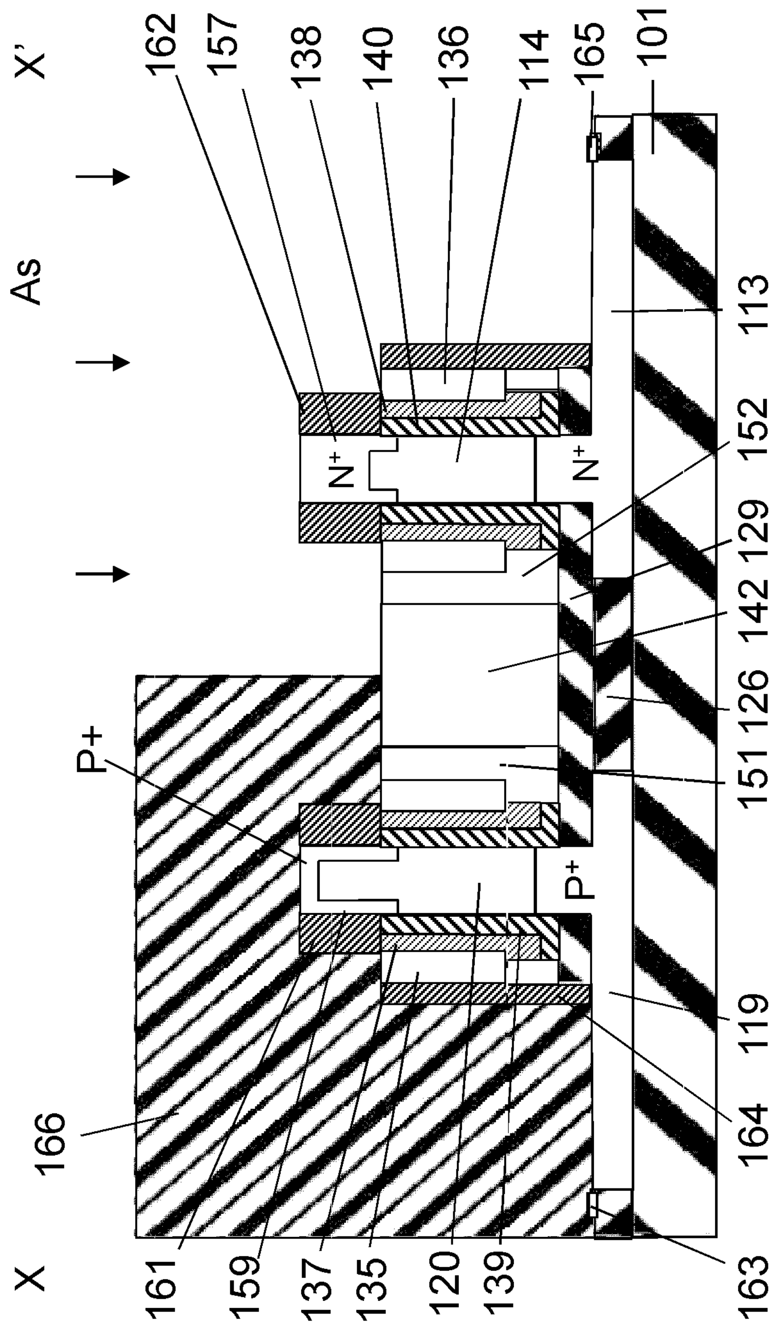
Figure 67C:
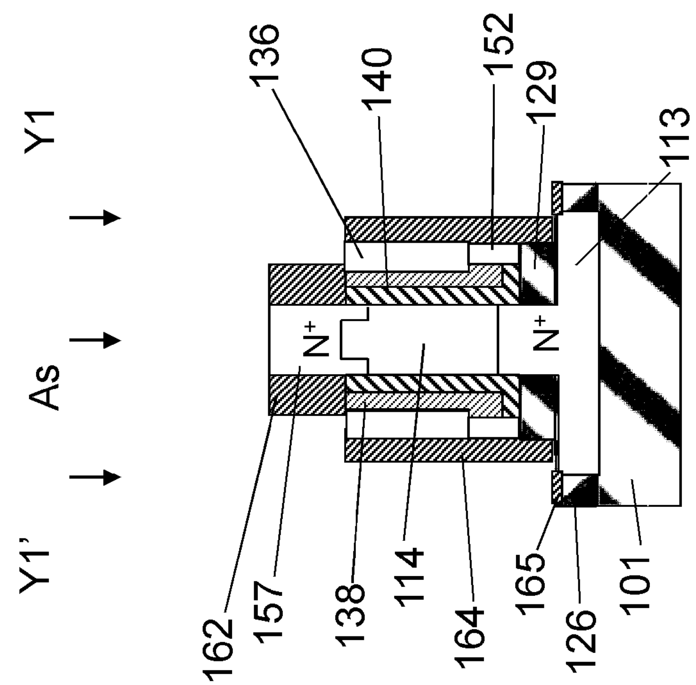
Figure 67D:
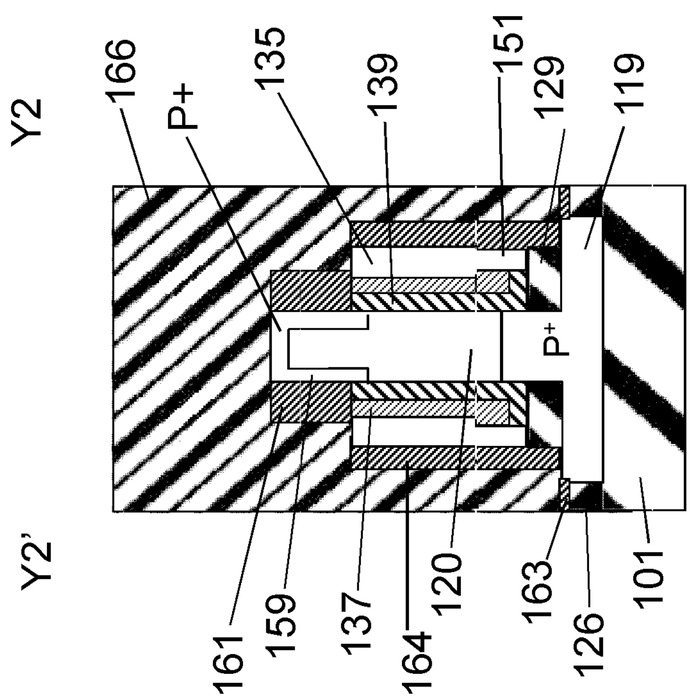
Figure 68A:
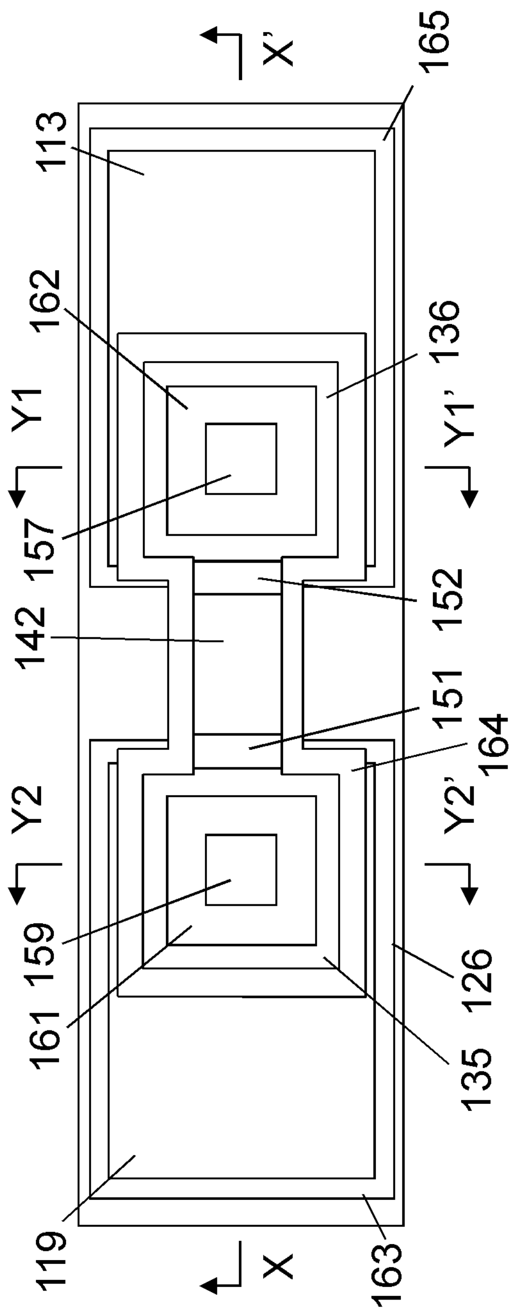
Figure 68B:
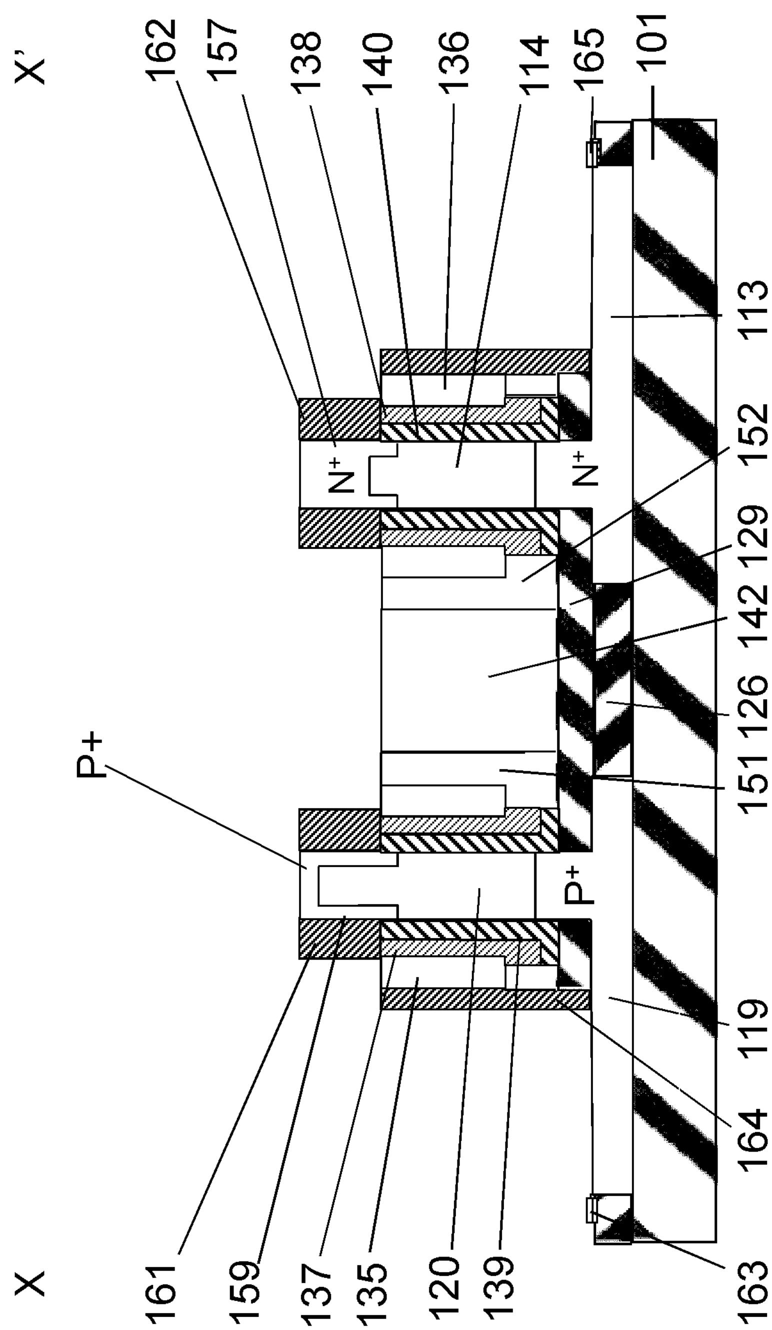
Figure 68C:
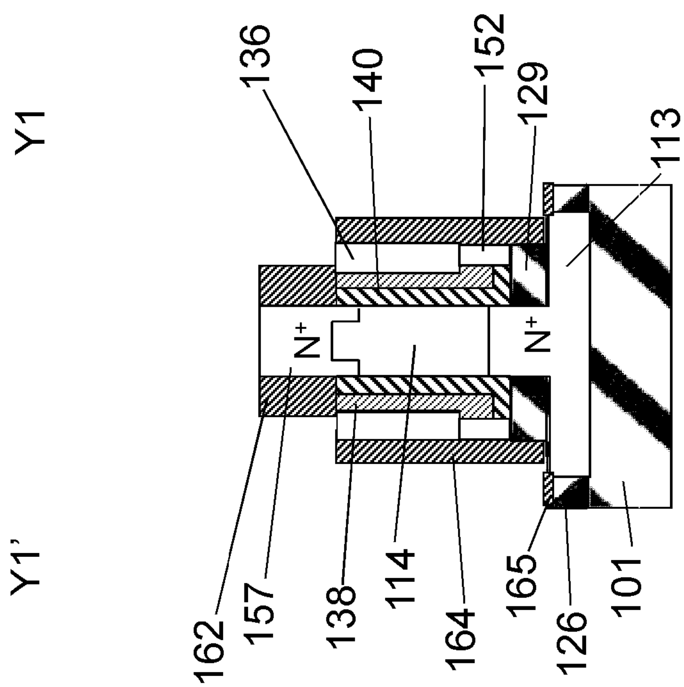
Figure 68D:
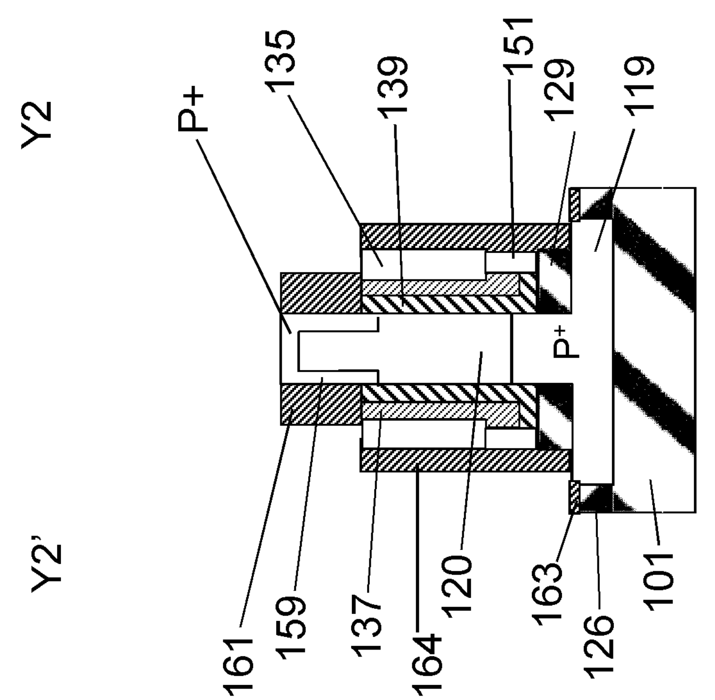
Figure 69A:
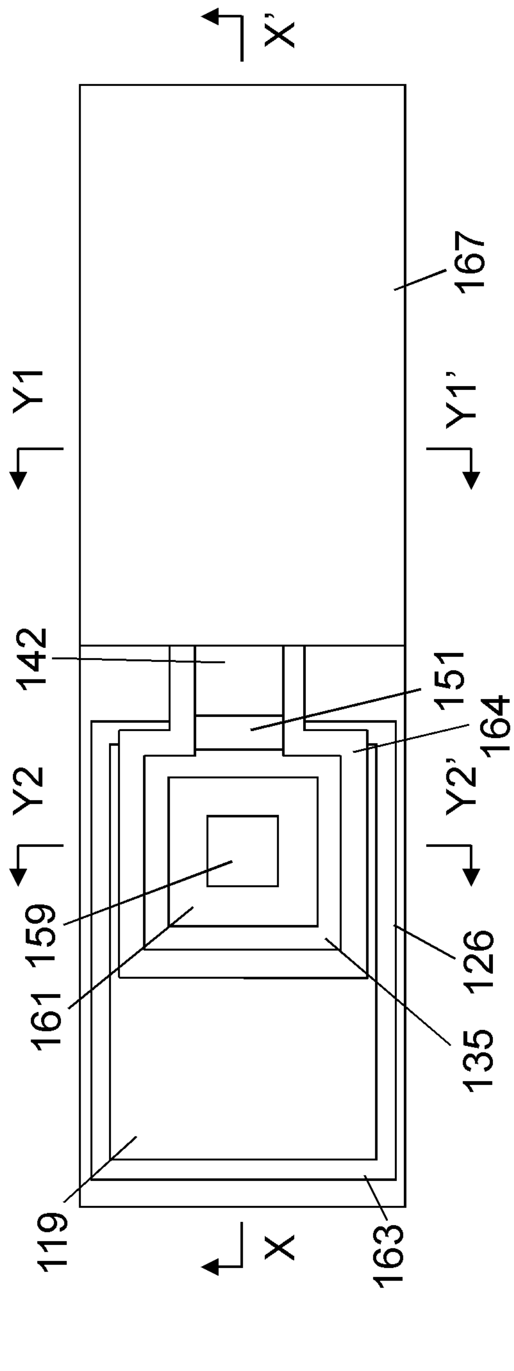
Figure 69B:
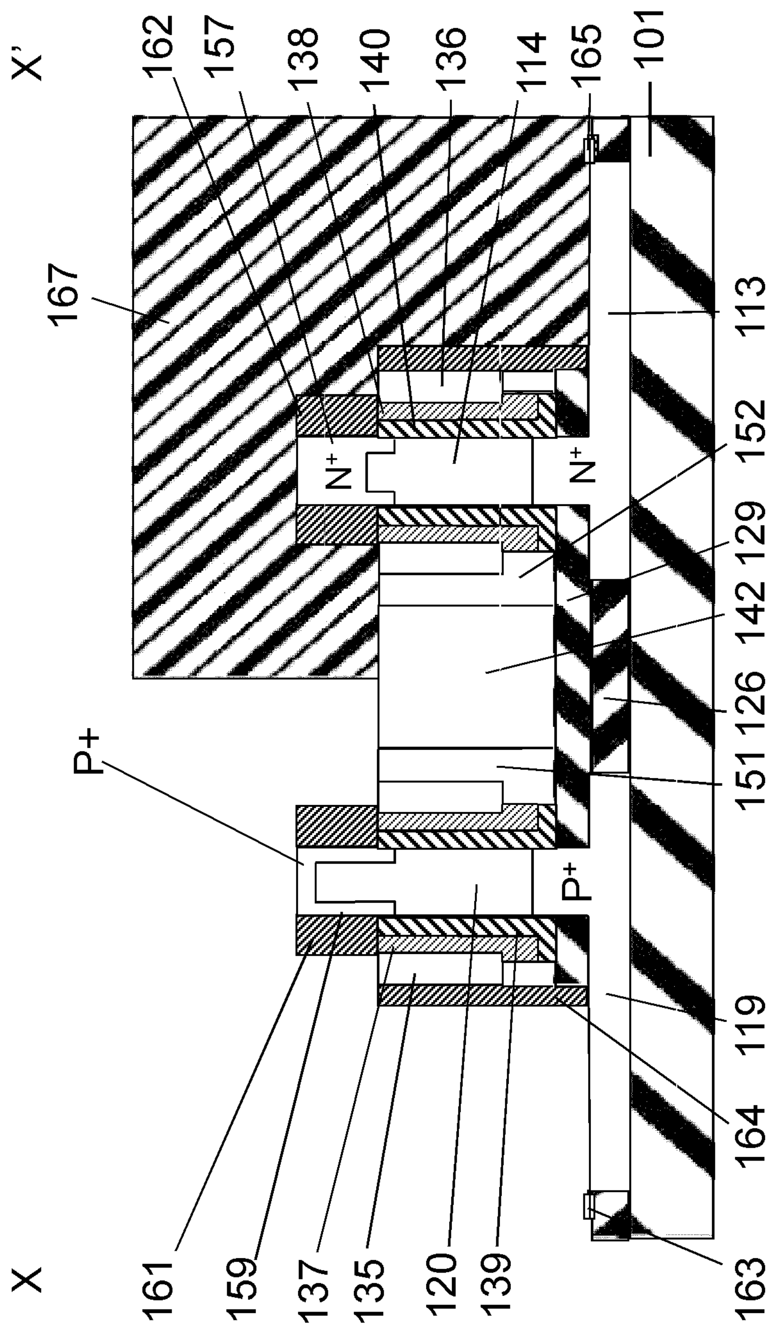
Figure 69C:
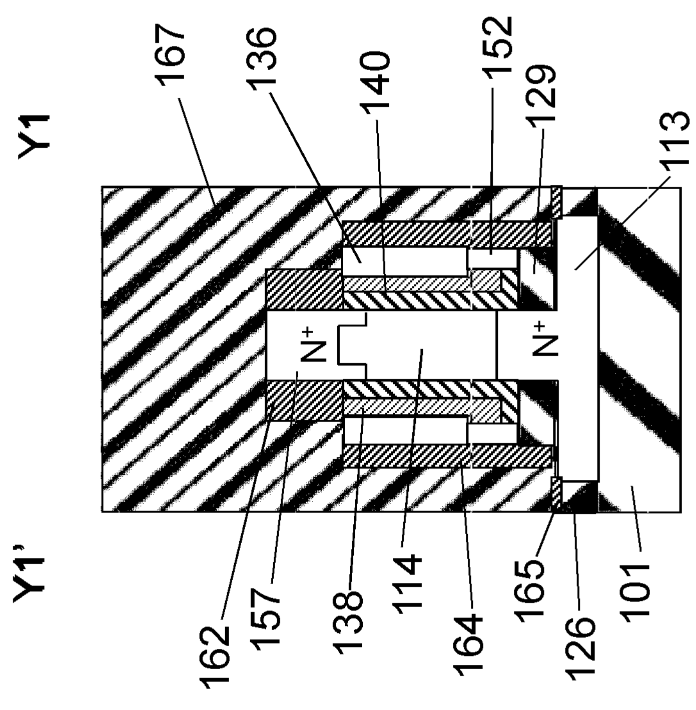
Figure 69D:
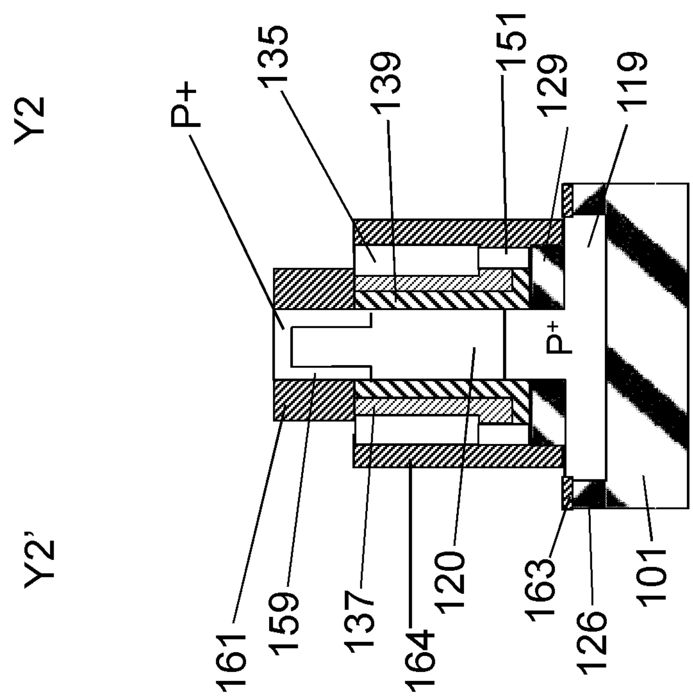
Figure 70A:
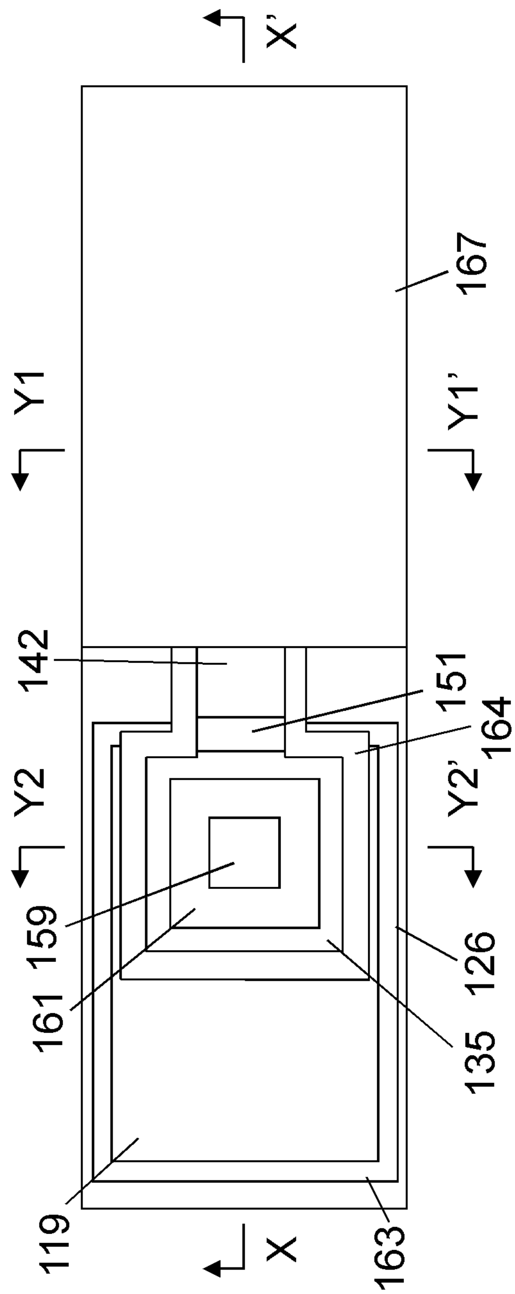
Figure 70B:
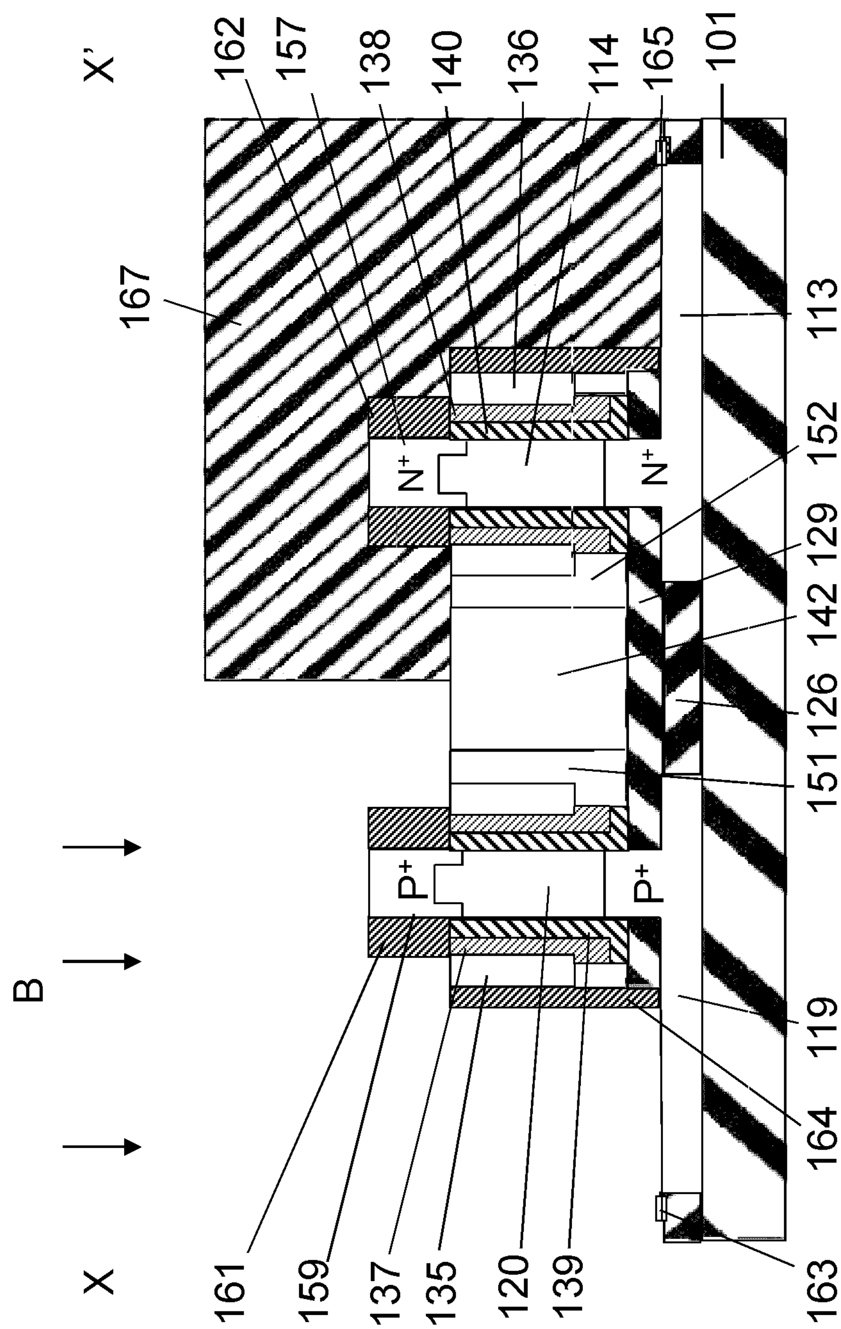
Figure 70C:
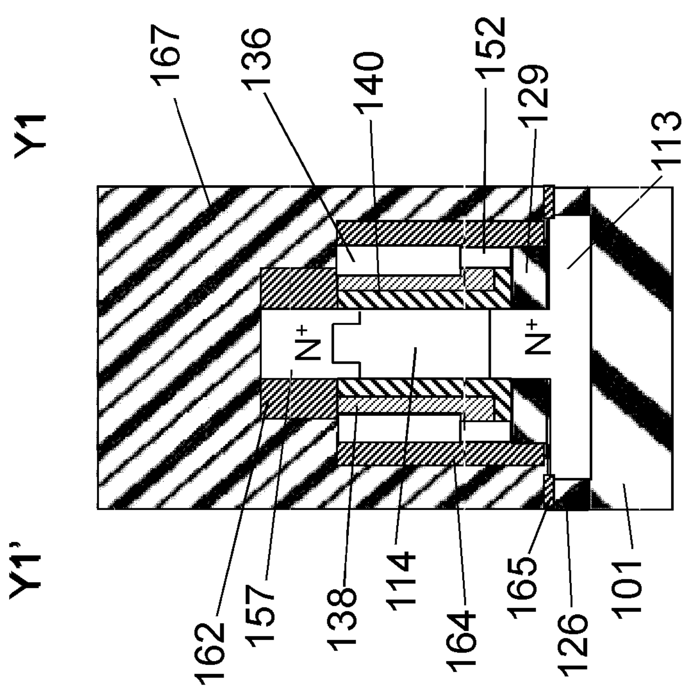
Figure 70D:
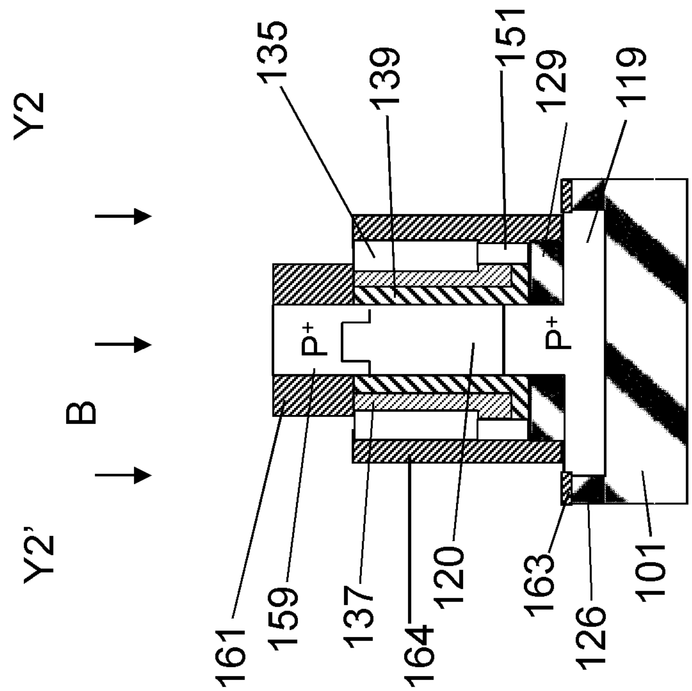
Figure 71A:
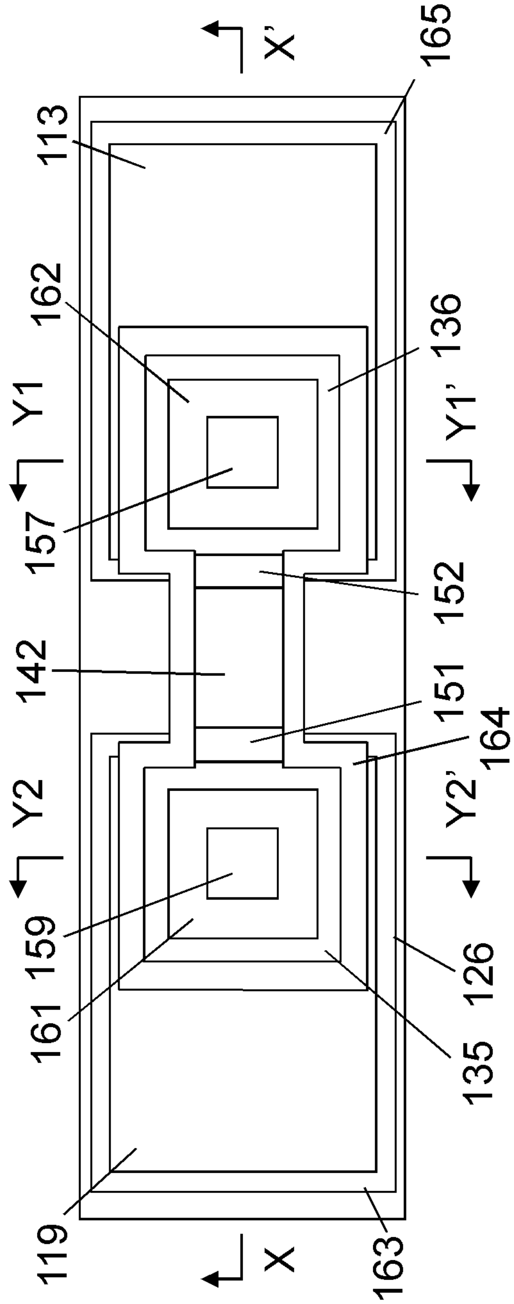
Figure 71B:
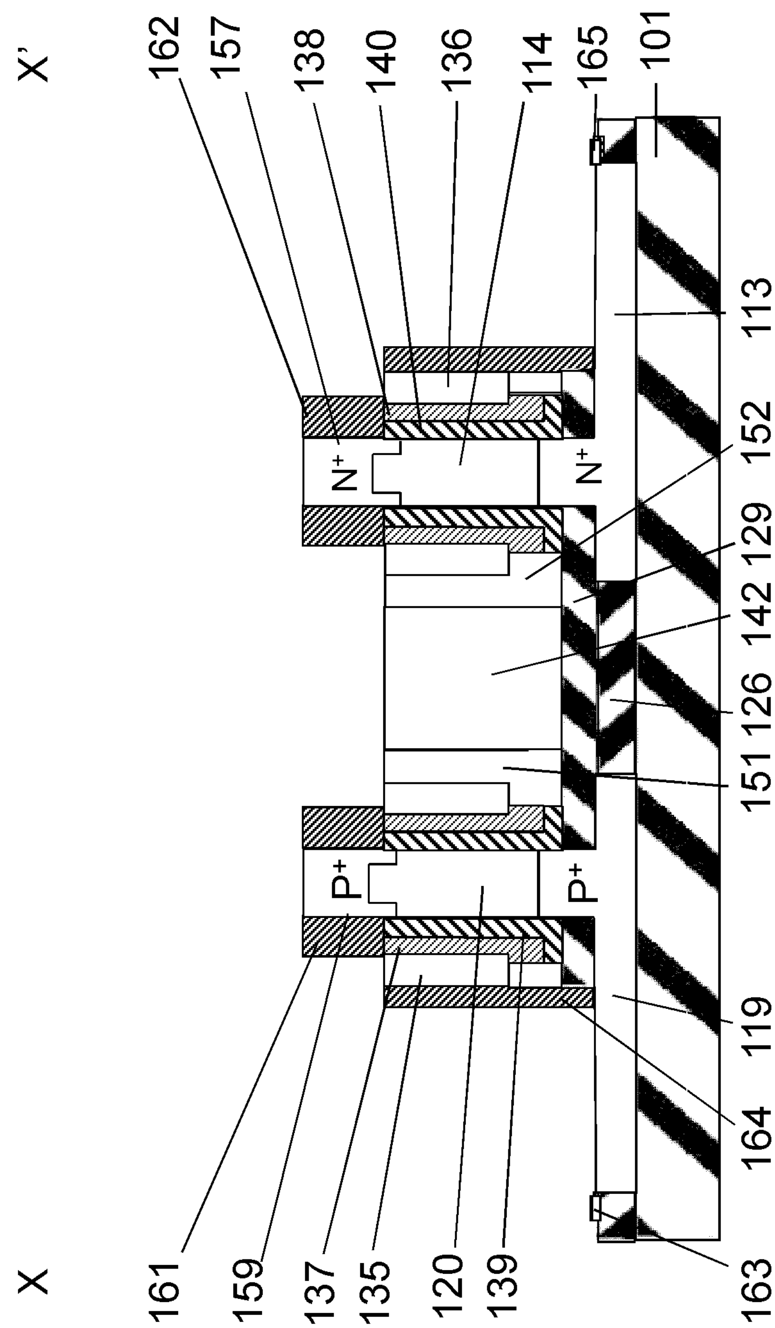
Figure 71C:
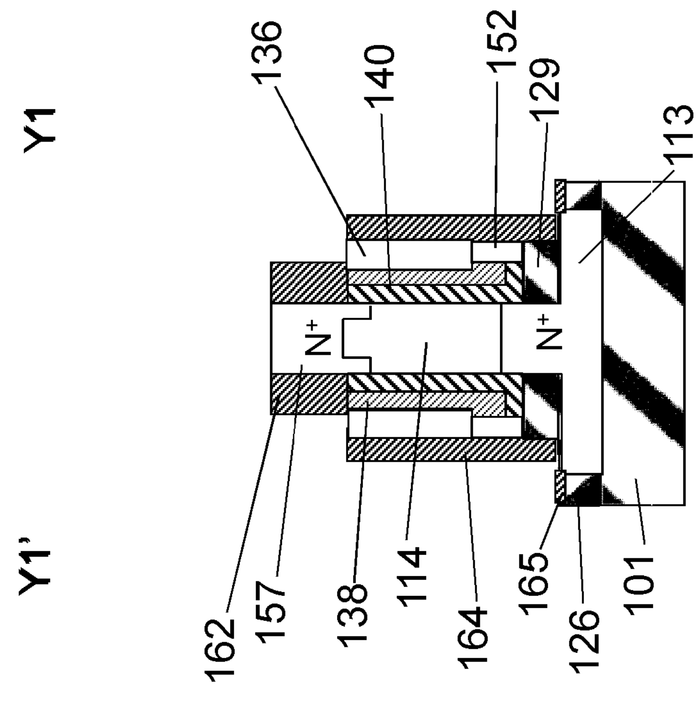
Figure 71D:
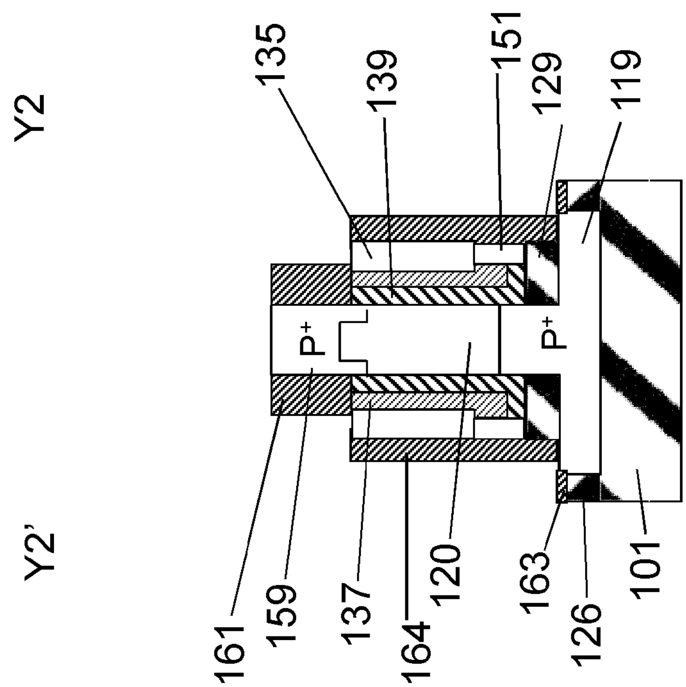
Figure 72A:
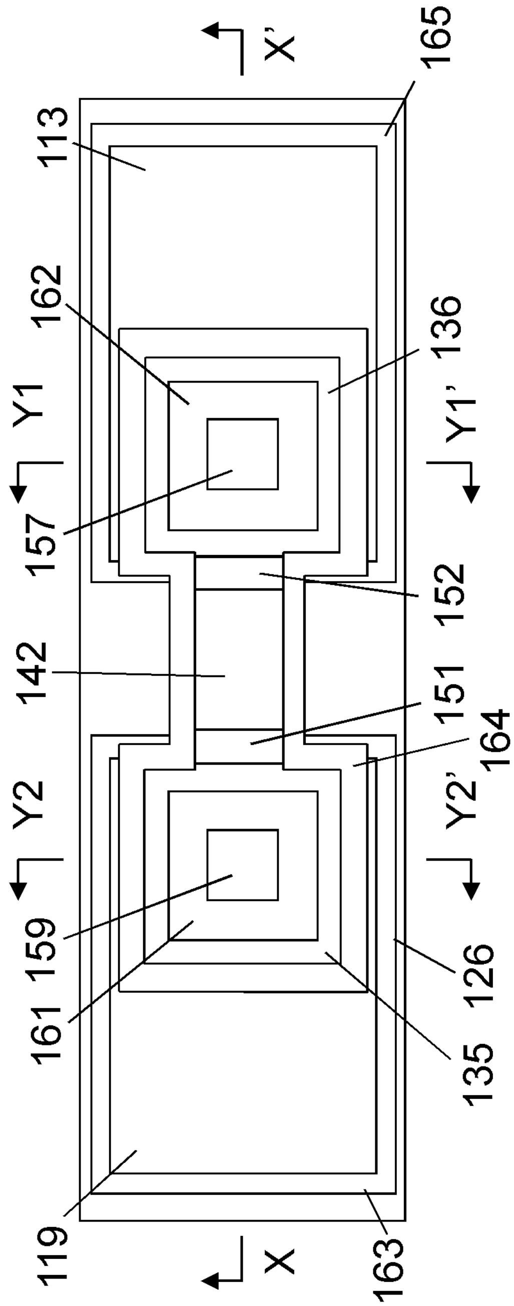
Figure 72B:
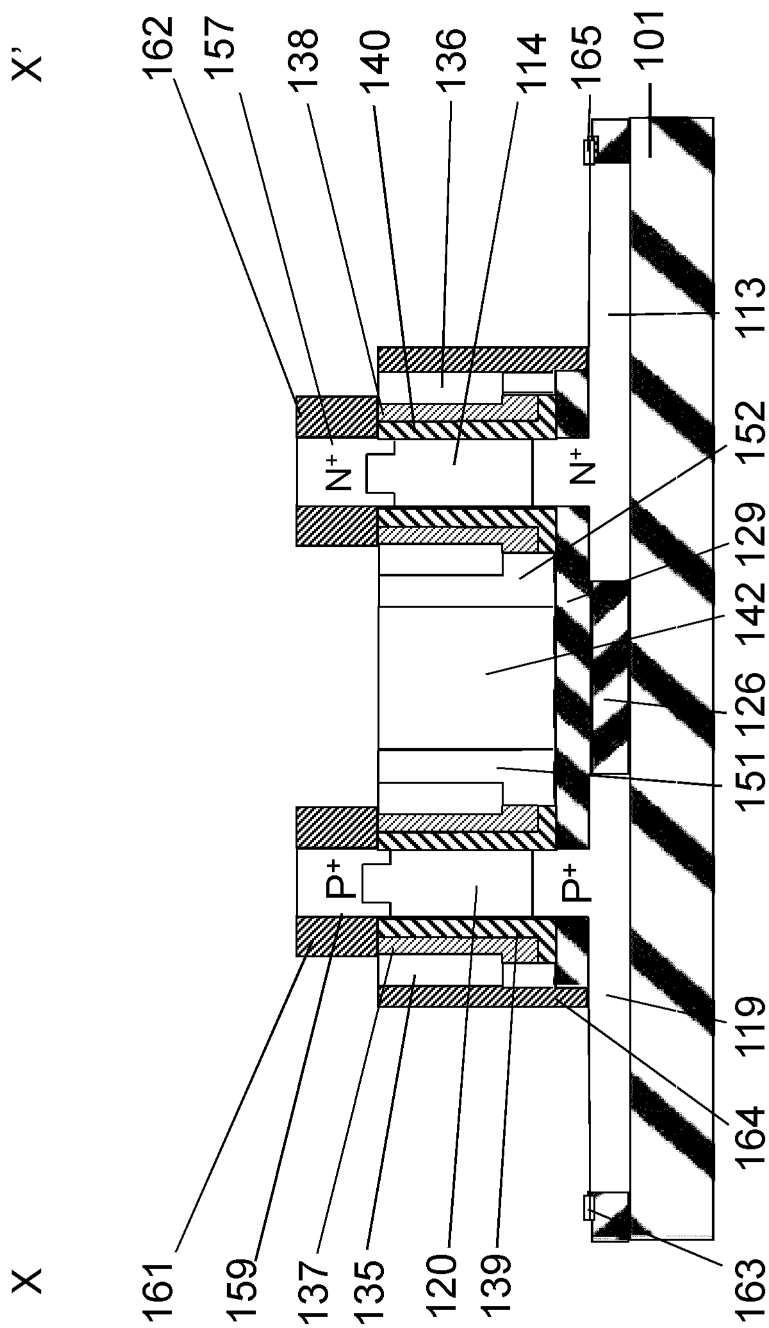
Figure 72C:
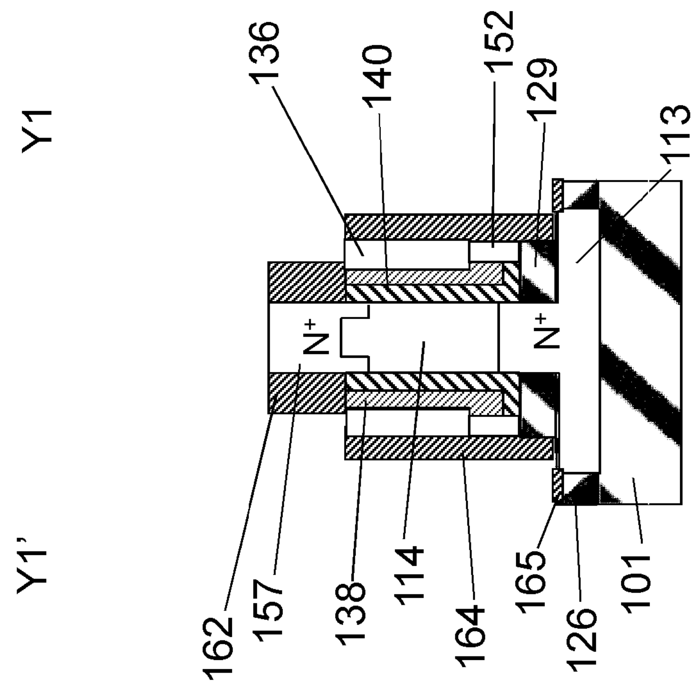
Figure 72D:
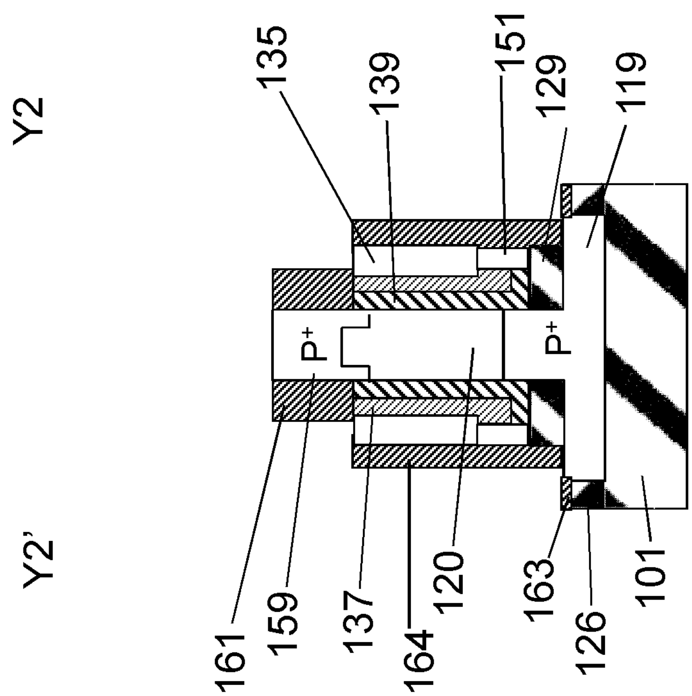
Figure 73A:
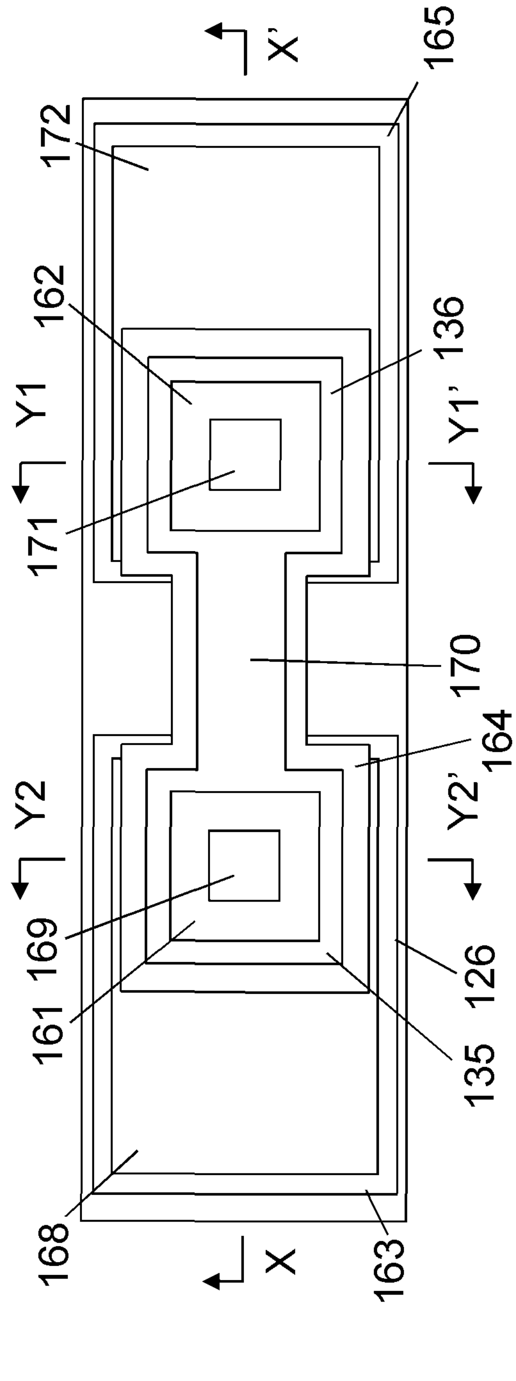
Figure 73B:
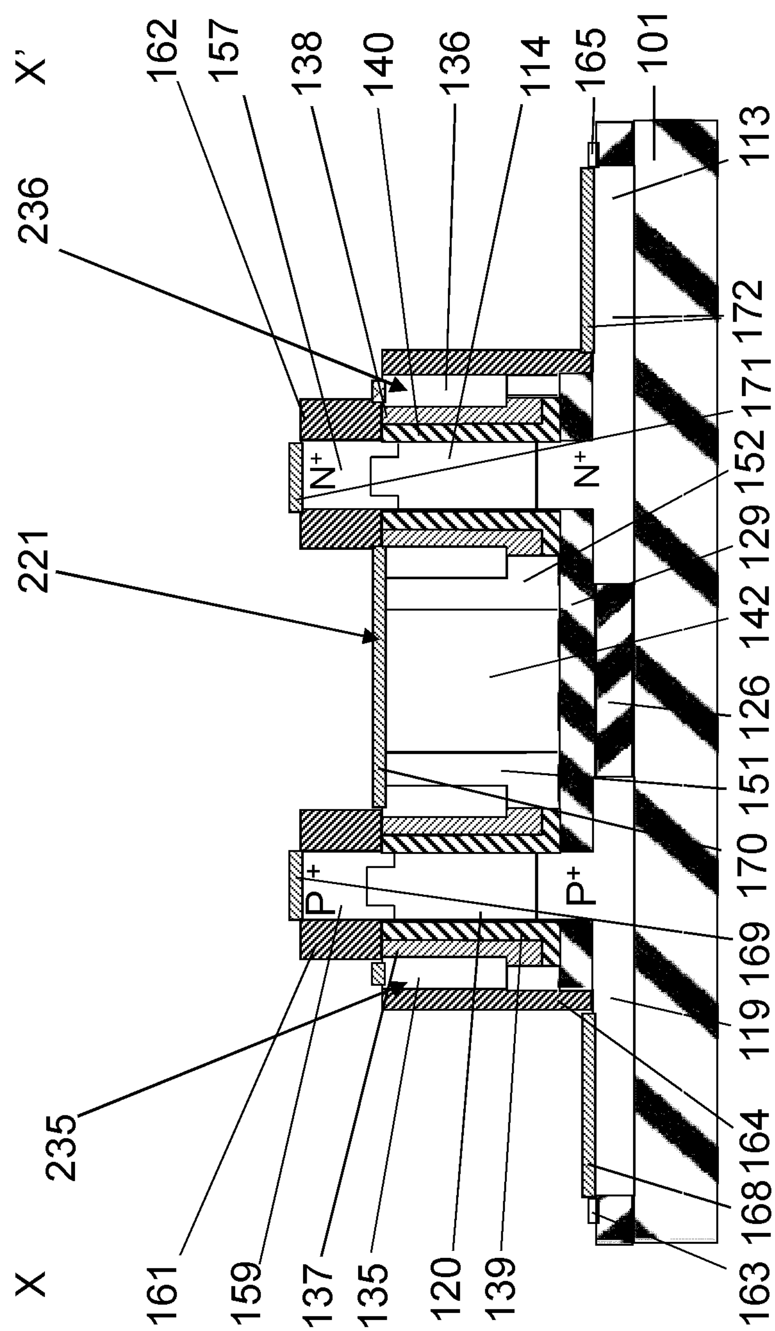
Figure 73C:
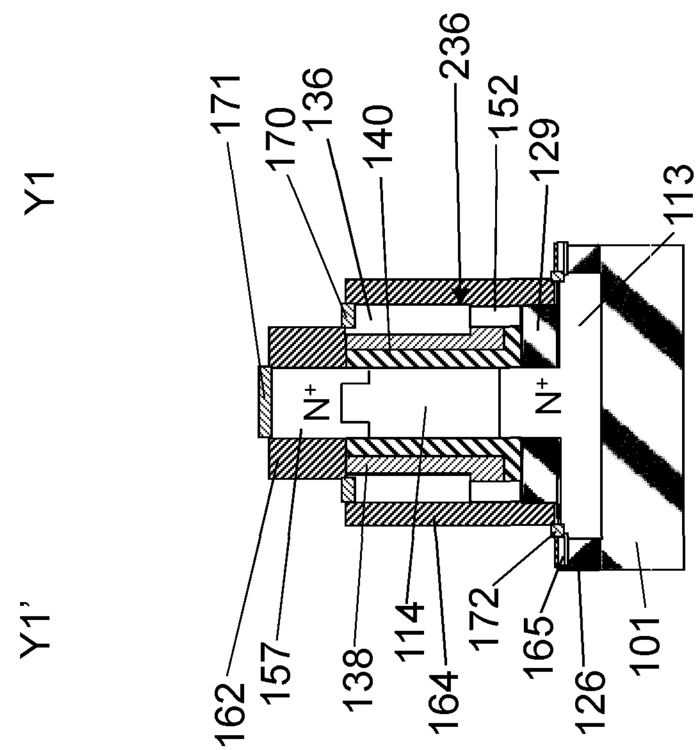
Figure 73D:
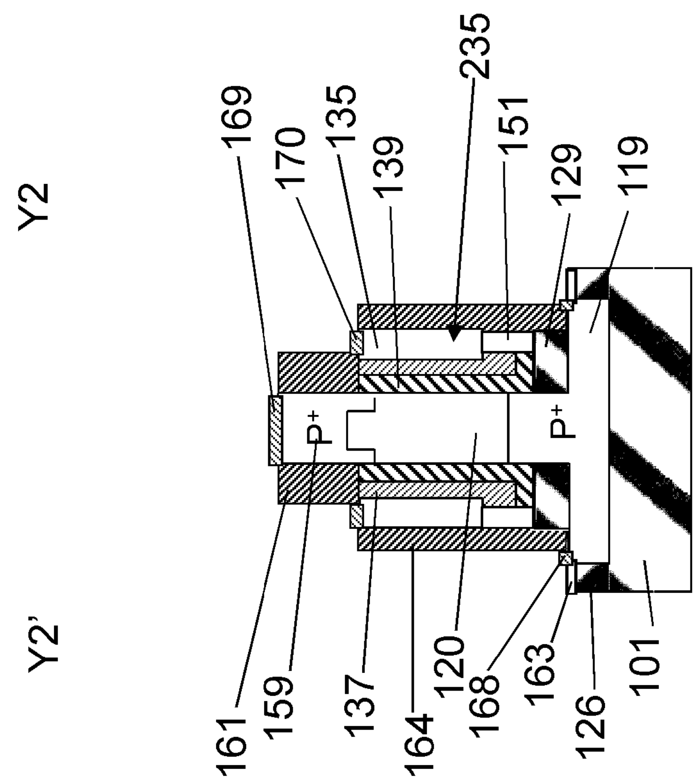
Figure 74A:
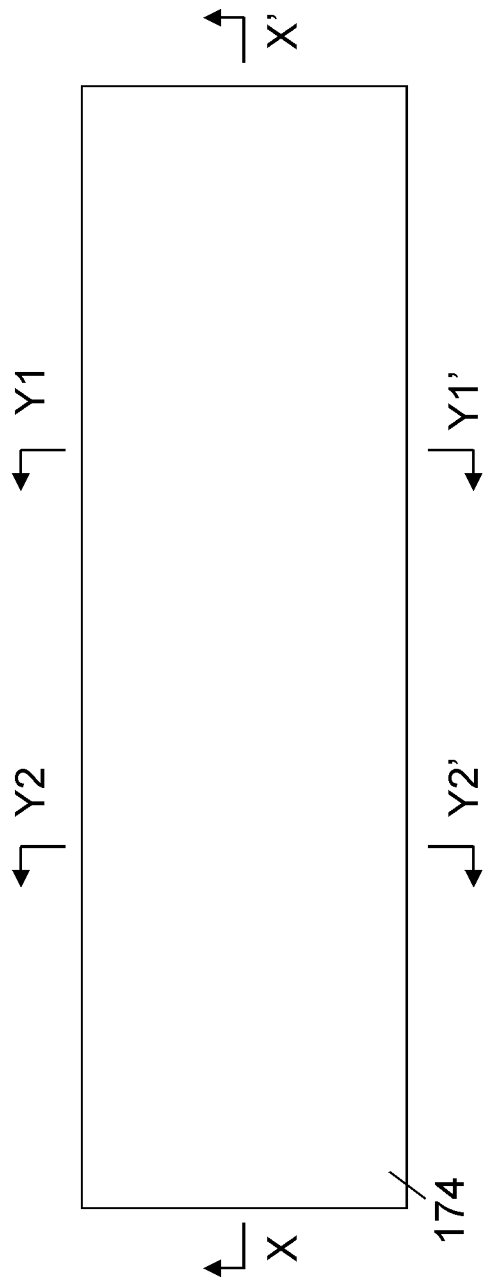
Figure 74B:
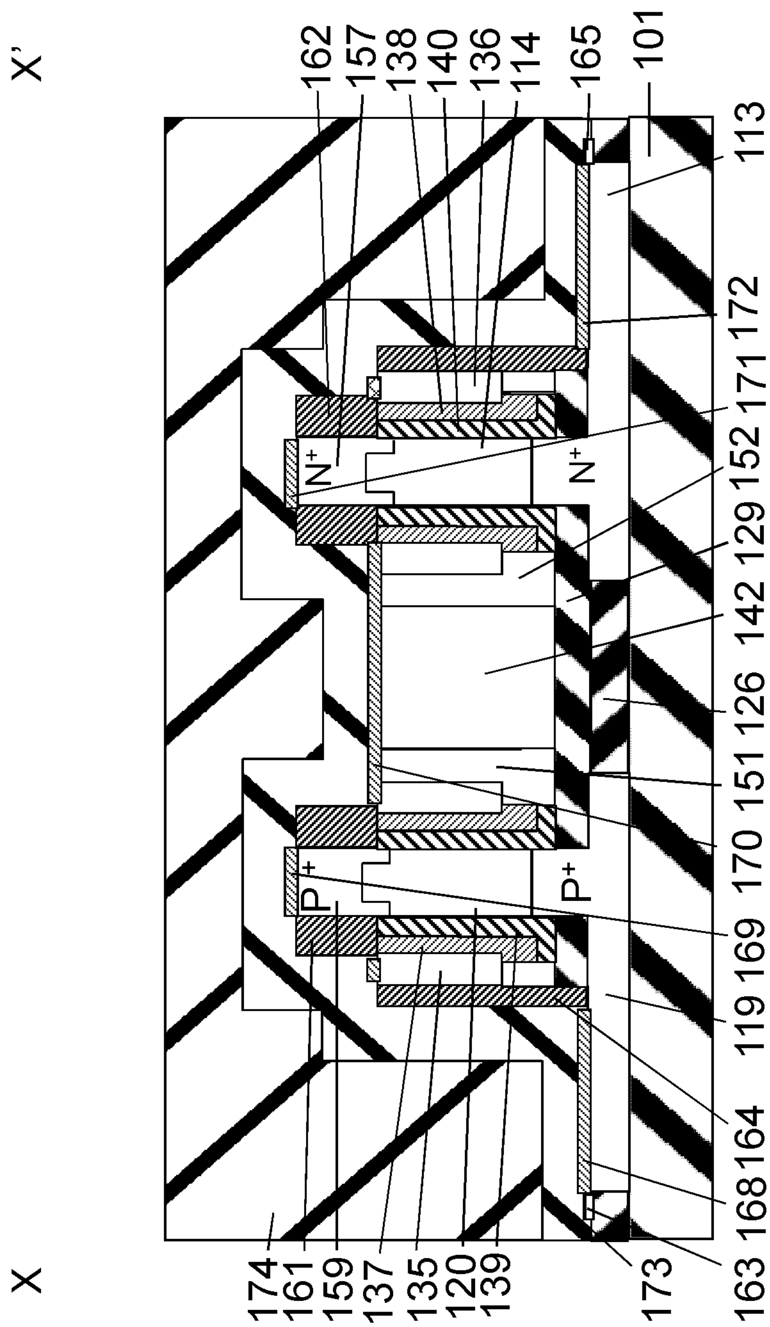
Figure 74C:
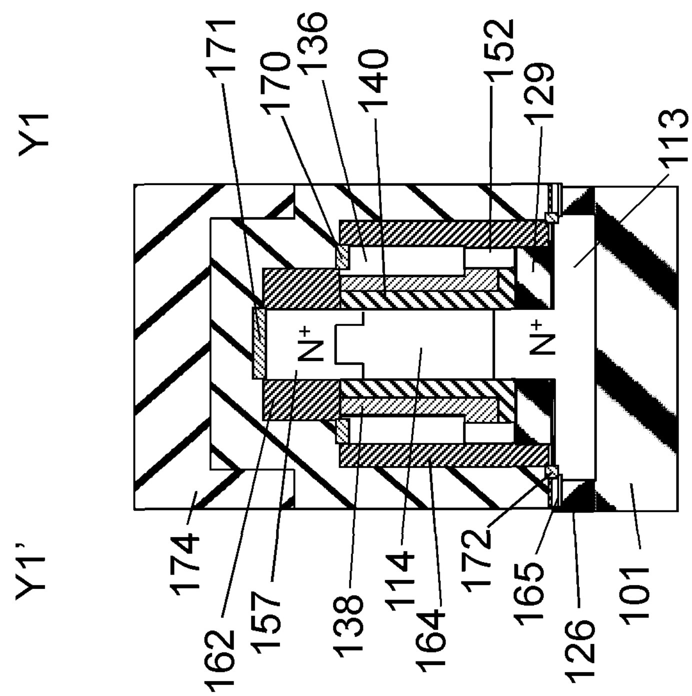
Figure 74D:
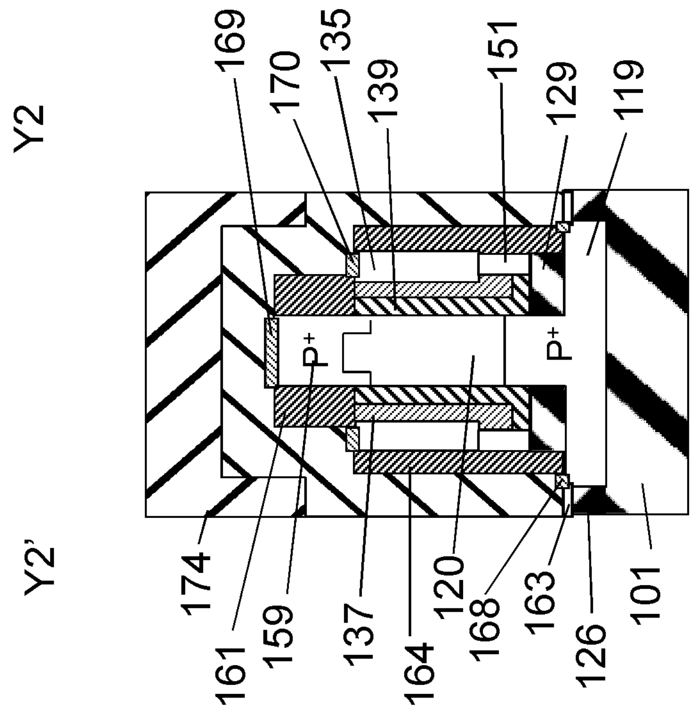
Figure 75A:
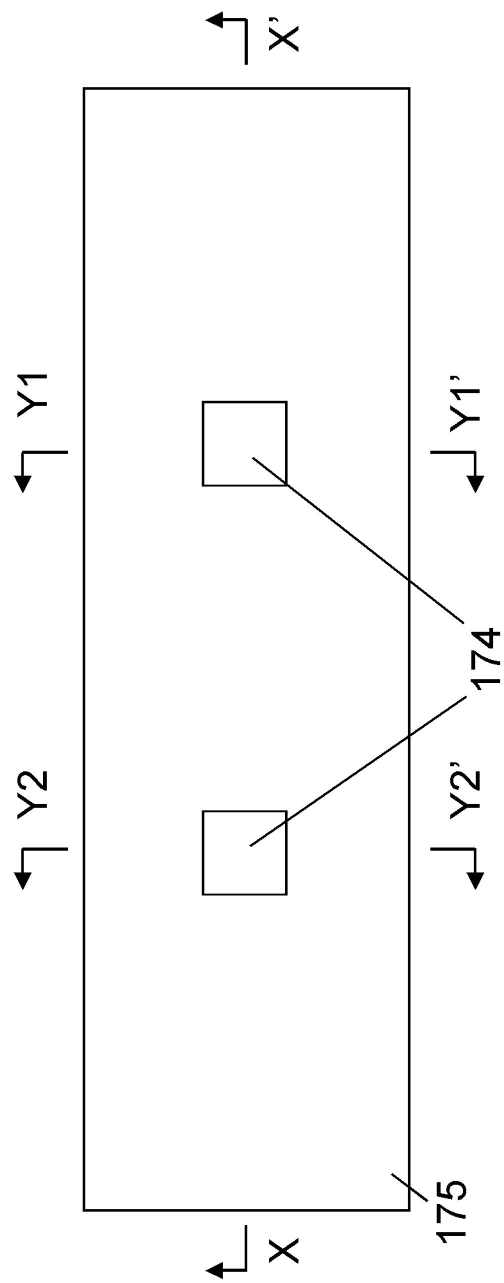
Figure 75B:
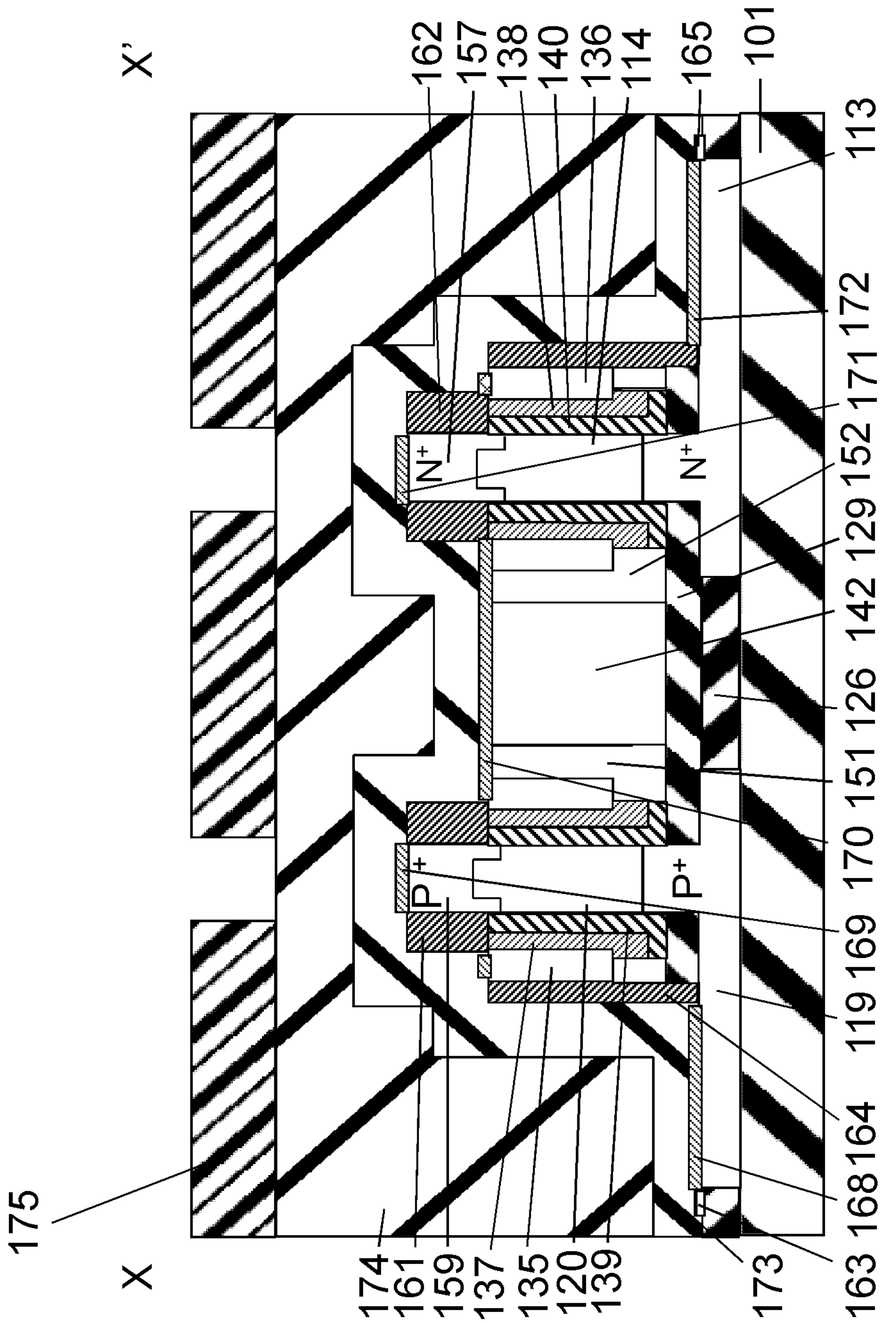
Figure 75C:
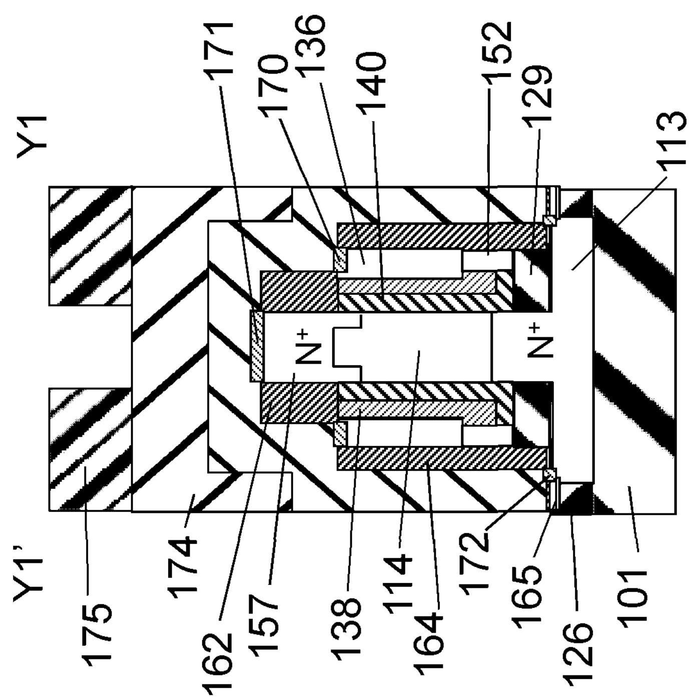
Figure 75D:
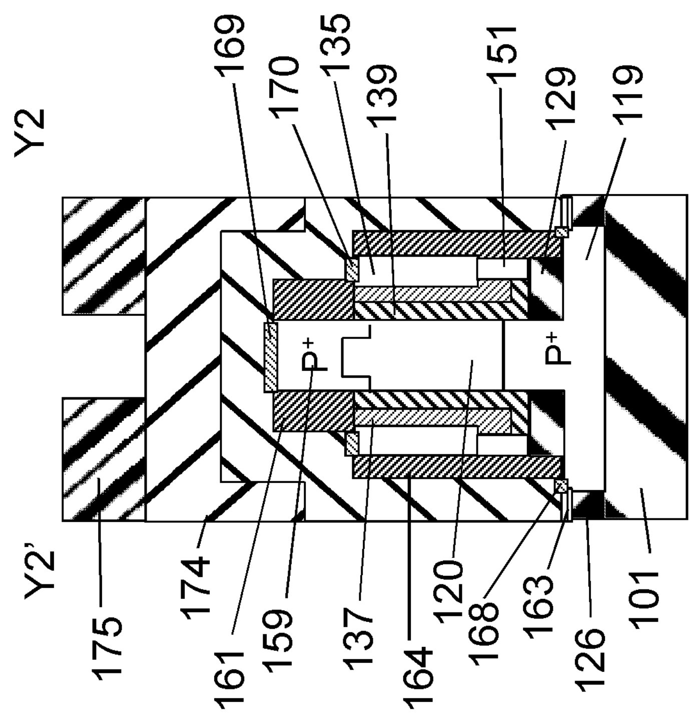
Figure 76A:
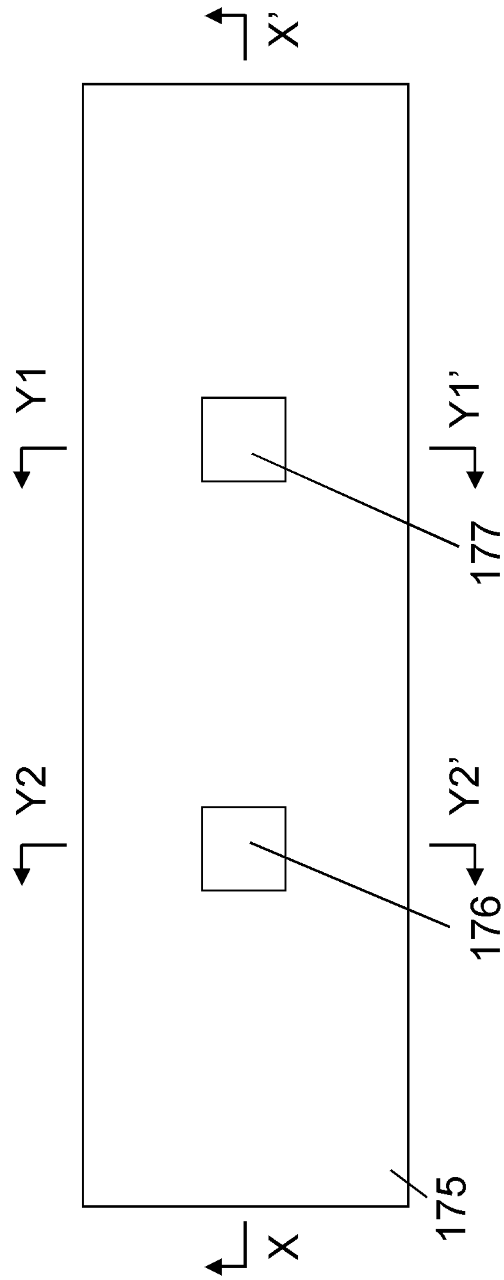
Figure 76B:
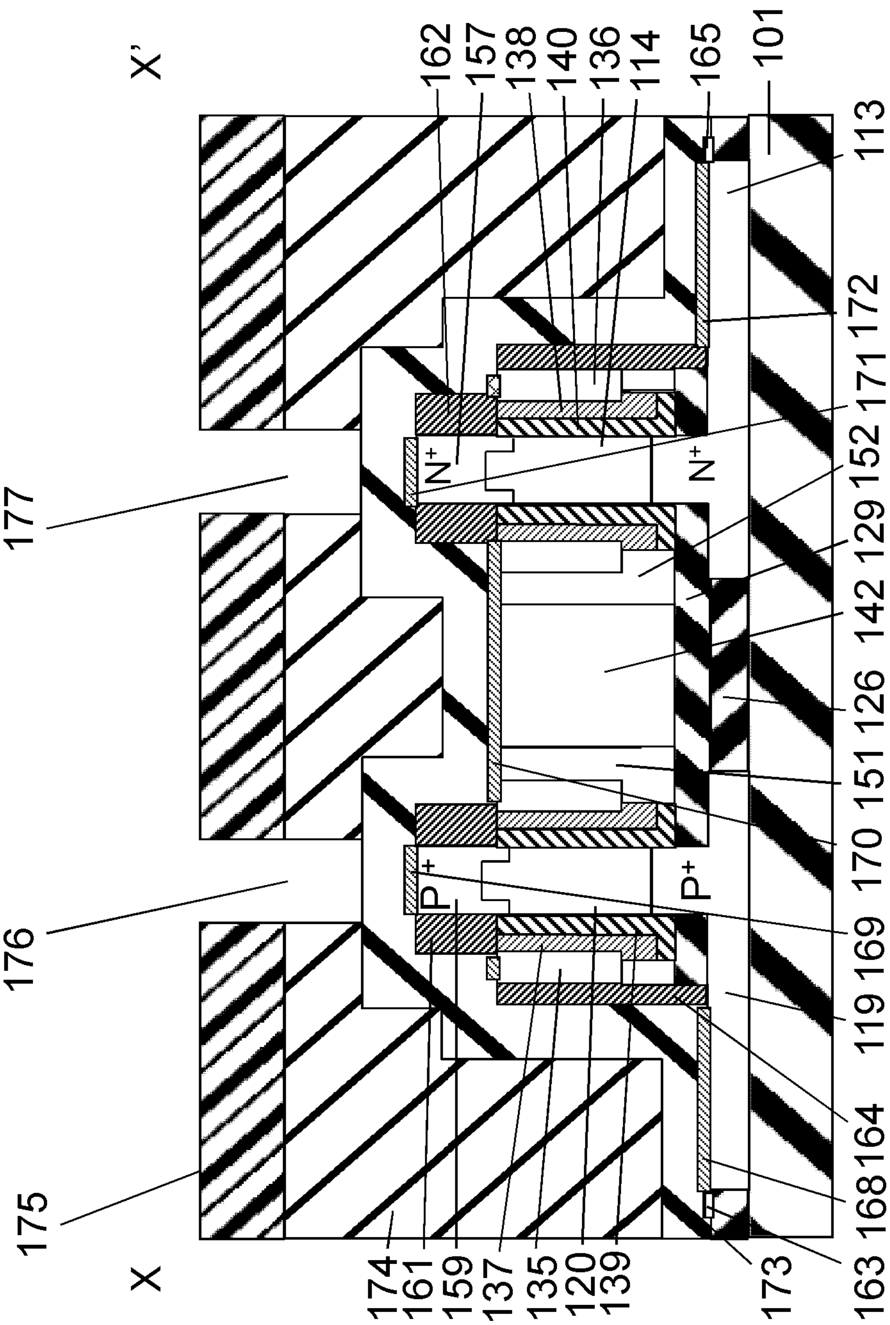
Figure 76C:
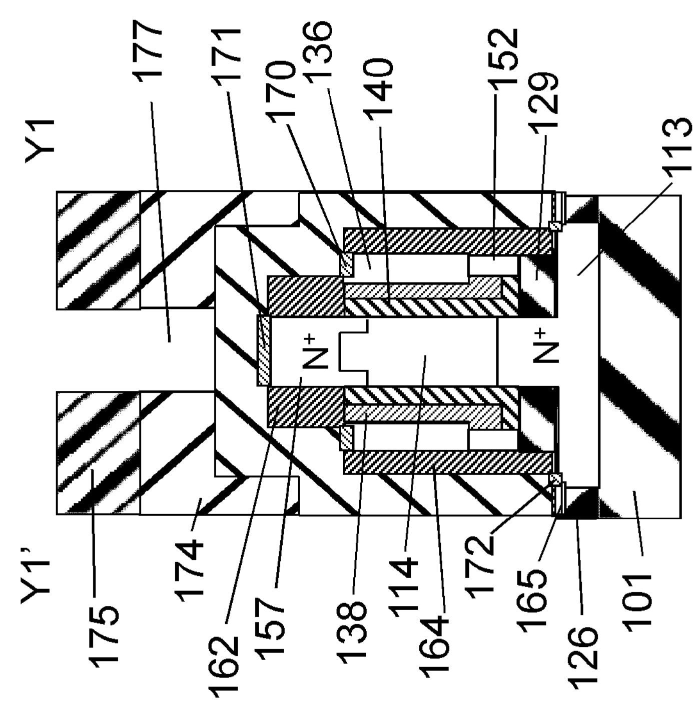
Figure 76D:
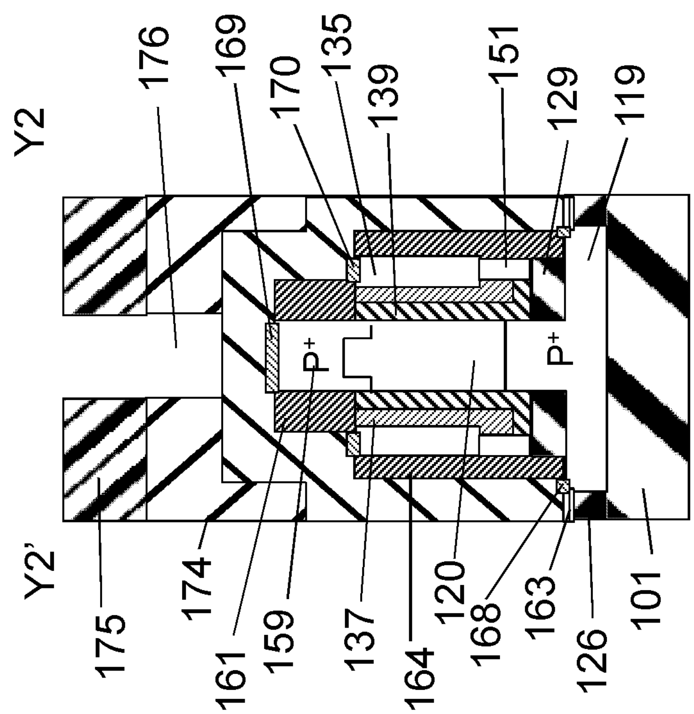
Figure 77A:
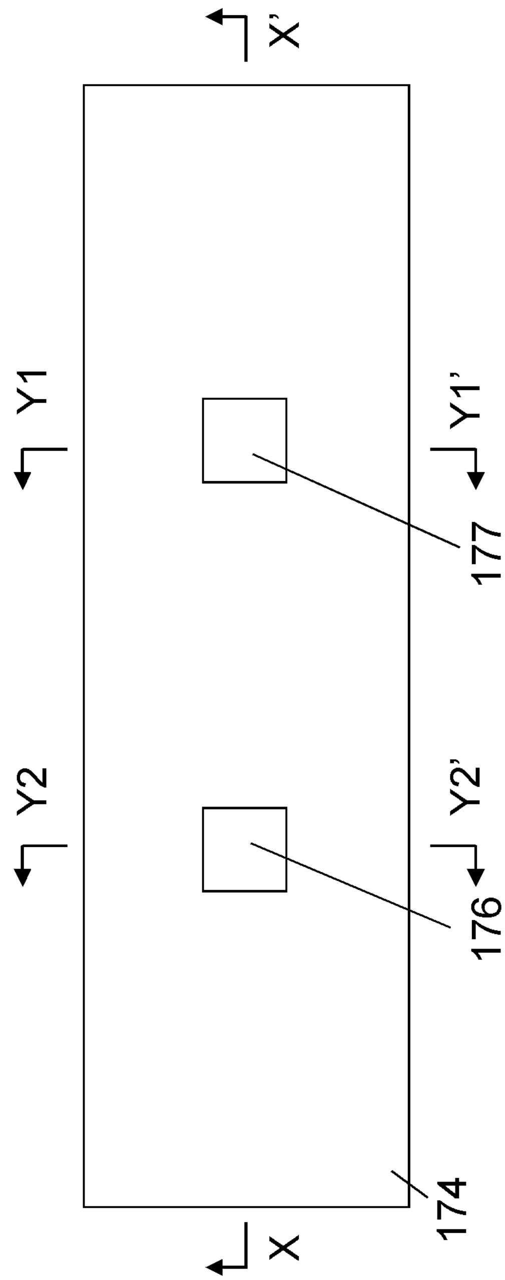
Figure 77B:
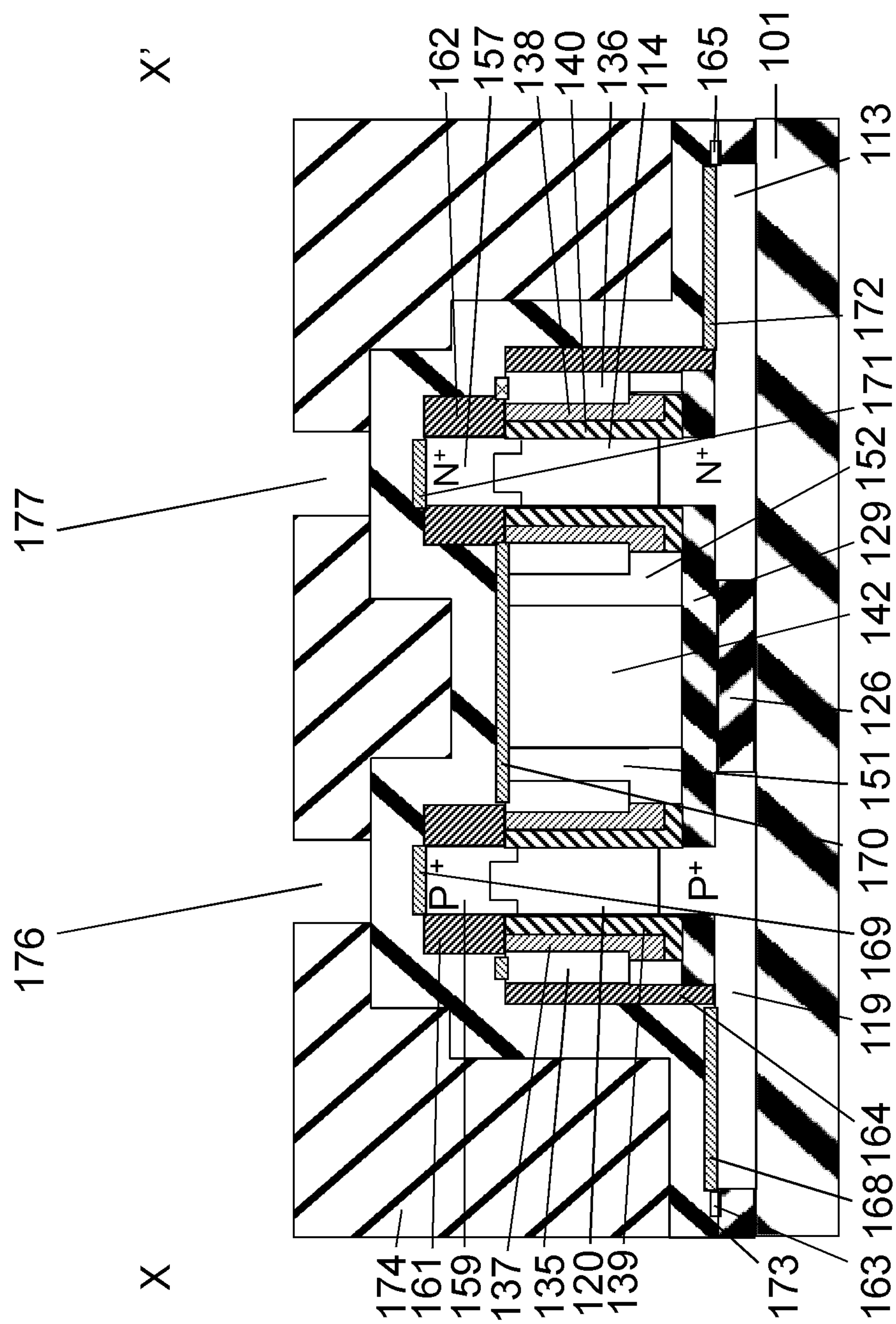
Figure 77C:
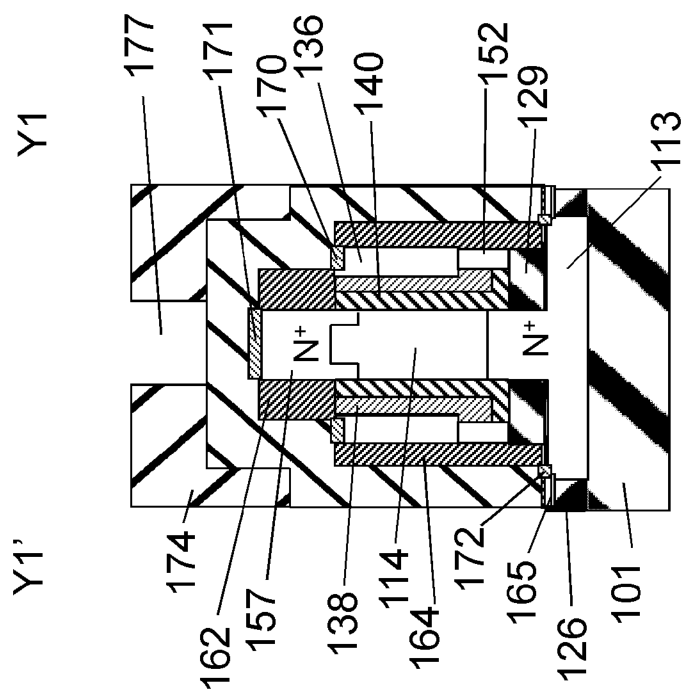
Figure 77D:
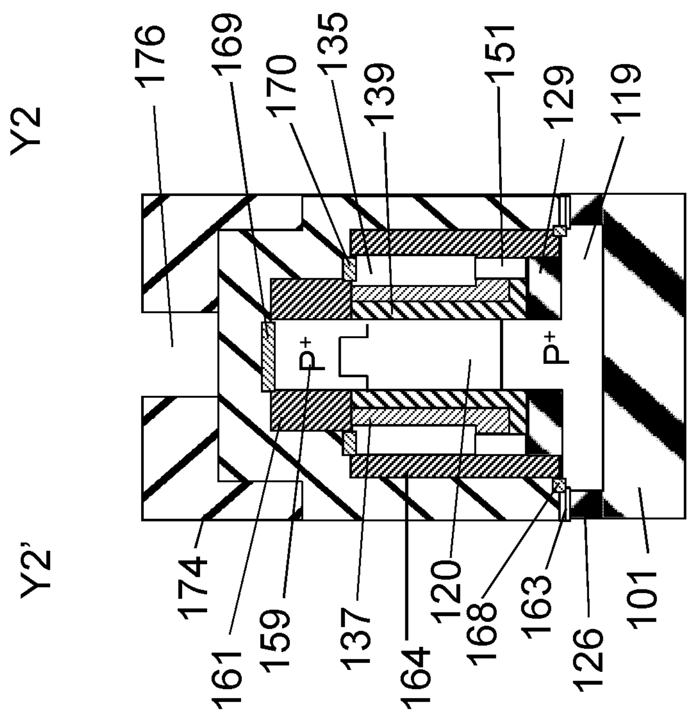
Figure 78A:
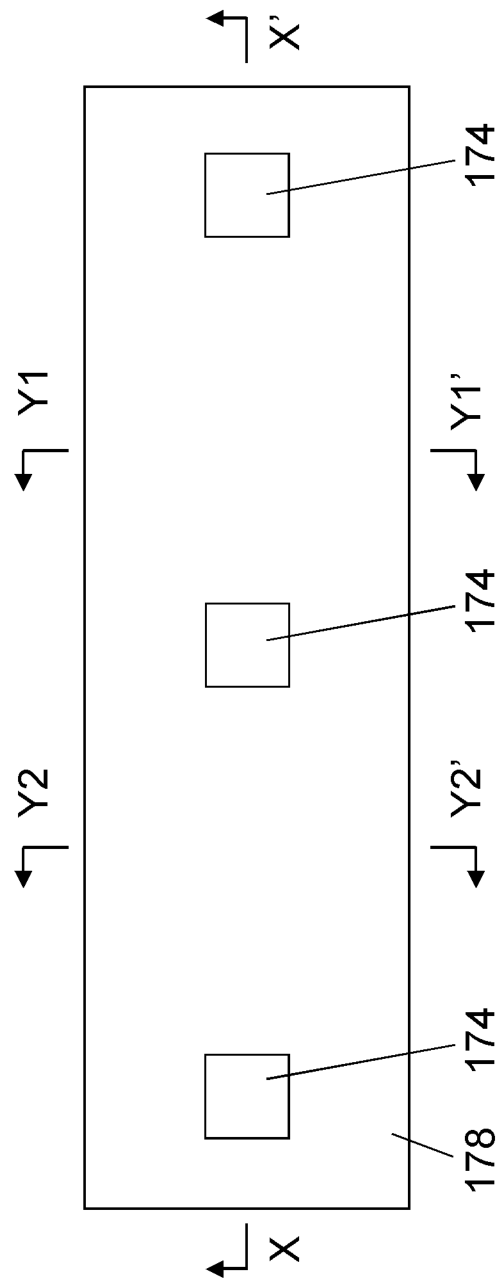
Figure 78B:
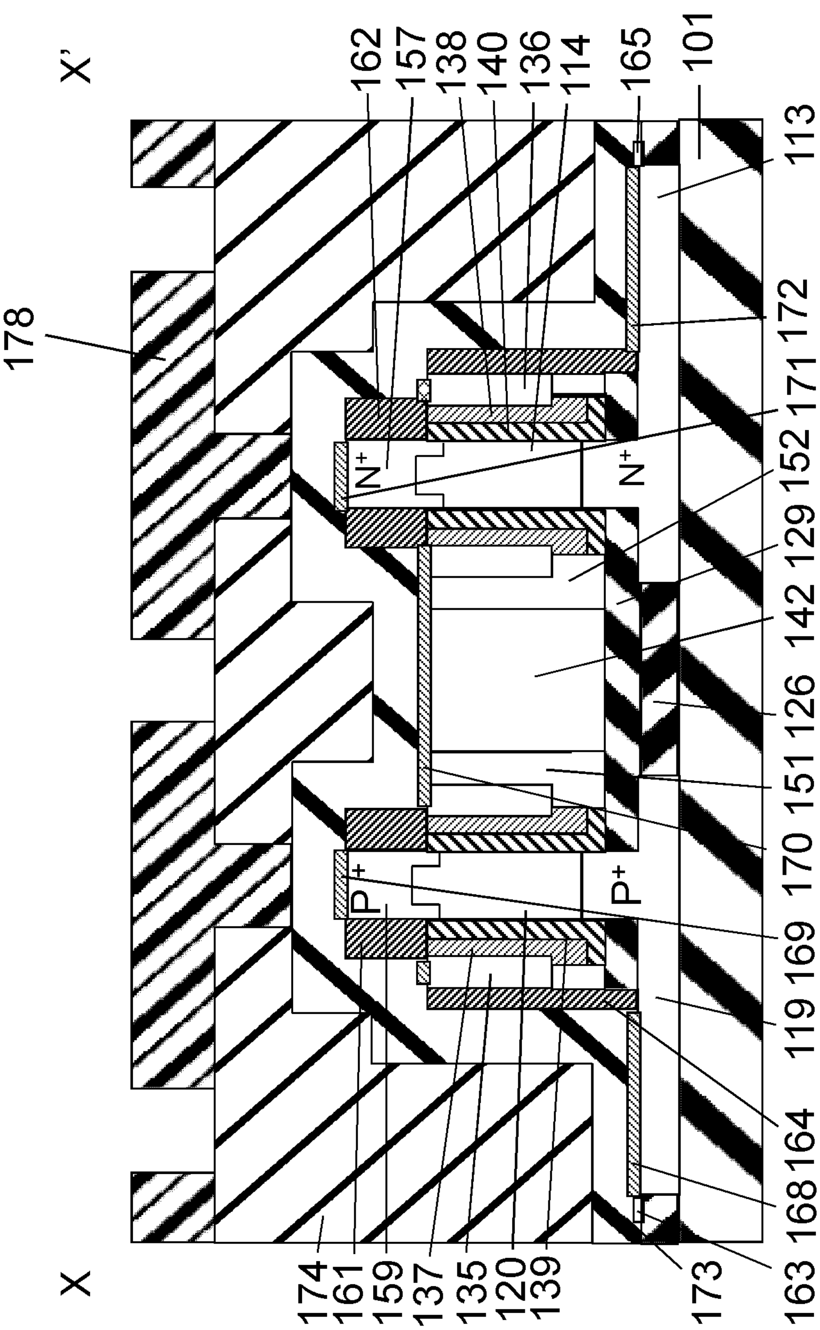
Figure 78C:
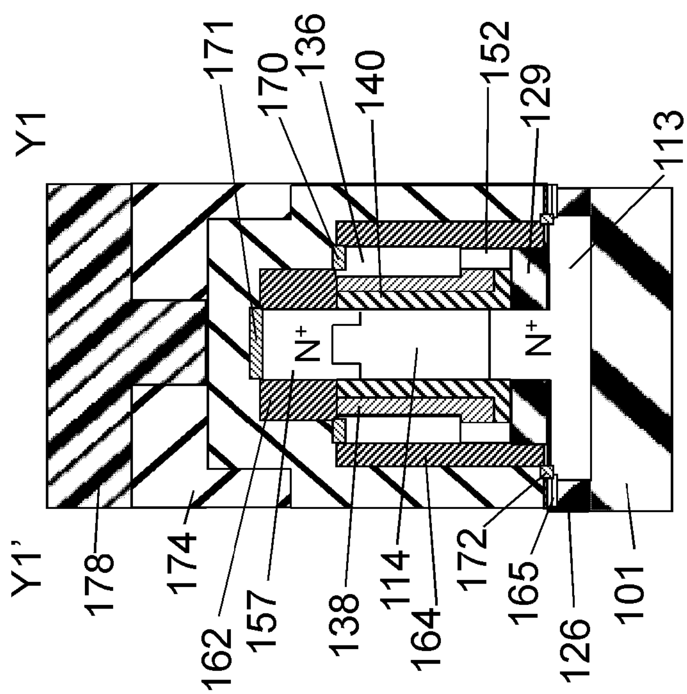
Figure 78D:
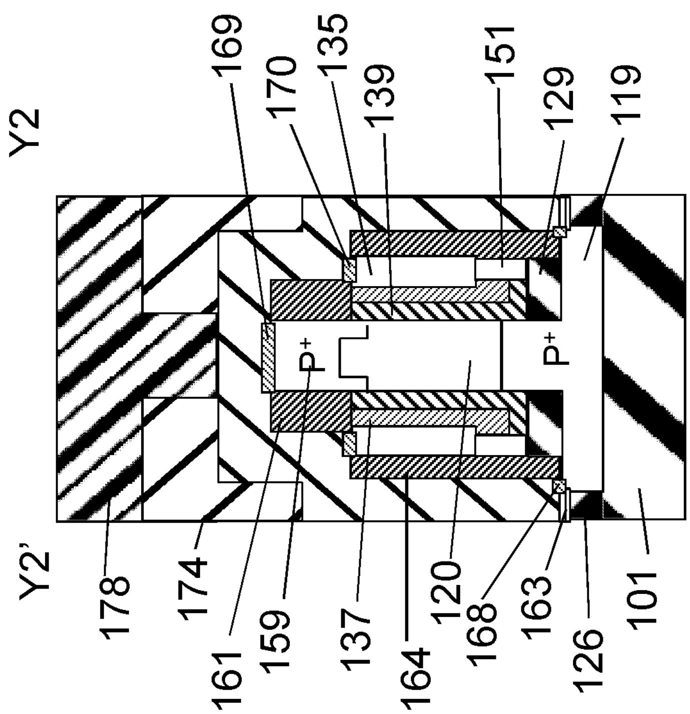
Figure 79A:
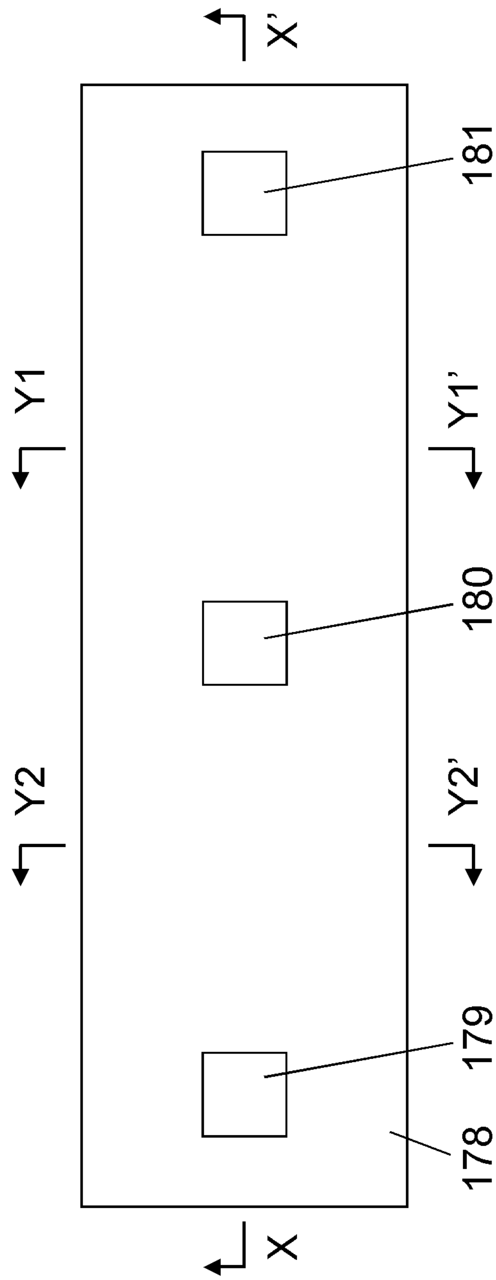
Figure 79B:
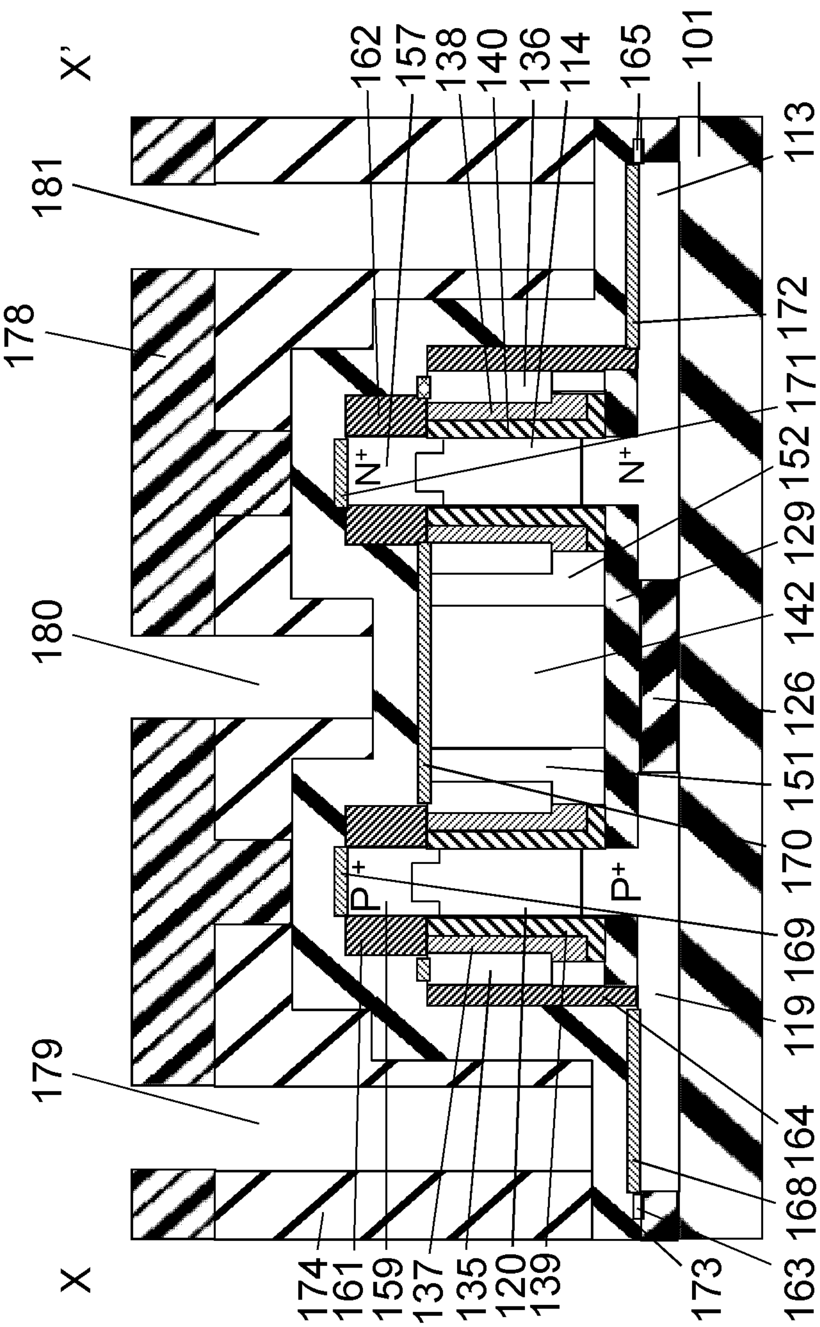
Figure 79C:
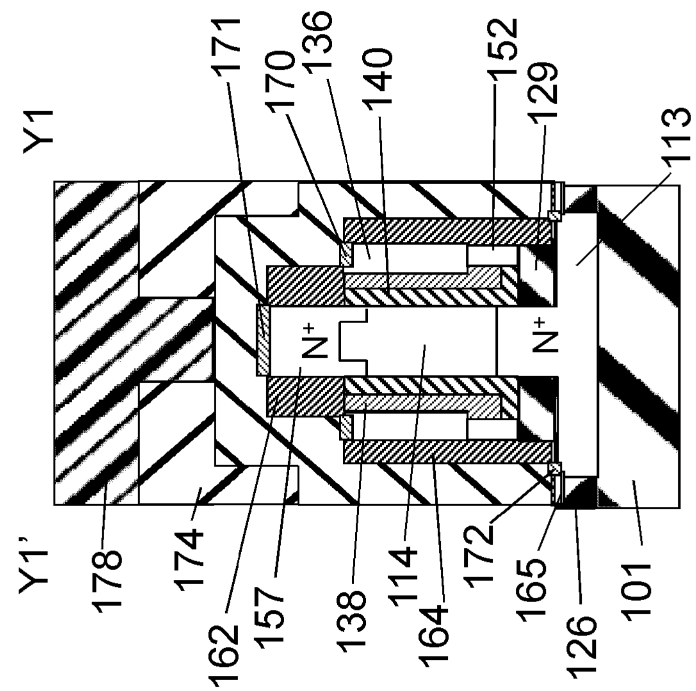
Figure 79D:
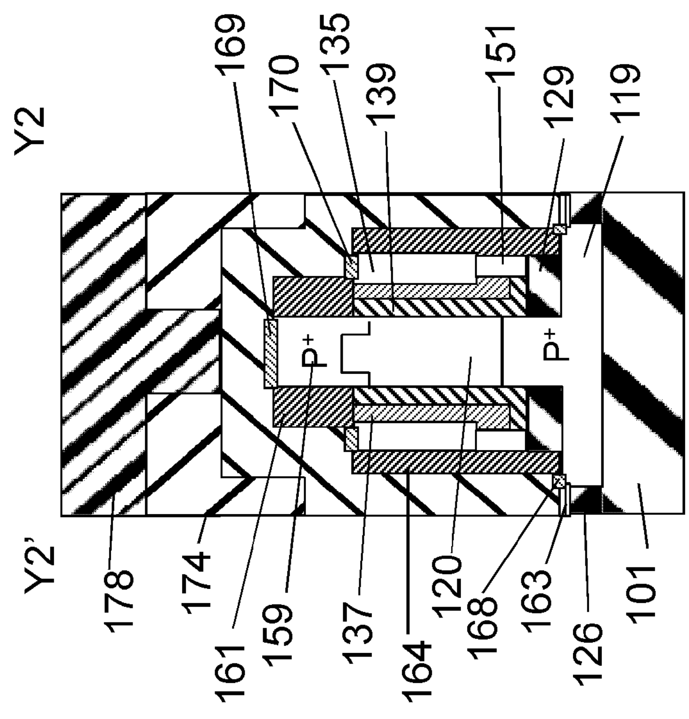
Figure 80A:
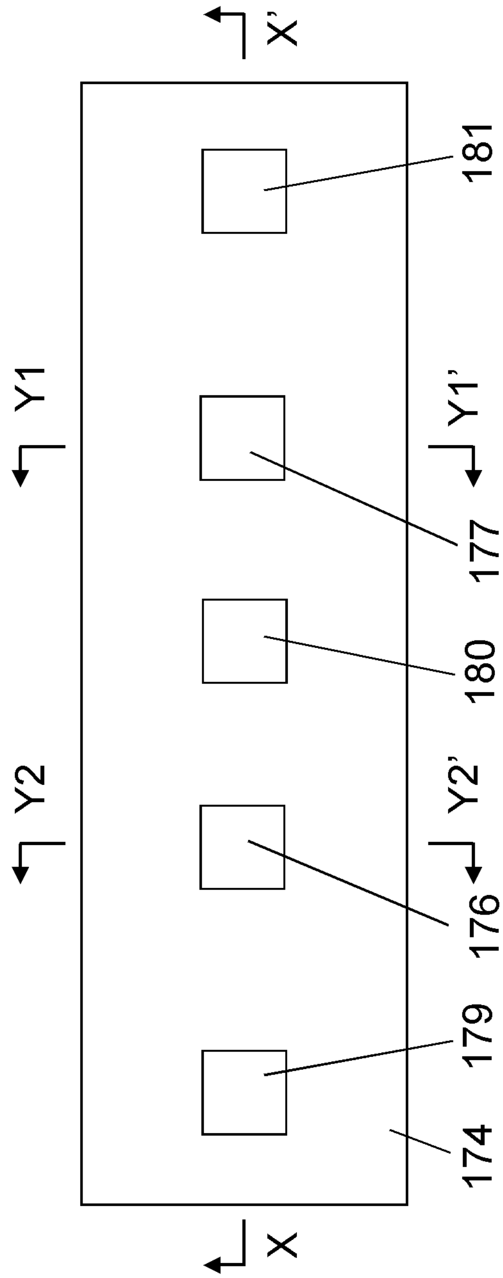
Figure 80B:
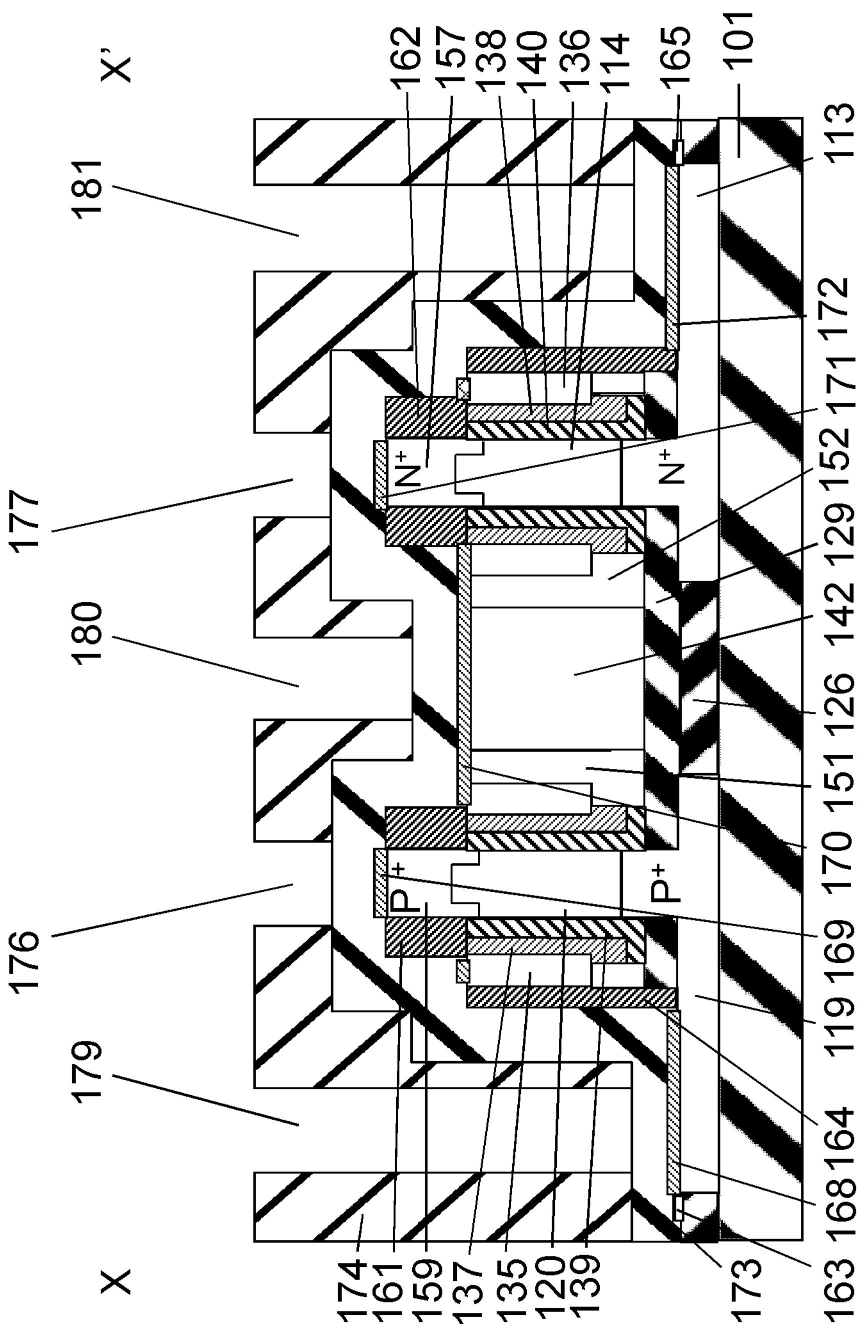
Figure 80C:
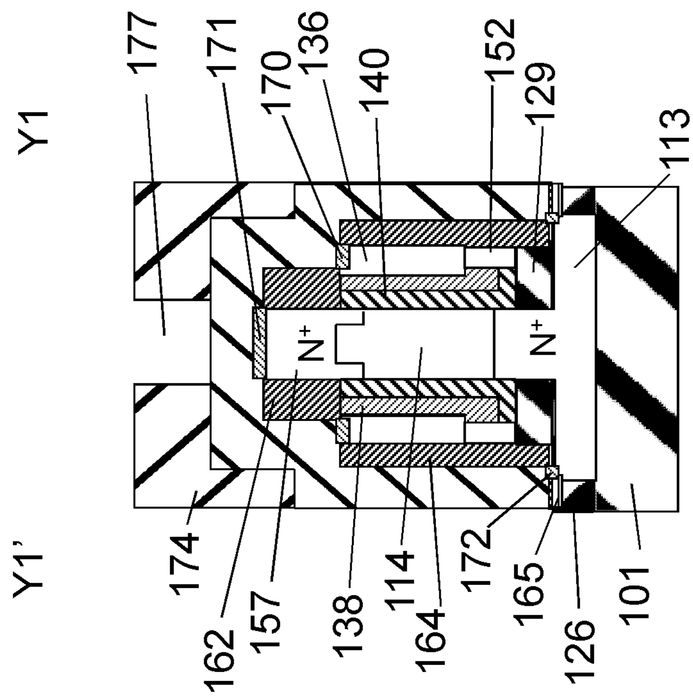
Figure 80D:
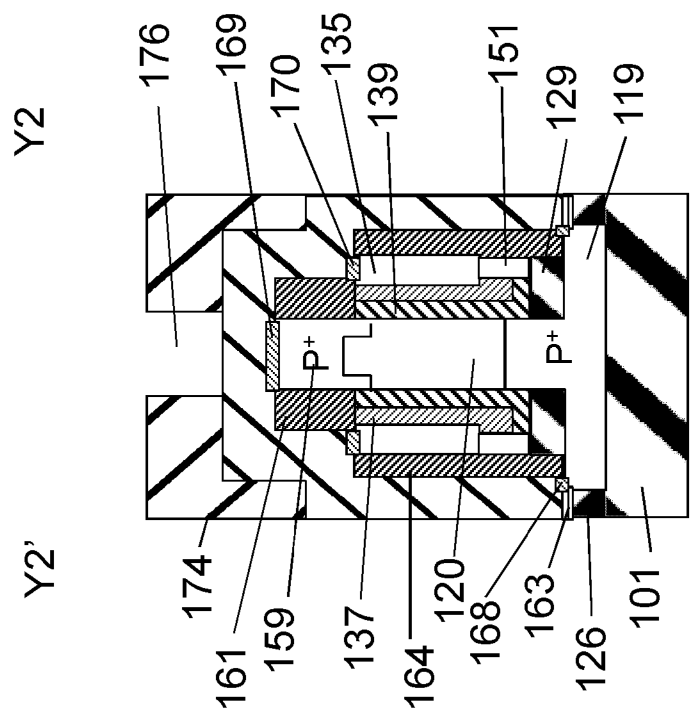
Figure 81A:
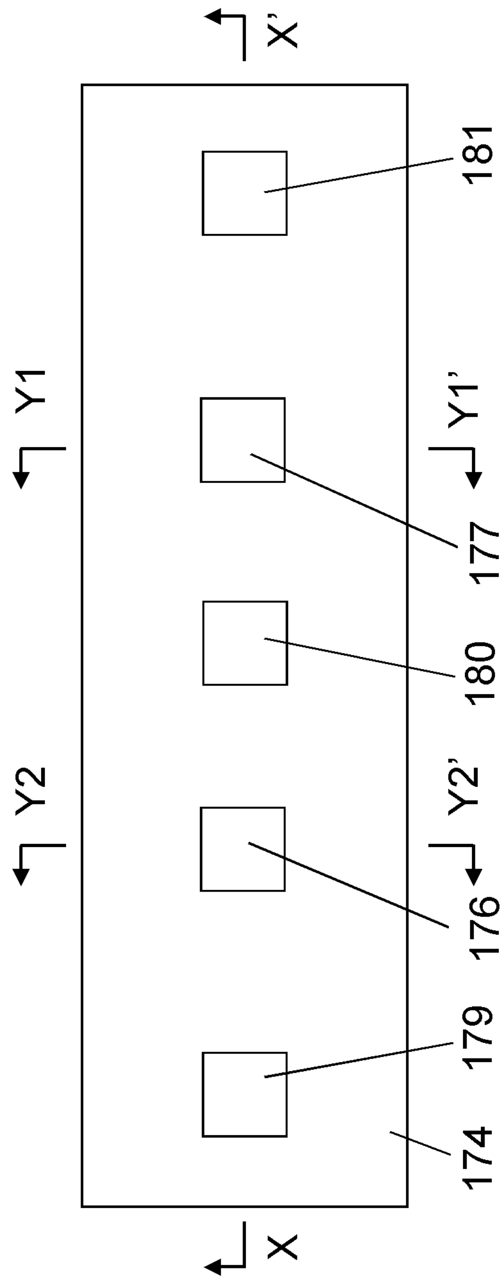
Figure 81B:
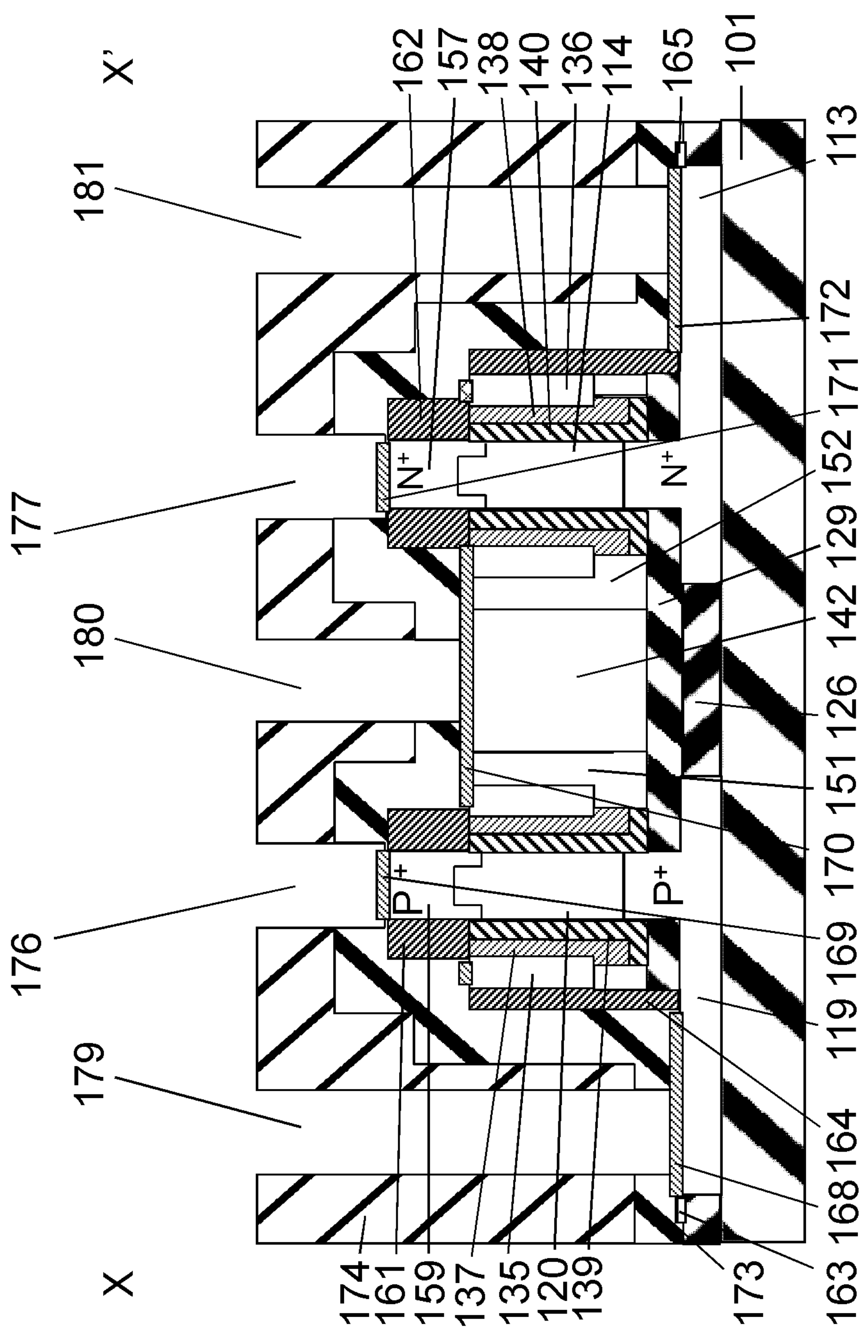
Figure 81C:
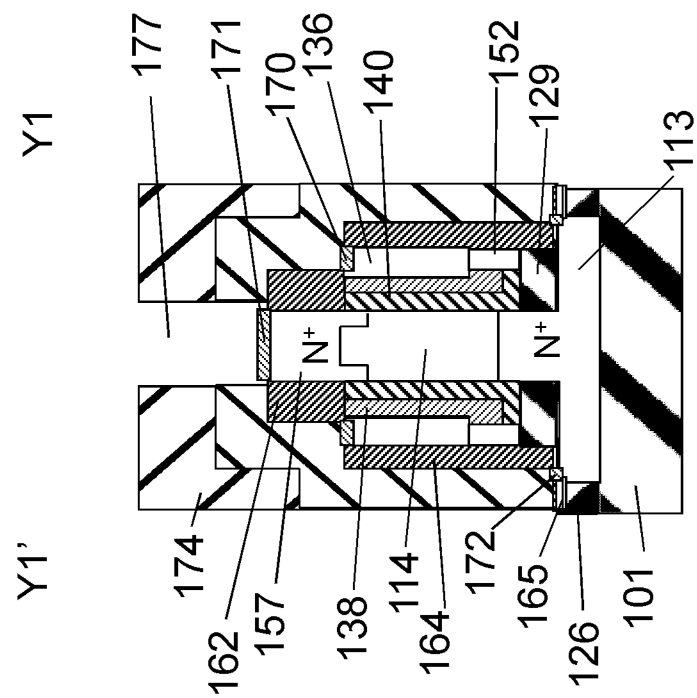
Figure 81D:
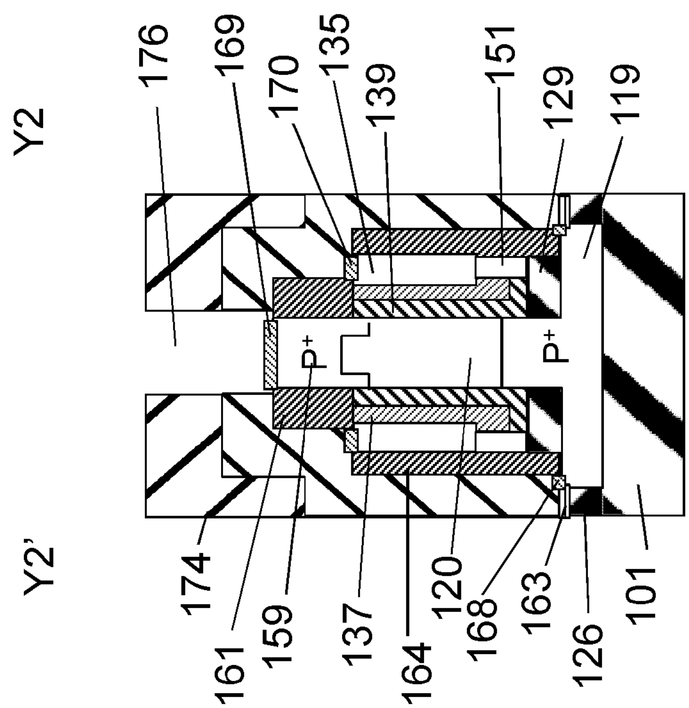
Figure 82A:
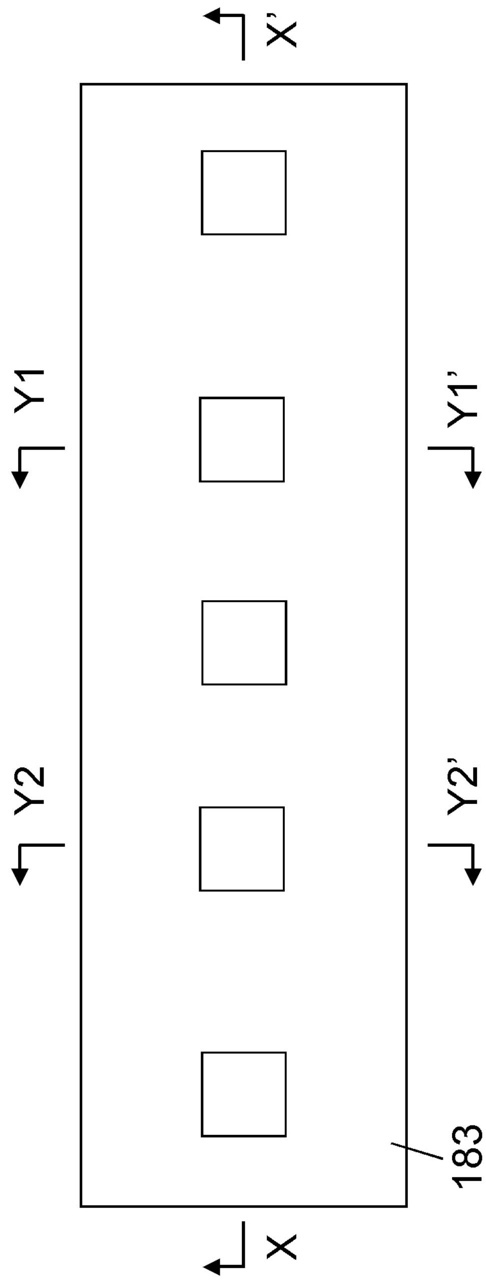
Figure 82B:
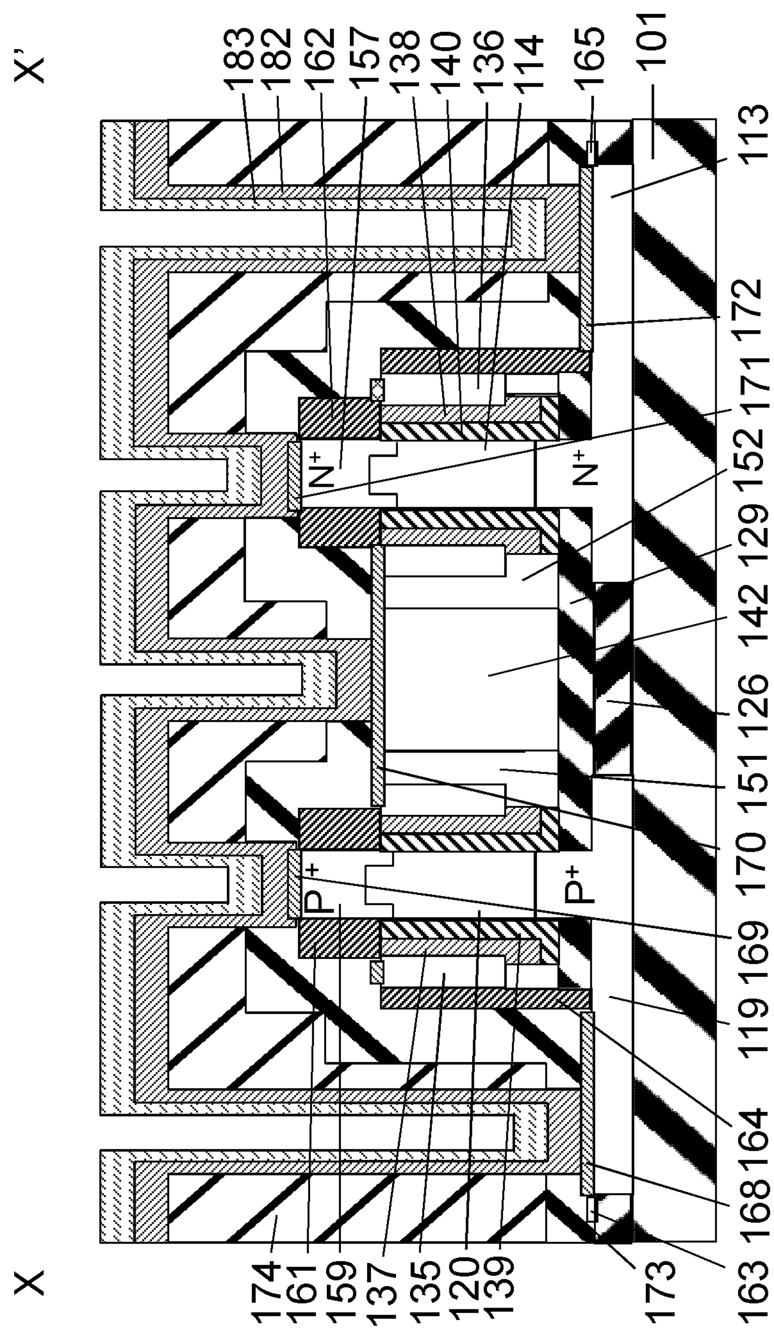
Figure 82C:
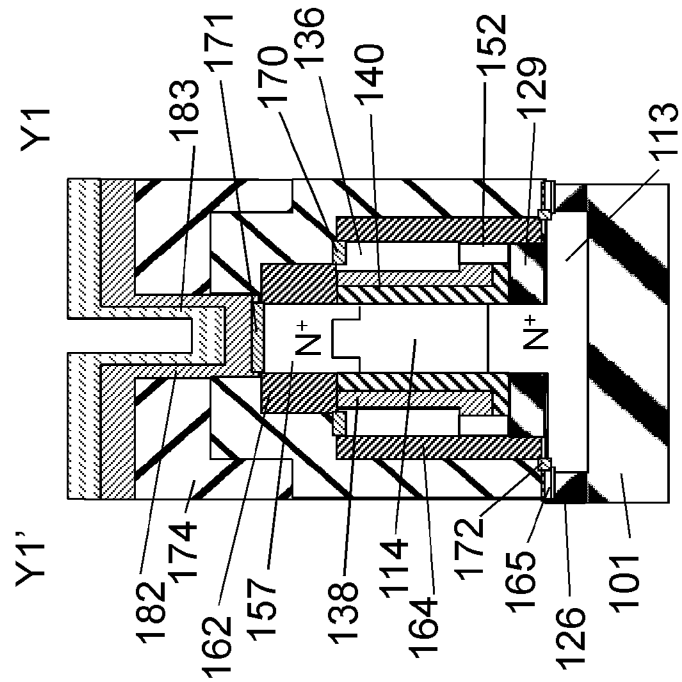
Figure 82D:
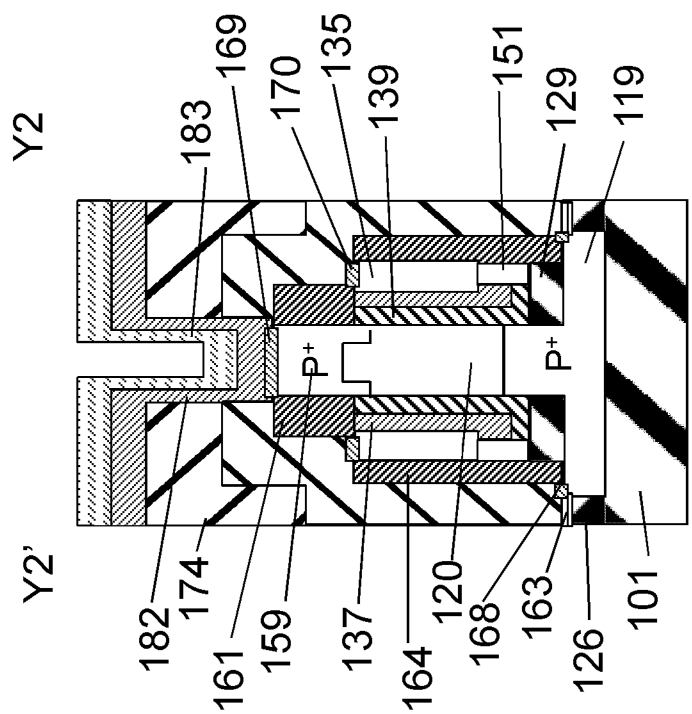
Figure 83A:
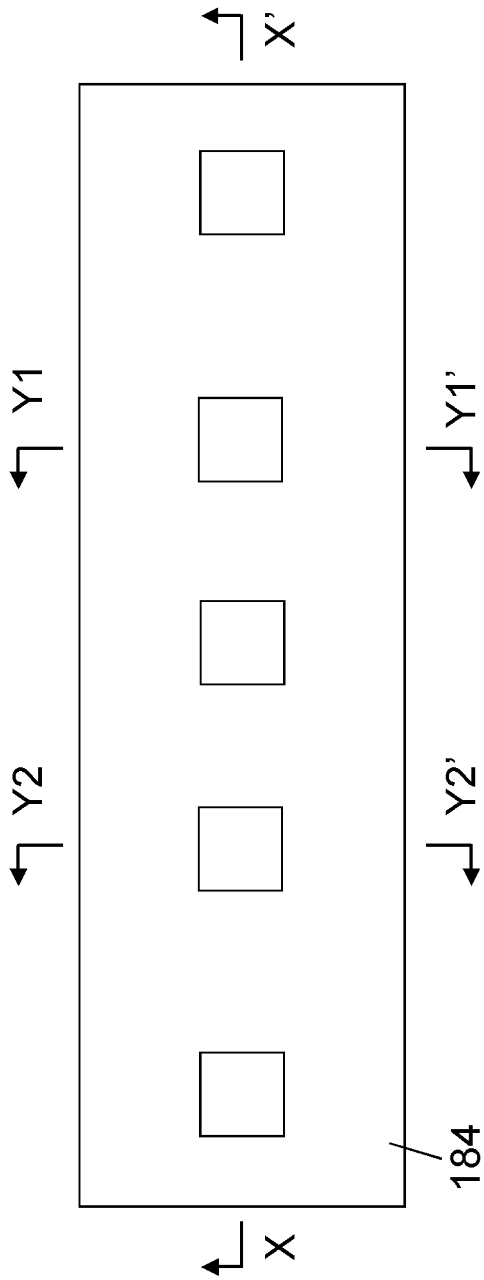
Figure 83B:
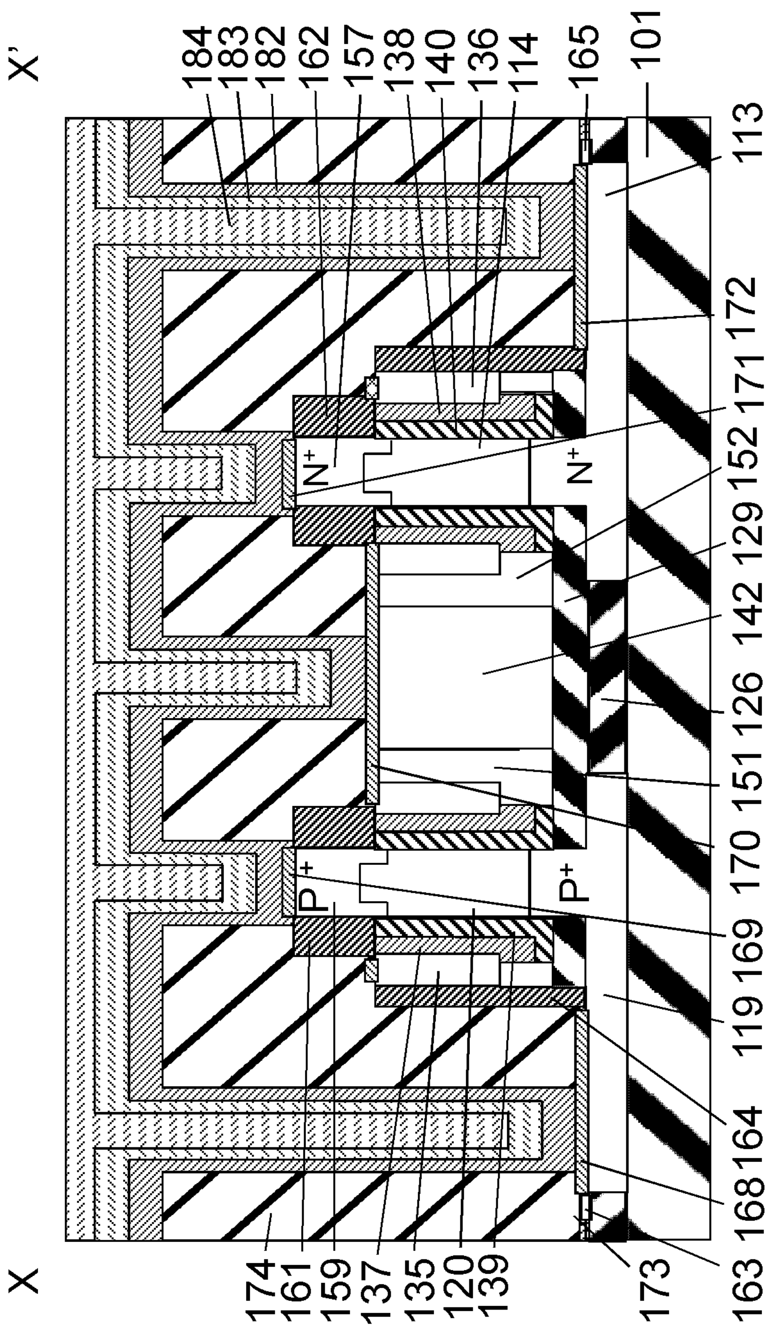
Figure 83C:
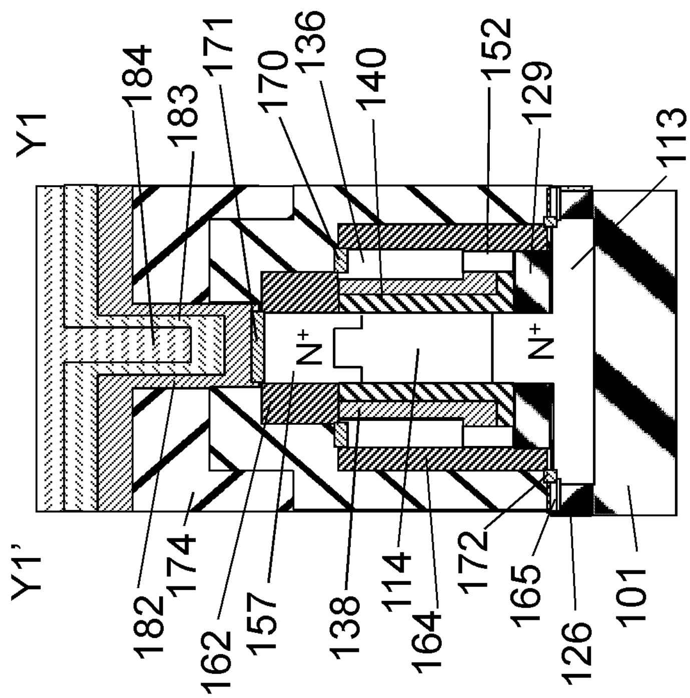
Figure 83D:
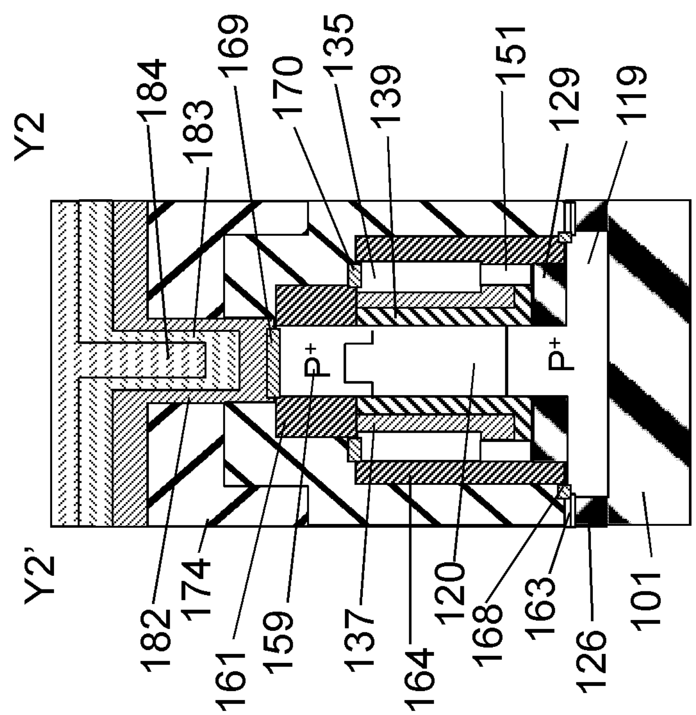
Figure 84A:
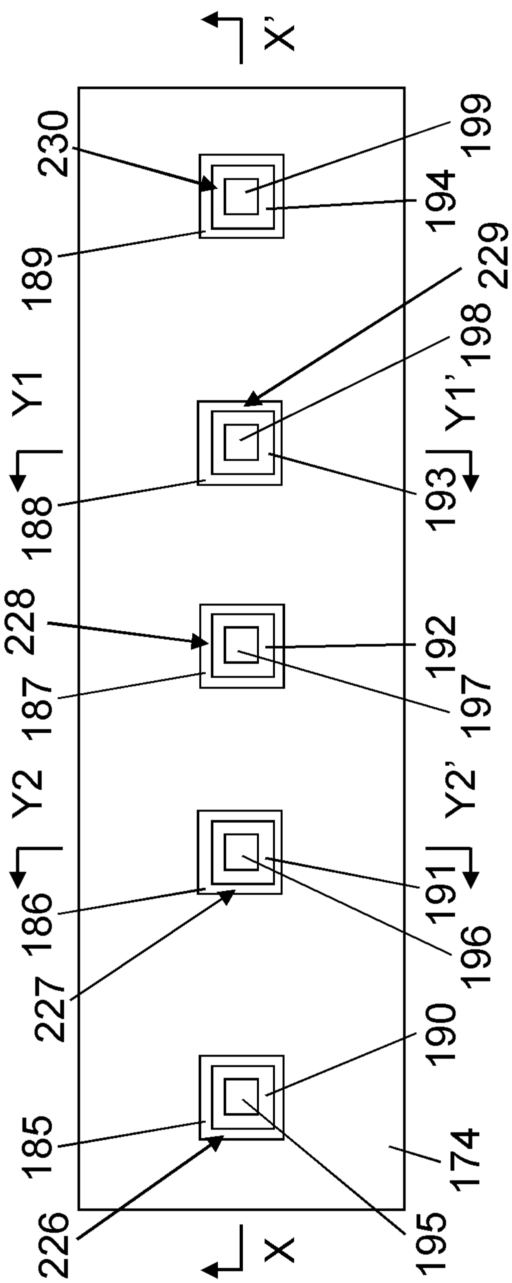
Figure 84B:
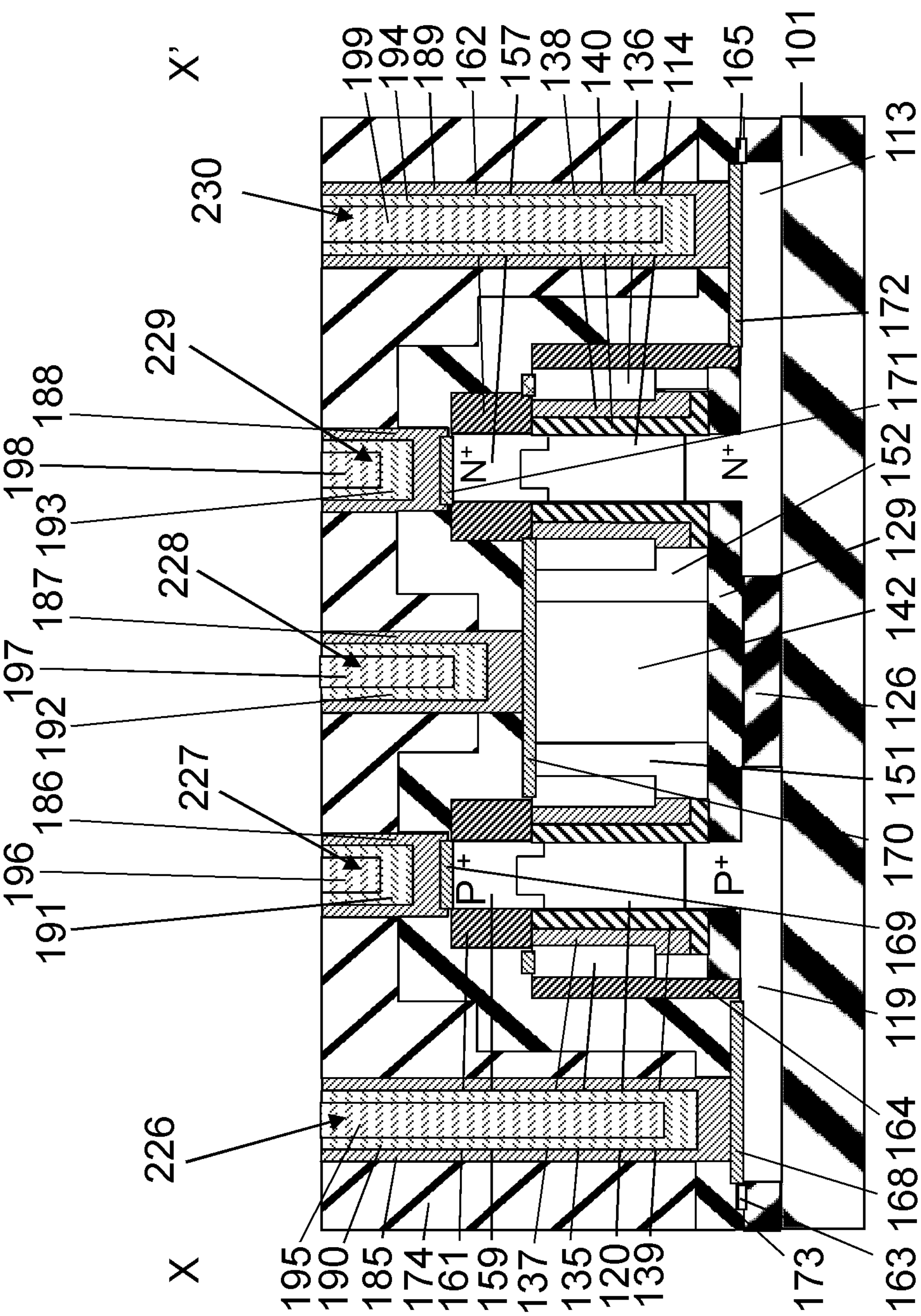
Figure 84C:
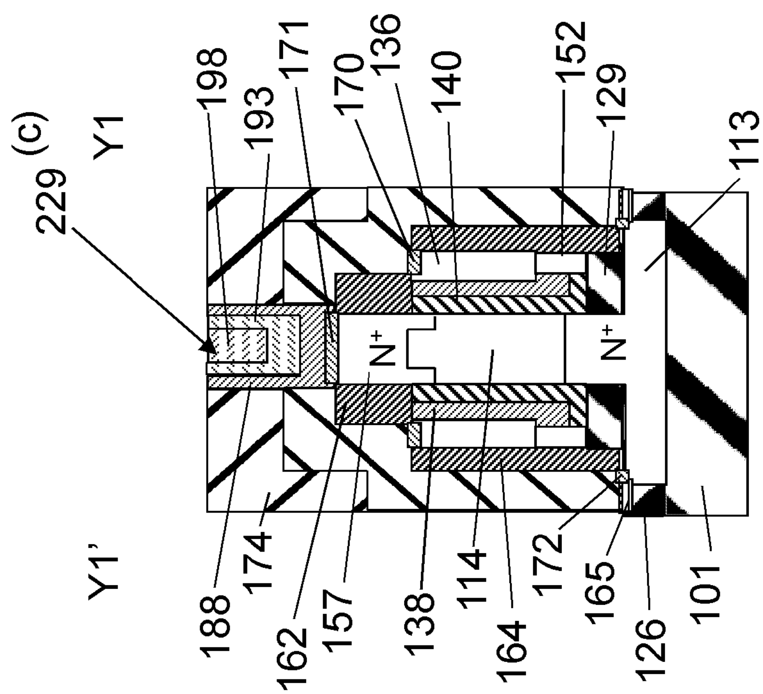
Figure 84D:
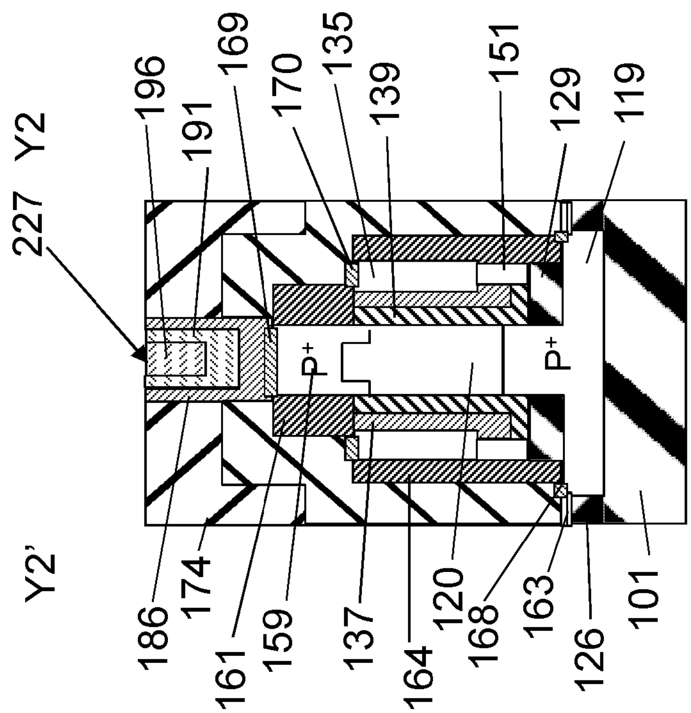
Figure 85A:
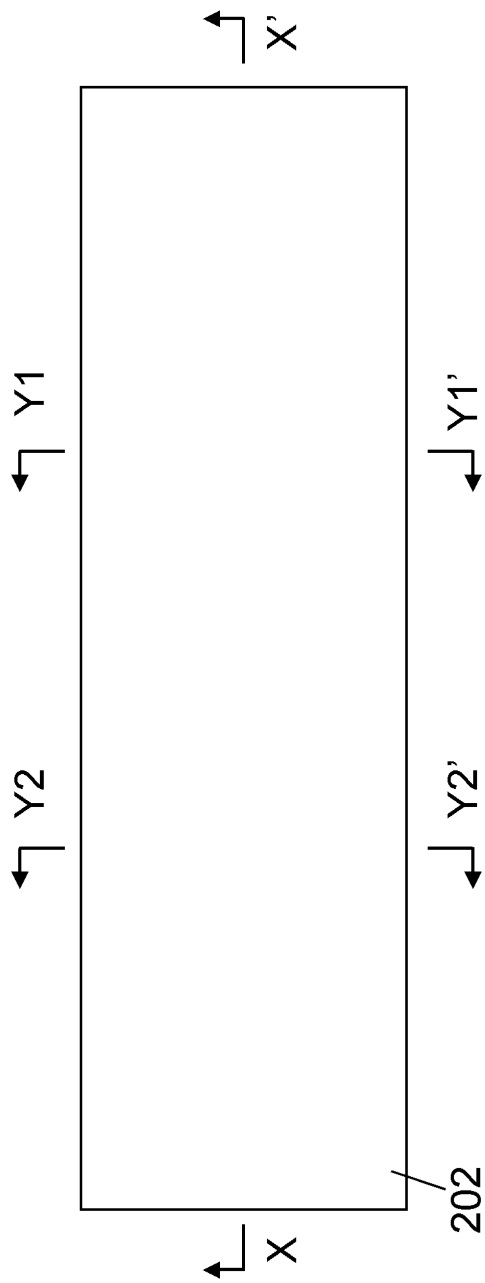
Figure 85B:
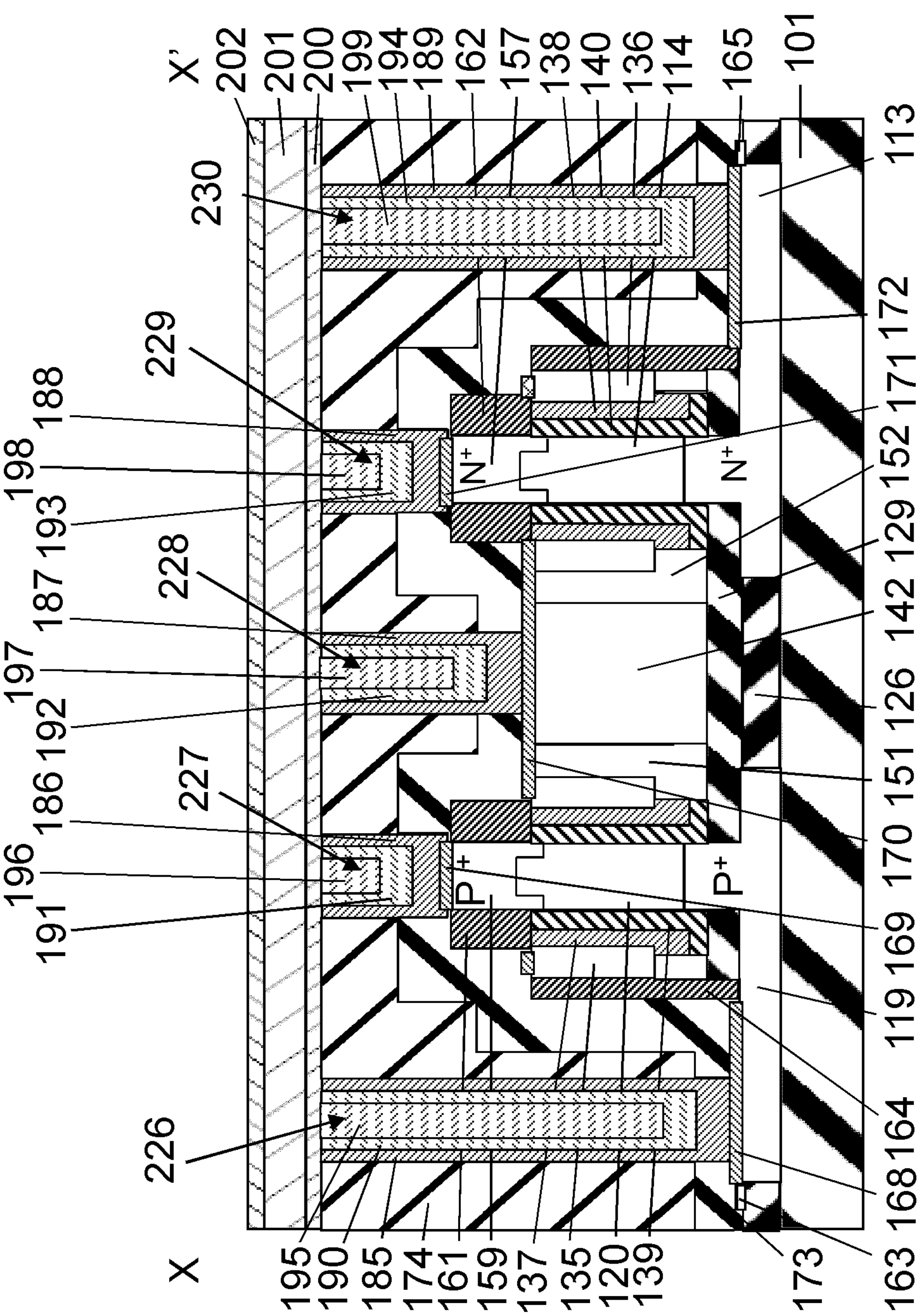
Figure 85C:
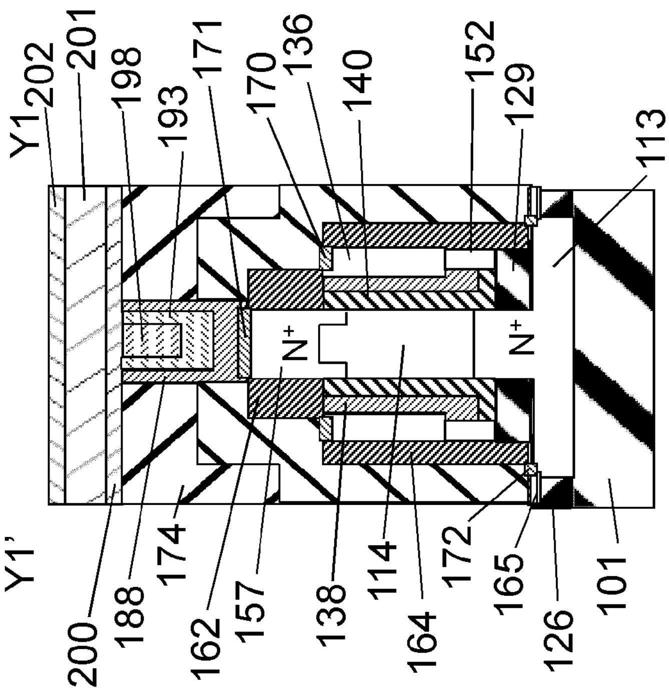
Figure 85D:
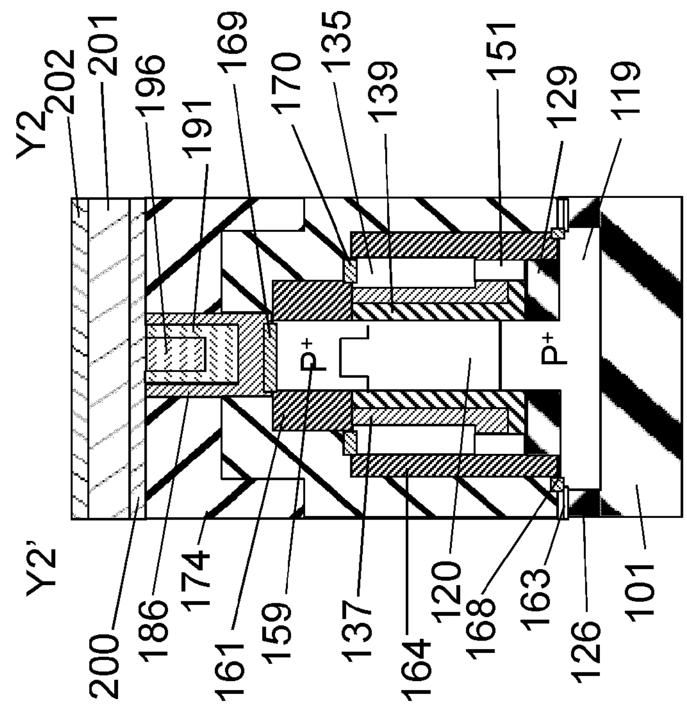
Figure 86A:
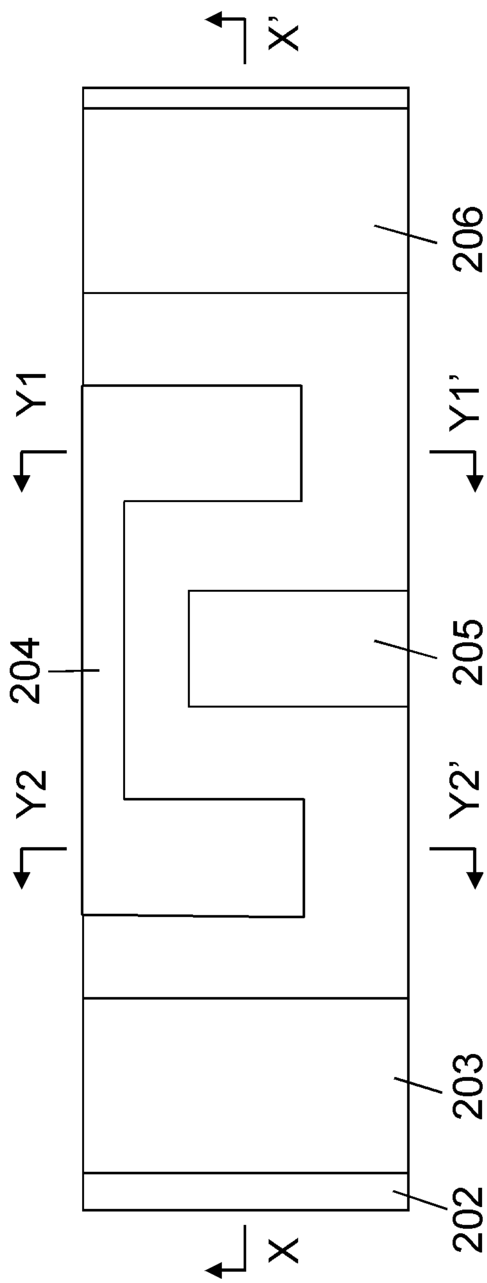
Figure 86B:
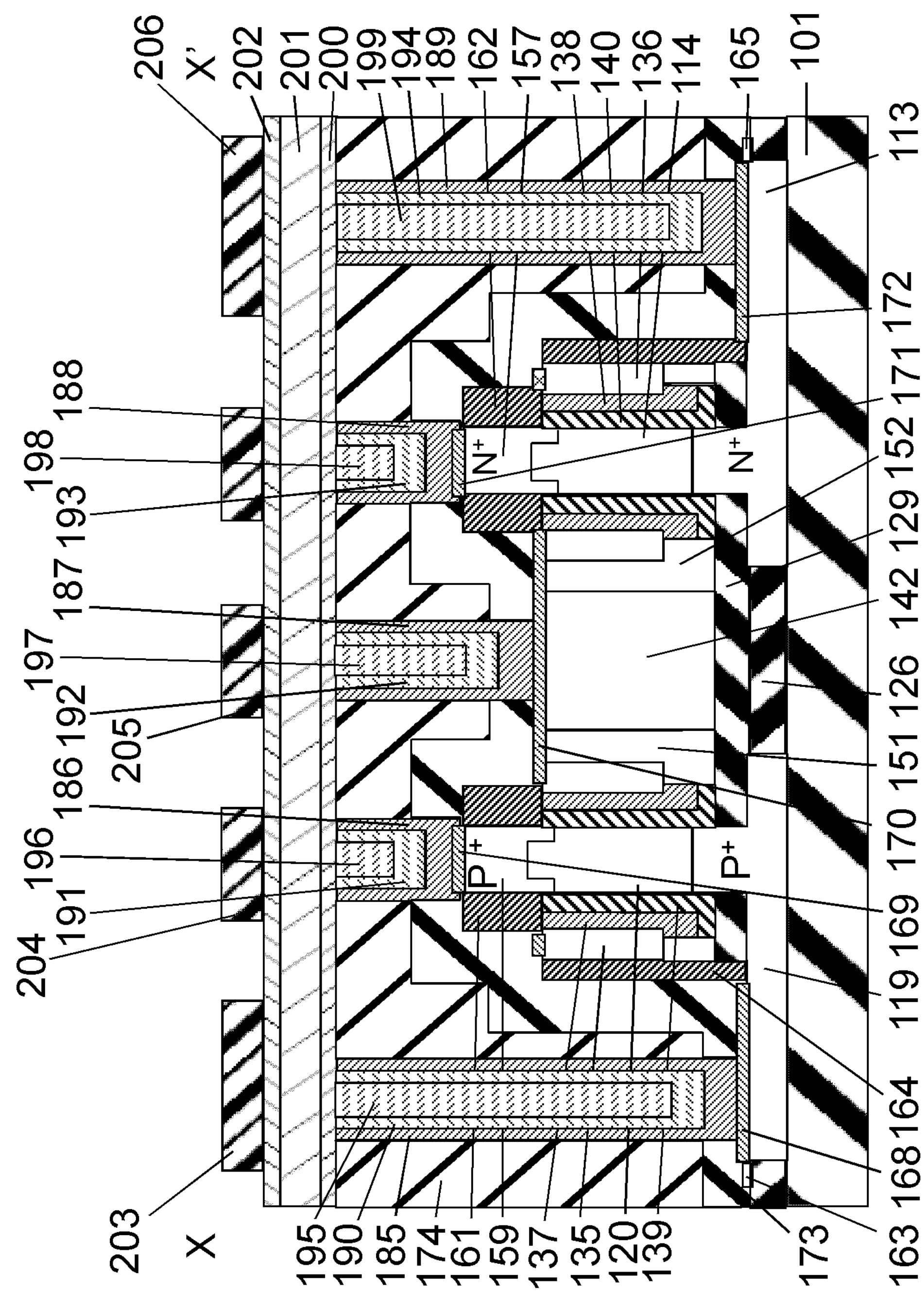
Figure 86C:
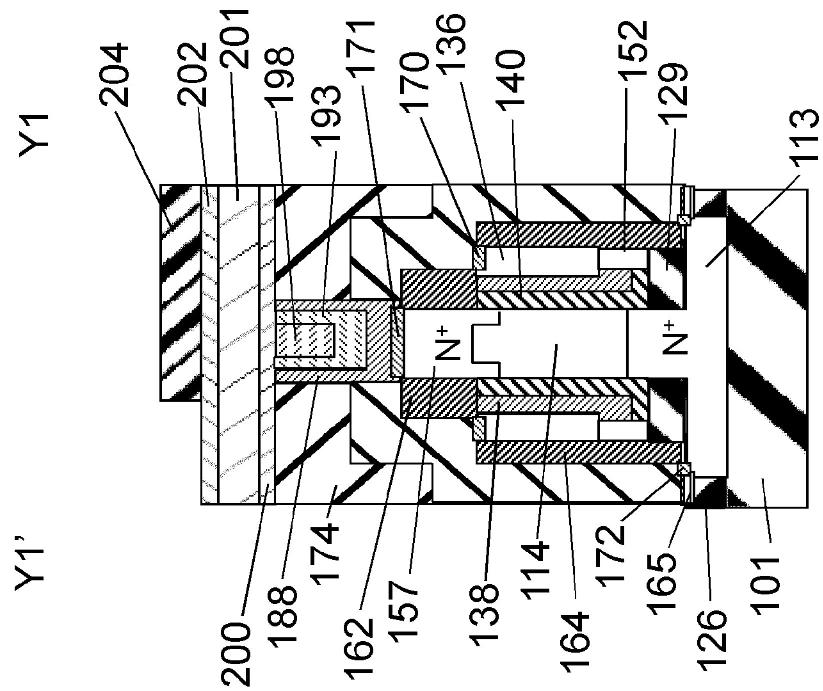
Figure 86D:
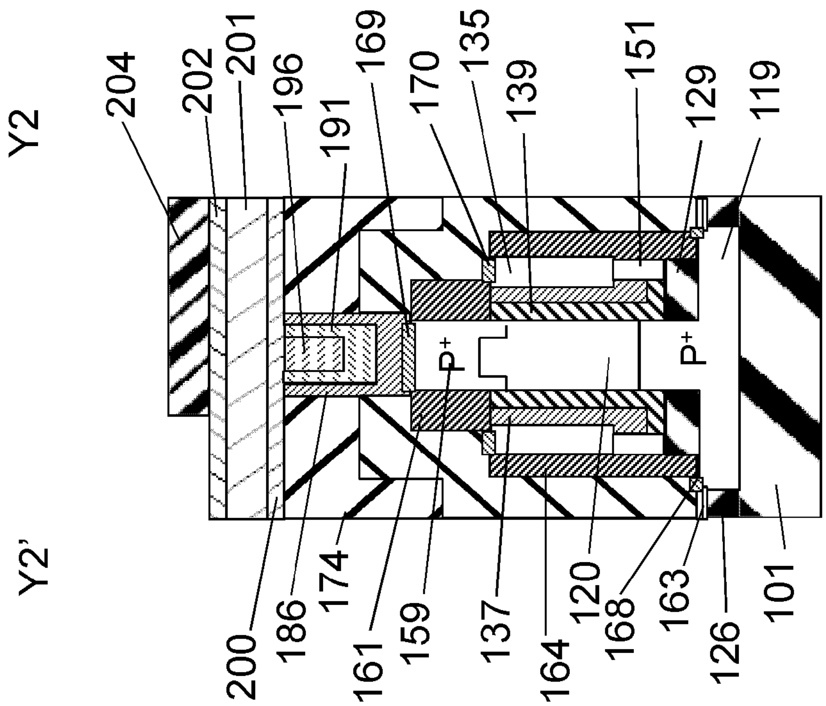
Figure 87A:
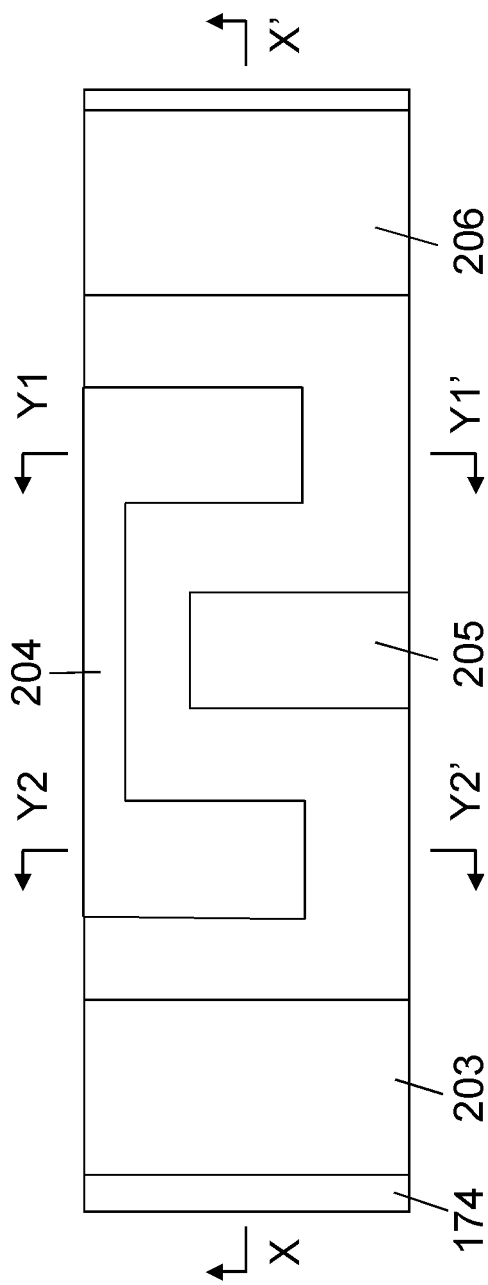
Figure 87B:
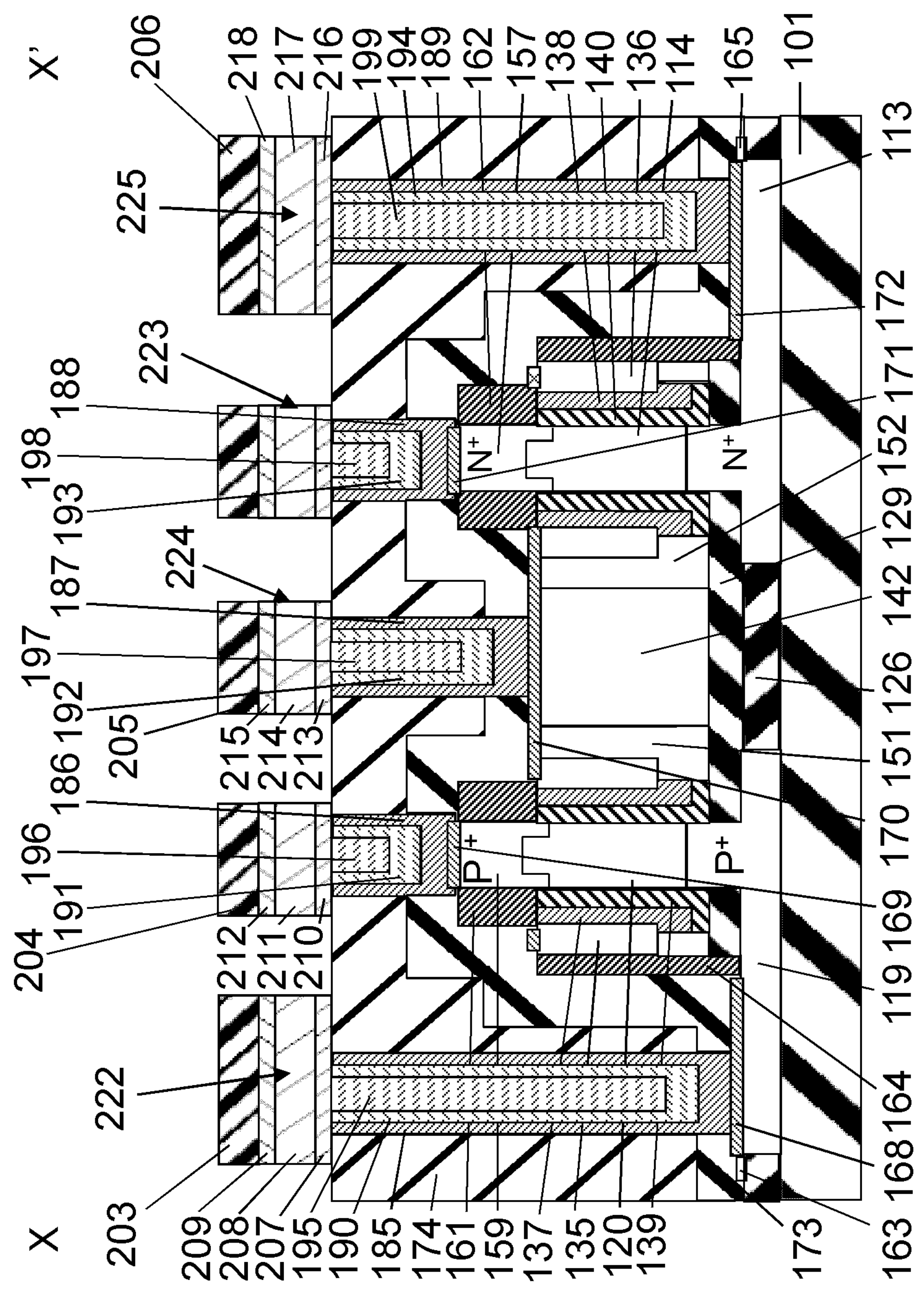
Figure 87C:
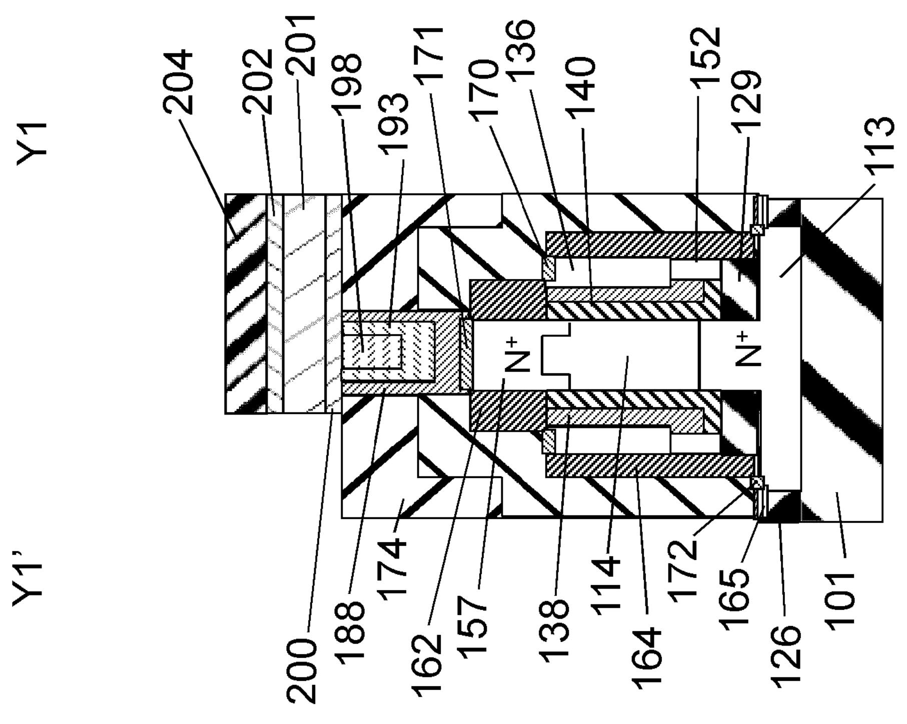
Figure 87D:
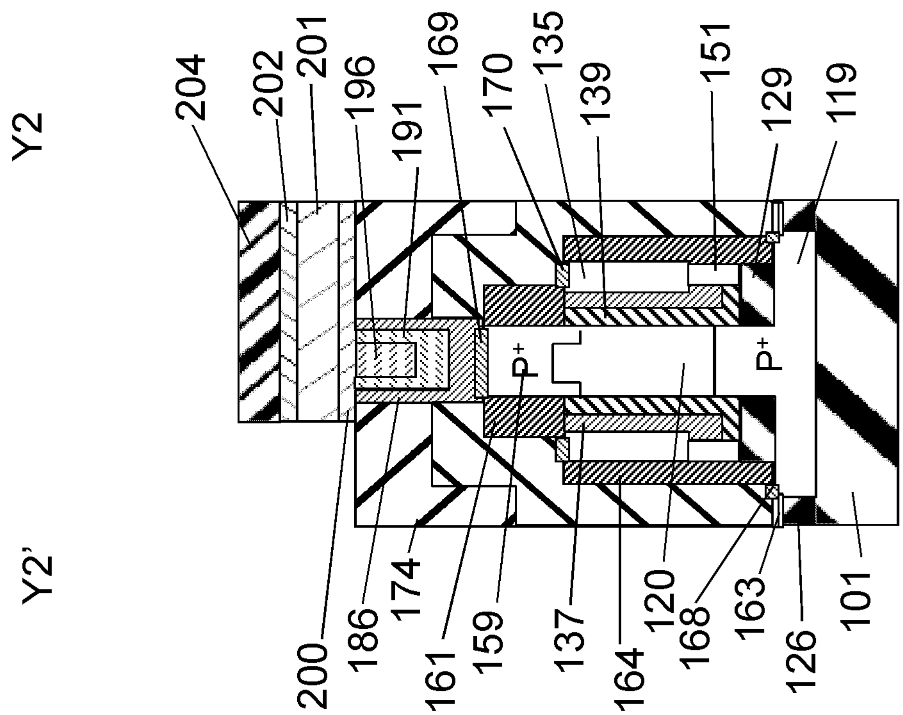
Figure 88A:
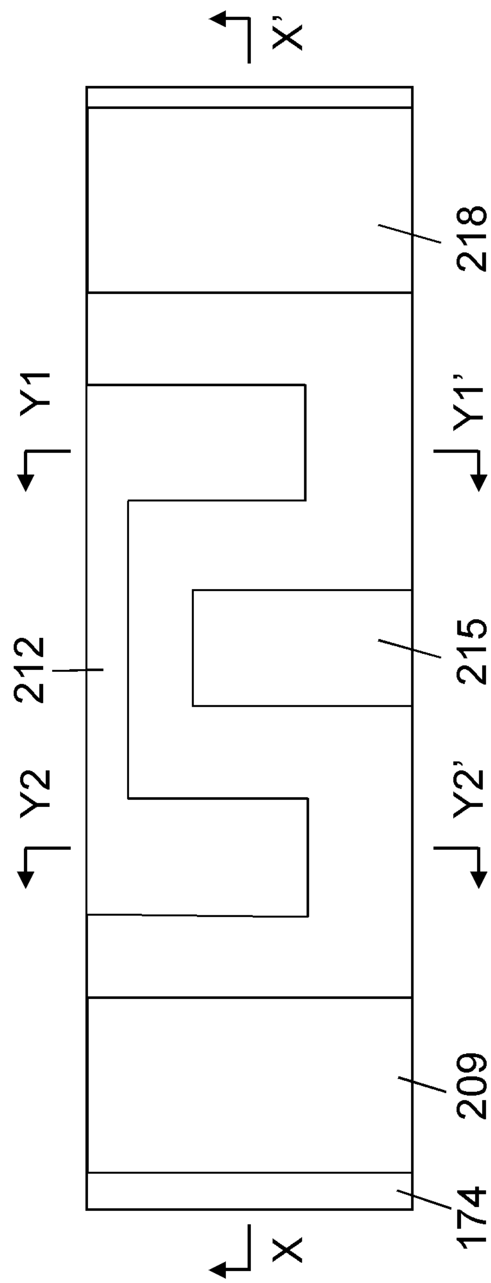
Figure 88B:
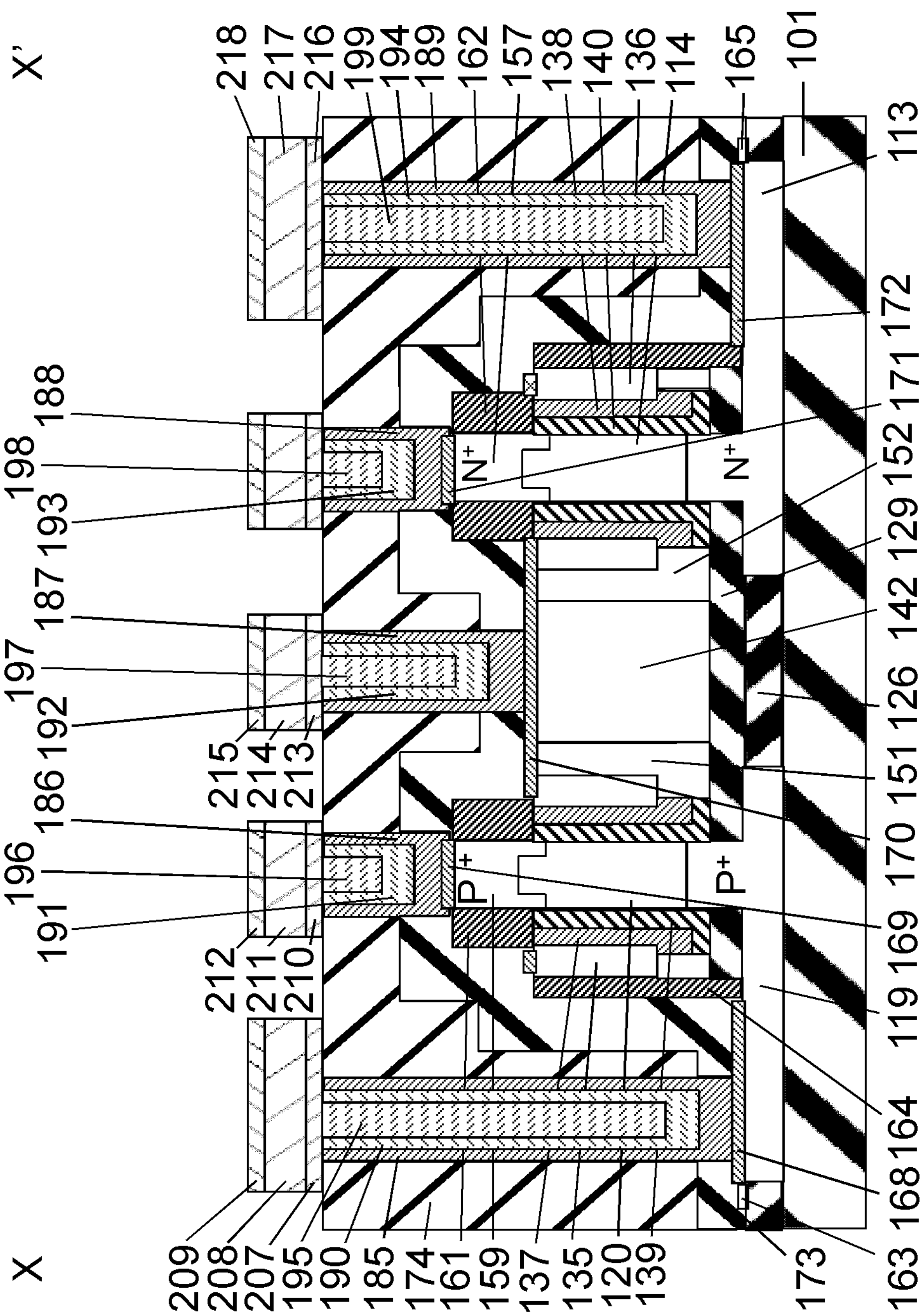
Figure 88C:
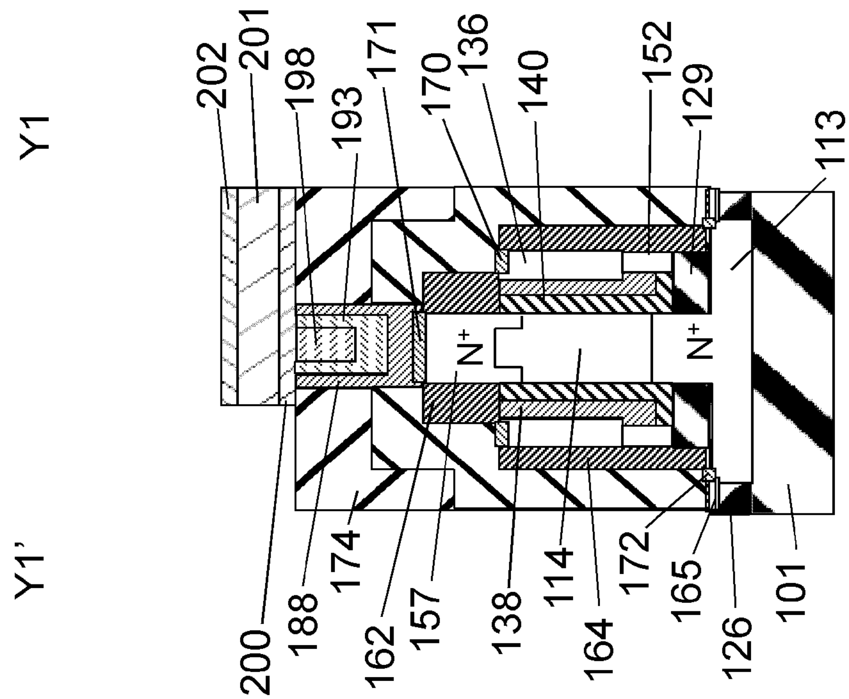
Figure 88D:
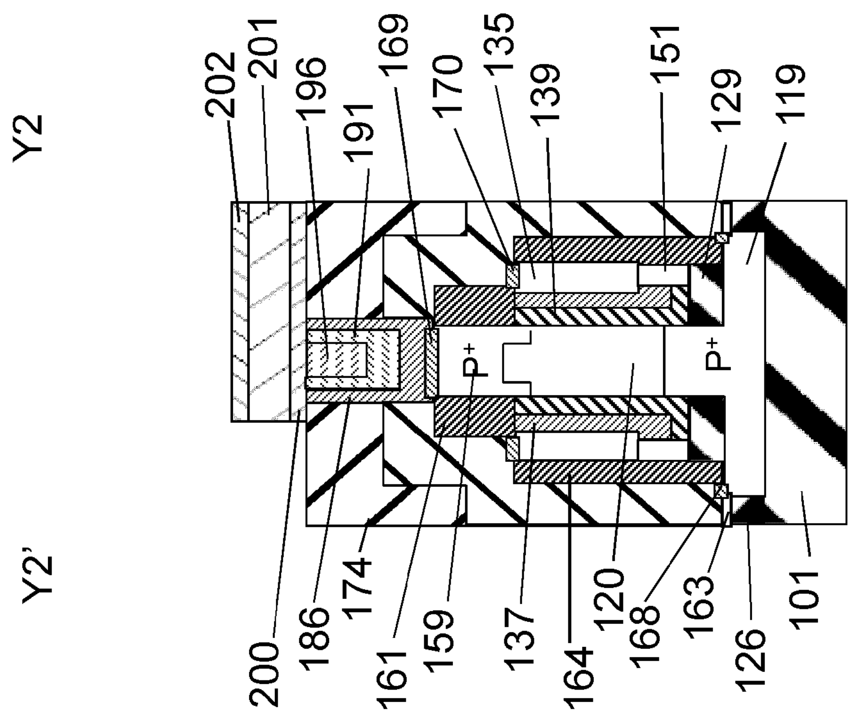

FIG. 33C is a cross-sectional view along line Y1-Y1' in FIG. 33A;

FIG. 33D is a cross-sectional view along line Y2-Y2' in FIG. 33A;

FIG. 34A is a planar view of the semiconductor device during production, showing the method of producing the semiconductor device according to an embodiment of the present invention;

FIG. 34B is a cross-sectional view along line X-X' in FIG. 34A;

FIG. 34C is a cross-sectional view along line Y1-Y1' in FIG. 34A;

FIG. 34D is a cross-sectional view along line Y2-Y2' in FIG. 34A;

FIG. 35A is a planar view of the semiconductor device during production, showing the method of producing the semiconductor device according to an embodiment of the present invention;

FIG. 35B is a cross-sectional view along line X-X' in FIG. 35A;

FIG. 35C is a cross-sectional view along line Y1-Y1' in FIG. 35A;

FIG. 35D is a cross-sectional view along line Y2-Y2' in FIG. 35A;

FIG. 36A is a planar view of the semiconductor device during production, showing the method of producing the semiconductor device according to an embodiment of the present invention;

FIG. 36B is a cross-sectional view along line X-X' in FIG. 36A;

FIG. 36C is a cross-sectional view along line Y1-Y1' in FIG. 36A;

FIG. 36D is a cross-sectional view along line Y2-Y2' in FIG. 36A;

FIG. 37A is a planar view of the semiconductor device during production, showing the method of producing the semiconductor device according to an embodiment of the present invention;

FIG. 37B is a cross-sectional view along line X-X' in FIG. 37A;

FIG. 37C is a cross-sectional view along line Y1-Y1' in FIG. 37A;

FIG. 37D is a cross-sectional view along line Y2-Y2' in FIG. 37A;

FIG. 38A is a planar view of the semiconductor device during production, showing the method of producing the semiconductor device according to an embodiment of the present invention;

FIG. 38B is a cross-sectional view along line X-X' in FIG. 38A;

FIG. 38C is a cross-sectional view along line Y1-Y1' in FIG. 38A;

FIG. 38D is a cross-sectional view along line Y2-Y2' in FIG. 38A;

FIG. 39A is a planar view of the semiconductor device during production, showing the method of producing the semiconductor device according to an embodiment of the present invention;

FIG. 39B is a cross-sectional view along line X-X' in FIG. 39A;

FIG. 39C is a cross-sectional view along line Y1-Y1' in FIG. 39A;

FIG. 39D is a cross-sectional view along line Y2-Y2' in FIG. 39A;

FIG. 40A is a planar view of the semiconductor device during production, showing the method of producing the semiconductor device according to an embodiment of the present invention;

FIG. 40B is a cross-sectional view along line X-X' in FIG. 40A;

FIG. 40C is a cross-sectional view along line Y1-Y1' in FIG. 40A;

FIG. 40D is a cross-sectional view along line Y2-Y2' in FIG. 40A;

FIG. 41A is a planar view of the semiconductor device during production, showing the method of producing the semiconductor device according to an embodiment of the present invention;

FIG. 41B is a cross-sectional view along line X-X' in FIG. 41A;

FIG. 41C is a cross-sectional view along line Y1-Y1' in FIG. 41A;

FIG. 41D is a cross-sectional view along line Y2-Y2' in FIG. 41A;

FIG. 42A is a planar view of the semiconductor device during production, showing the method of producing the semiconductor device according to an embodiment of the present invention;

FIG. 42B is a cross-sectional view along line X-X' in FIG. 42A;

FIG. 42C is a cross-sectional view along line Y1-Y1' in FIG. 42A;

FIG. 42D is a cross-sectional view along line Y2-Y2' in FIG. 42A;

FIG. 43A is a planar view of the semiconductor device during production, showing the method of producing the semiconductor device according to an embodiment of the present invention;

FIG. 43B is a cross-sectional view along line X-X' in FIG. 43A;

FIG. 43C is a cross-sectional view along line Y1-Y1' in FIG. 43A;

FIG. 43D is a cross-sectional view along line Y2-Y2' in FIG. 43A;

FIG. 44A is a planar view of the semiconductor device during production, showing the method of producing the semiconductor device according to an embodiment of the present invention;

FIG. 44B is a cross-sectional view along line X-X' in FIG. 44A;

FIG. 44C is a cross-sectional view along line Y1-Y1' in FIG. 44A;

FIG. 44D is a cross-sectional view along line Y2-Y2' in FIG. 44A;

FIG. 45A is a planar view of the semiconductor device during production, showing the method of producing the semiconductor device according to an embodiment of the present invention;

FIG. 45B is a cross-sectional view along line X-X' in FIG. 45A;

FIG. 45C is a cross-sectional view along line Y1-Y1' in FIG. 45A;

FIG. 45D is a cross-sectional view along line Y2-Y2' in FIG. 45A;

FIG. 46A is a planar view of the semiconductor device during production, showing the method of producing the semiconductor device according to an embodiment of the present invention;

FIG. 46B is a cross-sectional view along line X-X' in FIG. 46A;

FIG. 46C is a cross-sectional view along line Y1-Y1' in FIG. 46A;

FIG. 46D is a cross-sectional view along line Y2-Y2' in FIG. 46A;

FIG. 47A is a planar view of the semiconductor device during production, showing the method of producing the semiconductor device according to an embodiment of the present invention;

FIG. 47B is a cross-sectional view along line X-X' in FIG. 47A;

FIG. 47C is a cross-sectional view along line Y1-Y1' in FIG. 47A;

FIG. 47D is a cross-sectional view along line Y2-Y2' in FIG. 47A;

FIG. 48A is a planar view of the semiconductor device during production, showing the method of producing the semiconductor device according to an embodiment of the present invention;

FIG. 48B is a cross-sectional view along line X-X' in FIG. 48A;

FIG. 48C is a cross-sectional view along line Y1-Y1' in FIG. 48A;

FIG. 48D is a cross-sectional view along line Y2-Y2' in FIG. 48A;

FIG. 49A is a planar view of the semiconductor device during production, showing the method of producing the semiconductor device according to an embodiment of the present invention;

FIG. 49B is a cross-sectional view along line X-X' in FIG. 49A;

FIG. 49C is a cross-sectional view along line Y1-Y1' in FIG. 49A;

FIG. 49D is a cross-sectional view along line Y2-Y2' in FIG. 49A;

FIG. 50A is a planar view of the semiconductor device during production, showing the method of producing the semiconductor device according to an embodiment of the present invention;

FIG. 50B is a cross-sectional view along line X-X' in FIG. 50A;

FIG. 50C is a cross-sectional view along line Y1-Y1' in FIG. 50A;

FIG. 50D is a cross-sectional view along line Y2-Y2' in FIG. 50A;

FIG. 51A is a planar view of the semiconductor device during production, showing the method of producing the semiconductor device according to an embodiment of the present invention;

FIG. 51B is a cross-sectional view along line X-X' in FIG. 51A;

FIG. 51C is a cross-sectional view along line Y1-Y1' in FIG. 51A;

FIG. 51D is a cross-sectional view along line Y2-Y2' in FIG. 51A;

FIG. 52A is a planar view of the semiconductor device during production, showing the method of producing the semiconductor device according to an embodiment of the present invention;

FIG. 52B is a cross-sectional view along line X-X' in FIG. 52A;

FIG. 52C is a cross-sectional view along line Y1-Y1' in FIG. 52A;

FIG. 52D is a cross-sectional view along line Y2-Y2' in FIG. 52A;

FIG. 53A is a planar view of the semiconductor device during production, showing the method of producing the semiconductor device according to an embodiment of the present invention;

FIG. 53B is a cross-sectional view along line X-X' in FIG. 53A;

FIG. 53C is a cross-sectional view along line Y1-Y1' in FIG. 53A;

FIG. 53D is a cross-sectional view along line Y2-Y2' in FIG. 53A;

FIG. 54A is a planar view of the semiconductor device during production, showing the method of producing the semiconductor device according to an embodiment of the present invention;

FIG. 54B is a cross-sectional view along line X-X' in FIG. 54A;

FIG. 54C is a cross-sectional view along line Y1-Y1' in FIG. 54A;

FIG. 54D is a cross-sectional view along line Y2-Y2' in FIG. 54A;

FIG. 55A is a planar view of the semiconductor device during production, showing the method of producing the semiconductor device according to an embodiment of the present invention;

FIG. 55B is a cross-sectional view along line X-X' in FIG. 55A;

FIG. 55C is a cross-sectional view along line Y1-Y1' in FIG. 55A;

FIG. 55D is a cross-sectional view along line Y2-Y2' in FIG. 55A;

FIG. 56A is a planar view of the semiconductor device during production, showing the method of producing the semiconductor device according to an embodiment of the present invention;

FIG. 56B is a cross-sectional view along line X-X' in FIG. 56A;

FIG. 56C is a cross-sectional view along line Y1-Y1' in FIG. 56A;

FIG. 56D is a cross-sectional view along line Y2-Y2' in FIG. 56A;

FIG. 57A is a planar view of the semiconductor device during production, showing the method of producing the semiconductor device according to an embodiment of the present invention;

FIG. 57B is a cross-sectional view along line X-X' in FIG. 57A;

FIG. 57C is a cross-sectional view along line Y1-Y1' in FIG. 57A;

FIG. 57D is a cross-sectional view along line Y2-Y2' in FIG. 57A;

FIG. 58A is a planar view of the semiconductor device during production, showing the method of producing the semiconductor device according to an embodiment of the present invention;

FIG. 58B is a cross-sectional view along line X-X' in FIG. 58A;

FIG. 58C is a cross-sectional view along line Y1-Y1' in FIG. 58A;

FIG. 58D is a cross-sectional view along line Y2-Y2' in FIG. 58A;

FIG. 59A is a planar view of the semiconductor device during production, showing the method of producing the semiconductor device according to an embodiment of the present invention;

FIG. 59B is a cross-sectional view along line X-X' in FIG. 59A;

FIG. 59C is a cross-sectional view along line Y1-Y1' in FIG. 59A;

FIG. 59D is a cross-sectional view along line Y2-Y2' in FIG. 59A;

FIG. 60A is a planar view of the semiconductor device during production, showing the method of producing the semiconductor device according to an embodiment of the present invention;

FIG. 60B is a cross-sectional view along line X-X' in FIG. 60A;

FIG. 60C is a cross-sectional view along line Y1-Y1' in FIG. 60A;

FIG. 60D is a cross-sectional view along line Y2-Y2' in FIG. 60A;

FIG. 61A is a planar view of the semiconductor device during production, showing the method of producing the semiconductor device according to an embodiment of the present invention;

FIG. 61B is a cross-sectional view along line X-X' in FIG. 61A;

FIG. 61C is a cross-sectional view along line Y1-Y1' in FIG. 61A;

FIG. 61D is a cross-sectional view along line Y2-Y2' in FIG. 61A;

FIG. 62A is a planar view of the semiconductor device during production, showing the method of producing the semiconductor device according to an embodiment of the present invention;

FIG. 62B is a cross-sectional view along line X-X' in FIG. 62A;

FIG. 62C is a cross-sectional view along line Y1-Y1' in FIG. 62A;

FIG. 62D is a cross-sectional view along line Y2-Y2' in FIG. 62A;

FIG. 63A is a planar view of the semiconductor device during production, showing the method of producing the semiconductor device according to an embodiment of the present invention;

FIG. 63B is a cross-sectional view along line X-X' in FIG. 63A;

FIG. 63C is a cross-sectional view along line Y1-Y1' in FIG. 63A;

FIG. 63D is a cross-sectional view along line Y2-Y2' in FIG. 63A;

FIG. 64A is a planar view of the semiconductor device during production, showing the method of producing the semiconductor device according to an embodiment of the present invention;

FIG. 64B is a cross-sectional view along line X-X' in FIG. 64A;

FIG. 64C is a cross-sectional view along line Y1-Y1' in FIG. 64A;

FIG. 64D is a cross-sectional view along line Y2-Y2' in FIG. 64A;

FIG. 65A is a planar view of the semiconductor device during production, showing the method of producing the semiconductor device according to an embodiment of the present invention;

FIG. 65B is a cross-sectional view along line X-X' in FIG. 65A;

FIG. 65C is a cross-sectional view along line Y1-Y1' in FIG. 65A;

FIG. 65D is a cross-sectional view along line Y2-Y2' in FIG. 65A;

FIG. 66A is a planar view of the semiconductor device during production, showing the method of producing the semiconductor device according to an embodiment of the present invention;

FIG. 66B is a cross-sectional view along line X-X' in FIG. 66A;

FIG. 66C is a cross-sectional view along line Y1-Y1' in FIG. 66A;

FIG. 66D is a cross-sectional view along line Y2-Y2' in FIG. 66A;

FIG. 67A is a planar view of the semiconductor device during production, showing the method of producing the semiconductor device according to an embodiment of the present invention;

FIG. 67B is a cross-sectional view along line X-X' in FIG. 67A;

FIG. 67C is a cross-sectional view along line Y1-Y1' in FIG. 67A;

FIG. 67D is a cross-sectional view along line Y2-Y2' in FIG. 67A;

FIG. 68A is a planar view of the semiconductor device during production, showing the method of producing the semiconductor device according to an embodiment of the present invention;

FIG. 68B is a cross-sectional view along line X-X' in FIG. 68A;

FIG. 68C is a cross-sectional view along line Y1-Y1' in FIG. 68A;

FIG. 68D is a cross-sectional view along line Y2-Y2' in FIG. 68A;

FIG. 69A is a planar view of the semiconductor device during production, showing the method of producing the semiconductor device according to an embodiment of the present invention;

FIG. 69B is a cross-sectional view along line X-X' in FIG. 69A;

FIG. 69C is a cross-sectional view along line Y1-Y1' in FIG. 69A;

FIG. 69D is a cross-sectional view along line Y2-Y2' in FIG. 69A;

FIG. 70A is a planar view of the semiconductor device during production, showing the method of producing the semiconductor device according to an embodiment of the present invention;

FIG. 70B is a cross-sectional view along line X-X' in FIG. 70A;

FIG. 70C is a cross-sectional view along line Y1-Y1' in FIG. 70A;

FIG. 70D is a cross-sectional view along line Y2-Y2' in FIG. 70A;

FIG. 71A is a planar view of the semiconductor device during production, showing the method of producing the semiconductor device according to an embodiment of the present invention;

FIG. 71B is a cross-sectional view along line X-X' in FIG. 71A;

FIG. 71C is a cross-sectional view along line Y1-Y1' in FIG. 71A;

FIG. 71D is a cross-sectional view along line Y2-Y2' in FIG. 71A;

FIG. 72A is a planar view of the semiconductor device during production, showing the method of producing the semiconductor device according to an embodiment of the present invention;

FIG. 72B is a cross-sectional view along line X-X' in FIG. 72A;

FIG. 72C is a cross-sectional view along line Y1-Y1' in FIG. 72A;

FIG. 72D is a cross-sectional view along line Y2-Y2' in FIG. 72A;

FIG. 73A is a planar view of the semiconductor device during production, showing the method of producing the semiconductor device according to an embodiment of the present invention;

FIG. 73B is a cross-sectional view along line X-X' in FIG. 73A;

FIG. 73C is a cross-sectional view along line Y1-Y1' in FIG. 73A;

FIG. 73D is a cross-sectional view along line Y2-Y2' in FIG. 73A;

FIG. 74A is a planar view of the semiconductor device during production, showing the method of producing the semiconductor device according to an embodiment of the present invention;

FIG. 74B is a cross-sectional view along line X-X' in FIG. 74A;

FIG. 74C is a cross-sectional view along line Y1-Y1' in FIG. 74A;

FIG. 74D is a cross-sectional view along line Y2-Y2' in FIG. 74A;

FIG. 75A is a planar view of the semiconductor device during production, showing the method of producing the semiconductor device according to an embodiment of the present invention;

FIG. 75B is a cross-sectional view along line X-X' in FIG. 75A;

FIG. 75C is a cross-sectional view along line Y1-Y1' in FIG. 75A;

FIG. 75D is a cross-sectional view along line Y2-Y2' in FIG. 75A;

FIG. 76A is a planar view of the semiconductor device during production, showing the method of producing the semiconductor device according to an embodiment of the present invention;

FIG. 76B is a cross-sectional view along line X-X' in FIG. 76A;

FIG. 76C is a cross-sectional view along line Y1-Y1' in FIG. 76A;

FIG. 76D is a cross-sectional view along line Y2-Y2' in FIG. 76A;

FIG. 77A is a planar view of the semiconductor device during production, showing the method of producing the semiconductor device according to an embodiment of the present invention;

FIG. 77B is a cross-sectional view along line X-X' in FIG. 77A;

FIG. 77C is a cross-sectional view along line Y1-Y1' in FIG. 77A;

FIG. 77D is a cross-sectional view along line Y2-Y2' in FIG. 77A;

FIG. 78A is a planar view of the semiconductor device during production, showing the method of producing the semiconductor device according to an embodiment of the present invention;

FIG. 78B is a cross-sectional view along line X-X' in FIG. 78A;

FIG. 78C is a cross-sectional view along line Y1-Y1' in FIG. 78A;

FIG. 78D is a cross-sectional view along line Y2-Y2' in FIG. 78A;

FIG. 79A is a planar view of the semiconductor device during production, showing the method of producing the semiconductor device according to an embodiment of the present invention;

FIG. 79B is a cross-sectional view along line X-X' in FIG. 79A;

FIG. 79C is a cross-sectional view along line Y1-Y1' in FIG. 79A;

FIG. 79D is a cross-sectional view along line Y2-Y2' in FIG. 79A;

FIG. 80A is a planar view of the semiconductor device during production, showing the method of producing the semiconductor device according to an embodiment of the present invention;

FIG. 80B is a cross-sectional view along line X-X' in FIG. 80A;

FIG. 80C is a cross-sectional view along line Y1-Y1' in FIG. 80A;

FIG. 80D is a cross-sectional view along line Y2-Y2' in FIG. 80A;

FIG. 81A is a planar view of the semiconductor device during production, showing the method of producing the semiconductor device according to an embodiment of the present invention;

FIG. 81B is a cross-sectional view along line X-X' in FIG. 81A;

FIG. 81C is a cross-sectional view along line Y1-Y1' in FIG. 81A;

FIG. 81D is a cross-sectional view along line Y2-Y2' in FIG. 81A;

FIG. 82A is a planar view of the semiconductor device during production, showing the method of producing the semiconductor device according to an embodiment of the present invention;

FIG. 82B is a cross-sectional view along line X-X' in FIG. 82A;

FIG. 82C is a cross-sectional view along line Y1-Y1' in FIG. 82A;

FIG. 82D is a cross-sectional view along line Y2-Y2' in FIG. 82A;

FIG. 83A is a planar view of the semiconductor device during production, showing the method of producing the semiconductor device according to an embodiment of the present invention;

FIG. 83B is a cross-sectional view along line X-X' in FIG. 83A;

FIG. 83C is a cross-sectional view along line Y1-Y1' in FIG. 83A;

FIG. 83D is a cross-sectional view along line Y2-Y2' in FIG. 83A;

FIG. 84A is a planar view of the semiconductor device during production, showing the method of producing the semiconductor device according to an embodiment of the present invention;

FIG. 84B is a cross-sectional view along line X-X' in FIG. 84A;

FIG. 84C is a cross-sectional view along line Y1-Y1' in FIG. 84A;

FIG. 84D is a cross-sectional view along line Y2-Y2' in FIG. 84A;

FIG. 85A is a planar view of the semiconductor device during production, showing the method of producing the semiconductor device according to an embodiment of the present invention;

FIG. 85B is a cross-sectional view along line X-X' in FIG. 85A;

FIG. 85C is a cross-sectional view along line Y1-Y1' in FIG. 85A;

FIG. 85D is a cross-sectional view along line Y2-Y2' in FIG. 85A;

FIG. 86A is a planar view of the semiconductor device during production, showing the method of producing the semiconductor device according to an embodiment of the present invention;

FIG. 86B is a cross-sectional view along line X-X' in FIG. 86A;

FIG. 86C is a cross-sectional view along line Y1-Y1' in FIG. 86A;

FIG. 86D is a cross-sectional view along line Y2-Y2' in FIG. 86A;

FIG. 87A is a planar view of the semiconductor device during production, showing the method of producing the semiconductor device according to an embodiment of the present invention;

FIG. 87B is a cross-sectional view along line X-X' in FIG. 87A;

FIG. 87C is a cross-sectional view along line Y1-Y1' in FIG. 87A;

FIG. 87D is a cross-sectional view along line Y2-Y2' in FIG. 87A;

FIG. 88A is a planar view of the semiconductor device during production, showing the method of producing the semiconductor device according to an embodiment of the present invention;

FIG. 88B is a cross-sectional view along line X-X' in FIG. 88A;

FIG. 88C is a cross-sectional view along line Y1-Y1' in FIG. 88A; and FIG. 88D is a cross-sectional view along line Y2-Y2' in FIG. 88A;

DETAILED DESCRIPTION OF THE PREFERRED EMBODIMENTS

Figure 1A:
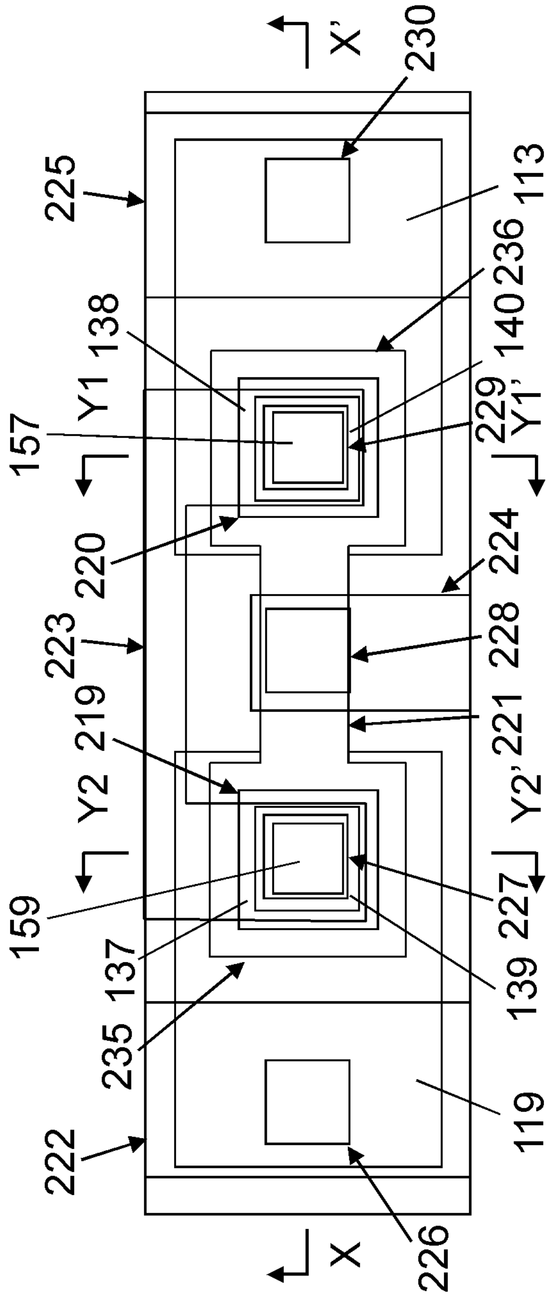
FIG. 1A is a planar view of the semiconductor device according to an embodiment of the present invention.
Figure 1B:
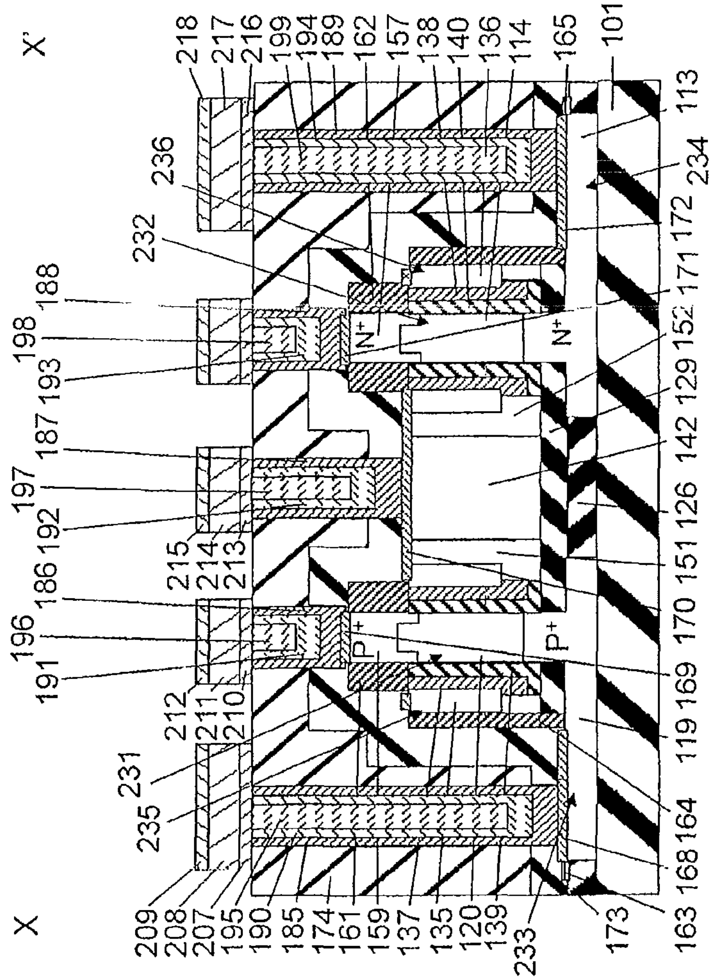
FIG. 1B is a cross-sectional view along line X-X' in FIG. 1A.

The embodiments of the present invention are described below with reference to FIGS. 1A to 88D.

Embodiment 1

Figure 1C:
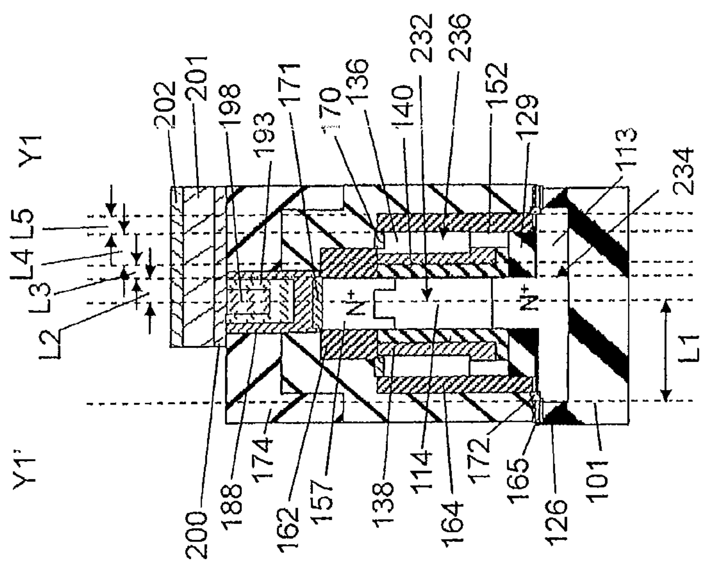
FIG. 1C is a cross-sectional view along line Y1-Y1' in FIG. 1A.
Figure 1D:
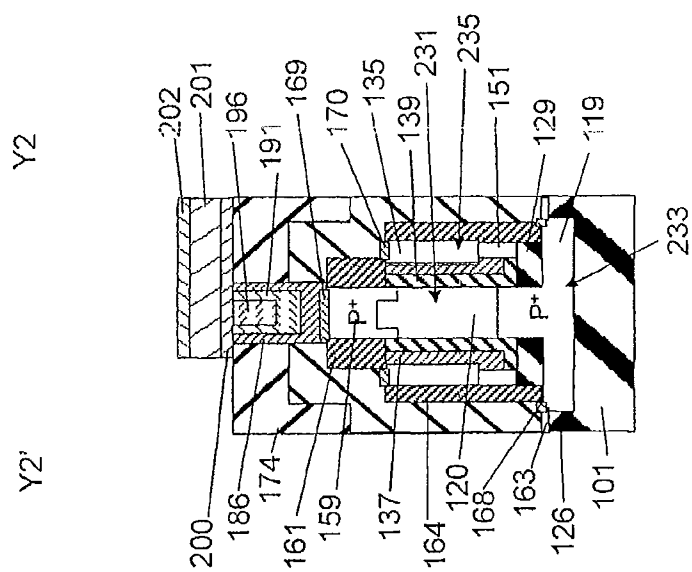
FIG. 1D is a cross-sectional view along line Y2-Y2' in FIG. 1A.

FIG. 1C shows an SGT 220 according to a first embodiment of the present invention.

This SGT 220 is an nMOS SGT and is provided with a first planar silicon layer 234 and a first columnar silicon layer 232 formed on top of the first planar silicon layer 234.

A first n+ type silicon layer 113 is formed on the lower region of the first columnar silicon layer 232 and the region of the first planar silicon layer 234 positioned below the first columnar silicon layer 232, and a second n+ type silicon layer 157 is formed on the upper region of the first columnar silicon layer 232. In this embodiment, the first n+ type silicon layer 113, for example, functions as a source scattering layer and the second n+ type silicon layer 157 functions as a drain scattering layer. In addition, the area between the source scattering layer and the drawing scattering layer functions as a channel region. The first columnar silicon layer 232 between the first n+ type silicon layer 113 and the second n+ type silicon layer 157 functioning as this channel region is called a first silicon layer 114.

A gate insulating film 140 is formed surrounding the first columnar silicon layer 232 functioning as the channel region. The gate insulating film 140 may be, for example, an oxide film, a nitride film or a high-k film. Furthermore, a first metal film 138 is formed surrounding this gate insulating film 140. The first metal film 138 may be, for example, titanium, titanium nitride, tantalum or tantalum nitride. First polysilicon films 136 and 152 are formed surrounding this first metal film 138. The first metal film 138 and the first polysilicon films 136 and 152 constitute a first gate electrode 236. Thus, by using metal as the gate electrode, it is possible to control depletion of the channel region while also lowering the resistance of the gate electrode.

In the present embodiment, a channel is formed in the first silicon layer 114 by impressing a voltage on the first gate electrode 236 during operation.

In addition, a first metal-silicon compound 172, a third metal-silicon compound 170 and a second metal-silicon compound 171 are formed on the first n+ type silicon layer 113, the gate electrode 236 and the second n+ type silicon layer 157, respectively. As the metal comprising the metal-silicon compounds, Ni or Co may be used, for example. Through these metal-silicon compounds, the first n+ type silicon layer 113, the gate electrode 236 and the second n+ type silicon layer 157 are connected to below-described contacts. Through this, the resistances of the gate, source and drain are lowered.

The first n+ type silicon layer 113 is connected to a contact 230 via the first metal-silicon compound 172. The contact 230 is formed from a barrier metal layer 189 and metal layers 194 and 199. The contact 230 is further connected to a power source wire 225. The power source wire 225 is composed of a barrier metal layer 216, a metal layer 217 and a barrier metal layer 218.

The second n+ type silicon layer 157 is connected to a contact 229 via the second metal-silicon compound 171. The contact 229 is composed of a barrier metal layer 188 and metal layers 193 and 198. The contact 229 is further connected to an output wire 223. The output wire 223 is composed of a barrier metal layer 213, a metal 214 and a barrier metal layer 215.

Furthermore, a first insulating film 129 is formed between the first gate electrode 236 and the first planar silicon layer 234, a second insulating film 162 is formed in a sidewall shape on the upper sidewall of the first columnar silicon layer 232 and above the first gate electrode 236, and a third insulating film 164 is formed in a sidewall shape on the sidewall of the first gate electrode 236 and the first insulating film 129. The first insulating film 129 is preferably a low-k insulating film such as SiOF, SiOH or the like, for example. The second insulating film 162 and the third insulating film 164 are oxide films, nitride films or high-k films, for example.

The parasitic capacitance between the gate electrode and the planar silicon layer is reduced by the first insulating film 129.

With the above composition, downsizing and lowering of resistance in the semiconductor device are realized in the nMOS SGT according to the present embodiment, and in addition parasitic capacitance between multi-layer wiring is reduced. Through this, it is possible to avoid lowering of operation speeds accompanying downsizing of the SGT.

In the nMOS SGT according to this embodiment, the thickness of the second insulating film 162 is preferably thicker than the sum of the thickness of the first gate insulating film 140 and the thickness of the first metal film 138. In this case, the first gate insulating film 140 and the first metal film 138 are covered by the first columnar silicon layer 232, the first polysilicon films 136 and 152, the first insulating film 129 and the second insulating film 162.

By using the above-described composition, the entirety of the first metal film 138 is protected, so this film is not etched by a sulfuric acid hydrogen peroxide mixture or an ammonia hydrogen peroxide mixture when forming the metal-silicon compound.

In addition, the length from the center of the first columnar silicon layer 232 to the end of the first planar silicon layer 234 in the nMOS SGT according to the present embodiment is preferably larger than the sum of the length from the center to the sidewall of the first columnar silicon layer 232, the thickness of the first gate insulating film 140, the thickness of the first gate electrode 236 formed by the first metal film 138 and the first polysilicon films 136 and 152 and the thickness of the third insulating film 164.

When the above-described composition is used, it is possible to form the first metal-silicon compound 172 on the first n+ type silicon layer 113 without the special addition of manufacturing processes.

Embodiment 2

In the first embodiment, an example was shown of a single columnar semiconductor layer, but in the second embodiment, an example is shown of a circuit composed of multiple columnar semiconductor layers.

An inverter according to the second embodiment is provided with a pMOS SGT and an nMOS SGT.

The nMOS SGT 220 is provided with a first planar silicon layer 234 and a first columnar silicon layer 232 formed on top of the first planar silicon layer 234.

A first n+ type silicon layer 113 is formed on the lower region of the first columnar silicon layer 232 and the region of the first planar silicon layer 234 positioned below the first columnar silicon layer 232, and a second n+ type silicon layer 157 is formed on the upper region of the first columnar silicon layer 232. In this embodiment, the first n+ type silicon layer 113, for example, functions as a source scattering layer and the second n+ type silicon layer 157 functions as a drain scattering layer. In addition, the area between the source scattering layer and the drawing scattering layer functions as a channel region. The first columnar silicon layer 232 between the first n+ type silicon layer 113 and the second n+ type silicon layer 157 functioning as this channel region is called a first silicon layer 114.

A first gate insulating film 140 is formed surrounding the first columnar silicon layer 232 functioning as the channel region. The gate insulating film 140 may be, for example, an oxide film, a nitride film or a high-k film. Furthermore, a first metal film 138 is formed surrounding this first gate insulating film 140. The first metal film 138 may be, for example, titanium, titanium nitride, tantalum or tantalum nitride. First polysilicon films 136 and 152 are formed surrounding this first metal film 138. The first metal film 138 and the first polysilicon films 136 and 152 constitute a first gate electrode 236. Thus, by using metal as the gate electrode, it is possible to control depletion of the channel region while also lowering the resistance of the gate electrode.

In the present embodiment, a channel is formed in the first silicon layer 114 by impressing a voltage on the first gate electrode 236 during operation.

In addition, a first metal-silicon compound 172, a third metal-silicon compound 170 and a second metal-silicon compound 171 are formed on the first n+ type silicon layer 113, the first gate electrode 236 and the second n+ type silicon layer 157, respectively. The metal comprising the metal-silicon compounds may be Ni or Co, for example. Through these metal-silicon compounds, the first n+ type silicon layer 113, the gate electrode 236 and the second n+ type silicon layer 157 are connected to below-described contacts. Through this, the resistances of the gate, source and drain are lowered.

Furthermore, a first insulating film 129 is formed between the first gate electrode 236 and the first planar silicon layer 234, a second insulating film 162 is formed in a sidewall shape on the upper sidewall of the first columnar silicon layer 232 and above the first gate electrode 236, and a third insulating film 164 is formed in a sidewall shape on the sidewall of the first gate electrode 236 and the first insulating film 129. The first insulating film 129 is preferably a low-k insulating film such as SiOF, SiOH or the like, for example. The second insulating film 162 and the third insulating film 164 are oxide films, nitride films or high-k films, for example.

The parasitic capacitance between the gate electrode and the planar silicon layer is reduced by the first insulating film 129.

The pMOS SGT 219 and is provided with a second planar silicon layer 233 and a second columnar silicon layer 231 formed on top of the second planar silicon layer 233.

A first p+ type silicon layer 119 is formed on the lower region of the second columnar silicon layer 231 and the region of the second planar silicon layer 233 positioned below the second columnar silicon layer 231, and a second p+ type silicon layer 159 is formed on the upper region of the second columnar silicon layer 231. In this embodiment, the first p+ type silicon layer 119, for example, functions as a source scattering layer and the second p+ type silicon layer 159 functions as a drain scattering layer. In addition, the area between the source scattering layer and the drawing scattering layer functions as a channel region. The second columnar silicon layer 231 between the first p+ type silicon layer 119 and the second p+ type silicon layer 159 functioning as this channel region is called a second silicon layer 120.

A second gate insulating film 139 is formed surrounding the second columnar silicon layer 231 functioning as the channel region. The second gate insulating film 139 may be, for example, an oxide film, a nitride film or a high-k film. Furthermore, a second metal film 137 is formed surrounding this second gate insulating film 139. The second metal film 137 may be, for example, titanium, titanium nitride, tantalum or tantalum nitride. Second polysilicon films 135 and 151 are formed surrounding this second metal film 137. The second metal film 137 and the second polysilicon films 135 and 151 constitute a second gate electrode 235. Thus, by using metal as the gate electrode, it is possible to control depletion of the channel region while also lowering the resistance of the gate electrode.

In the present embodiment, a channel is formed in the second silicon layer 120 by impressing a voltage on the second gate electrode 235 during operation.

In addition, a fourth metal-silicon compound 168, a fifth metal-silicon compound 170 and a sixth metal-silicon compound 169 are respectively formed on the first p+ type silicon layer 119, the second gate electrode 235 and the second p+ type silicon layer 159. As the metal comprising the metal-silicon compounds, Ni or Co may be used, for example. Through these metal-silicon compounds, the first p+ type silicon layer 119, the second gate electrode 235 and the second p+ type silicon layer 159 are connected to below-described contacts. Through this, the resistances of the gate, source and drain are lowered.

Furthermore, a fourth insulating film 129 is formed between the second gate electrode 235 and the second planar silicon layer 233, a fifth insulating film 161 is formed in a sidewall shape on the upper sidewall of the second columnar silicon layer 231 and above the second gate electrode 235, and a sixth insulating film 164 is formed in a sidewall shape on the sidewall of the second gate electrode 235 and the fourth insulating film 129. The fourth insulating film 129 is preferably a low-k insulating film such as SiOF, SiOH or the like, for example.

The parasitic capacitance between the gate electrode and the planar silicon layer is reduced by the fourth insulating film 129.

The first n+ type silicon layer 113 is connected to a contact 230 via the first metal-silicon compound 172. The contact 230 is formed from a barrier metal layer 189 and metal layers 194 and 199. The contact 230 is further connected to a power source wire 225. The power source wire 225 is composed of a barrier metal layer 216, a metal layer 217 and a barrier metal layer 218.

The second n+ type silicon layer 157 is connected to a contact 229 via the second metal-silicon compound 171. The contact 229 is composed of a barrier metal layer 188 and metal layers 193 and 198. The contact 229 is further connected to an output wire 223. The output wire 223 is composed of a barrier metal layer 213, a metal layer 214 and a barrier metal layer 215.

The first gate electrode 236 is connected to a contact 228 via the third metal-silicon compound 170 and the second gate electrode 235 is connected to the contact 228 via the fifth metal-silicon compound 170. The contact 228 is composed of a barrier metal layer 187 and metal layers 192 and 197. The contact 228 is further connected to an input wire 224. The input wire 224 is composed of a barrier metal layer 213, a metal layer 214 and a barrier metal layer 215.

The first p+ type silicon layer 119 is connected to a contact 226 via the fourth metal-silicon compound 168. The contact 226 is formed from a barrier metal layer 185 and metal layers 190 and 195. The contact 226 is further connected to a power source wire 222. The power source wire 222 is composed of a barrier metal layer 207, a metal layer 208 and a barrier metal layer 209.

The second p+ type silicon layer 159 is connected to a contact 227 via the sixth metal-silicon compound 169. The contact 227 is composed of a barrier metal layer 186 and metal layers 191 and 196. The contact 227 is further connected to an output wire 223. The output wire 223 is composed of a barrier metal layer 213, a metal layer 214 and a barrier metal layer 215.

Through the above, an inverter circuit is composed from the pMOS SGT 219 and the nMOS SGT 220.

Through this composition, lower resistance and downsizing of the semiconductor device are realized in the inverter circuit according to the present embodiment, and in addition, the parasitic capacitance between interlayer wires is reduced. Through this, it is possible to avoid slowing of operating speeds accompanying SGT downsizing.

Through this composition, lower resistance and downsizing of the semiconductor device are realized in the inverter circuit according to the present embodiment, and in addition, the parasitic capacitance between interlayer wires is reduced. Through this, it is possible to avoid slowing of operating speeds accompanying SGT downsizing.

In this embodiment, the first gate insulating film 140 and the first metal film 138 are preferably materials that make the nMOS SGT 220 enhancement-type, and the second gate insulating film 139 and the second metal film 137 are preferably materials that make the pMOS SGT 219 enhancement-type. The penetrating current that flows during operation of this inverter composed of the nMOS SGT 220 and the pMOS SGT 219 can thus be reduced.

In addition, in the nMOS SGT according to this embodiment, the thickness of the second insulating film 162 is preferably thicker than the sum of the thickness of the first gate insulating film 140 and the thickness of the first metal film 138. In this case, the first gate insulating film 140 and the first metal film 138 are covered by the first columnar silicon layer 232, the first polysilicon films 136 and 152, the first insulating film 129 and the second insulating film 162.

When the above-described composition is employed, the first metal film 138 is protected in its entirety and thus is not etched by a sulfuric acid hydrogen peroxide mixture or an ammonia hydrogen peroxide mixture when the metal-semiconductor compound is formed.

In addition, in the pMOS SGT according to this embodiment, the thickness of the second insulating film 161 is preferably thicker than the sum of the thickness of the second gate insulating film 139 and the thickness of the second metal film 137. In this case, the second gate insulating film 139 and the second metal film 137 are covered by the second columnar silicon layer 231, the second polysilicon films 135 and 151, the fourth insulating film 129 and the fifth insulating film 161.

When the above-described composition is employed, the second metal film 137 is protected in its entirety and thus is not etched by a sulfuric acid hydrogen peroxide mixture or an ammonia hydrogen peroxide mixture when the metal-semiconductor compound is formed.

In addition, in the nMOS SGT according to this embodiment, the length from the center of the first columnar silicon layer 232 to the end of the first planar silicon layer 234 is preferably larger than the sum of the length from the center to the sidewall of the first columnar silicon layer 232, the thickness of the first gate insulating film 140, the thickness of the first gate electrode 236 and the thickness of the third insulating film 164.

When the above-described composition is employed, the first metal-silicon compound 172 can be formed on the n+ type silicon layer 113 without adding any special manufacturing processes.

In addition, in the pMOS SGT according to this embodiment, the length from the center of the second columnar silicon layer 231 to the end of the second planar silicon layer 233 is preferably larger than the sum of the length from the center to the sidewall of the second columnar silicon layer 231, the thickness of the second gate insulating film 139, the thickness of the first gate electrode 235 and the thickness of the sixth insulating film 164.

When the above-described composition is employed, the fourth metal-silicon compound 168 can be formed on the p+ type silicon layer 119 without adding any special manufacturing processes.

Next, one example of the manufacturing method for forming an inverter provided with SGTs according to the embodiments of the present invention will be described with reference to FIGS. 2A through 88D. In these drawings, the same constituent elements are labeled with the same reference numbers.

Figure 2A:
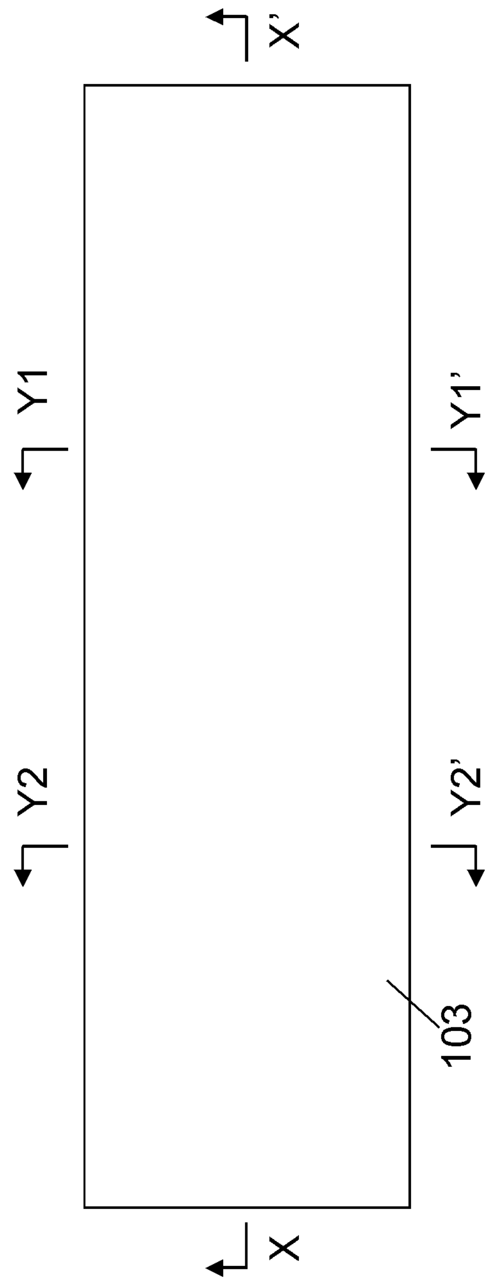
FIG. 2A is a planar view of the semiconductor device during production, showing the method of producing the semiconductor device according to an embodiment of the present invention.
Figure 2B:
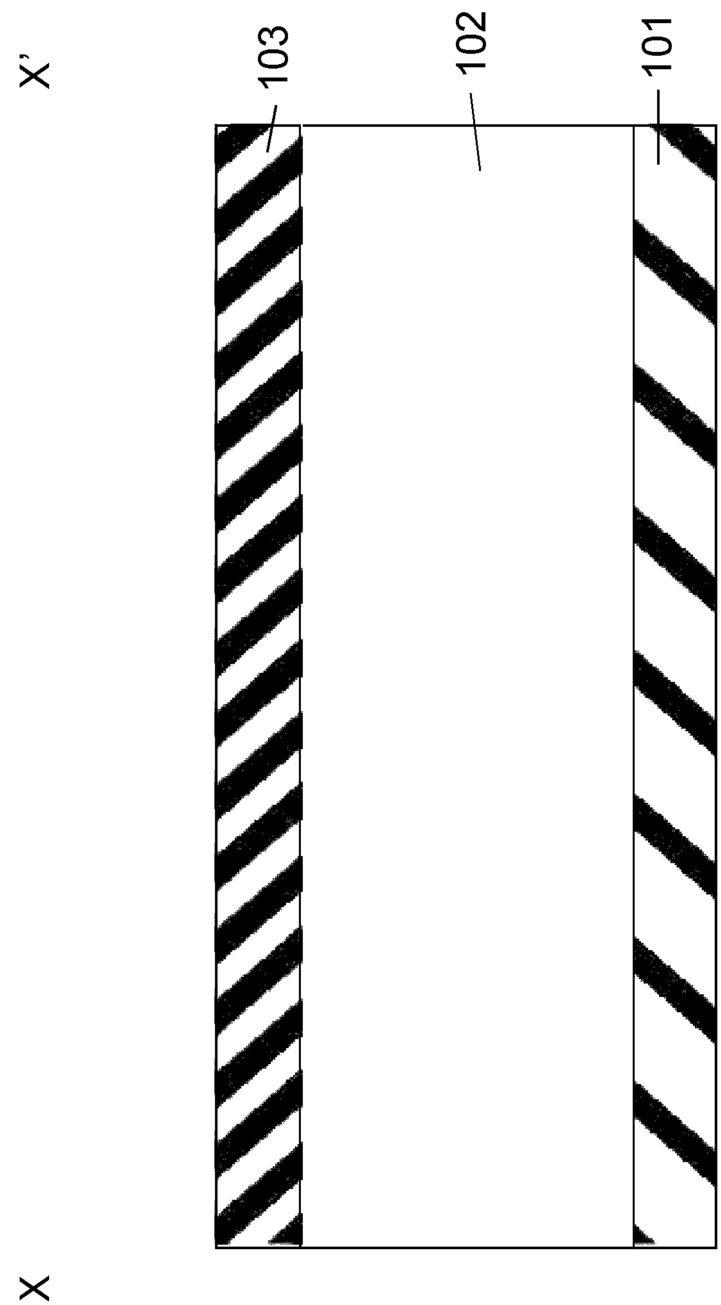
FIG. 2B is a cross-sectional view along line X-X' in FIG. 2A.
Figure 2C:
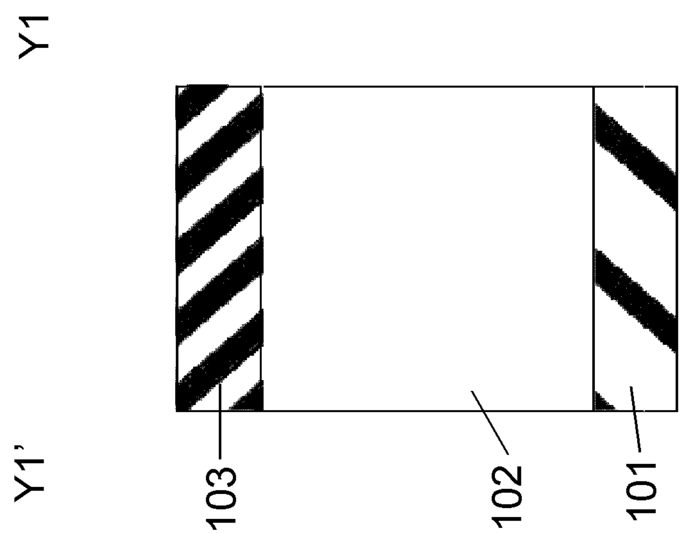
FIG. 2C is a cross-sectional view along line Y1-Y1' in FIG. 2A.
Figure 2D:
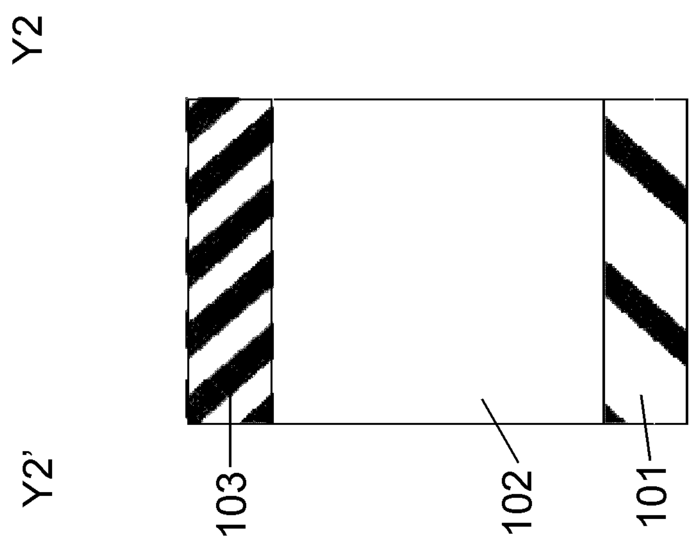
FIG. 2D is a cross-sectional view along line Y2-Y2' in FIG. 2A.
Figure 3A:
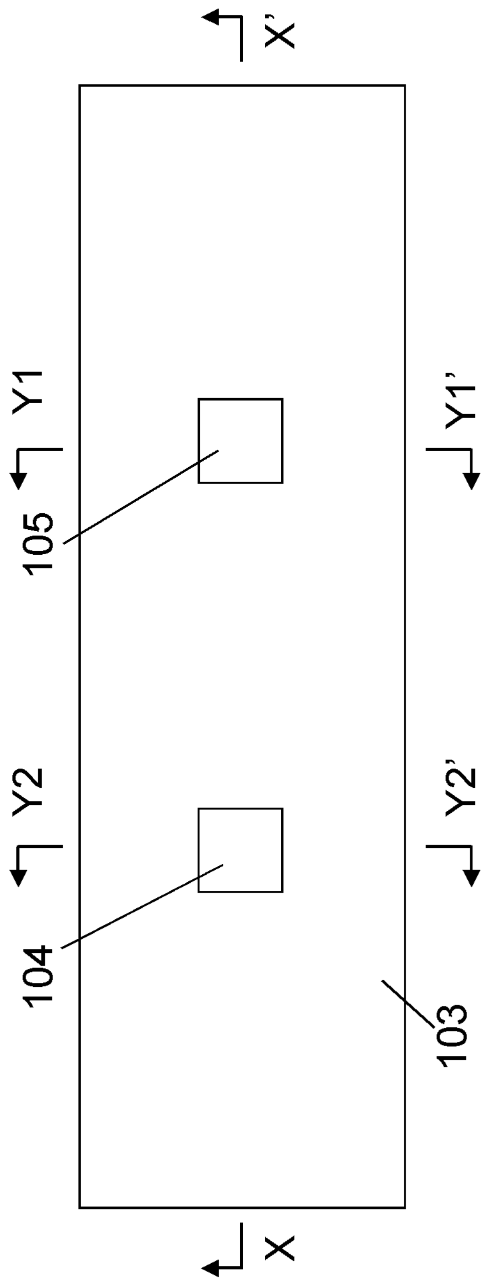
FIG. 3A is a planar view of the semiconductor device during production, showing the method of producing the semiconductor device according to an embodiment of the present invention.
Figure 3B:
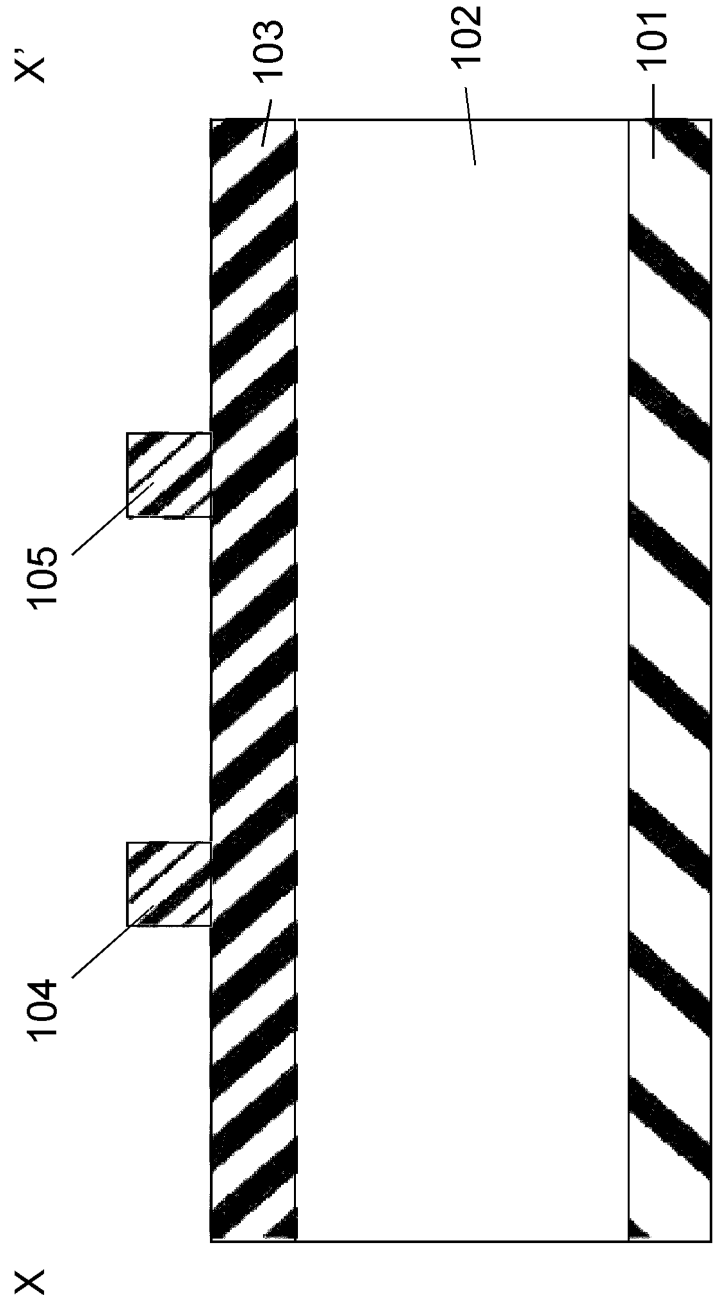
FIG. 3B is a cross-sectional view along line X-X' in FIG. 3A.
Figure 3C:
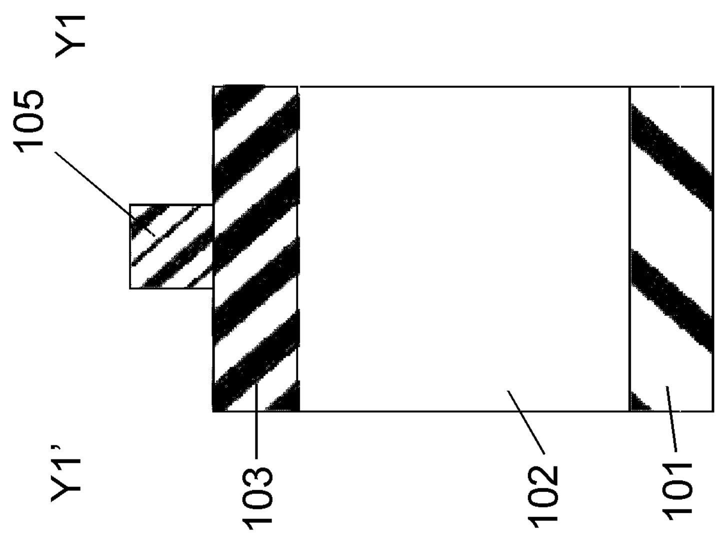
FIG. 3C is a cross-sectional view along line Y1-Y1' in FIG. 3A.
Figure 3D:
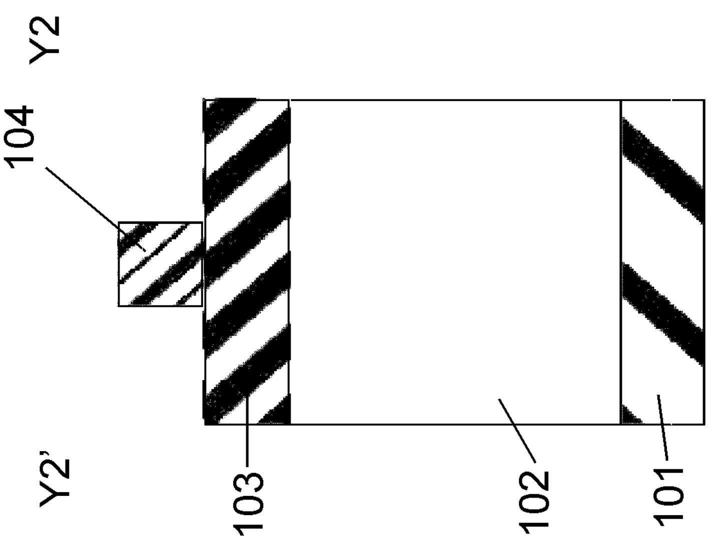
FIG. 3D is a cross-sectional view along line Y2-Y2' in FIG. 3A.
Figure 4A:
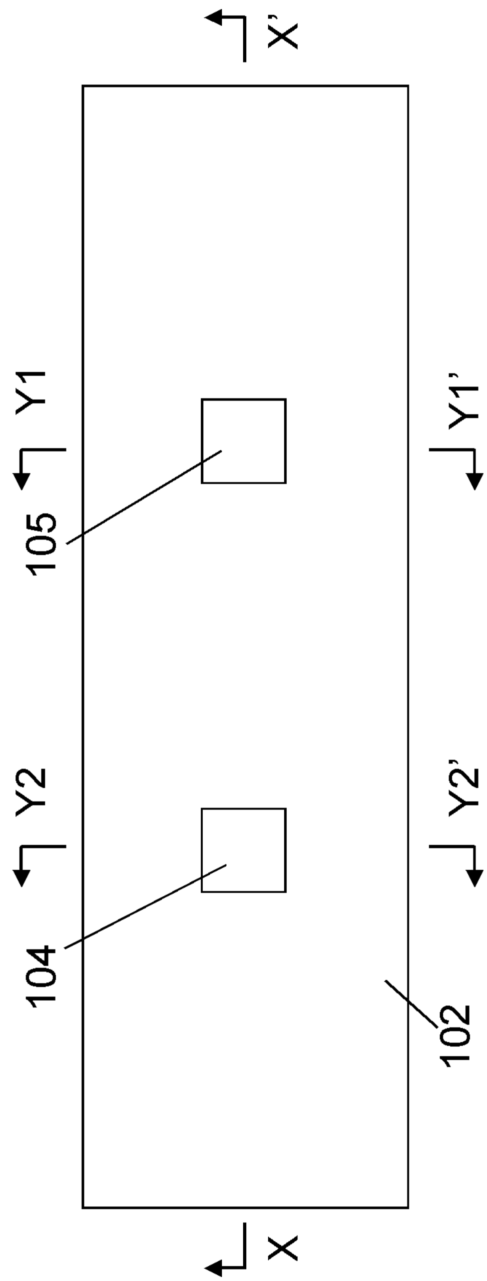
FIG. 4A is a planar view of the semiconductor device during production, showing the method of producing the semiconductor device according to an embodiment of the present invention.
Figure 4B:
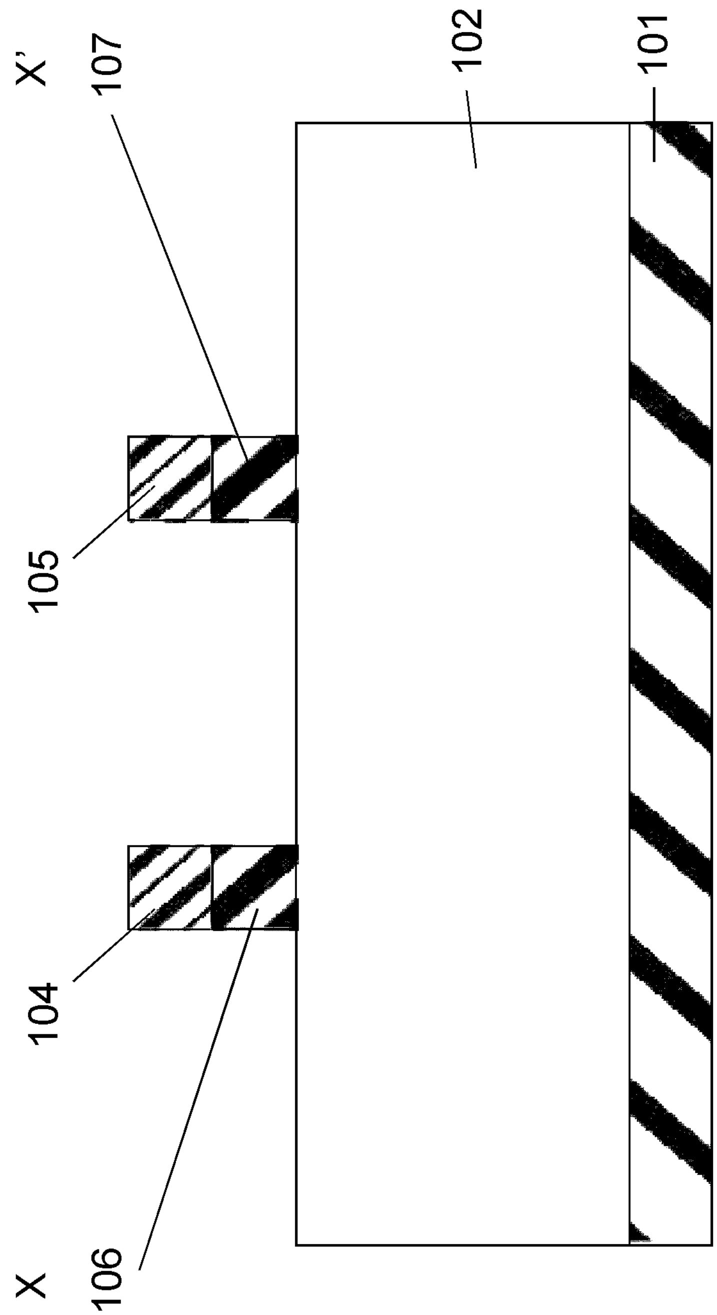
FIG. 4B is a cross-sectional view along line X-X' in FIG. 4A.
Figure 4C:
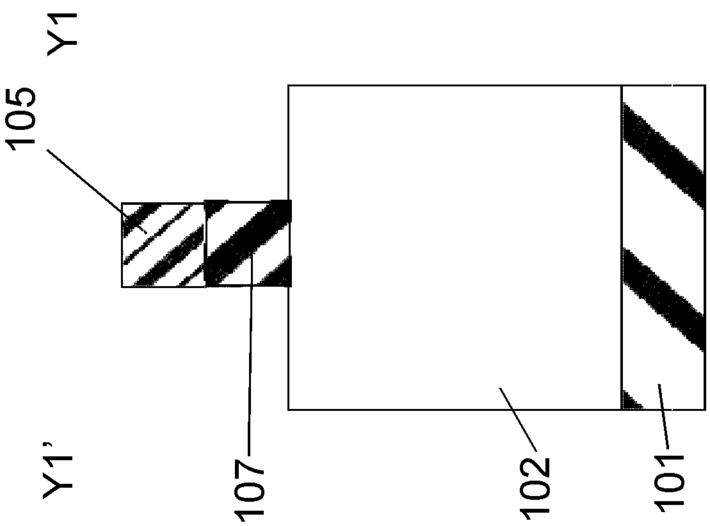
FIG. 4C is a cross-sectional view along line Y1-Y1' in FIG. 4A.
Figure 4D:
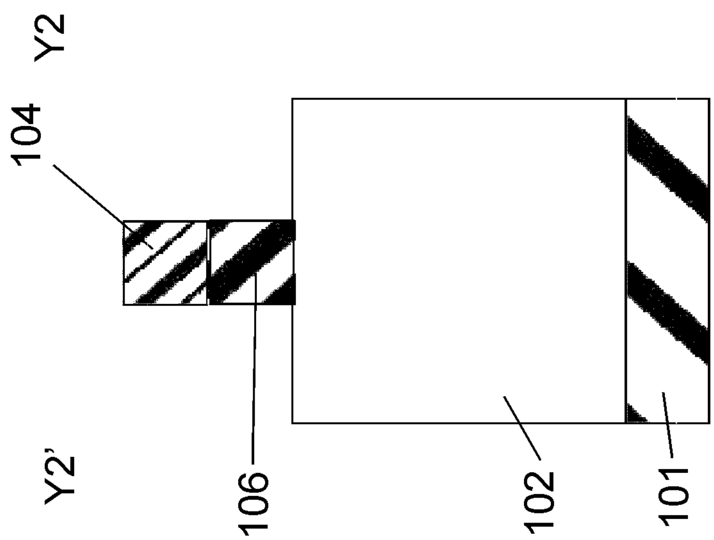
FIG. 4D is a cross-sectional view along line Y2-Y2' in FIG. 4A.
Figure 5A:
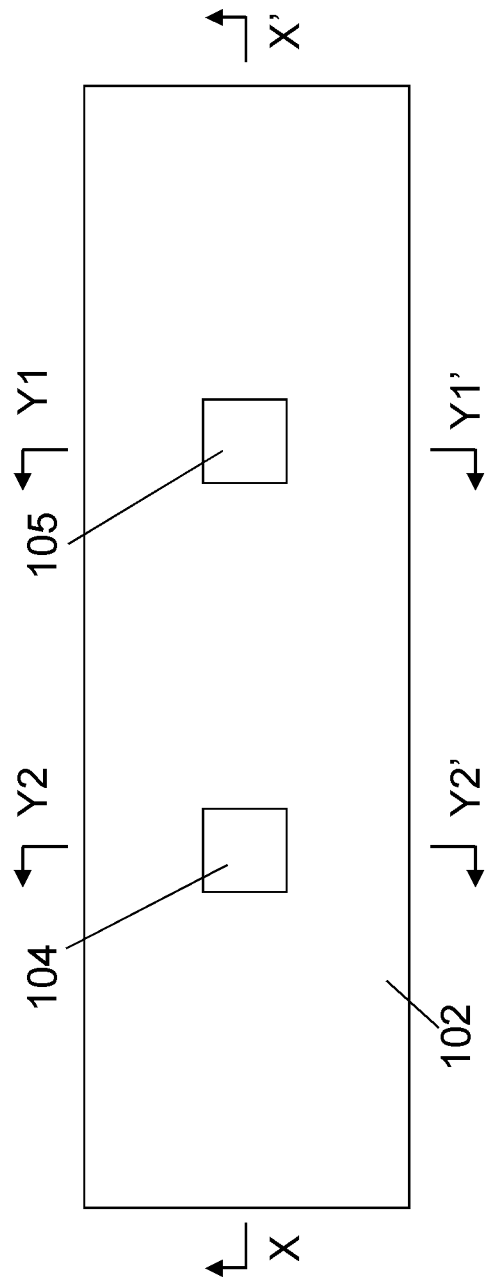
FIG. 5A is a planar view of the semiconductor device during production, showing the method of producing the semiconductor device according to an embodiment of the present invention.
Figure 5B:
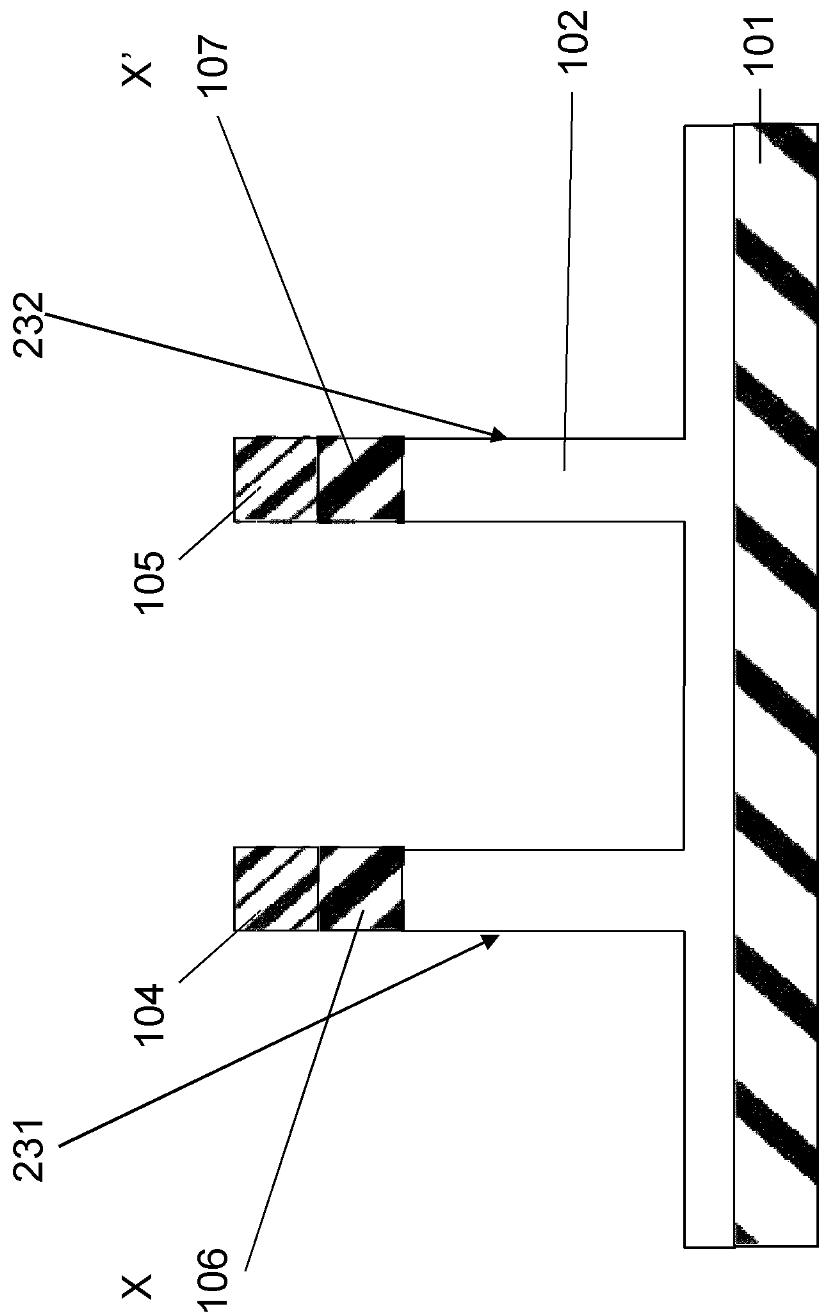
FIG. 5B is a cross-sectional view along line X-X' in FIG. 5A.
Figure 5C:
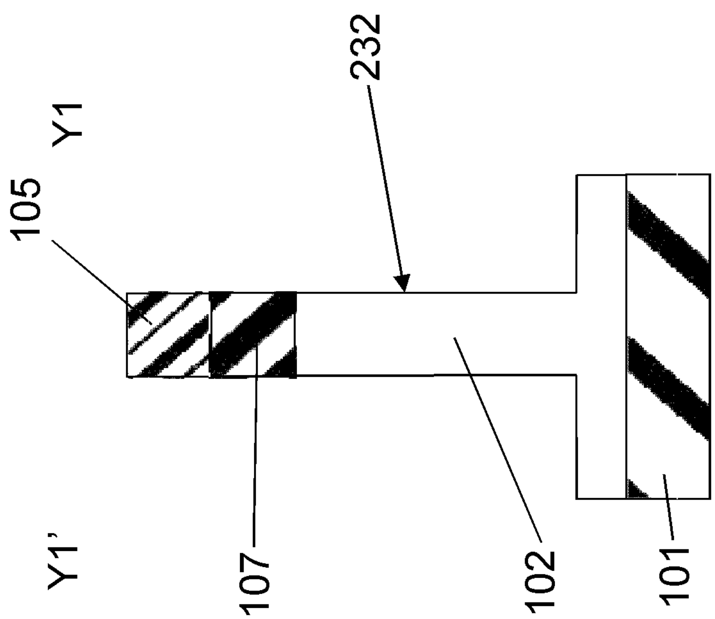
FIG. 5C is a cross-sectional view along line Y1-Y1' in FIG. 5A.
Figure 5D:
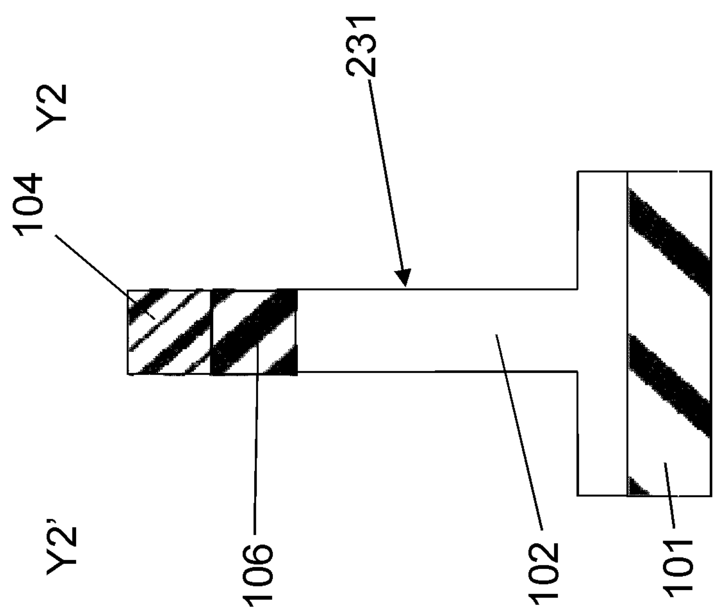
FIG. 5D is a cross-sectional view along line Y2-Y2' in FIG. 5A.
Figure 6A:
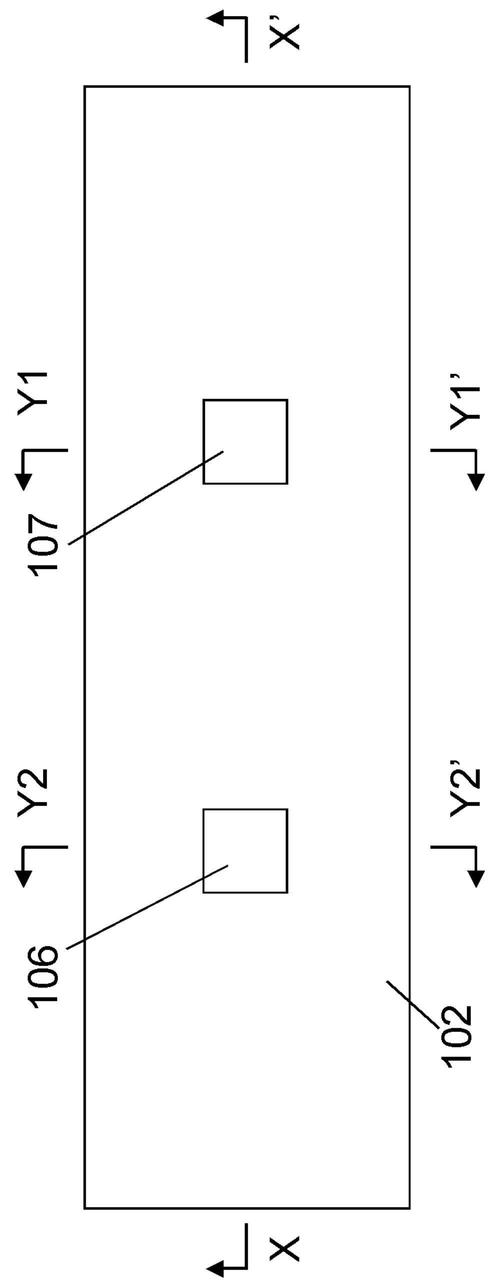
FIG. 6A is a planar view of the semiconductor device during production, showing the method of producing the semiconductor device according to an embodiment of the present invention.
Figure 6B:
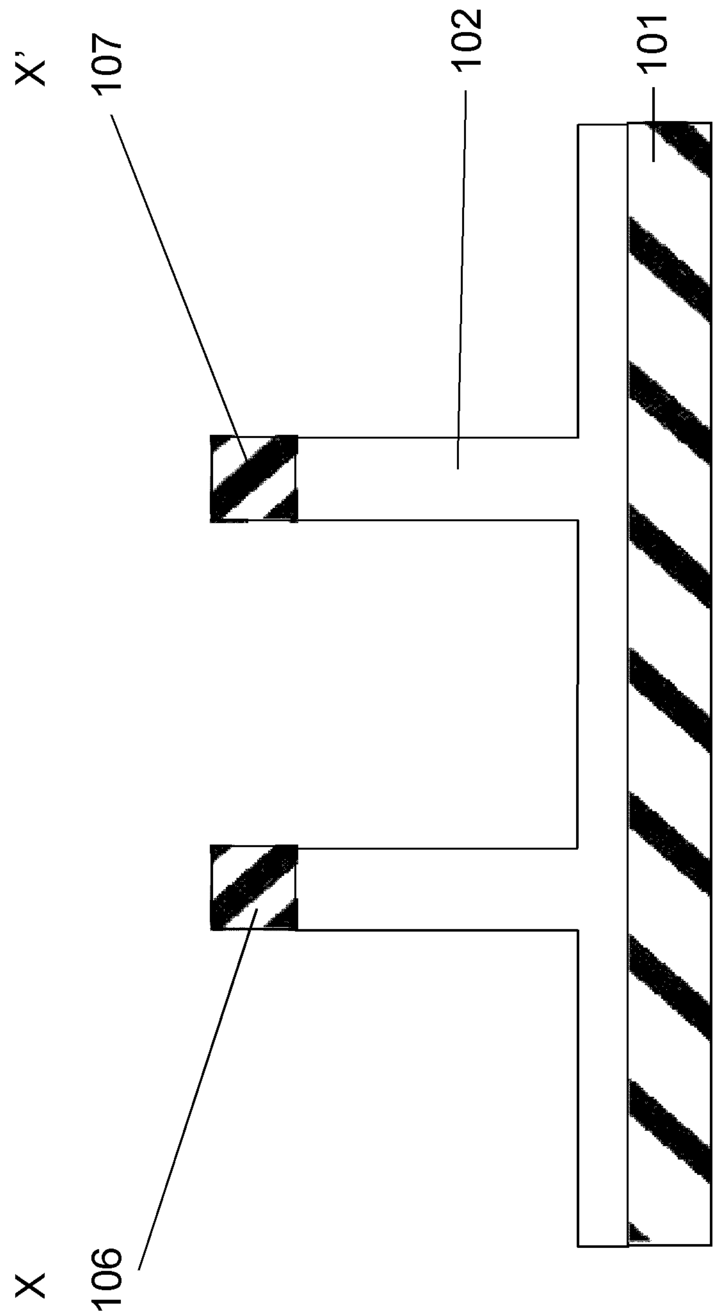
FIG. 6B is a cross-sectional view along line X-X' in FIG. 6A.
Figure 6C:
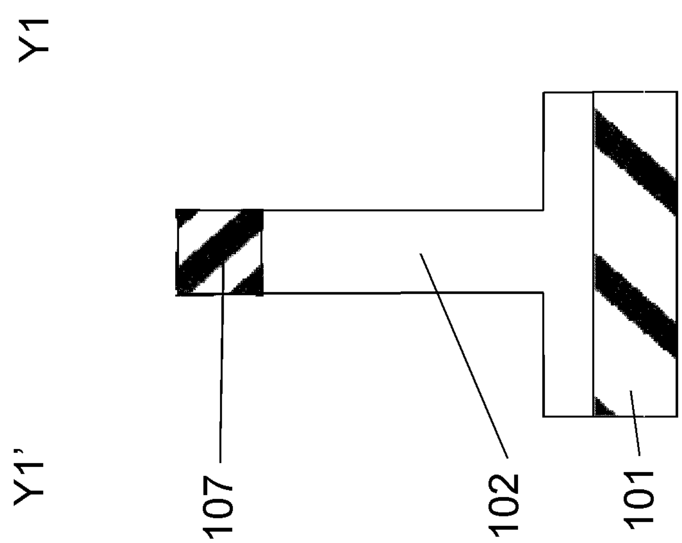
FIG. 6C is a cross-sectional view along line Y1-Y1' in FIG. 6A.
Figure 6D:
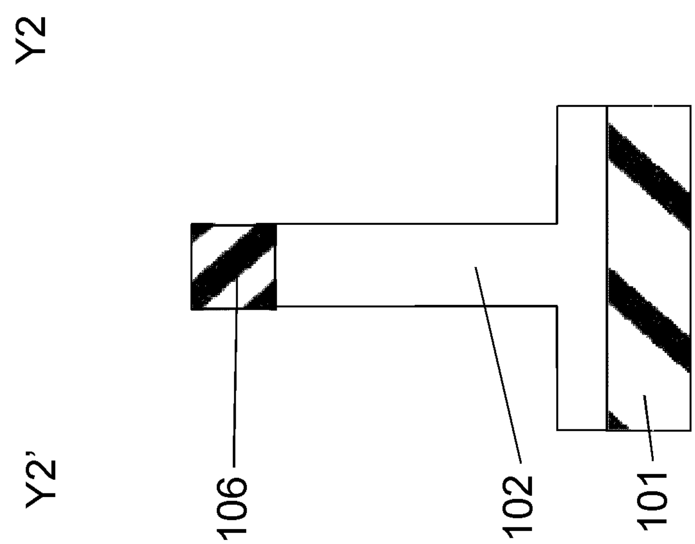
FIG. 6D is a cross-sectional view along line Y2-Y2' in FIG. 6A.
Figure 7A:
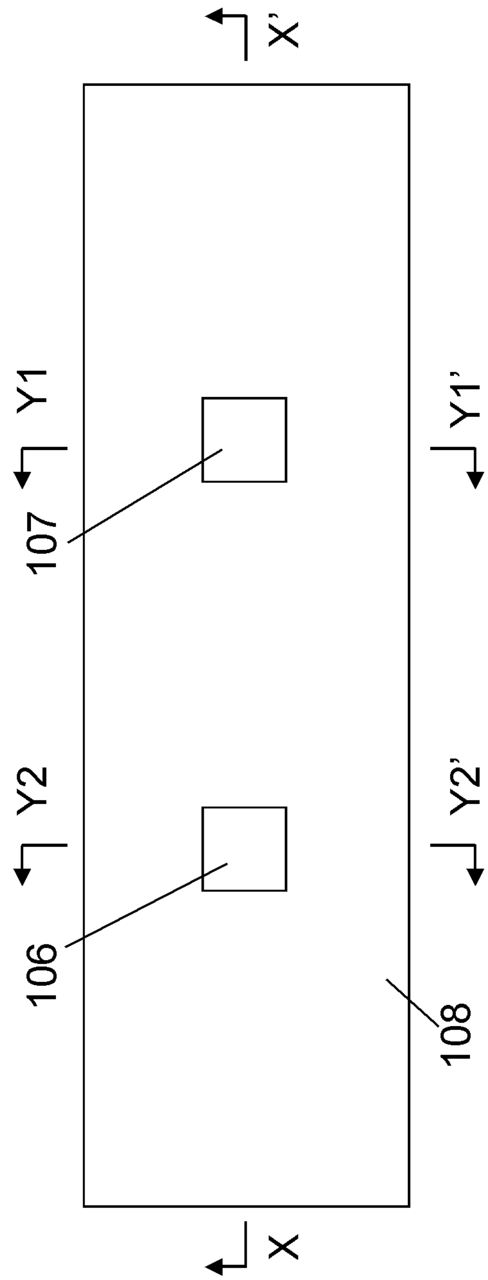
FIG. 7A is a planar view of the semiconductor device during production, showing the method of producing the semiconductor device according to an embodiment of the present invention.
Figure 7B:
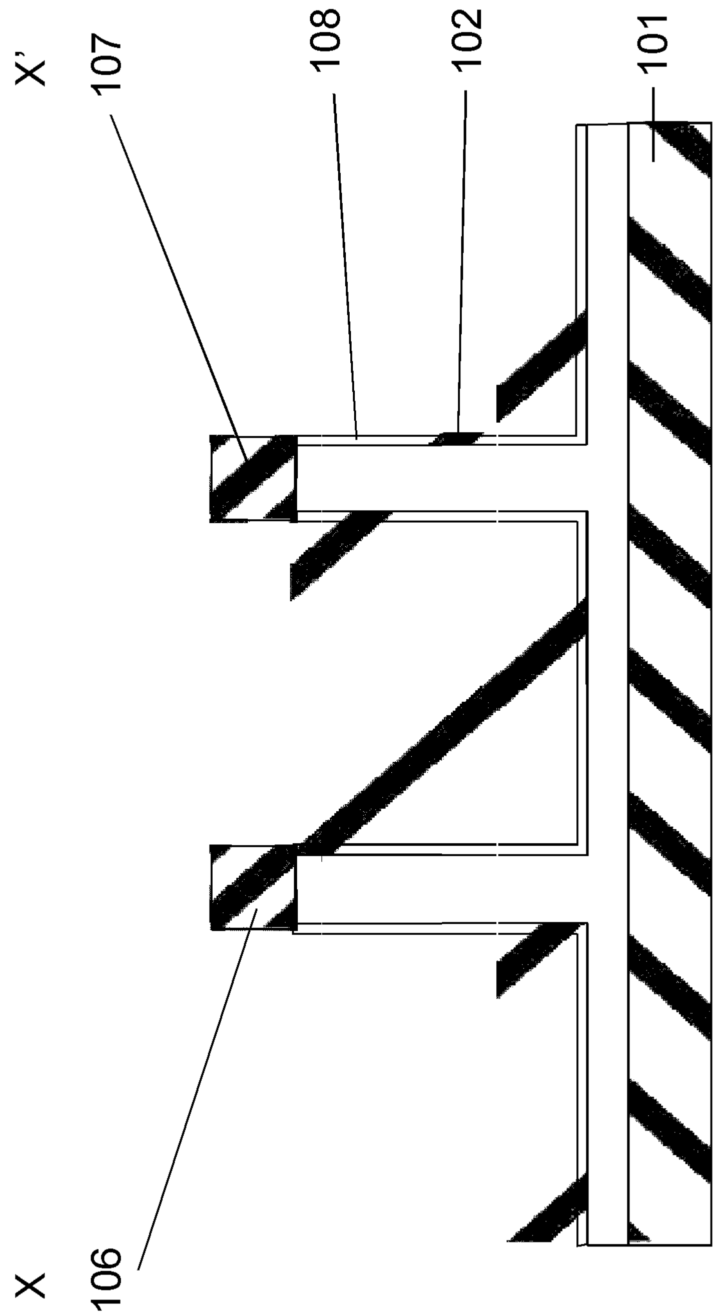
FIG. 7B is a cross-sectional view along line X-X' in FIG. 7A.
Figure 7C:
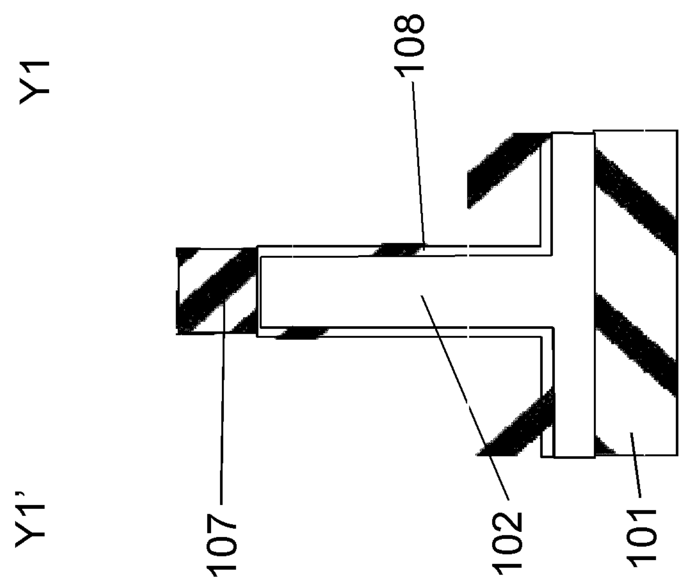
FIG. 7C is a cross-sectional view along line Y1-Y1' in FIG. 7A.
Figure 7D:
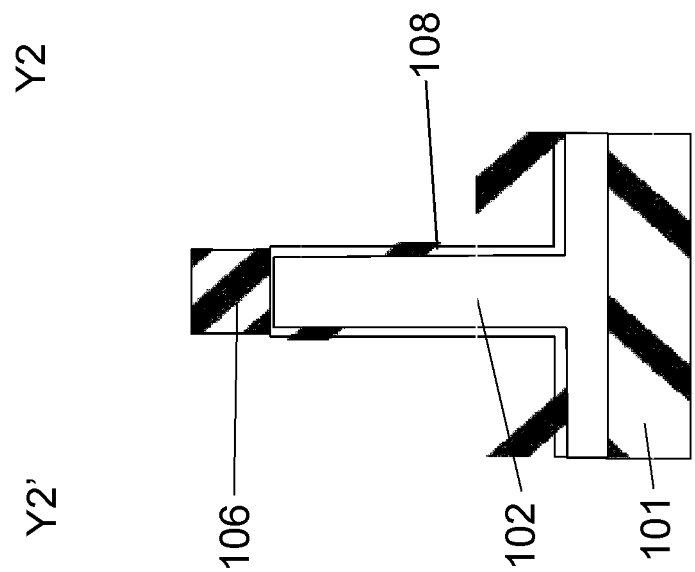
FIG. 7D is a cross-sectional view along line Y2-Y2' in FIG. 7A.
Figure 8A:
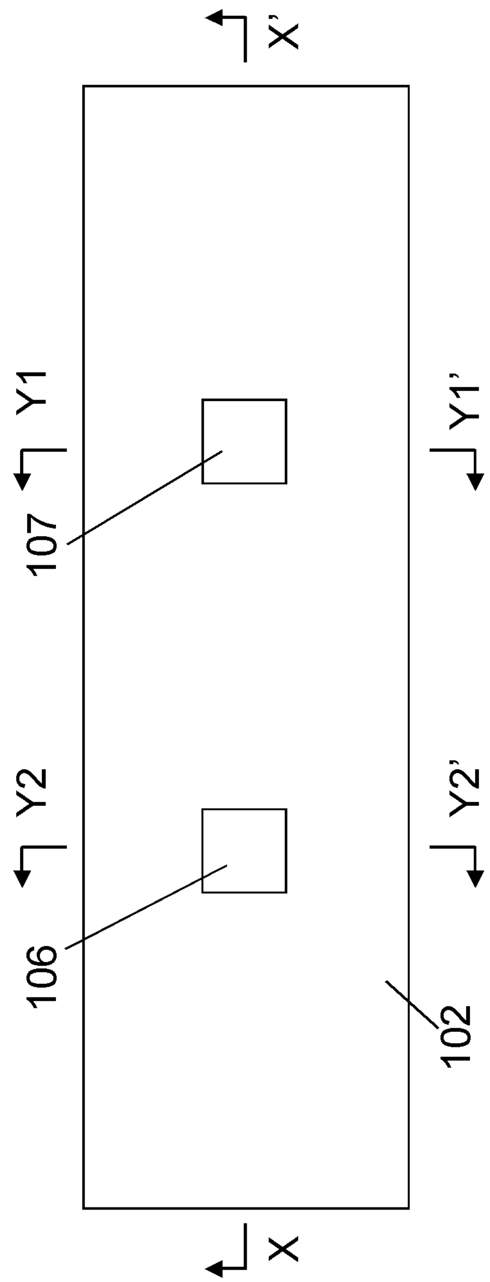
FIG. 8A is a planar view of the semiconductor device during production, showing the method of producing the semiconductor device according to an embodiment of the present invention.
Figure 8B:
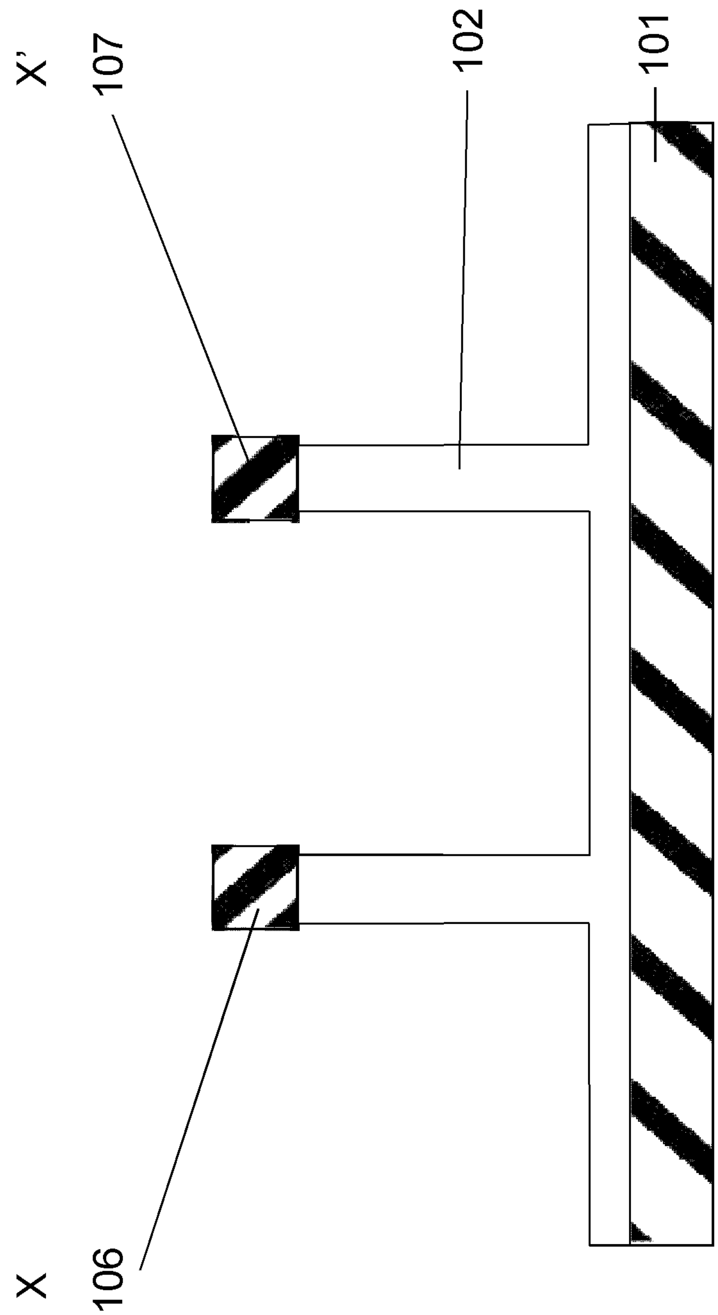
FIG. 8B is a cross-sectional view along line X-X' in FIG. 8A.
Figure 8C:
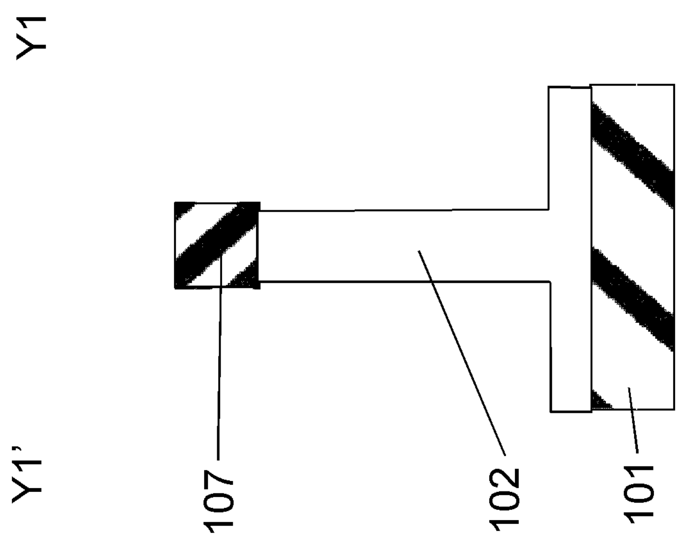
FIG. 8C is a cross-sectional view along line Y1-Y1' in FIG. 8A.
Figure 8D:
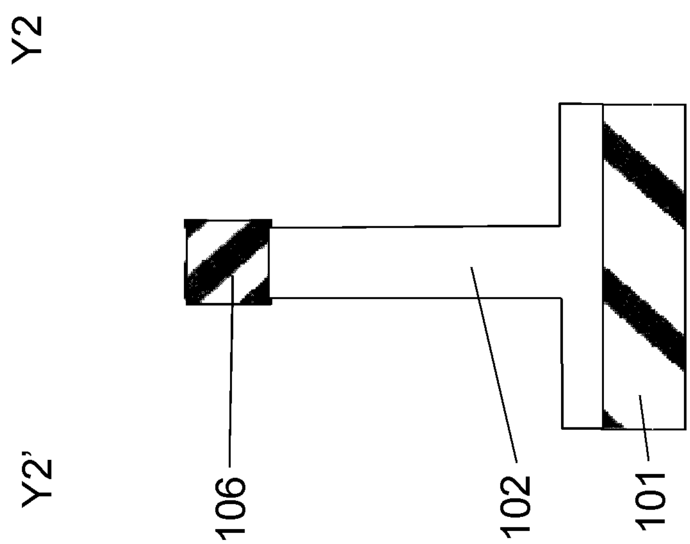
FIG. 8D is a cross-sectional view along line Y2-Y2' in FIG. 8A.
Figure 9A:
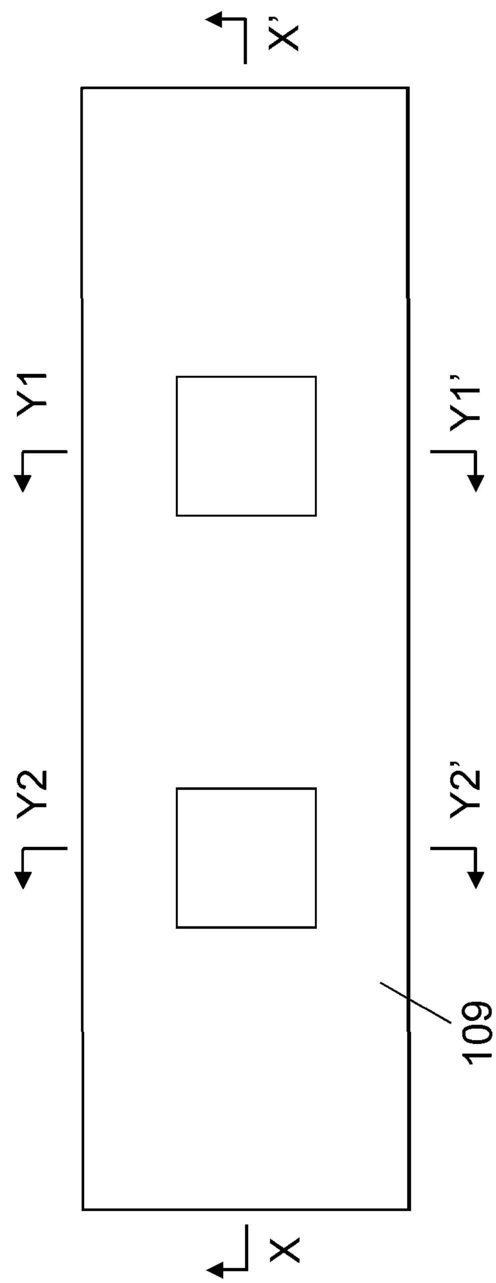
FIG. 9A is a planar view of the semiconductor device during production, showing the method of producing the semiconductor device according to an embodiment of the present invention.
Figure 9B:
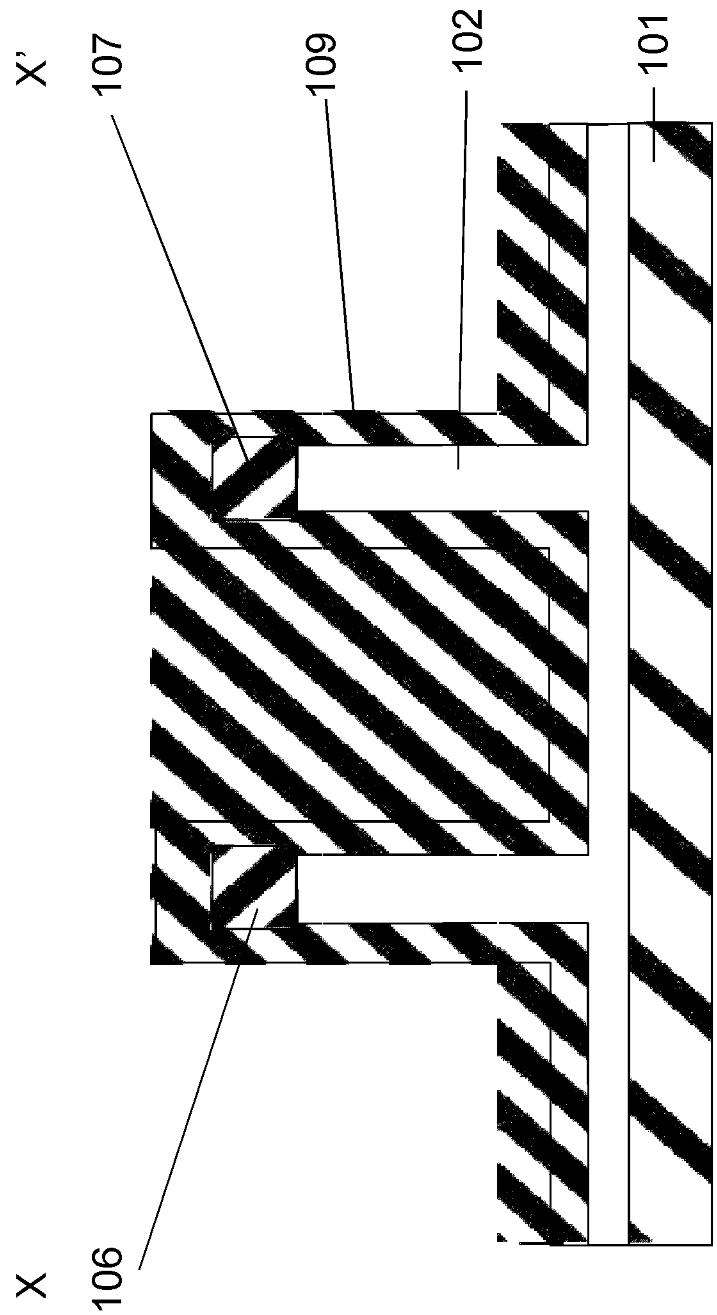
FIG. 9B is a cross-sectional view along line X-X' in FIG. 9A.
Figure 9C:
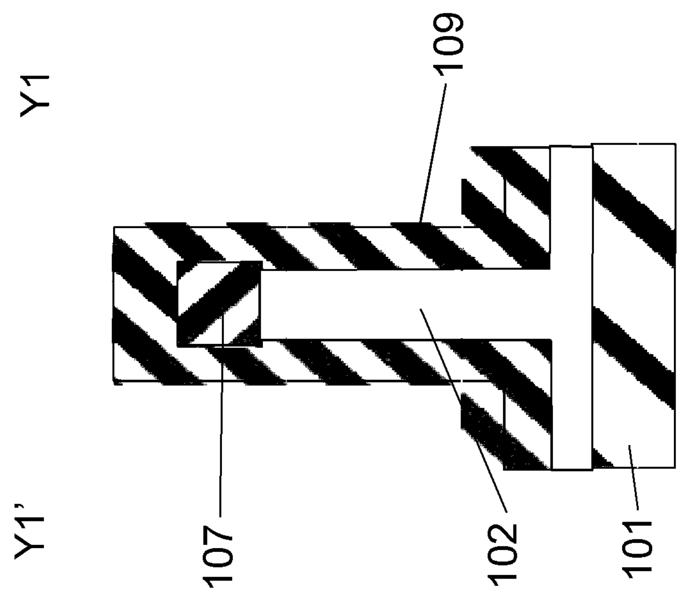
FIG. 9C is a cross-sectional view along line Y1-Y1' in FIG. 9A.
Figure 9D:
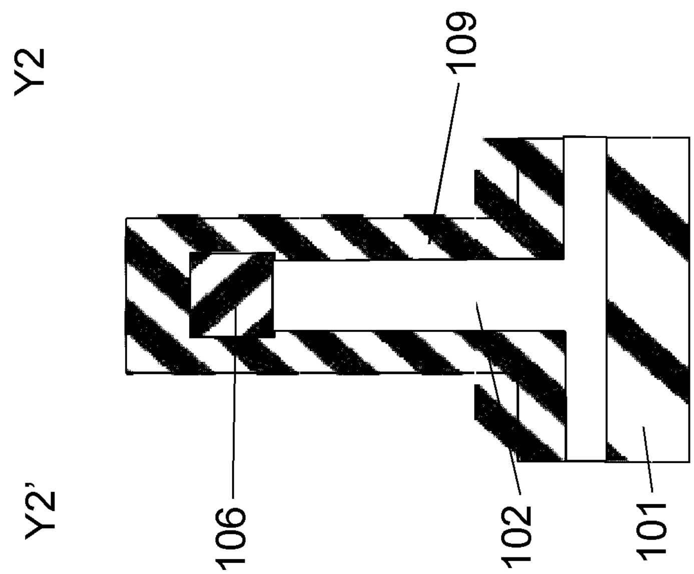
FIG. 9D is a cross-sectional view along line Y2-Y2' in FIG. 9A.
Figure 10A:
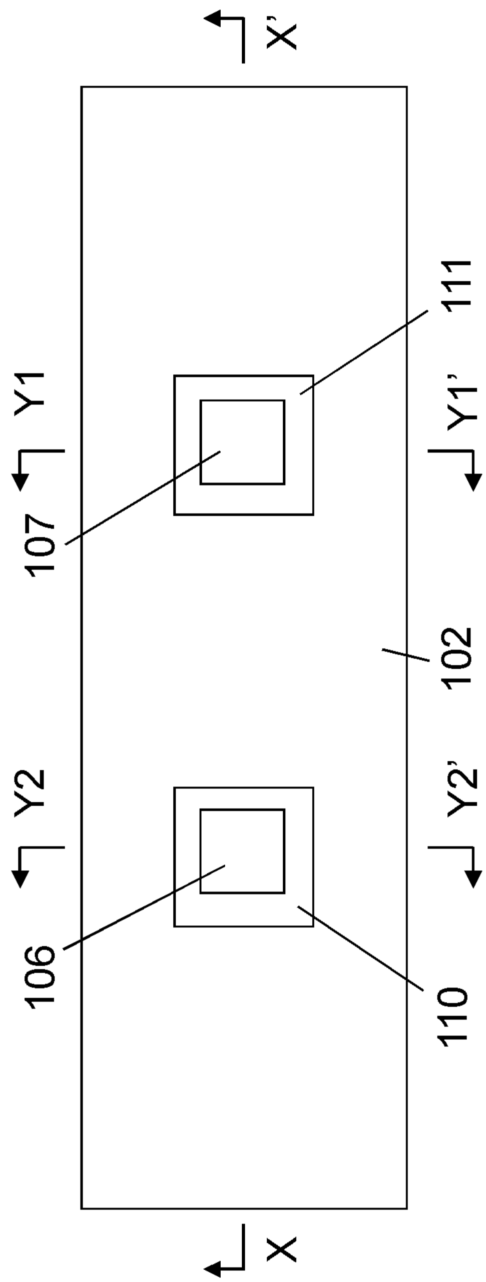
FIG. 10A is a planar view of the semiconductor device during production, showing the method of producing the semiconductor device according to an embodiment of the present invention.
Figure 10B:
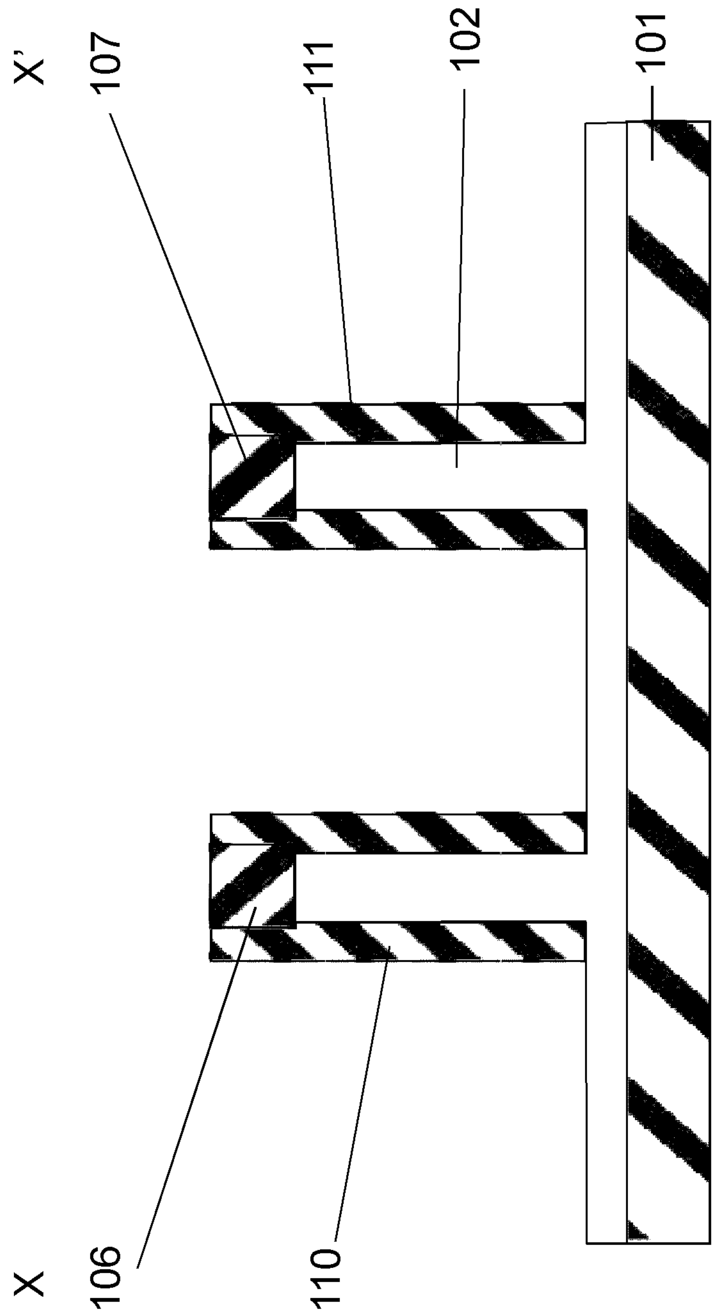
FIG. 10B is a cross-sectional view along line X-X' in FIG. 10A.
Figure 10C:
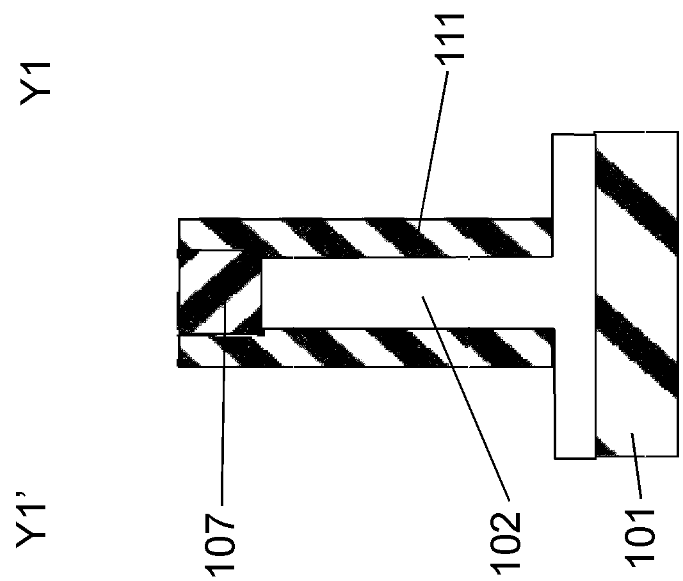
FIG. 10C is a cross-sectional view along line Y1-Y1' in FIG. 10A.
Figure 10D:
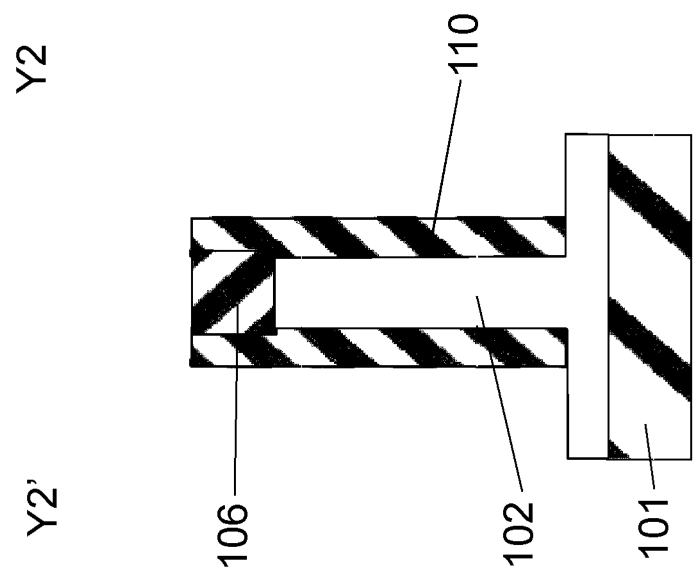
FIG. 10D is a cross-sectional view along line Y2-Y2' in FIG. 10A.
Figure 11A:
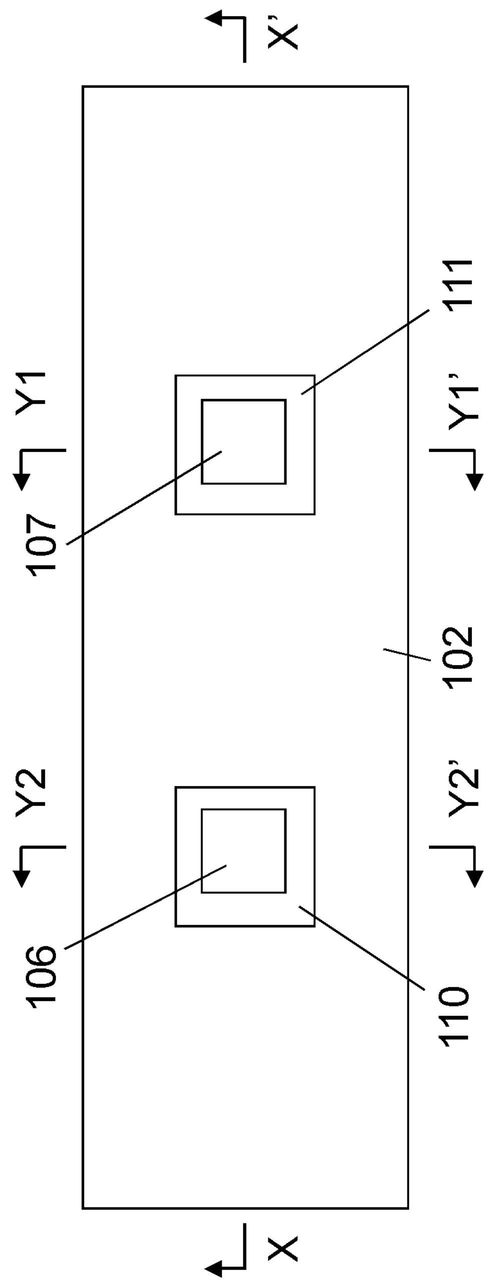
FIG. 11A is a planar view of the semiconductor device during production, showing the method of producing the semiconductor device according to an embodiment of the present invention.
Figure 11B:
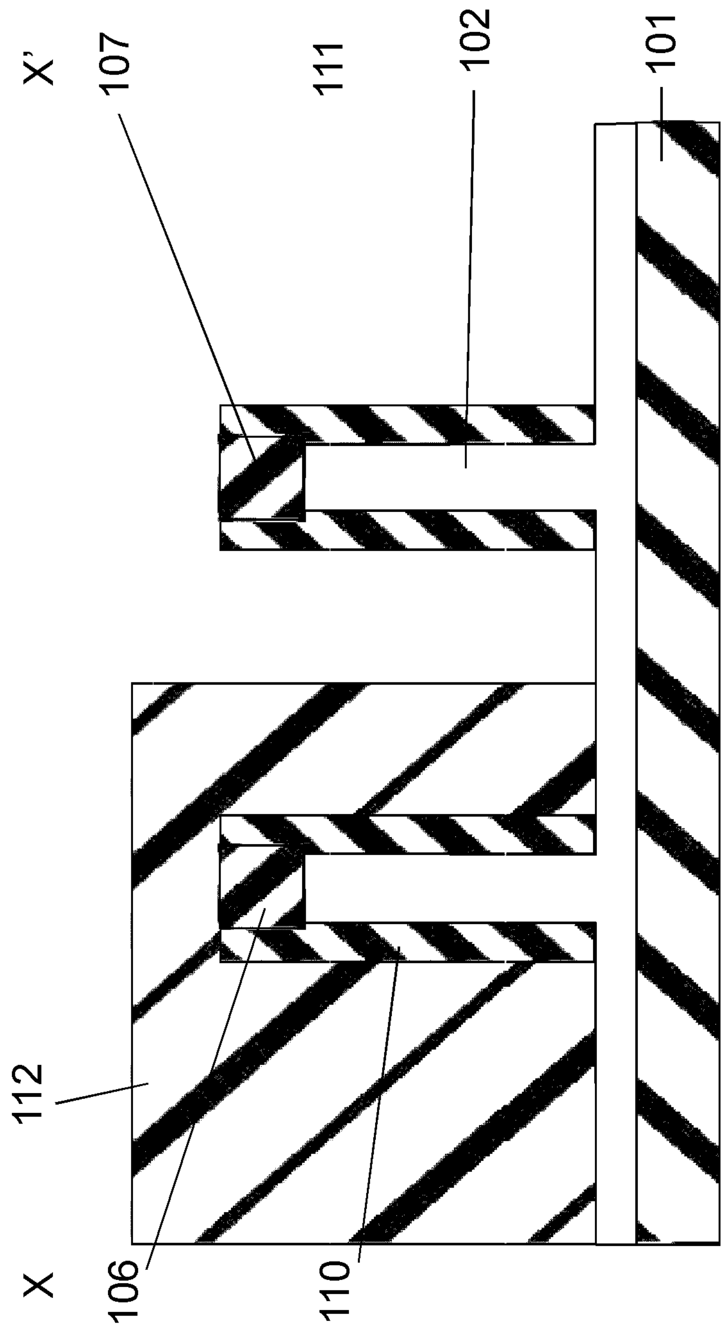
FIG. 11B is a cross-sectional view along line X-X' in FIG. 11A.
Figure 11C:
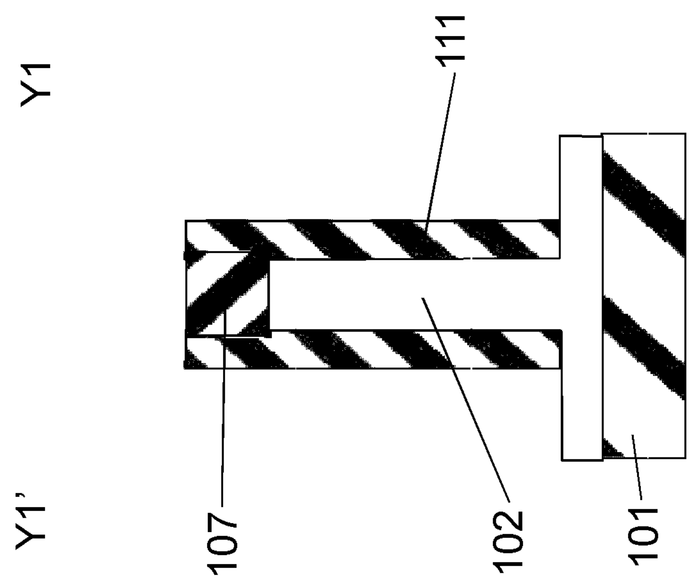
FIG. 11C is a cross-sectional view along line Y1-Y1' in FIG. 11A.
Figure 111D:
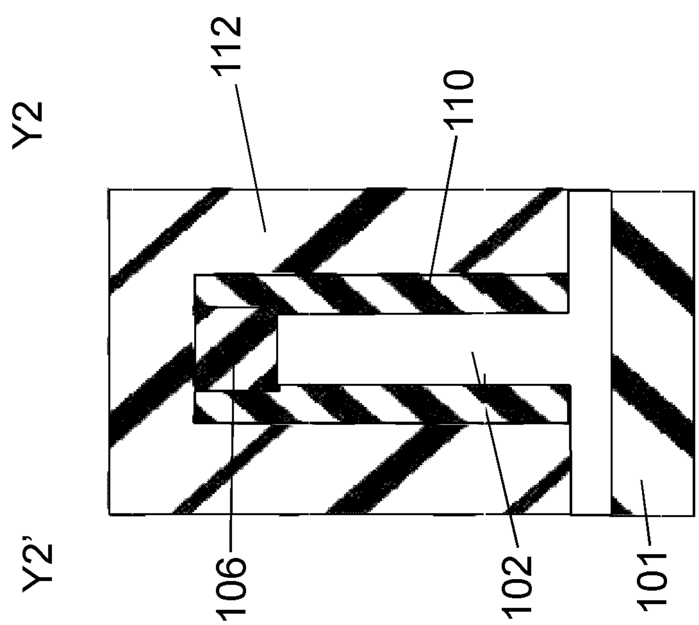

FIGS. 2A through 88D show an example of producing an SGT according to the present invention. In each drawing, part A shows a planar view, part B shows a cross-sectional view along line X-X', part C shows a cross-sectional view along line Y1-Y1' and part D shows a cross-sectional view along line Y2-Y2'.

First, as shown in FIGS. 2A to 2D, a nitride film 103 is formed on a substrate composed of a silicon oxide film 101 and a silicon layer 102. Here, the substrate may also be composed of silicon. In addition, an oxide film may be formed on the silicon layer and another silicon layer may be formed on the oxide film. In the present embodiment, an i-type silicon layer is used as the silicon layer 102. When a p-type silicon layer and an n-type silicon layer are used in place of the i-type silicon layer, dopants are introduced into the part that becomes the channel of the SGT. In addition, a thin n-type silicon layer or a thin p-type silicon layer may be used in place of the i-type silicon layer.

Next, resists 104 and 105 for forming a hard mask for a columnar silicon layer are formed on the nitride film 103, as shown in FIGS. 3A to 3D.

Next, the nitride film 103 is etched and hard masks 106 and 107 are formed, as shown in FIGS. 4A to 4D.

Next, the silicon layer 102 is etched and columnar silicon layers 231 and 232 are formed, as shown in FIGS. 5A to 5D.

Next, the resists 104 and 105 are removed. Conditions on the substrate following removal are shown in FIGS. 6A to 6D.

The surface of the silicon layer 102 is oxidized and a sacrificial oxide film 108 is formed, as shown in FIGS. 7A to 7D. By making this sacrificial oxide film, the surface of the silicon, such as carbon thrown in during silicon etching, is removed.

The sacrificial oxide film 108 is removed through etching to form the shape shown in FIGS. 8A to 8D.

An oxide film 109 is formed on the surface of the silicon layer 102 and the hard masks 106 and 107, as shown in FIGS. 9A to 9D.

The oxide film 109 is etched and left in sidewall shape on the sidewall of the columnar silicon layers 231 and 232 to form sidewalls 110 and 111, as shown in FIGS. 10A to 10D. When forming an n+ type silicon layer by injecting dopants surrounding the bottom of the columnar silicon layer 231, these sidewalls 110 and 111 prevent dopants from entering the channel, making it possible to control fluctuations in the threshold voltage of the SGT.

A resist 112 for injecting dopants into the bottom of the columnar silicon layer 232 is formed surrounding the columnar silicon layer 231, as shown in FIGS. 11A to 11D.

Figure 12A:
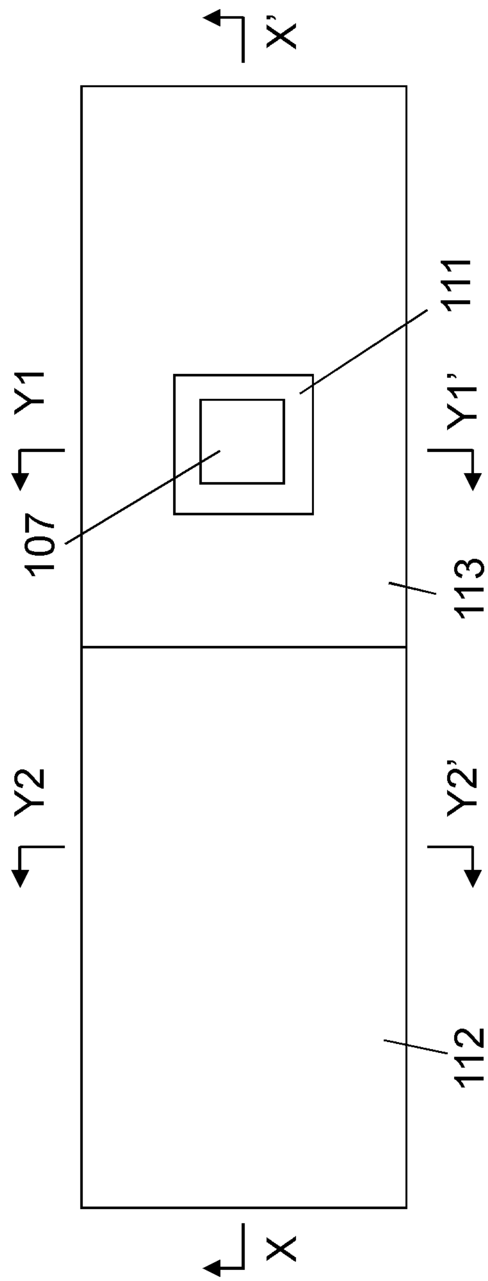
FIG. 12A is a planar view of the semiconductor device during production, showing the method of producing the semiconductor device according to an embodiment of the present invention.
Figure 12B:
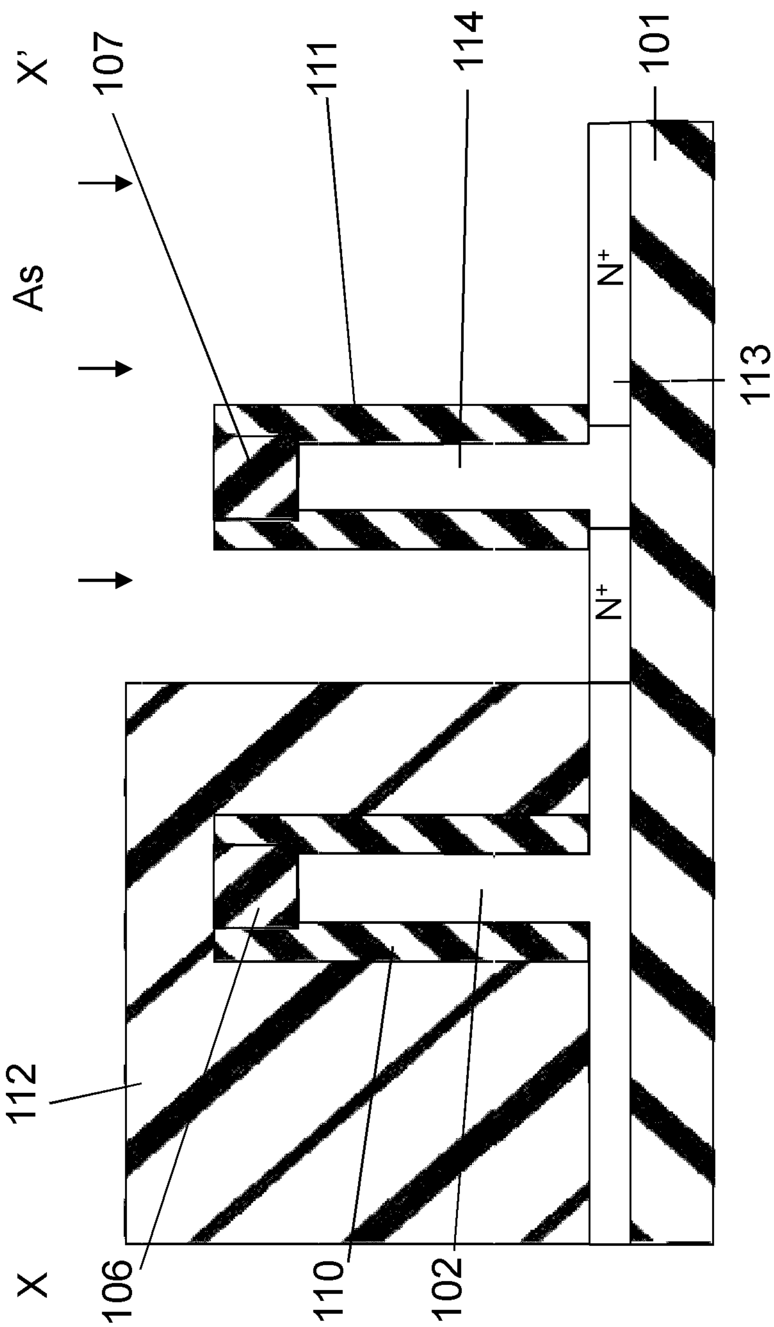
FIG. 12B is a cross-sectional view along line X-X' in FIG. 12A.
Figure 12C:
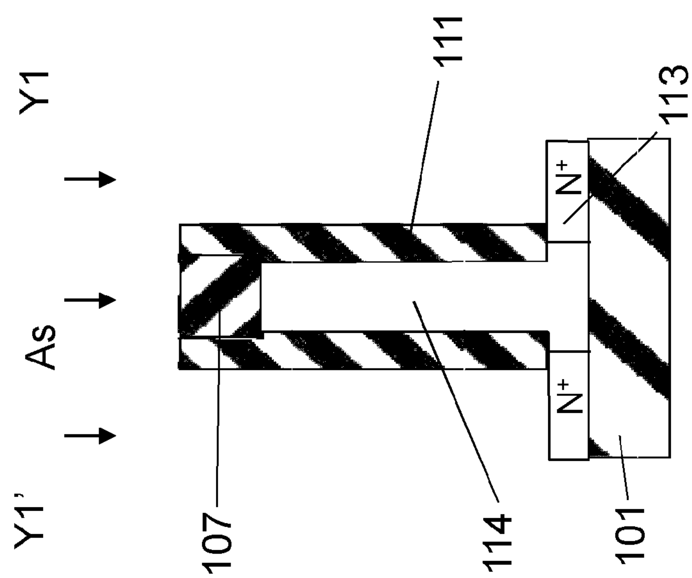
FIG. 12C is a cross-sectional view along line Y1-Y1' in FIG. 12A.
Figure 12D:
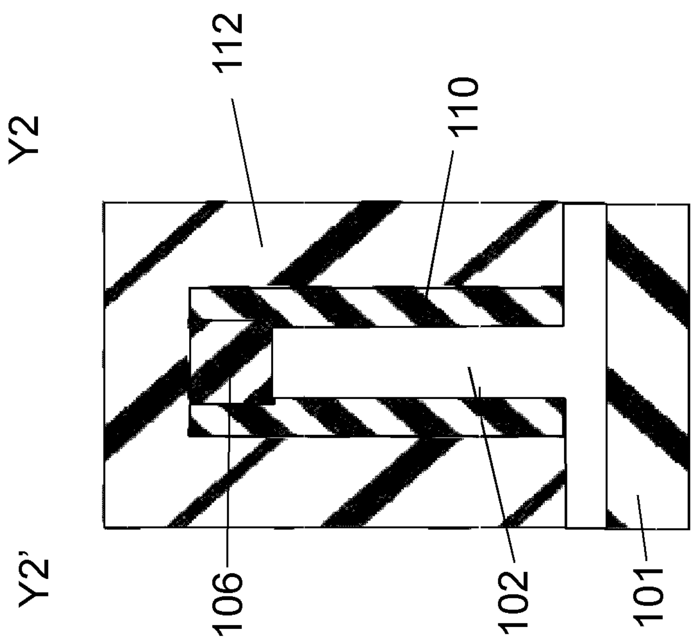
FIG. 12D is a cross-sectional view along line Y2-Y2' in FIG. 12A.
Figure 13A:
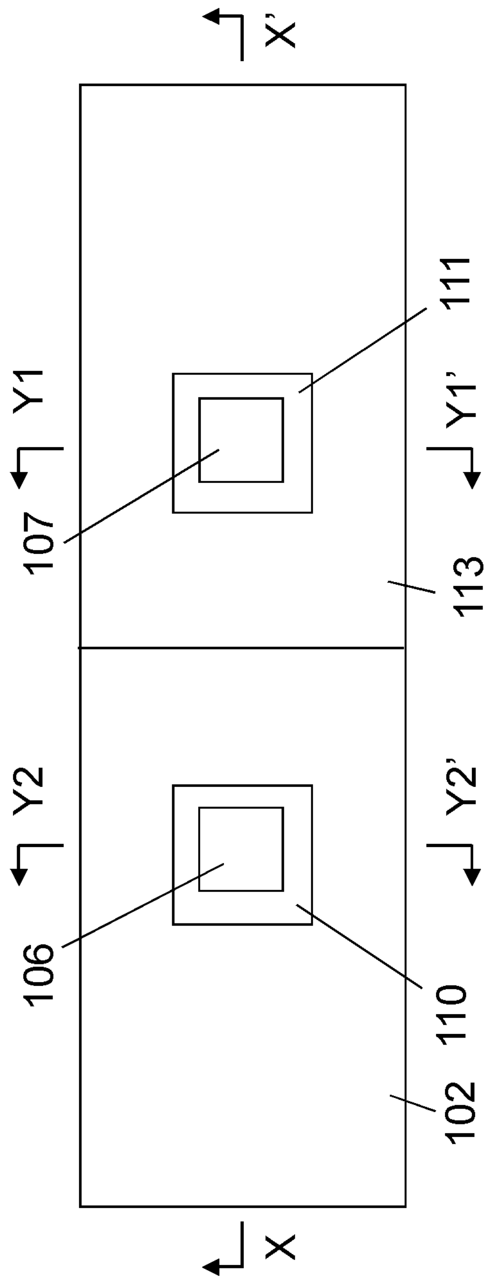
FIG. 13A is a planar view of the semiconductor device during production, showing the method of producing the semiconductor device according to an embodiment of the present invention.
Figure 13B:
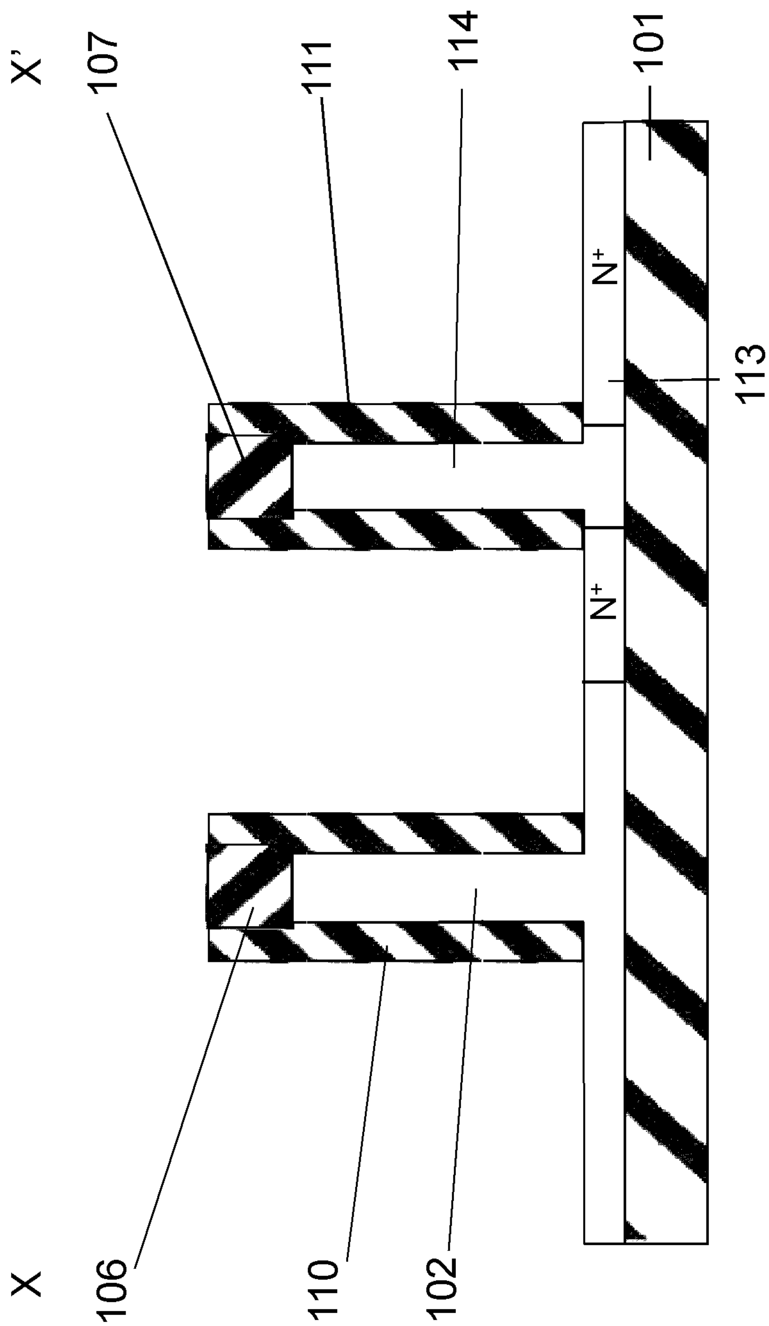
FIG. 13B is a cross-sectional view along line X-X' in FIG. 13A.
Figure 13C:
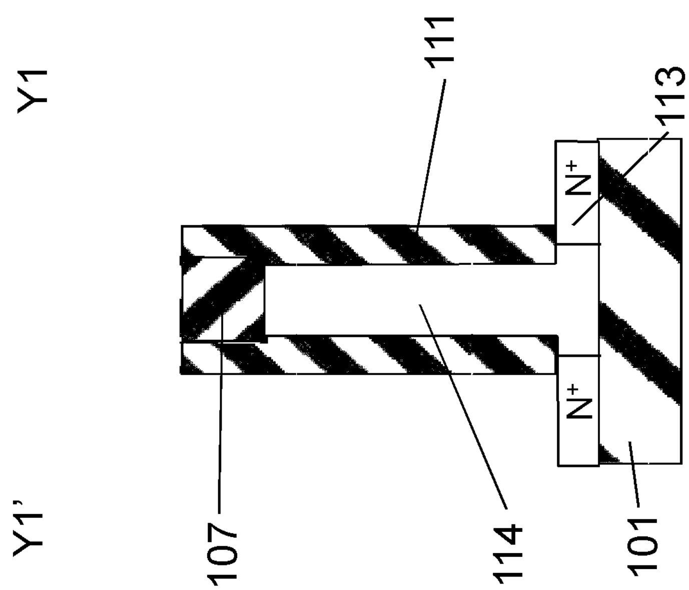
FIG. 13C is a cross-sectional view along line Y1-Y1' in FIG. 13A.
Figure 13D:
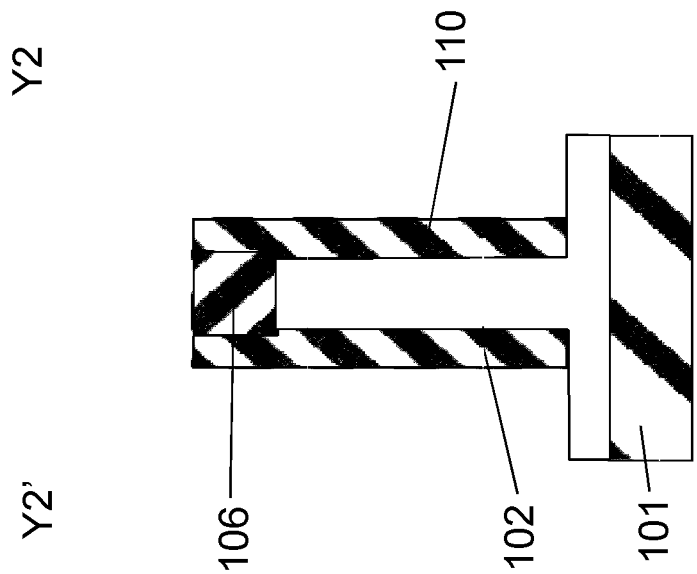
FIG. 13D is a cross-sectional view along line Y2-Y2' in FIG. 13A.
Figure 14A:
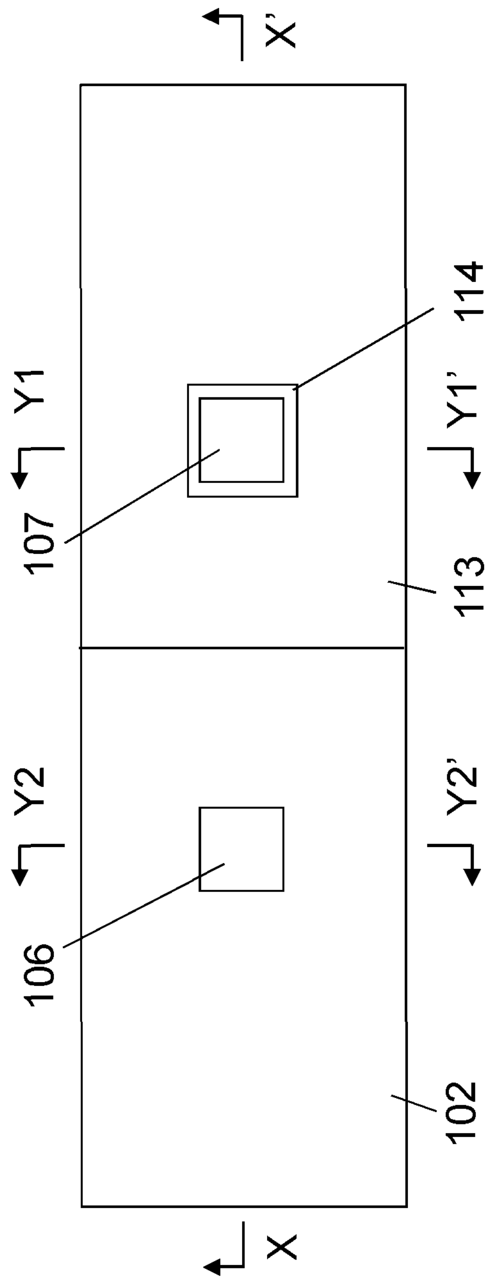
FIG. 14A is a planar view of the semiconductor device during production, showing the method of producing the semiconductor device according to an embodiment of the present invention.
Figure 14B:
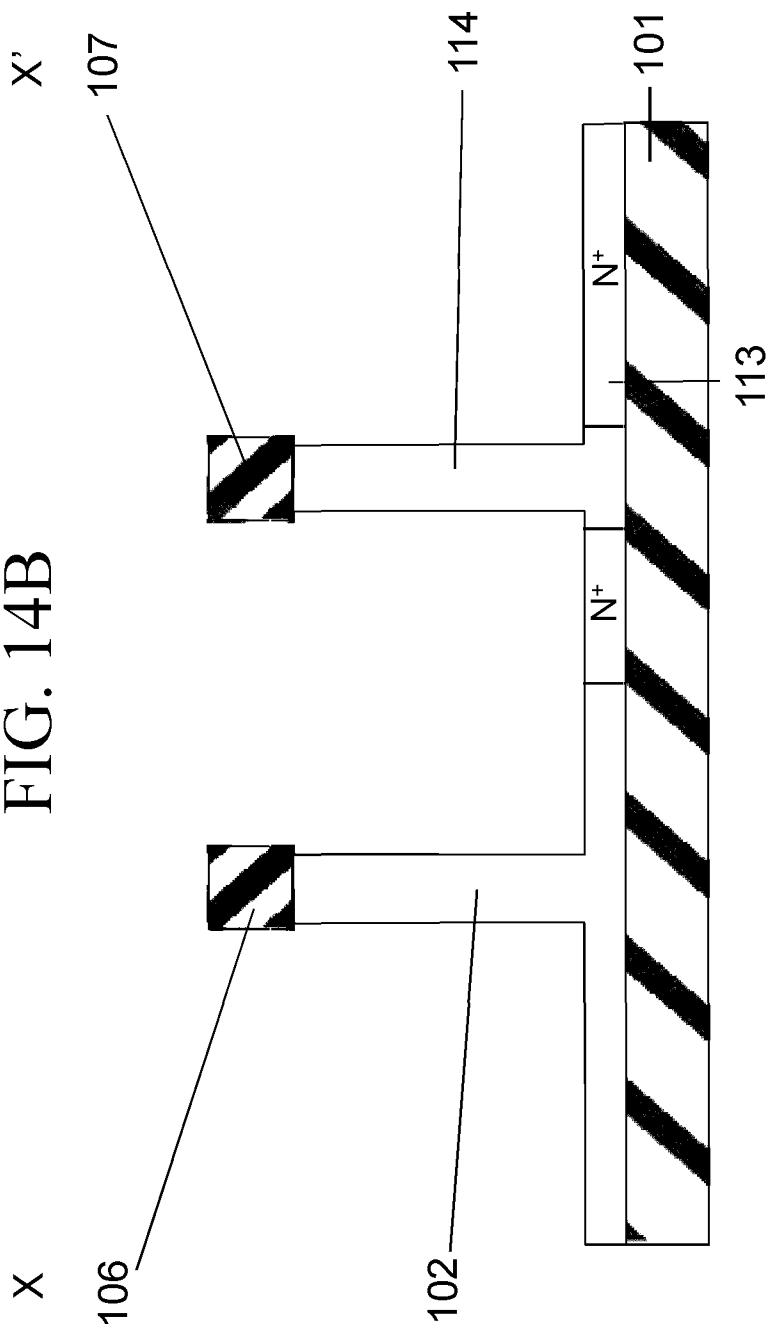
FIG. 14B is a cross-sectional view along line X-X' in FIG. 14A.
Figure 14C:
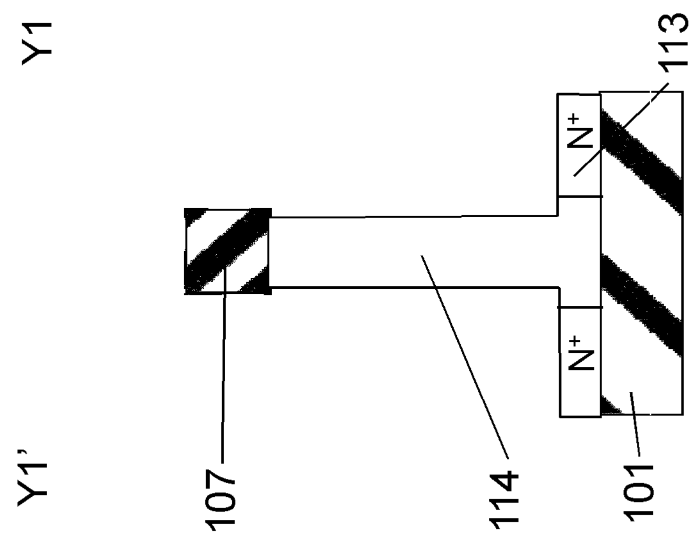
FIG. 14C is a cross-sectional view along line Y1-Y1' in FIG. 14A.
Figure 14D:
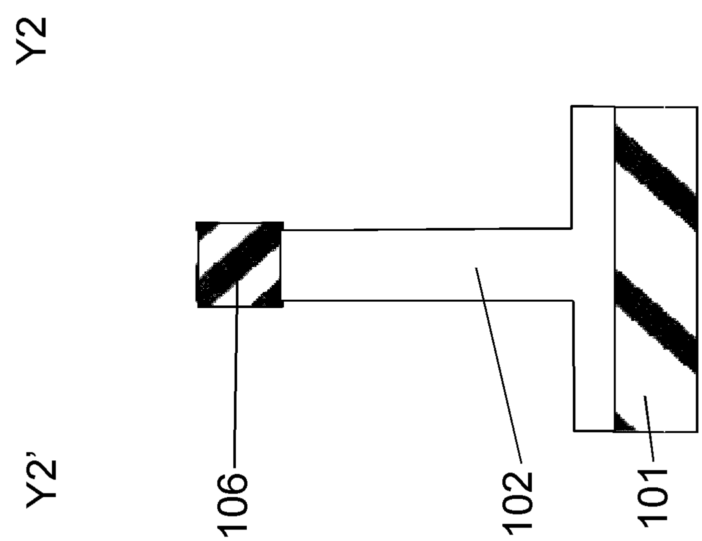
FIG. 14D is a cross-sectional view along line Y2-Y2' in FIG. 14A.
Figure 15A:
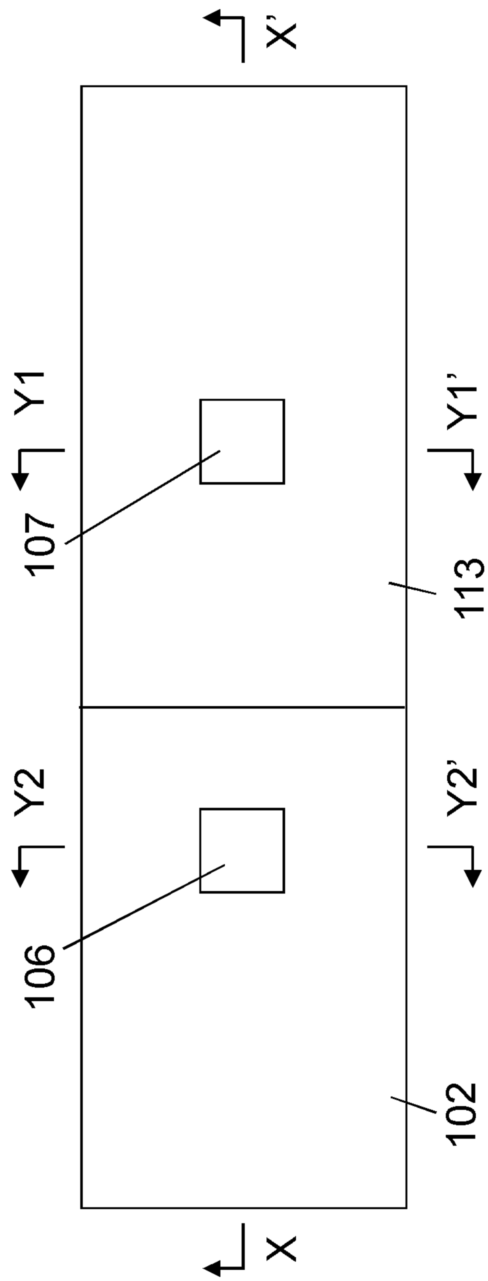
FIG. 15A is a planar view of the semiconductor device during production, showing the method of producing the semiconductor device according to an embodiment of the present invention.
Figure 15B:
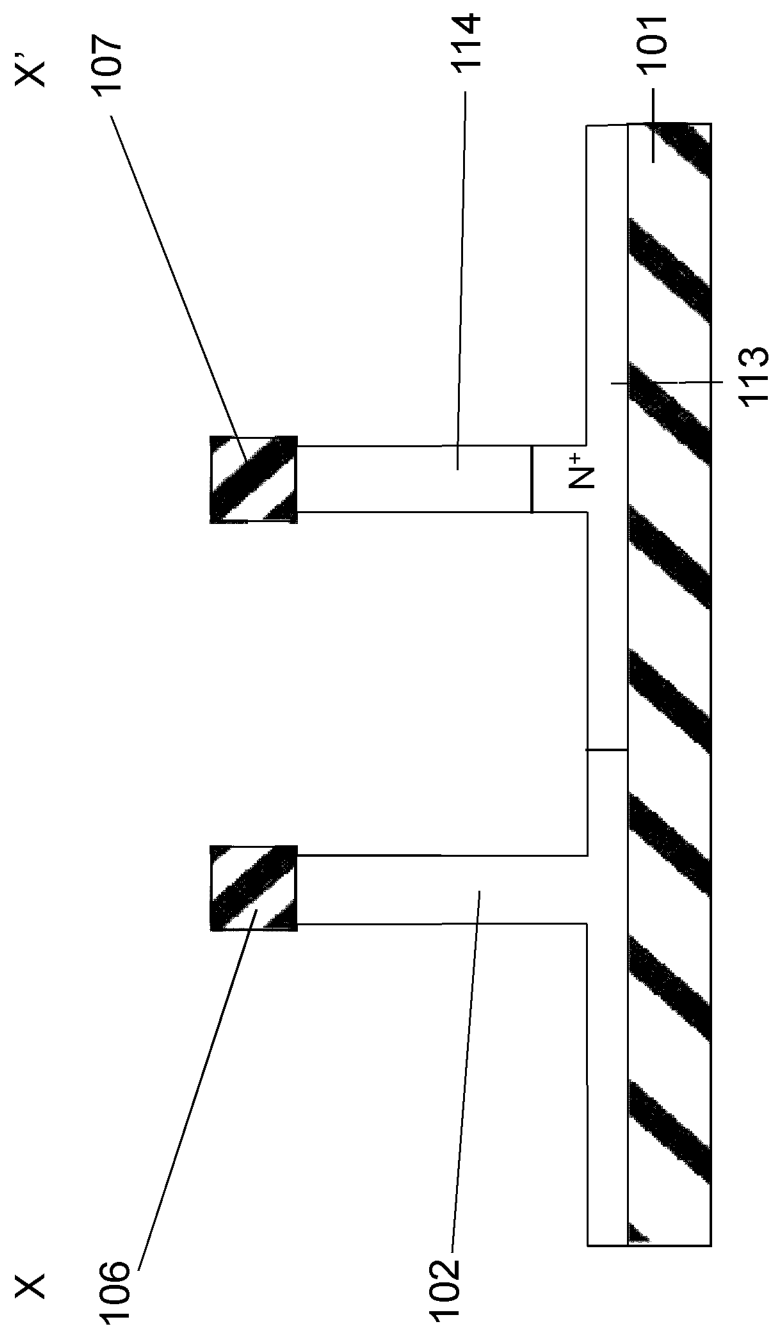
FIG. 15B is a cross-sectional view along line X-X' in FIG. 15A.
Figure 15C:
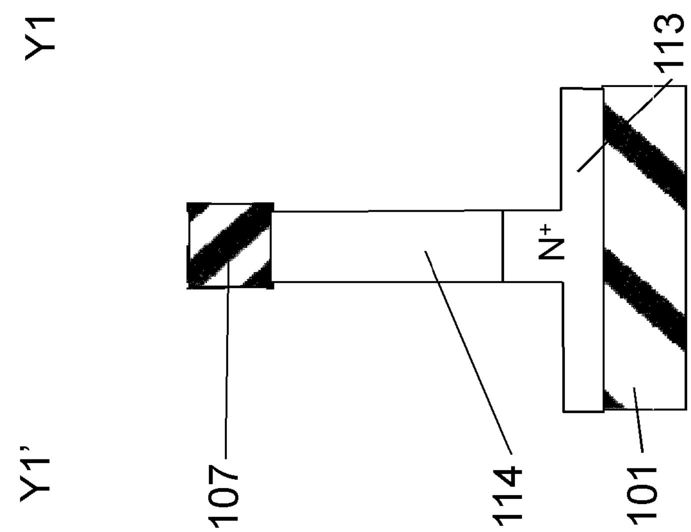
FIG. 15C is a cross-sectional view along line Y1-Y1' in FIG. 15A.
Figure 15D:
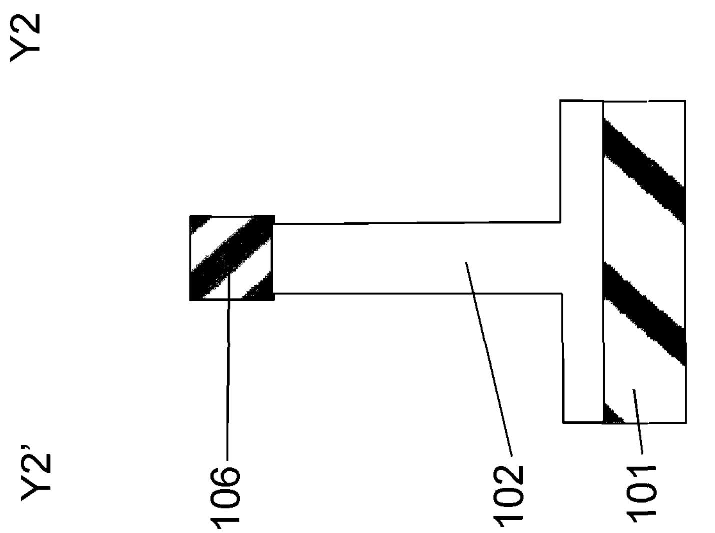
FIG. 15D is a cross-sectional view along line Y2-Y2' in FIG. 15A.
Figure 16A:
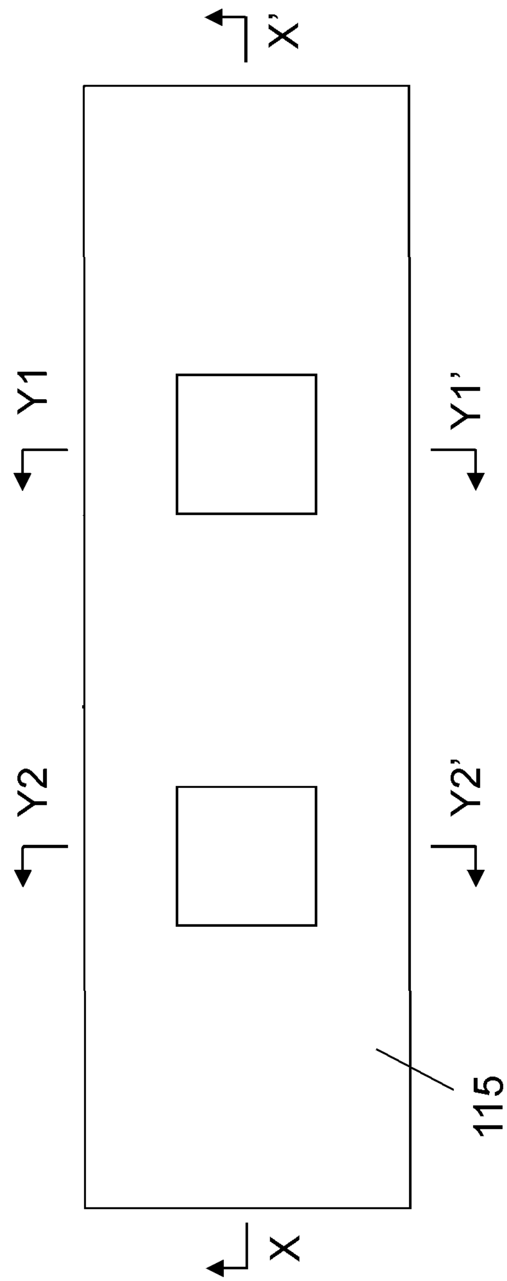
FIG. 16A is a planar view of the semiconductor device during production, showing the method of producing the semiconductor device according to an embodiment of the present invention.
Figure 16B:
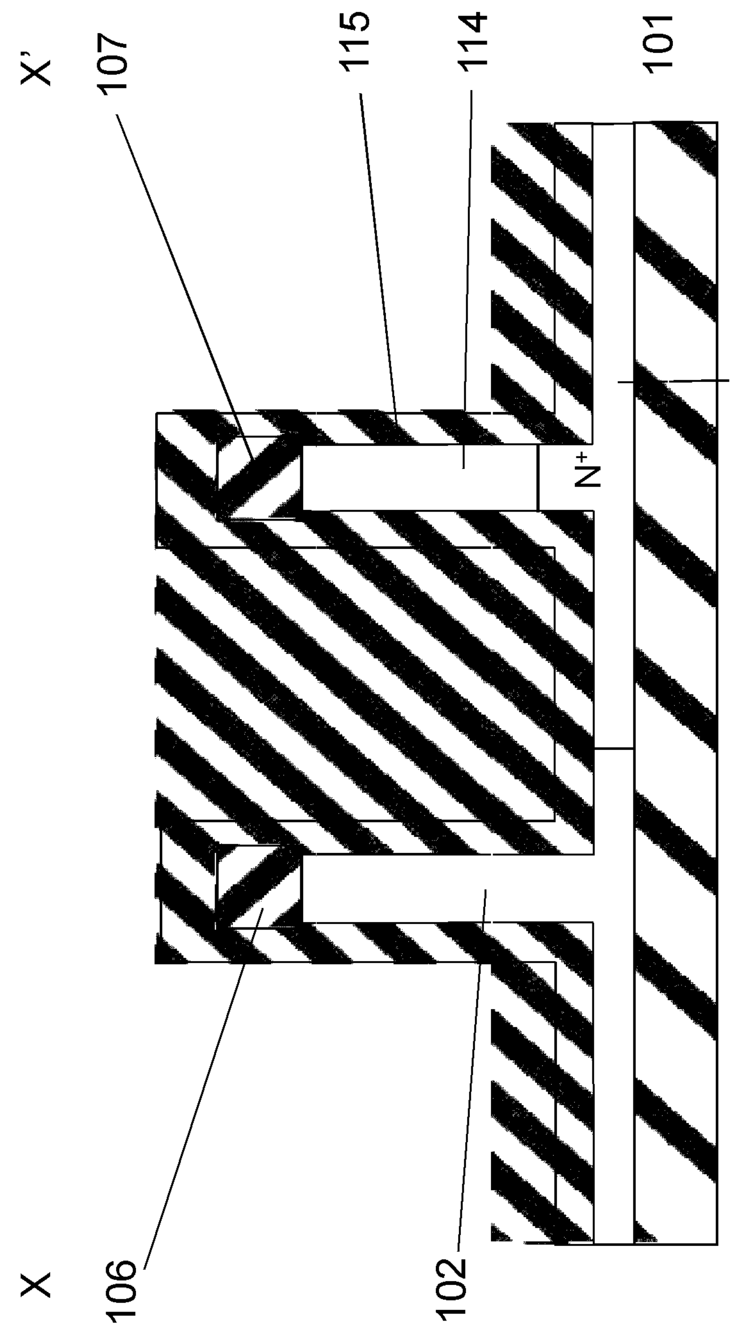
FIG. 16B is a cross-sectional view along line X-X' in FIG. 16A.
Figure 16C:
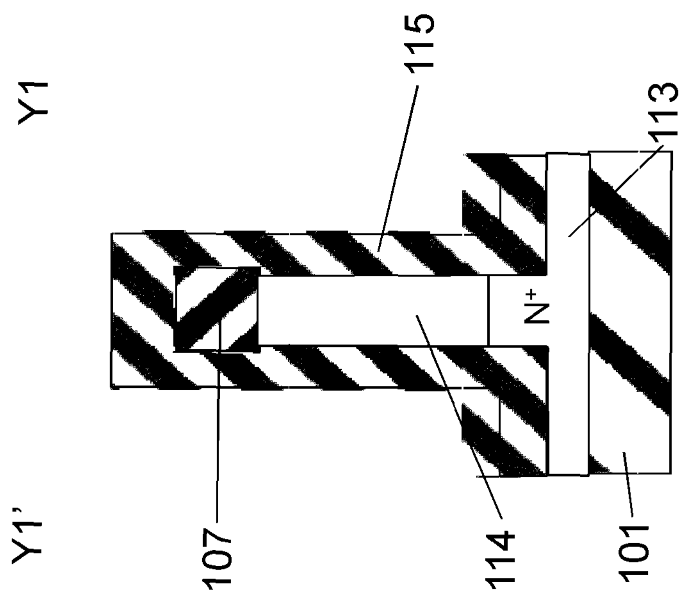
FIG. 16C is a cross-sectional view along line Y1-Y1' in FIG. 16A.
Figure 16D:
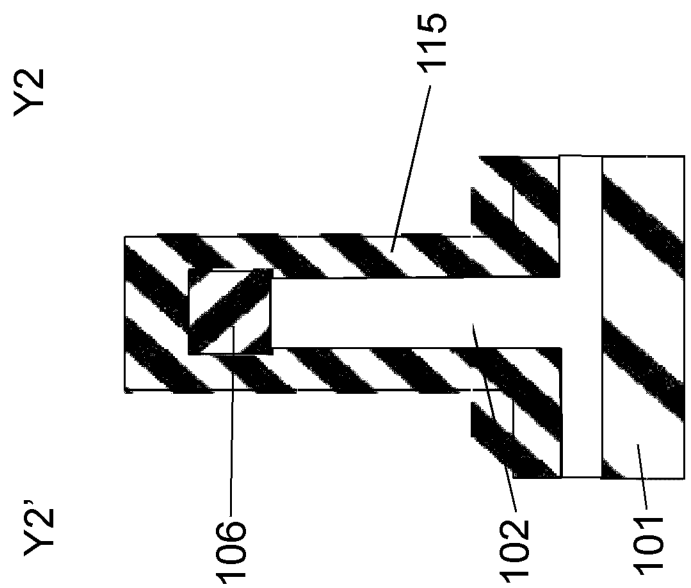
FIG. 16D is a cross-sectional view along line Y2-Y2' in FIG. 16A.
Figure 17A:
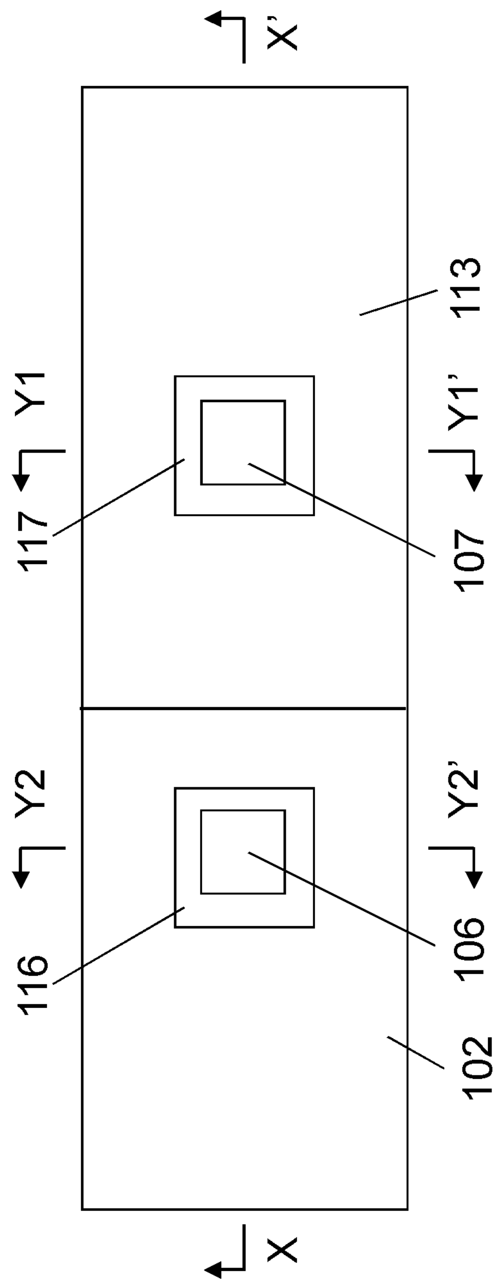
FIG. 17A is a planar view of the semiconductor device during production, showing the method of producing the semiconductor device according to an embodiment of the present invention.
Figure 17B:
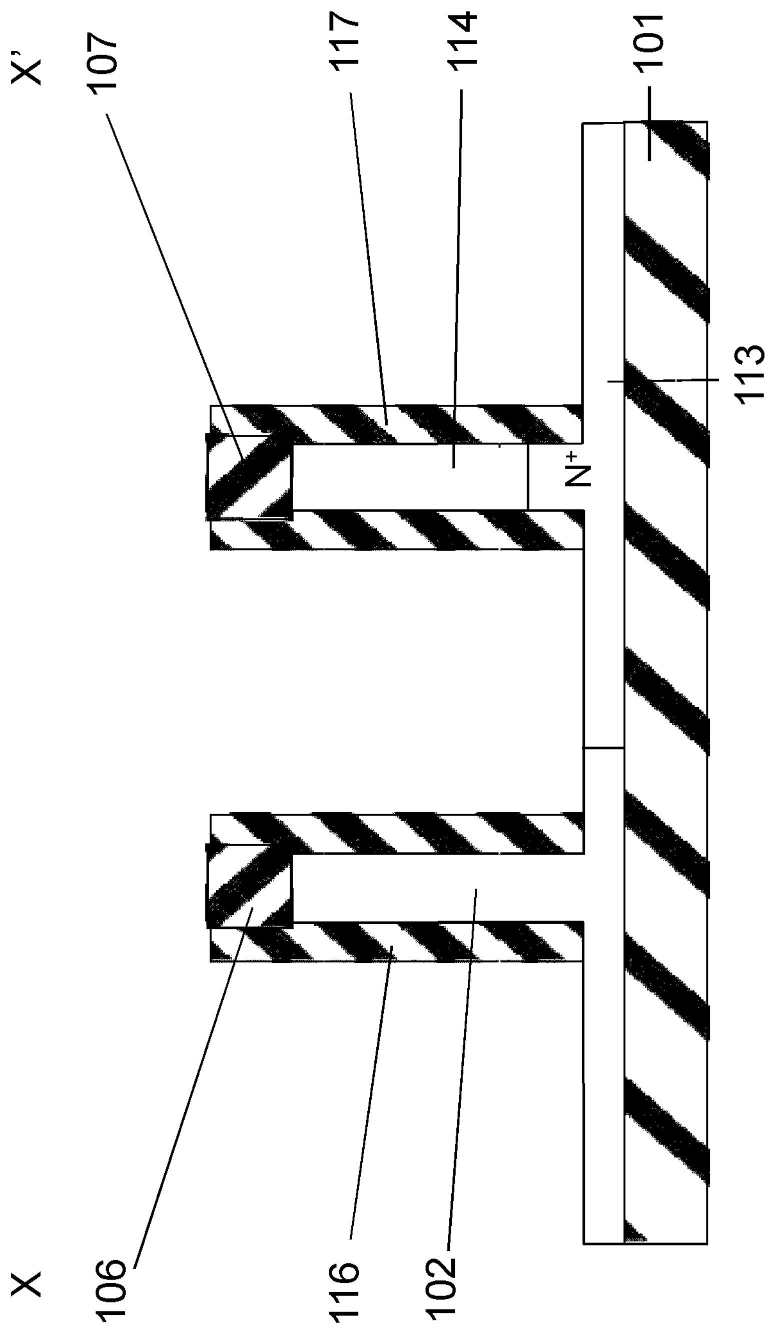
FIG. 17B is a cross-sectional view along line X-X' in FIG. 17A.
Figure 17C:
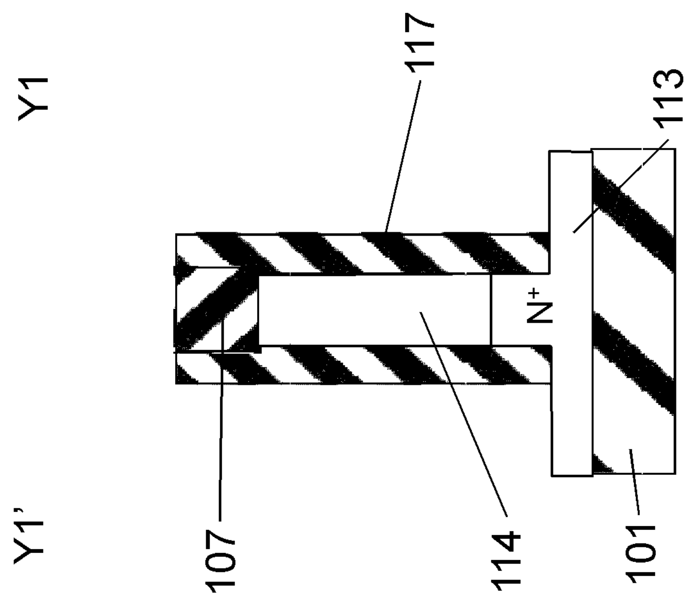
FIG. 17C is a cross-sectional view along line Y1-Y1' in FIG. 17A.
Figure 17D:
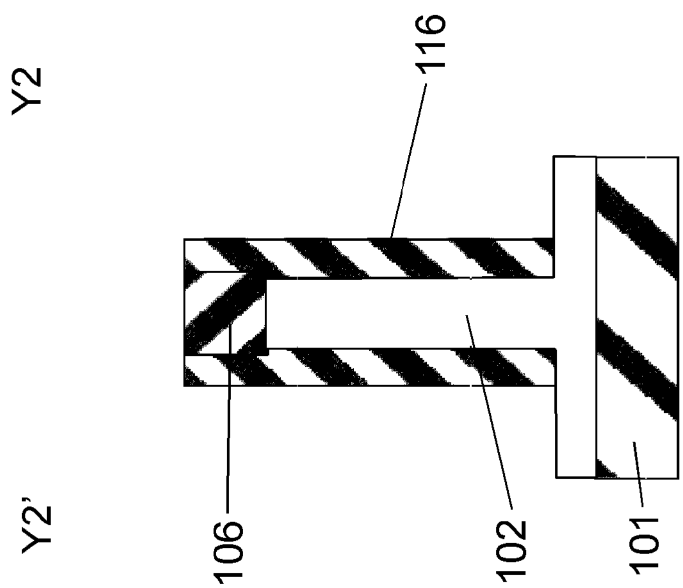
FIG. 17D is a cross-sectional view along line Y2-Y2' in FIG. 17A.
Figure 18A:
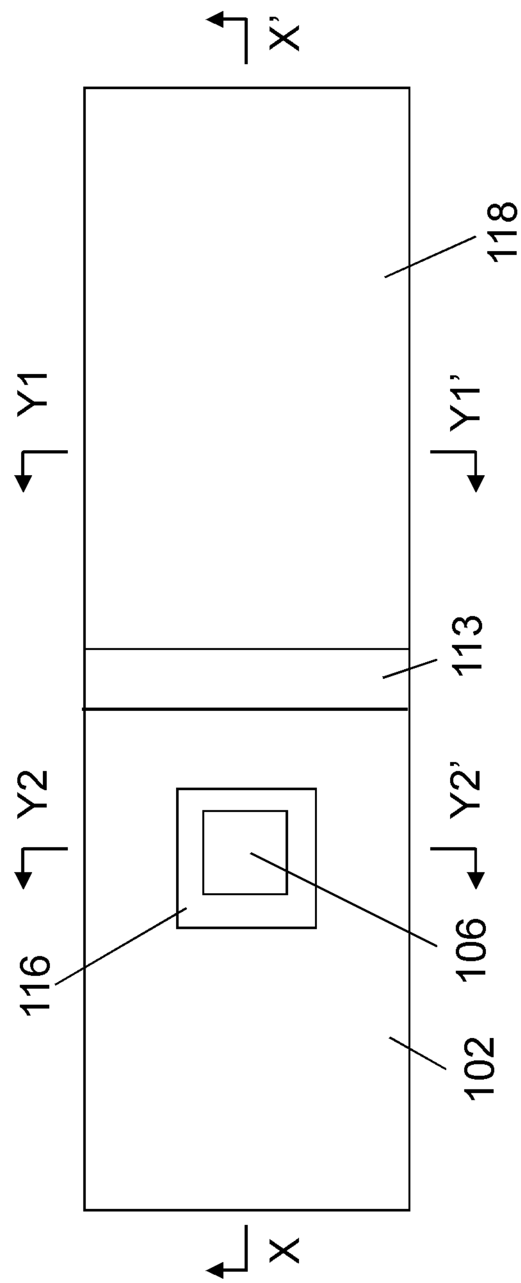
FIG. 18A is a planar view of the semiconductor device during production, showing the method of producing the semiconductor device according to an embodiment of the present invention.
Figure 18B:
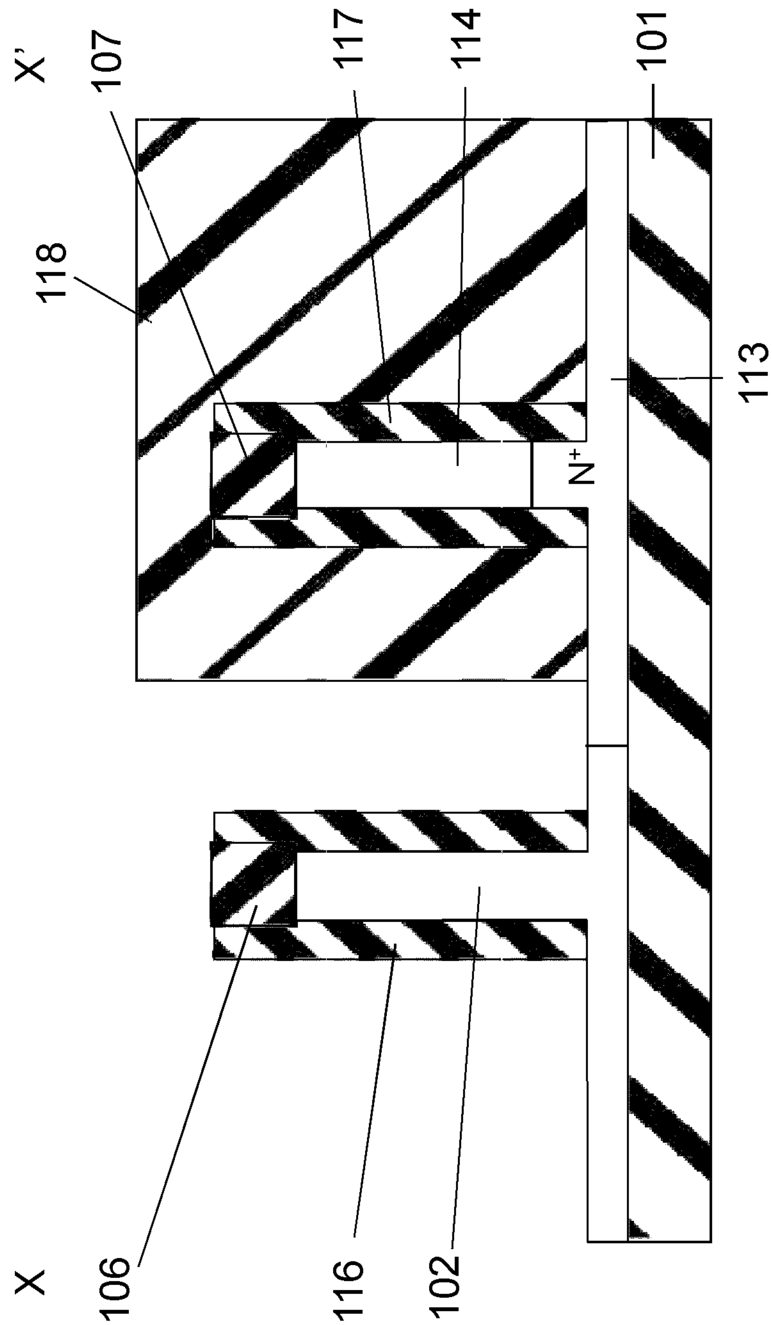
FIG. 18B is a cross-sectional view along line X-X' in FIG. 18A.
Figure 18C:
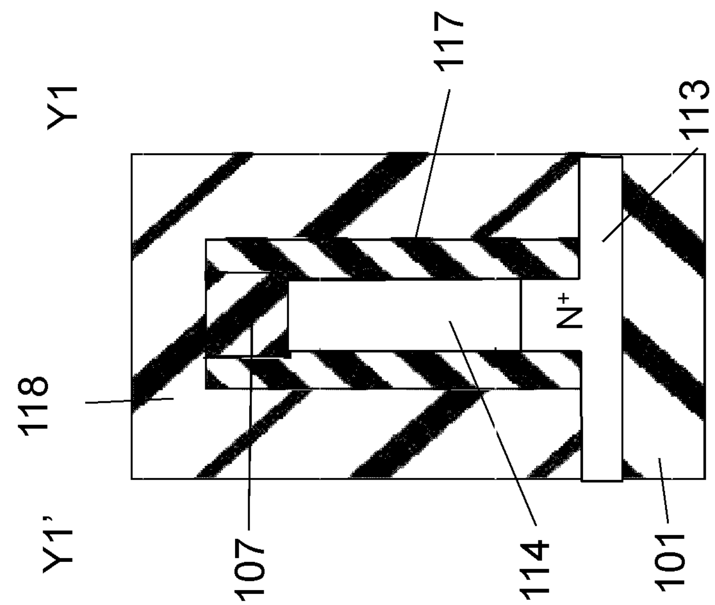
FIG. 18C is a cross-sectional view along line Y1-Y1' in FIG. 18A.
Figure 18D:
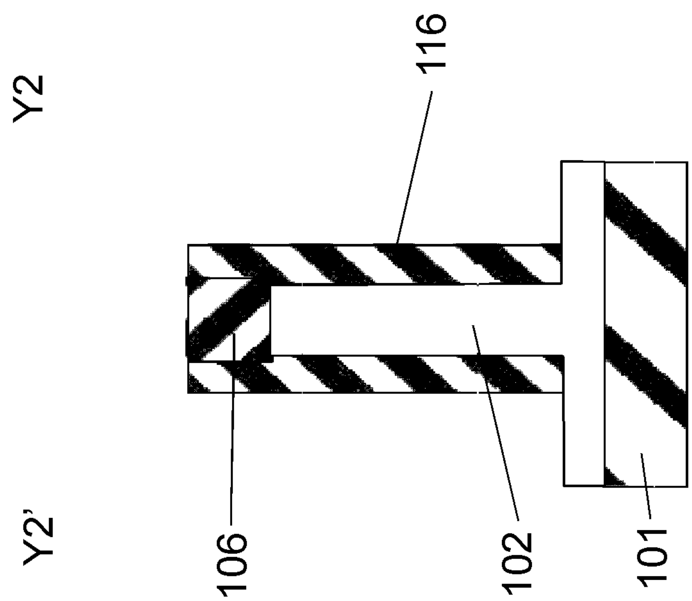
FIG. 18D is a cross-sectional view along line Y2-Y2' in FIG. 18A.

As indicated by the arrows in FIGS. 12B and 12C, arsenic, for example, is injected into the silicon layer 102 in the region where the nMOS SGT is to be formed, thereby forming an n+ type silicon layer 113 surrounding the bottom of the columnar silicon layer 232. At this time, the part of the silicon layer 102 covered by the hard mask 107 and the sidewall 111 does not become the n+ type silicon layer, comprising instead a first silicon layer 114 region in the columnar silicon layer 232.

The resist 112 is removed. Conditions on the substrate following removal are shown in FIGS. 13A to 13D.

The sidewalls 110 and 111 are removed through etching. Conditions on the substrate following etching are shown in FIGS. 14A to 14D.

Annealing is accomplished and the injected dopants, here arsenic, are activated. Through this, the injected dopants are scattered to the bottom of the columnar silicon layer 232, as shown in FIGS. 15A to 15D. Through this, even the bottom of the columnar silicon layer 231 becomes an n+ type silicon layer and forms a portion of the n+ type silicon layer 113.

An oxide film 115 is formed on the silicon layer 102, the hard masks 106 and 107 and the n+ type silicon layer 113, as shown in FIGS. 16A to 16D.

The oxide film 115 is etched, leaving behind a sidewall shape in the sidewall of the columnar silicon layers 231 and 232 to form sidewalls 116 and 117, as shown in FIGS. 17A to 17D. When forming a p+ type silicon layer by injecting dopants surrounding the bottom of the columnar silicon layer 231, these sidewalls prevent dopants from entering the channel, making it possible to control fluctuations in the threshold voltage of the SGT.

A resist 118 is formed surrounding the columnar silicon layer 231 in order to inject dopants into the bottom of the columnar silicon layer 232, as shown in FIGS. 18A to 18D.

Figure 19A:
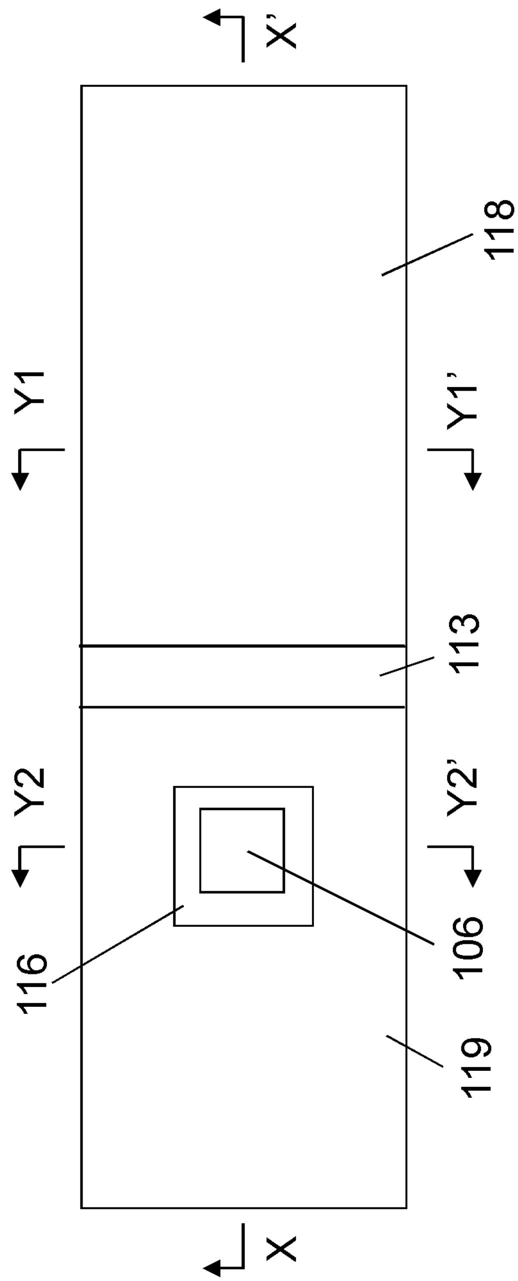
FIG. 19A is a planar view of the semiconductor device during production, showing the method of producing the semiconductor device according to an embodiment of the present invention.
Figure 19B:
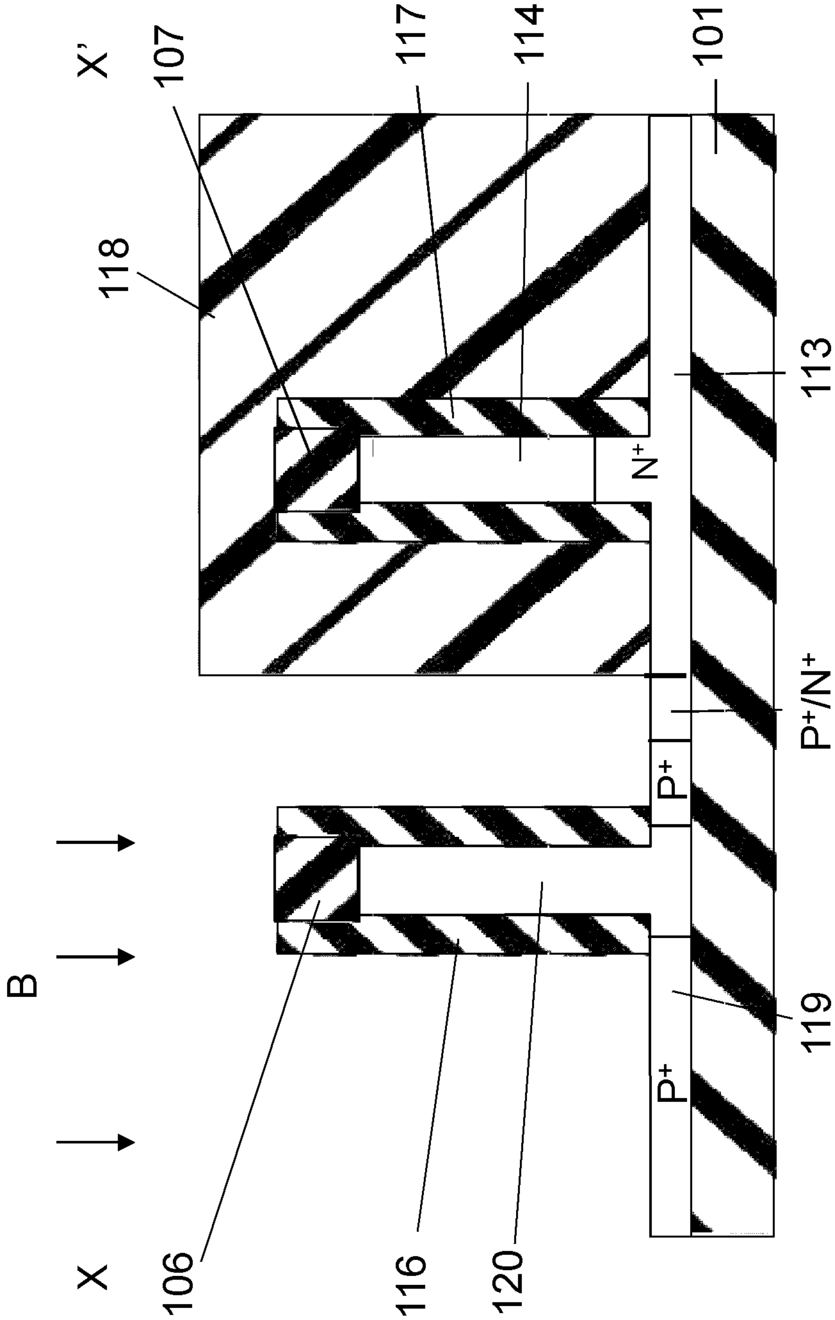
FIG. 19B is a cross-sectional view along line X-X' in FIG. 19A.
Figure 19C:
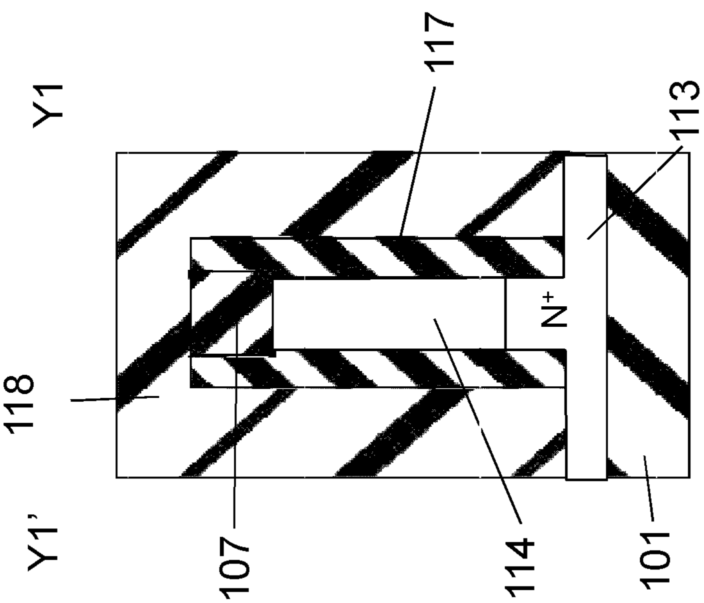
FIG. 19C is a cross-sectional view along line Y1-Y1' in FIG. 19A.
Figure 19D:
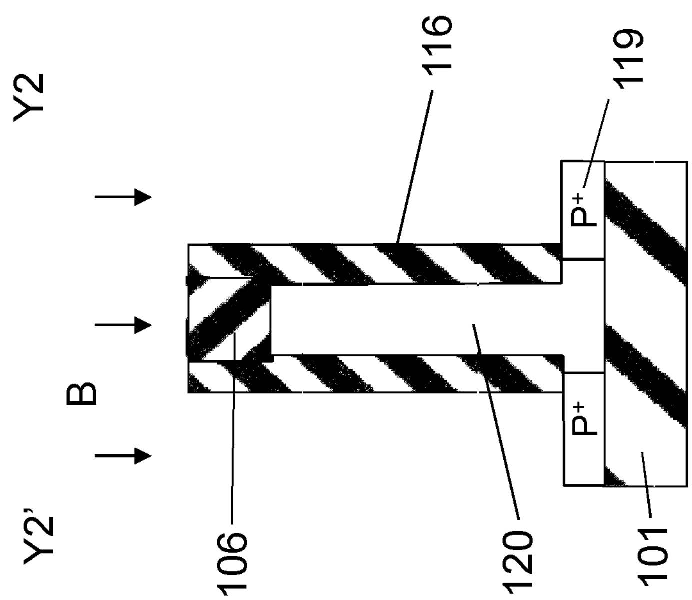
FIG. 19D is a cross-sectional view along line Y2-Y2' in FIG. 19A.
Figure 20A:
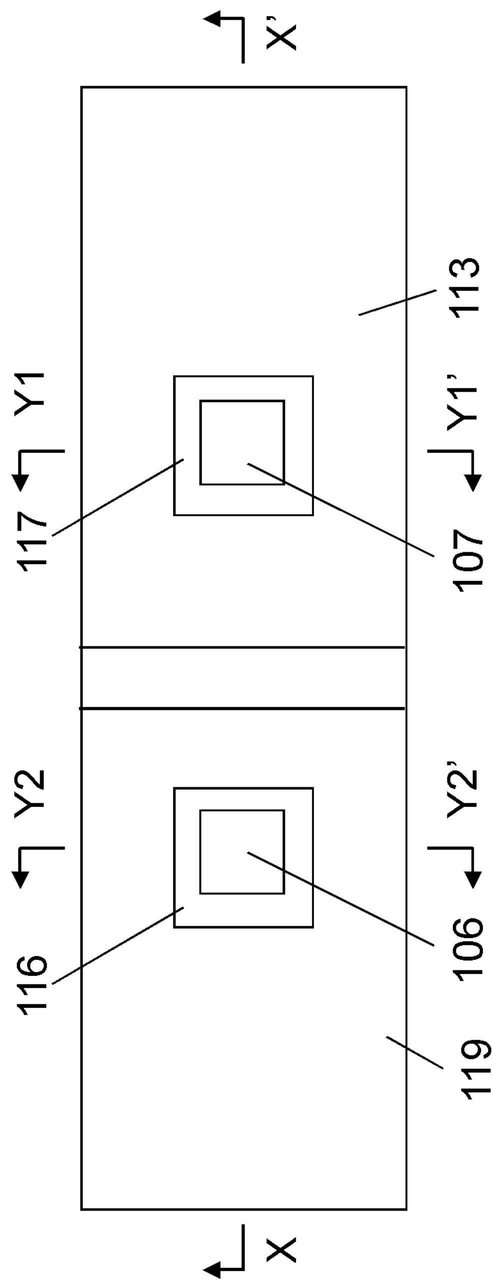
FIG. 20A is a planar view of the semiconductor device during production, showing the method of producing the semiconductor device according to an embodiment of the present invention.
Figure 20B:
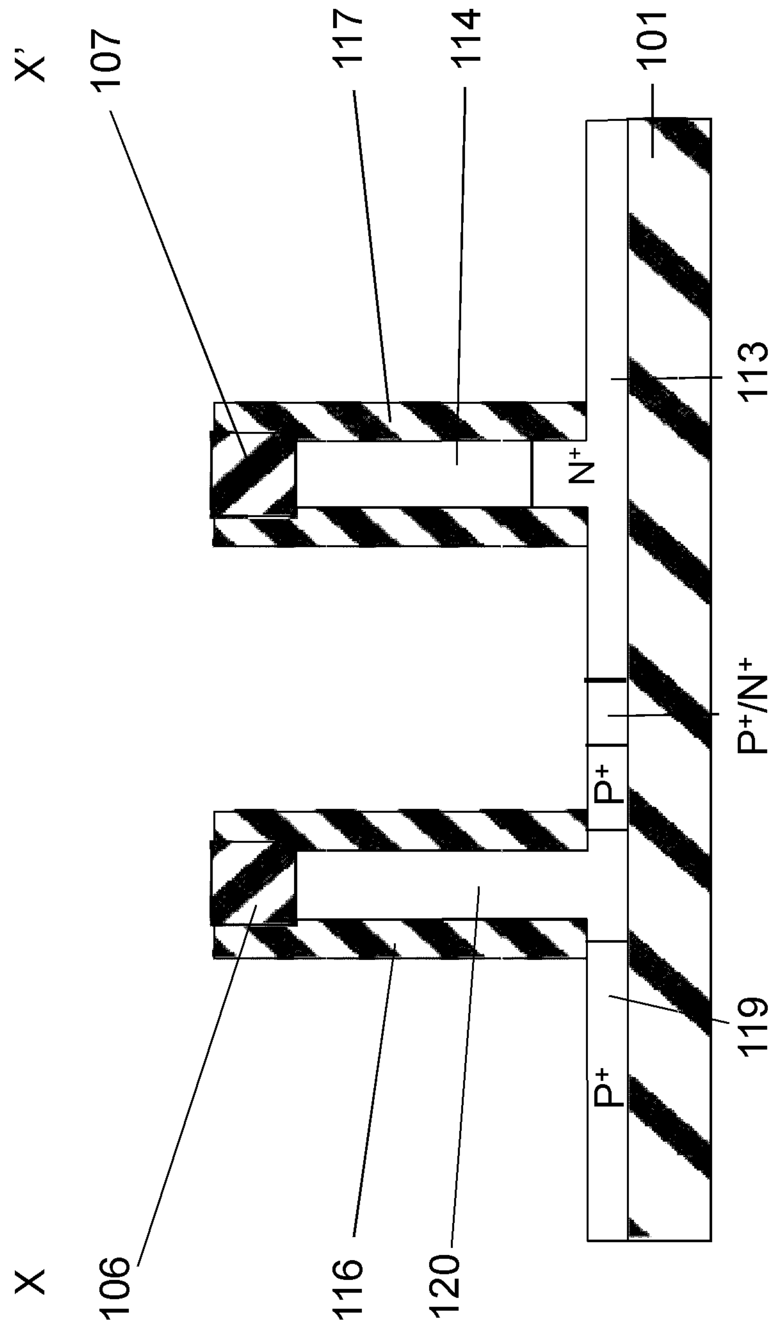
FIG. 20B is a cross-sectional view along line X-X' in FIG. 20A.
Figure 20C:
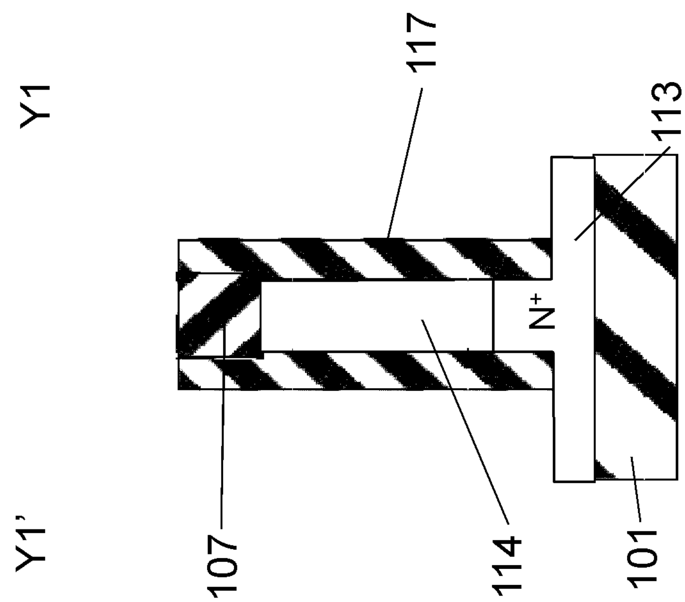
FIG. 20C is a cross-sectional view along line Y1-Y1' in FIG. 20A.
Figure 20D:
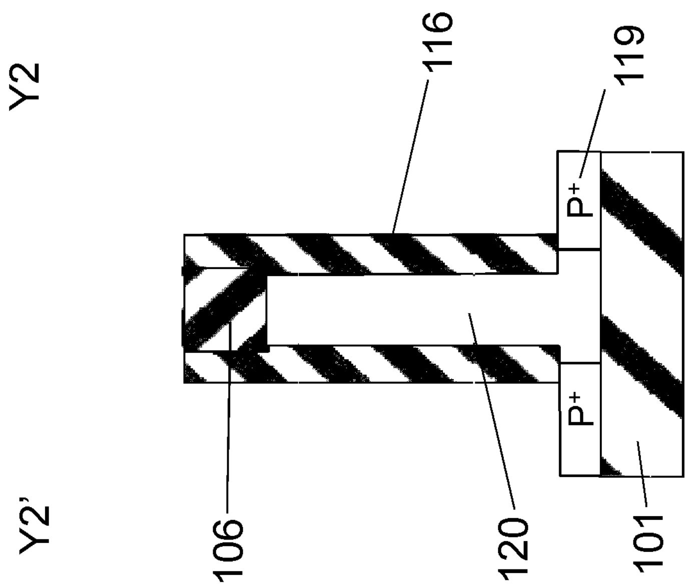
FIG. 20D is a cross-sectional view along line Y2-Y2' in FIG. 20A.
Figure 21A:
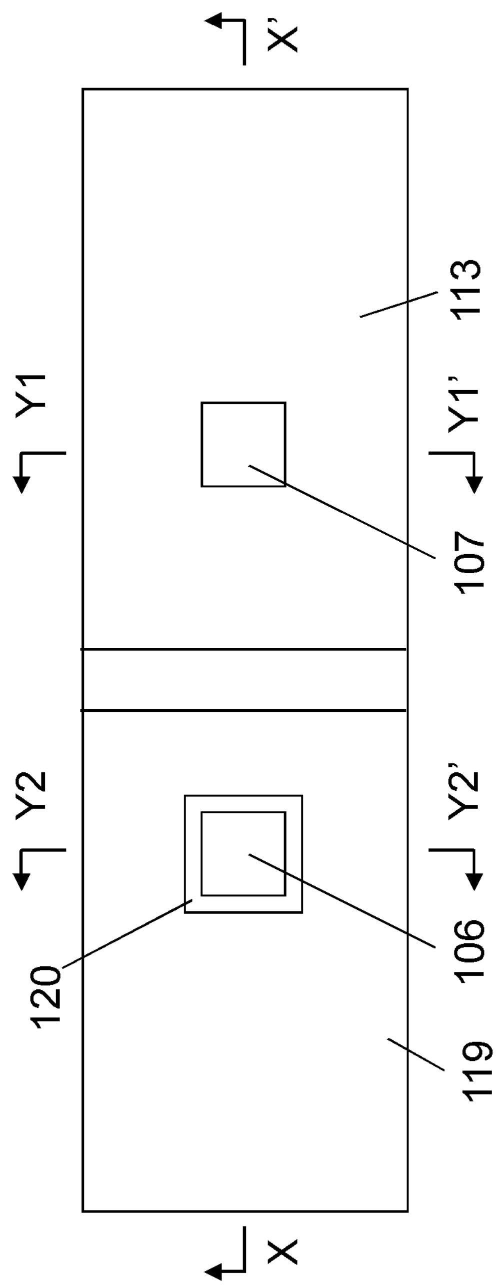
FIG. 21A is a planar view of the semiconductor device during production, showing the method of producing the semiconductor device according to an embodiment of the present invention.
Figure 21B:
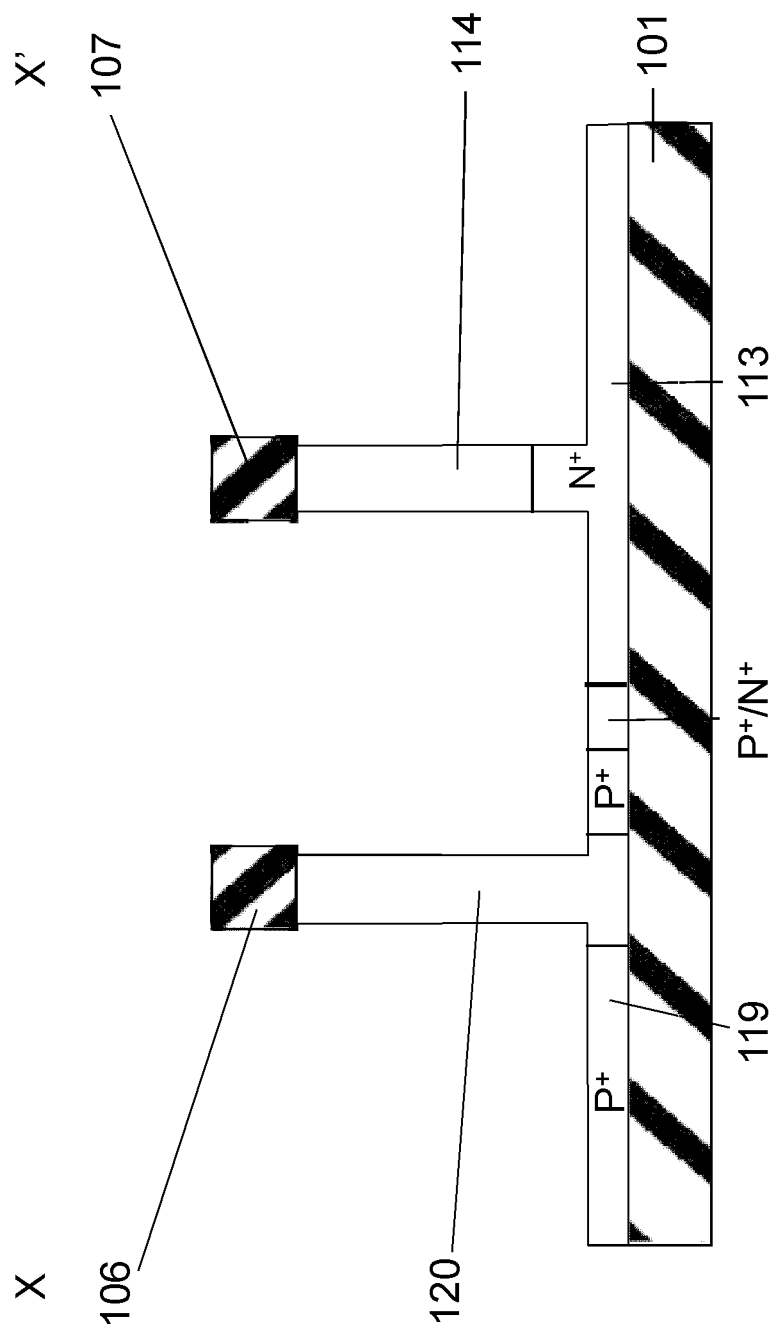
FIG. 21B is a cross-sectional view along line X-X' in FIG. 21A.
Figure 21C:
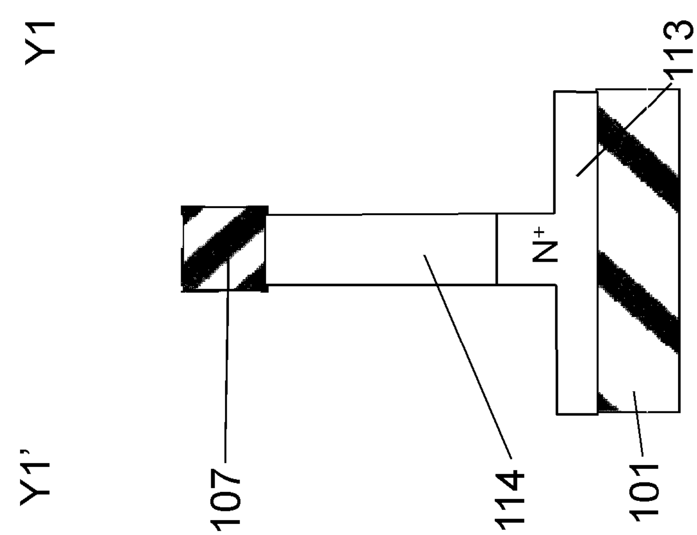
FIG. 21C is a cross-sectional view along line Y1-Y1' in FIG. 21A.
Figure 21D:
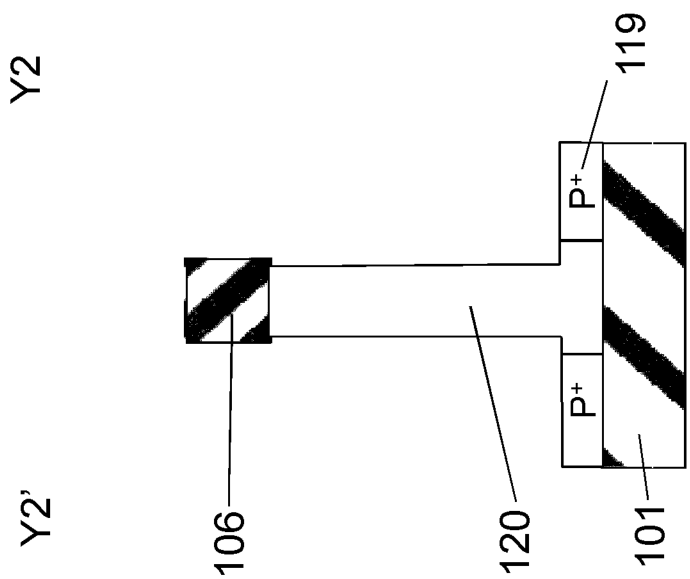
FIG. 21D is a cross-sectional view along line Y2-Y2' in FIG. 21A.
Figure 22A:
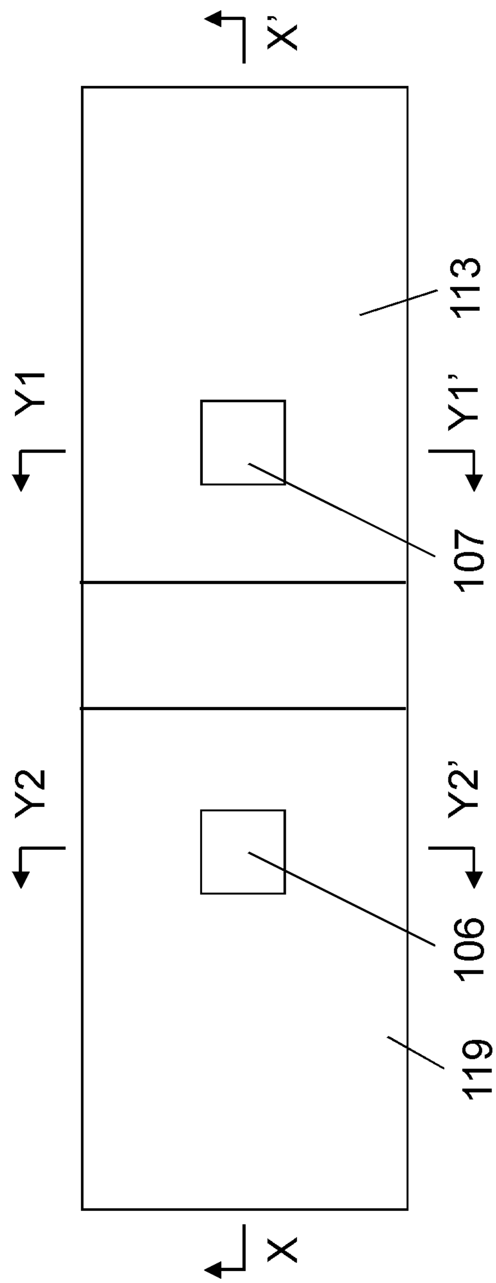
FIG. 22A is a planar view of the semiconductor device during production, showing the method of producing the semiconductor device according to an embodiment of the present invention.
Figure 22B:
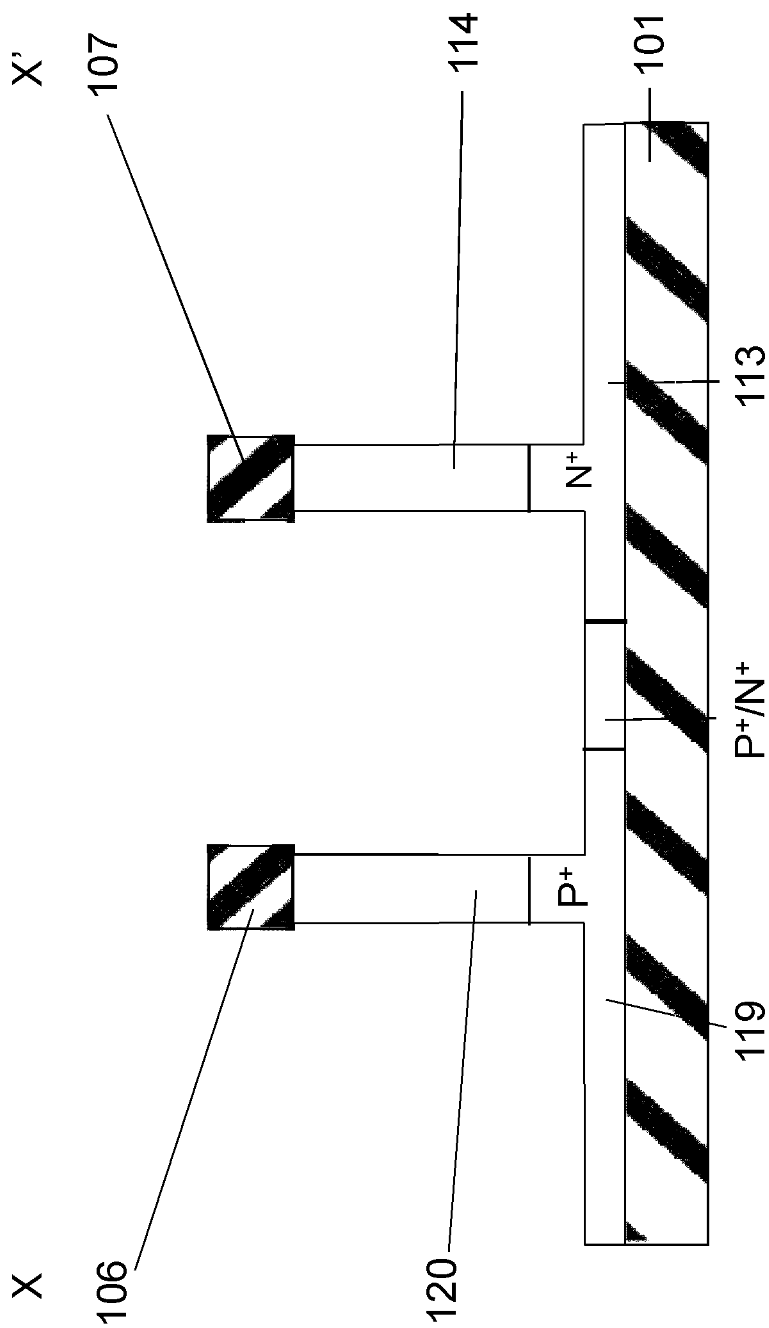
FIG. 22B is a cross-sectional view along line X-X' in FIG. 22A.
Figure 22C:
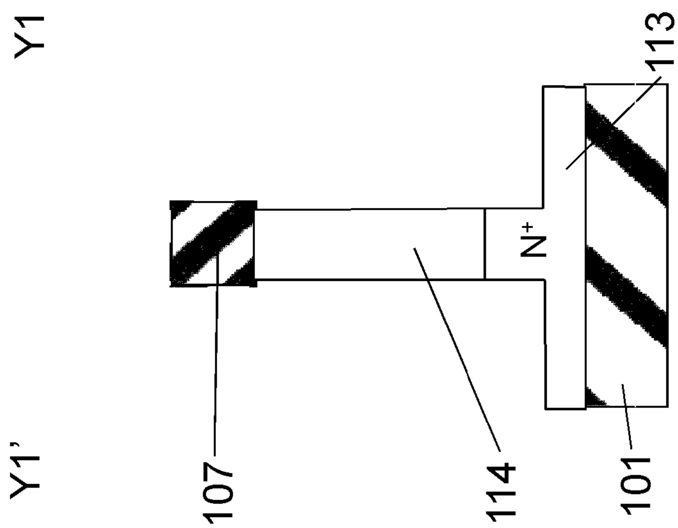
FIG. 22C is a cross-sectional view along line Y1-Y1' in FIG. 22A.
Figure 22D:
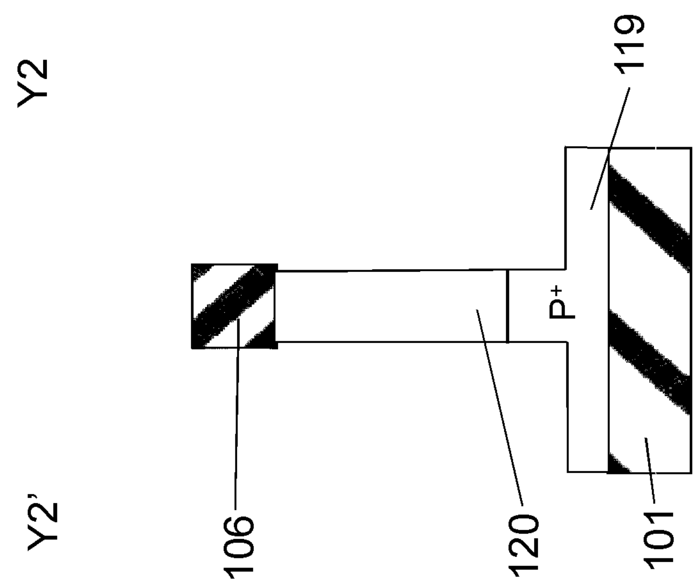
FIG. 22D is a cross-sectional view along line Y2-Y2' in FIG. 22A.
Figure 23A:
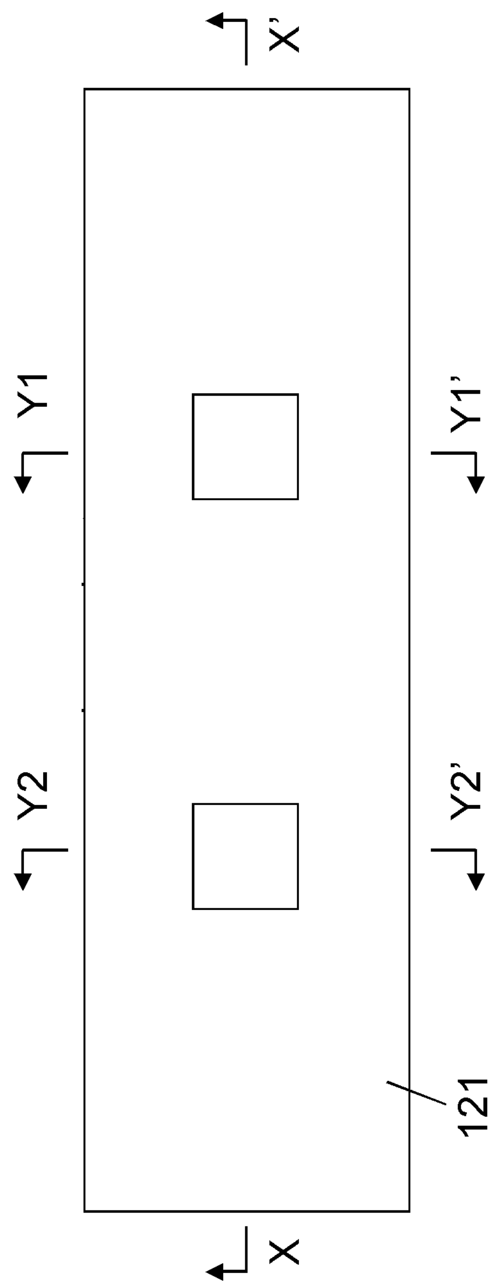
FIG. 23A is a planar view of the semiconductor device during production, showing the method of producing the semiconductor device according to an embodiment of the present invention.
Figure 23B:
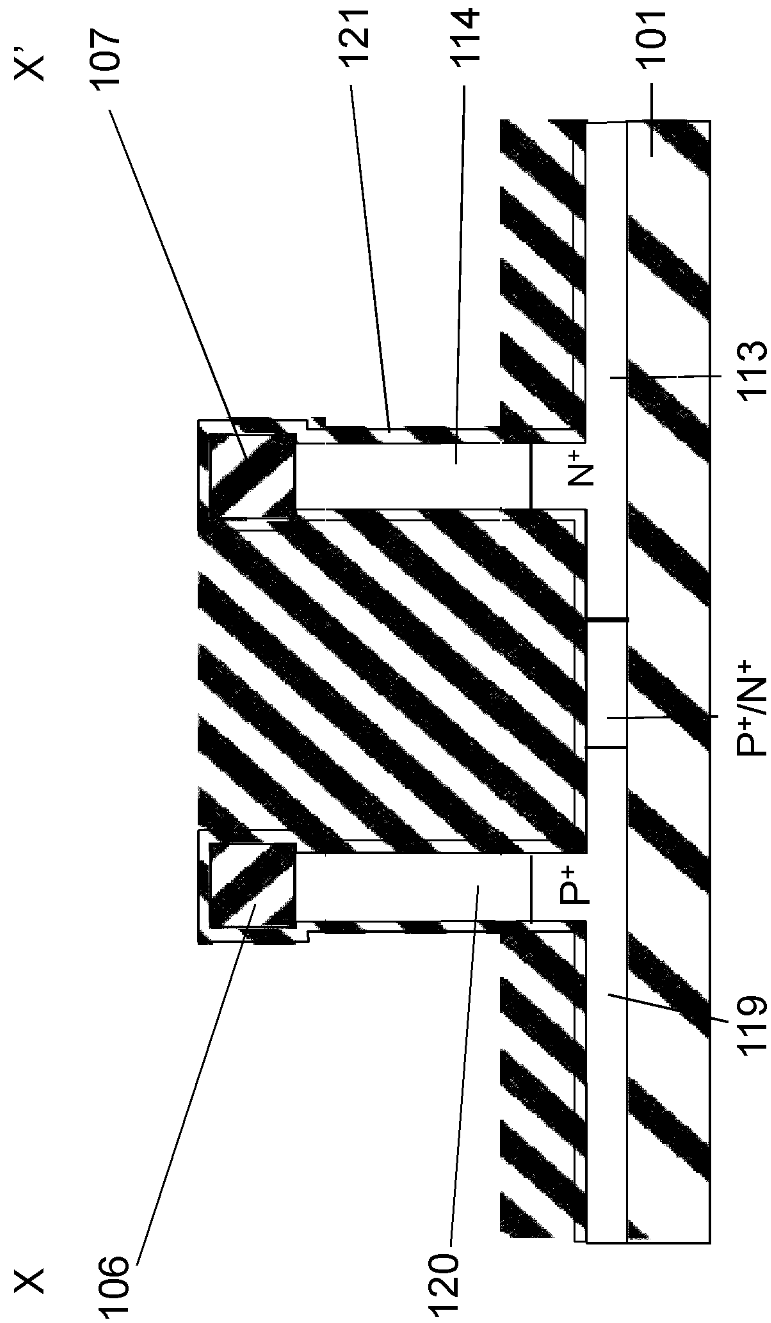
FIG. 23B is a cross-sectional view along line X-X' in FIG. 23A.
Figure 23C:
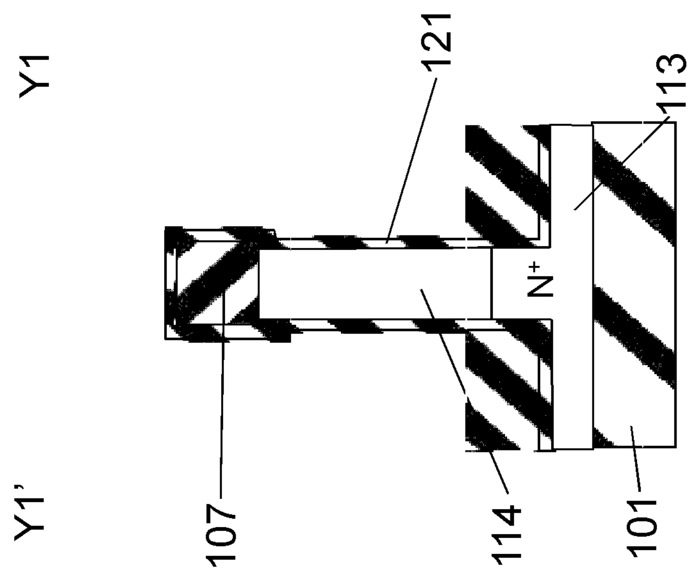
FIG. 23C is a cross-sectional view along line Y1-Y1' in FIG. 23A.
Figure 23D:
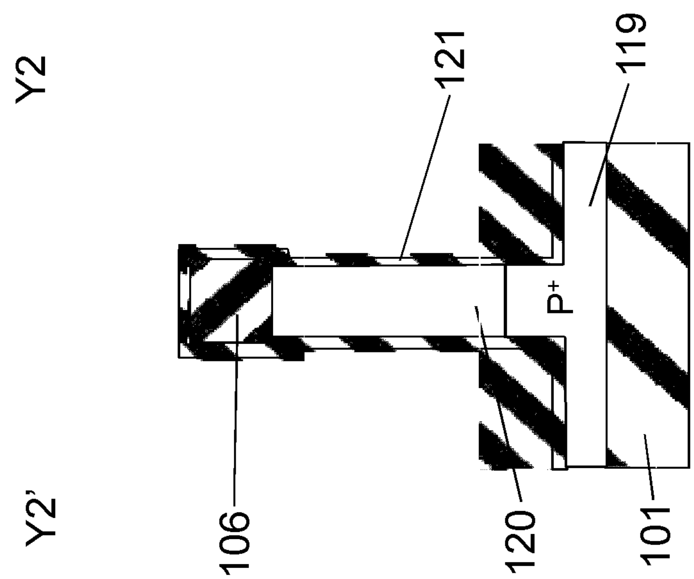
FIG. 23D is a cross-sectional view along line Y2-Y2' in FIG. 23A.
Figure 24A:
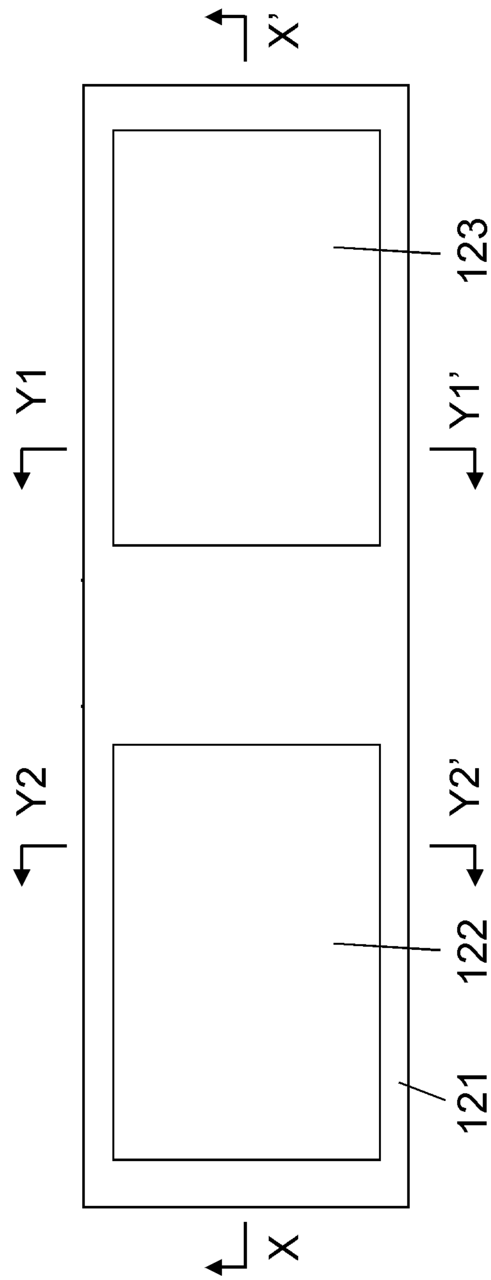
FIG. 24A is a planar view of the semiconductor device during production, showing the method of producing the semiconductor device according to an embodiment of the present invention.
Figure 24B:
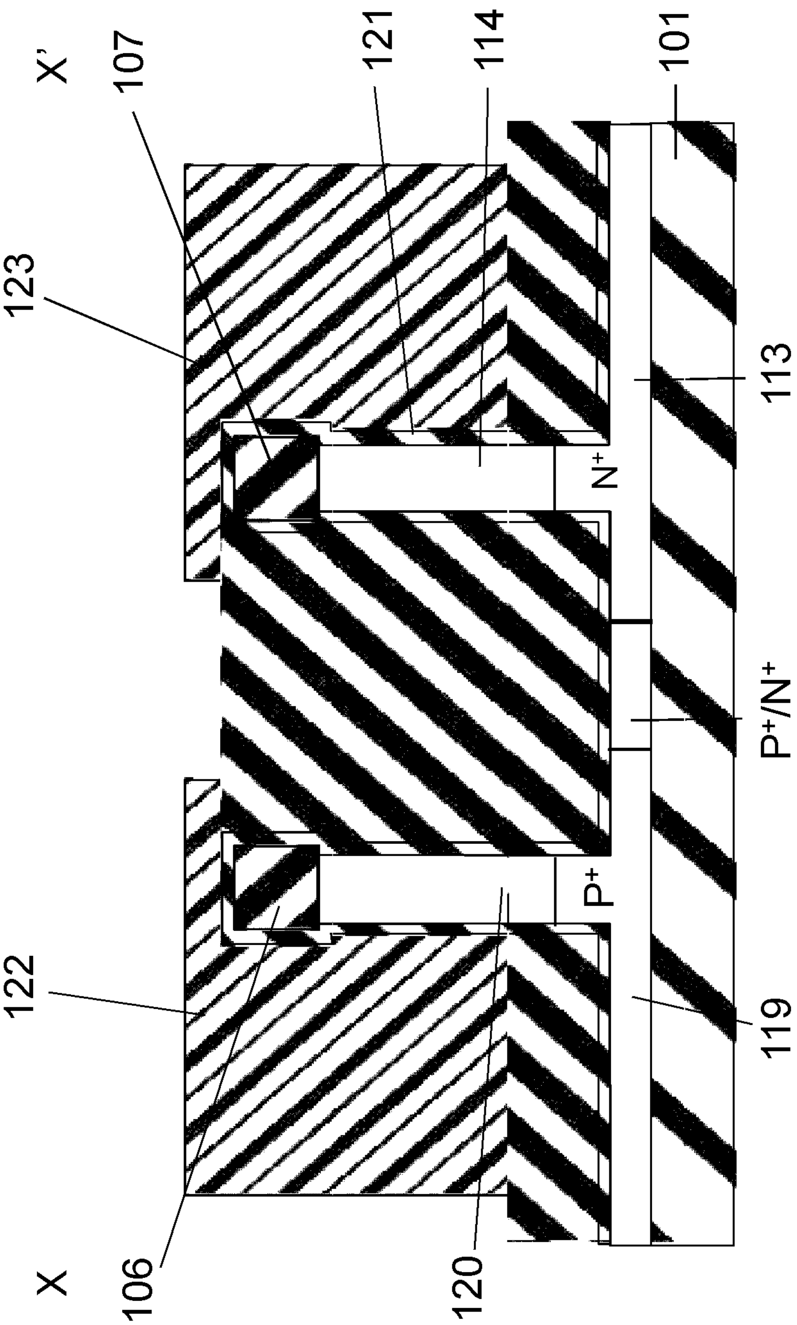
FIG. 24B is a cross-sectional view along line X-X' in FIG. 24A.
Figure 24C:
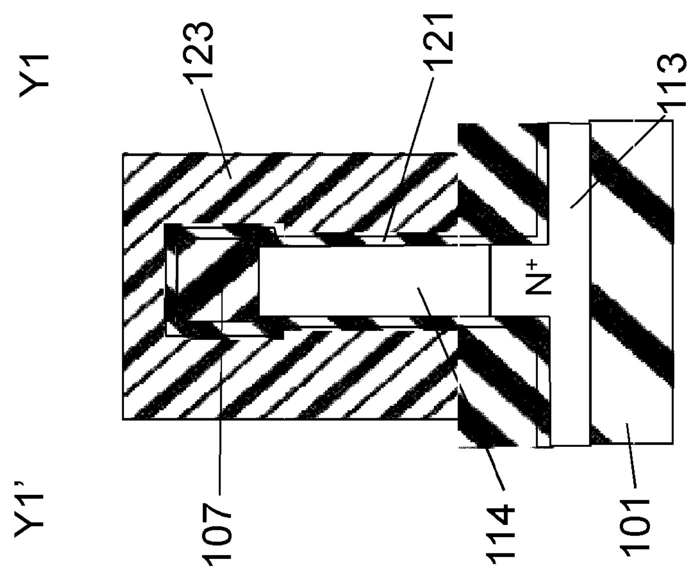
FIG. 24C is a cross-sectional view along line Y1-Y1' in FIG. 24A.
Figure 24D:
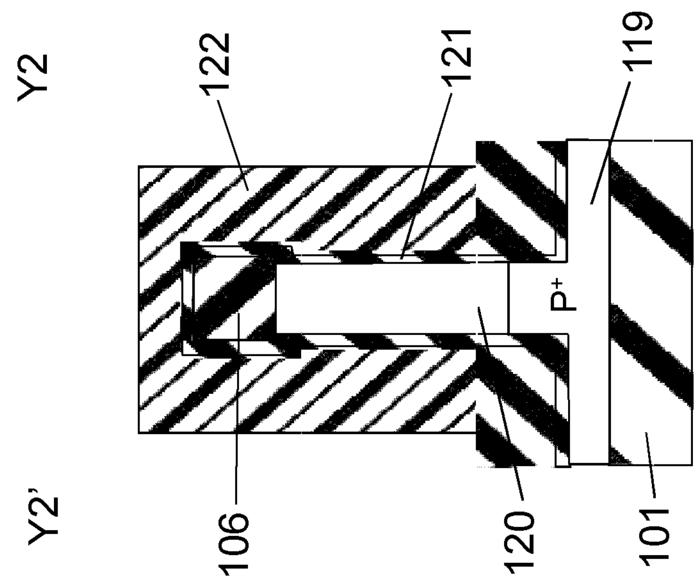
FIG. 24D is a cross-sectional view along line Y2-Y2' in FIG. 24A.
Figure 25A:
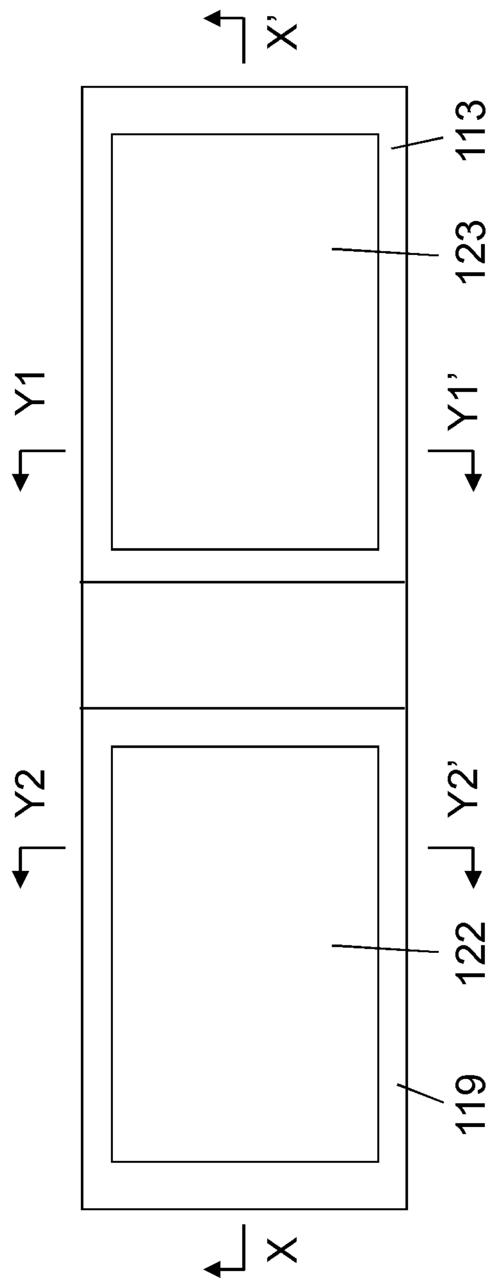
FIG. 25A is a planar view of the semiconductor device during production, showing the method of producing the semiconductor device according to an embodiment of the present invention.
Figure 25B:
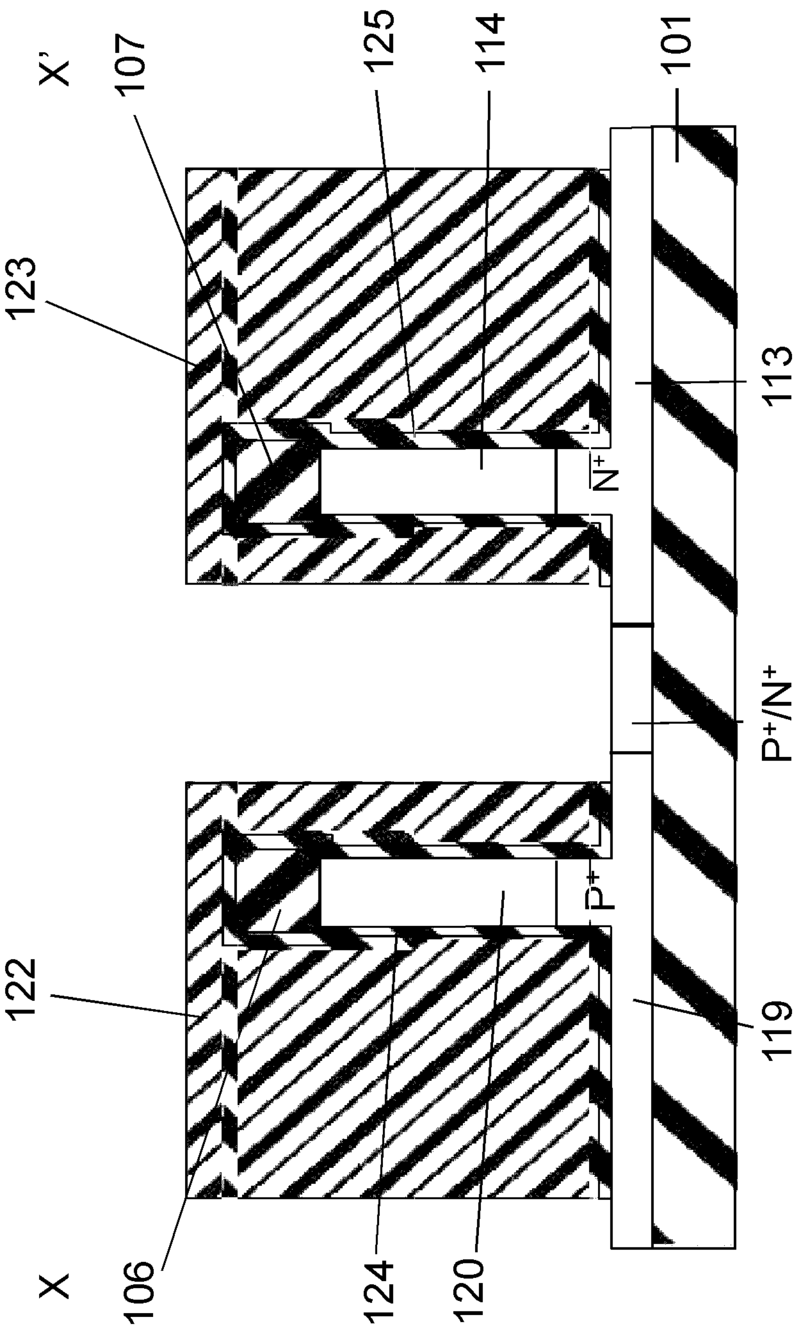
FIG. 25B is a cross-sectional view along line X-X' in FIG. 25A.
Figure 25C:
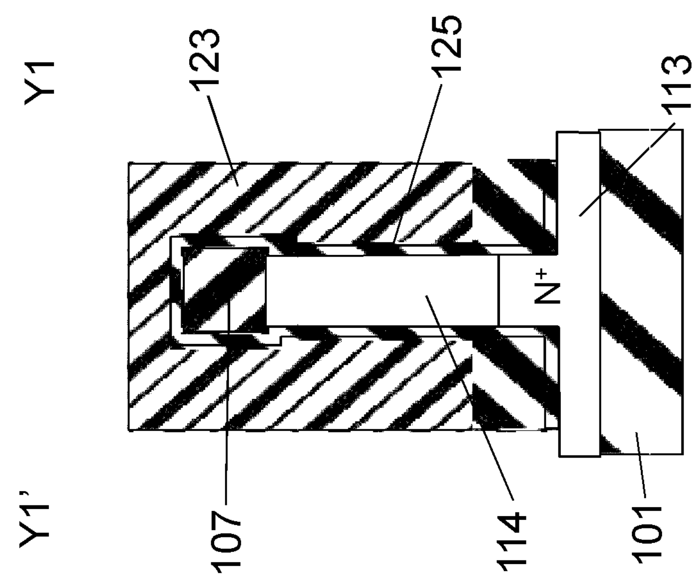
FIG. 25C is a cross-sectional view along line Y1-Y1' in FIG. 25A.
Figure 25D:
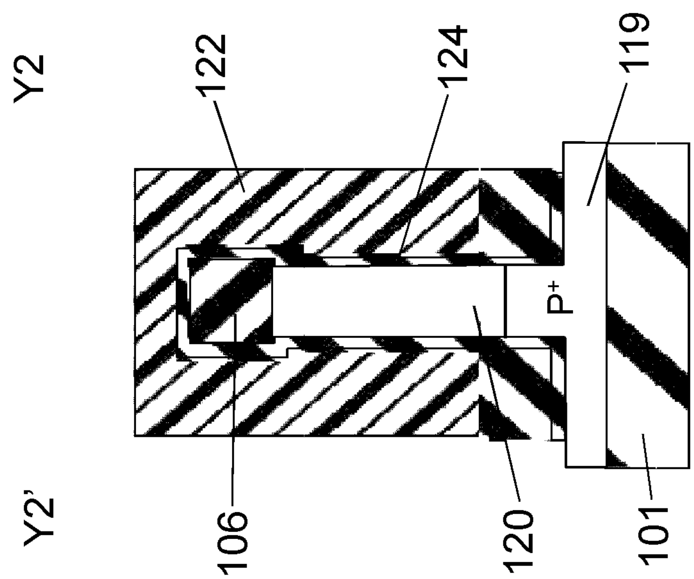
FIG. 25D is a cross-sectional view along line Y2-Y2' in FIG. 25A.

As indicated by the arrows in FIGS. 19B and 19D, boron, for example, is injected into the silicon layer 102 in the region where the pMOS SGT is to be formed, thereby forming a p+ type silicon layer 119 surrounding the bottom of the columnar silicon layer 231. At this time, the part of the silicon layer 102 covered by the hard mask 106 and the sidewall 116 does not become the p+ type silicon layer, comprising instead a second silicon layer 120 region in the columnar silicon layer 231.

The resist 118 is removed. Conditions on the substrate following removal are shown in FIGS. 20A to 20D.

The sidewalls 116 and 117 are removed through etching. Conditions on the substrate following etching are shown in FIGS. 21A to 21D.

Annealing is accomplished and the injected dopant, here boron, is activated. Through this, the injected dopant is scattered to the bottom of the columnar silicon layer 231, as shown in FIGS. 22A to 22D. Through this, even the bottom of the columnar silicon layer 231 becomes a p+ type silicon layer and forms a portion of the p+ type silicon layer 119.

An oxide film 121 is formed on the surface of the hard masks 106 and 107, the n+ type silicon layer 113 and the p+ type silicon layer 119, as shown in FIGS. 23A to 23D. This oxide film 121 protects the first silicon layer 114 and the second silicon layer 120 from resist for forming a planar silicon layer later.

Resists 122 and 123 for forming a planar silicon layer are formed. The resists 122 and 123 are formed so as to cover the second silicon layer 120 and the area surrounding the bottom thereof, and the first silicon layer 114 and the area surrounding the bottom thereof, respectively, as shown in FIGS. 24A to 24D.

The oxide film 121 is etched and partitioned into oxide films 124 and 125, as shown in FIGS. 25A to 25D.

Figure 26A:
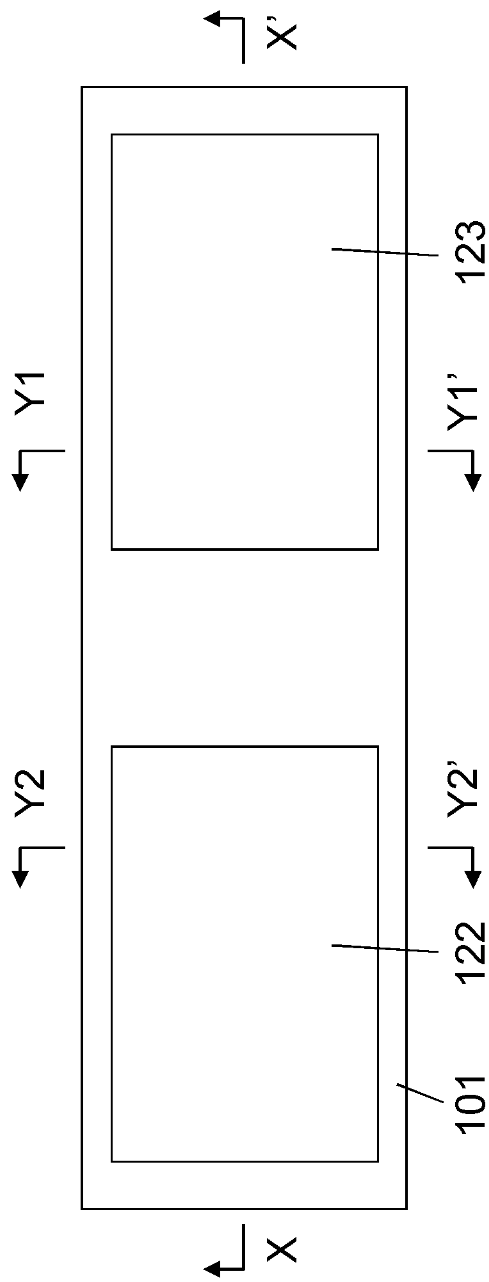
FIG. 26A is a planar view of the semiconductor device during production, showing the method of producing the semiconductor device according to an embodiment of the present invention.
Figure 26B:
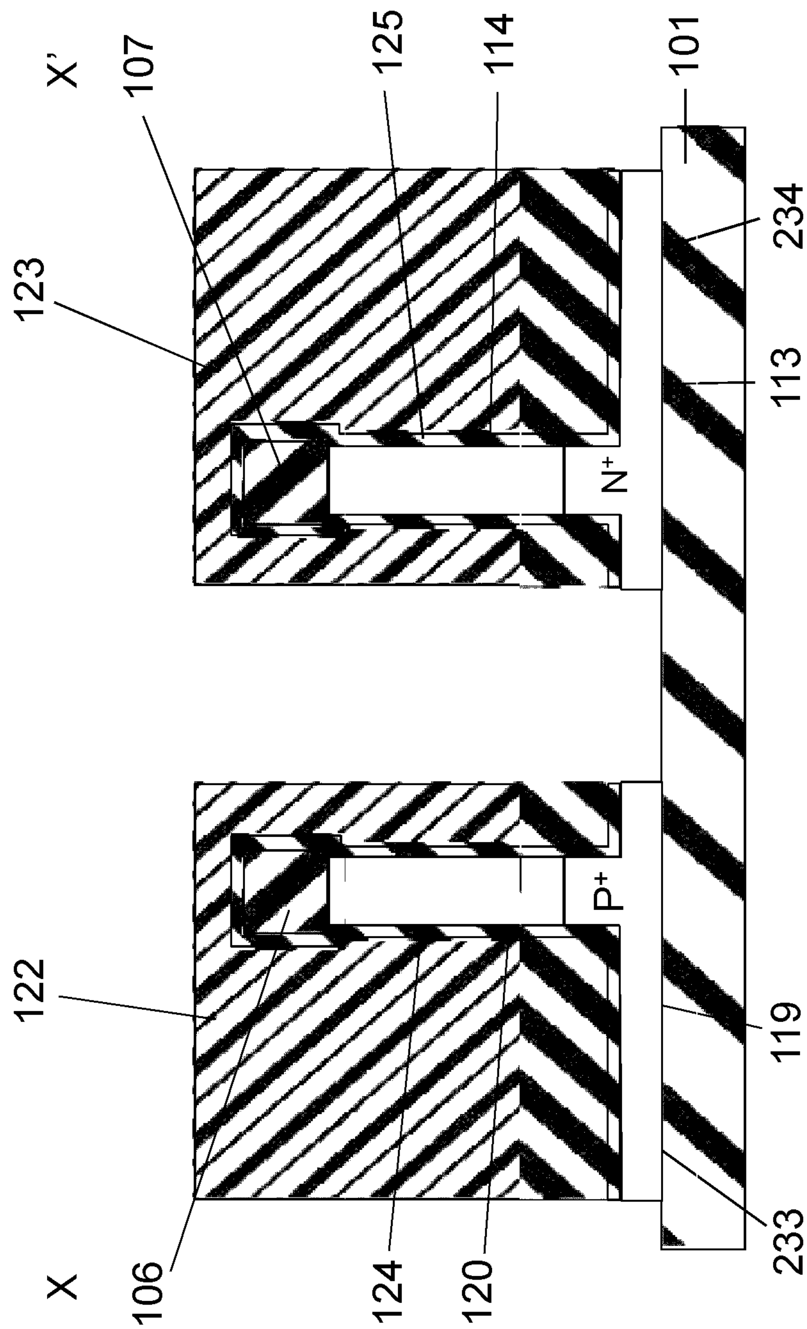
FIG. 26B is a cross-sectional view along line X-X' in FIG. 26A.
Figure 26C:
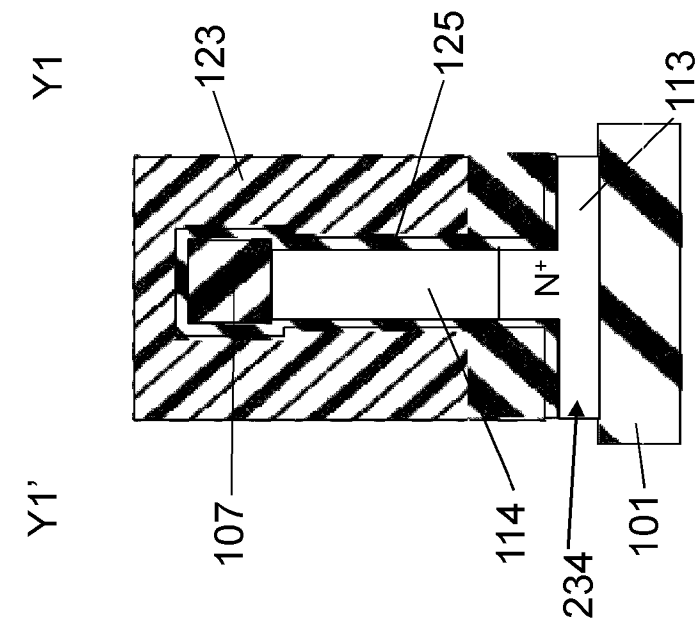
FIG. 26C is a cross-sectional view along line Y1-Y1' in FIG. 26A.
Figure 26D:
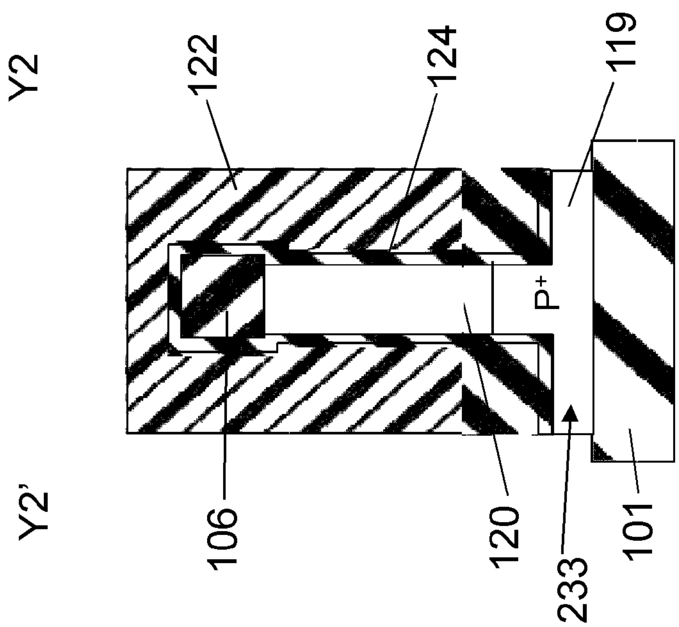
FIG. 26D is a cross-sectional view along line Y2-Y2' in FIG. 26A.
Figure 27A:
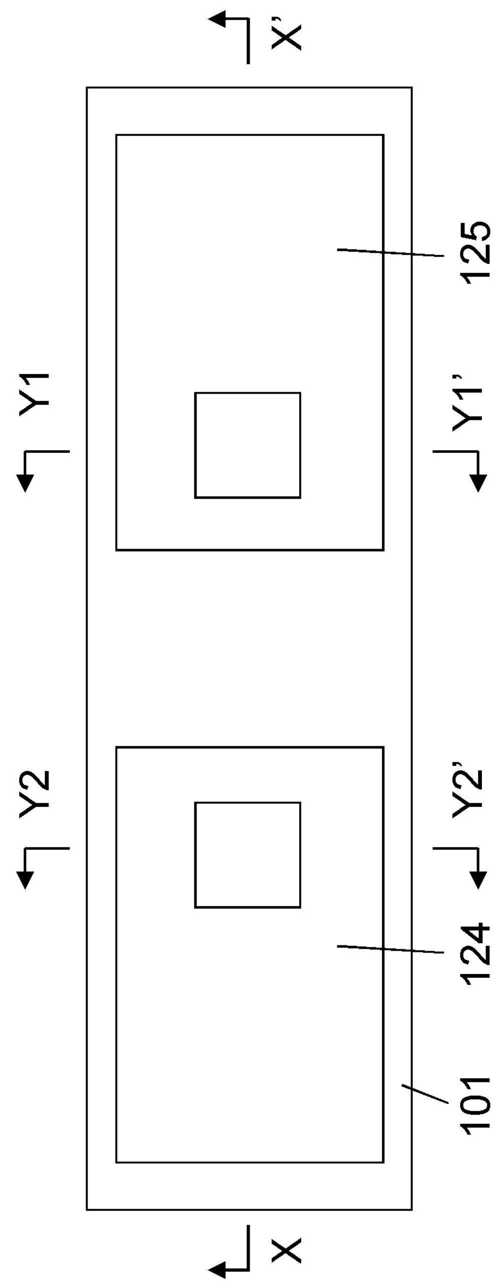
FIG. 27A is a planar view of the semiconductor device during production, showing the method of producing the semiconductor device according to an embodiment of the present invention.
Figure 27B:
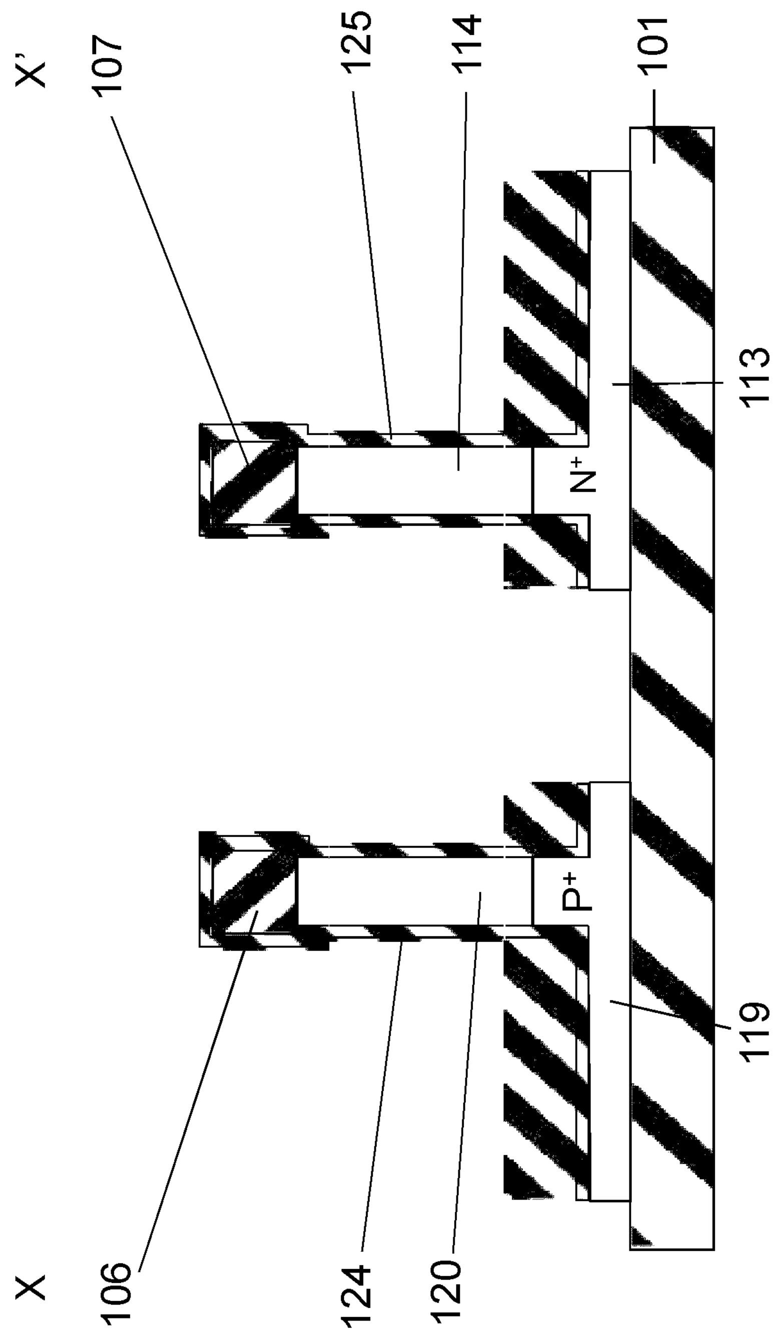
FIG. 27B is a cross-sectional view along line X-X' in FIG. 27A.
Figure 27C:
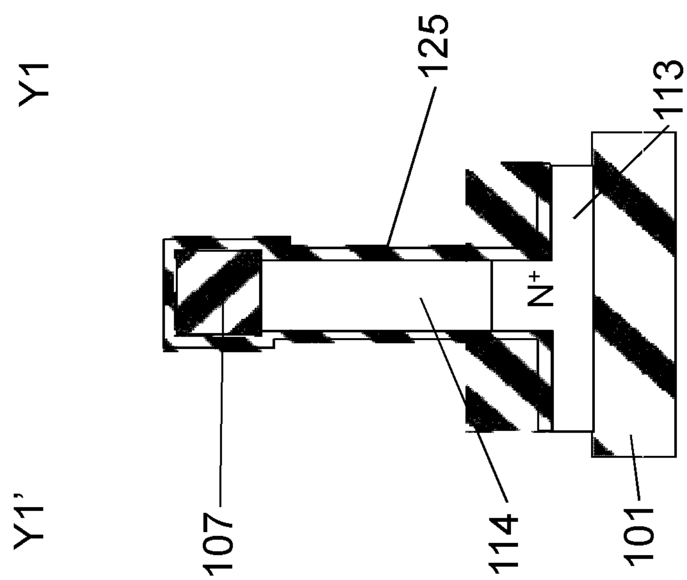
FIG. 27C is a cross-sectional view along line Y1-Y1' in FIG. 27A.
Figure 27D:
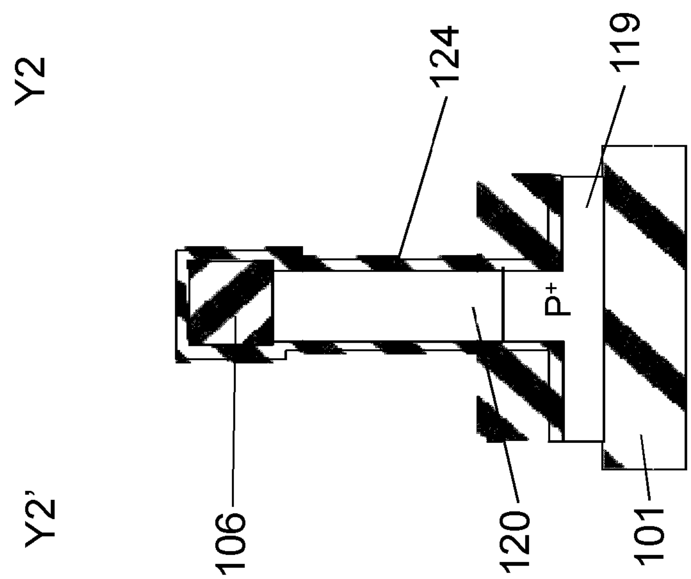
FIG. 27D is a cross-sectional view along line Y2-Y2' in FIG. 27A.
Figure 28A:
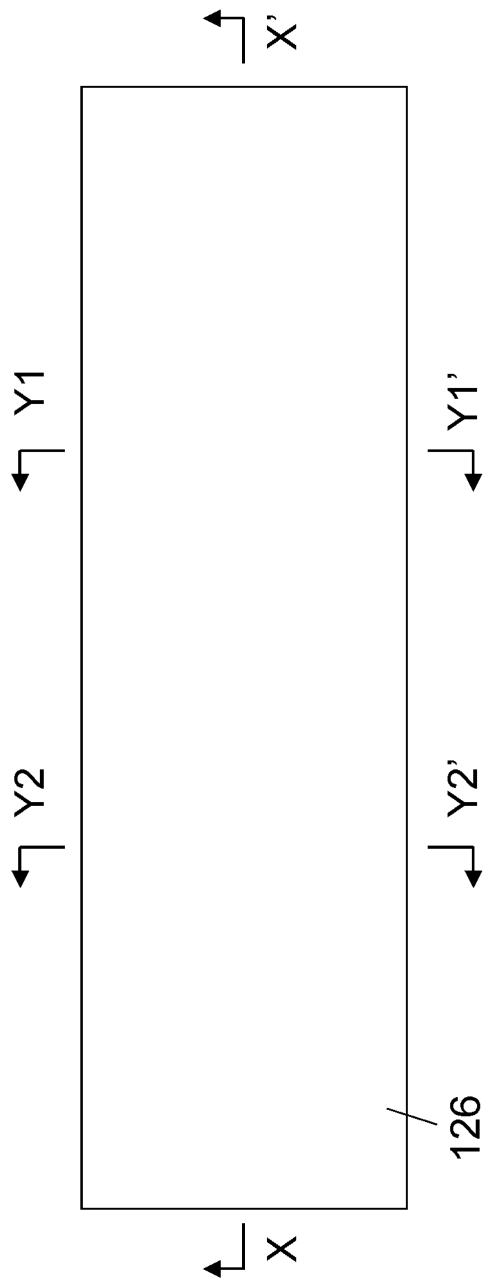
FIG. 28A is a planar view of the semiconductor device during production, showing the method of producing the semiconductor device according to an embodiment of the present invention.
Figure 28B:
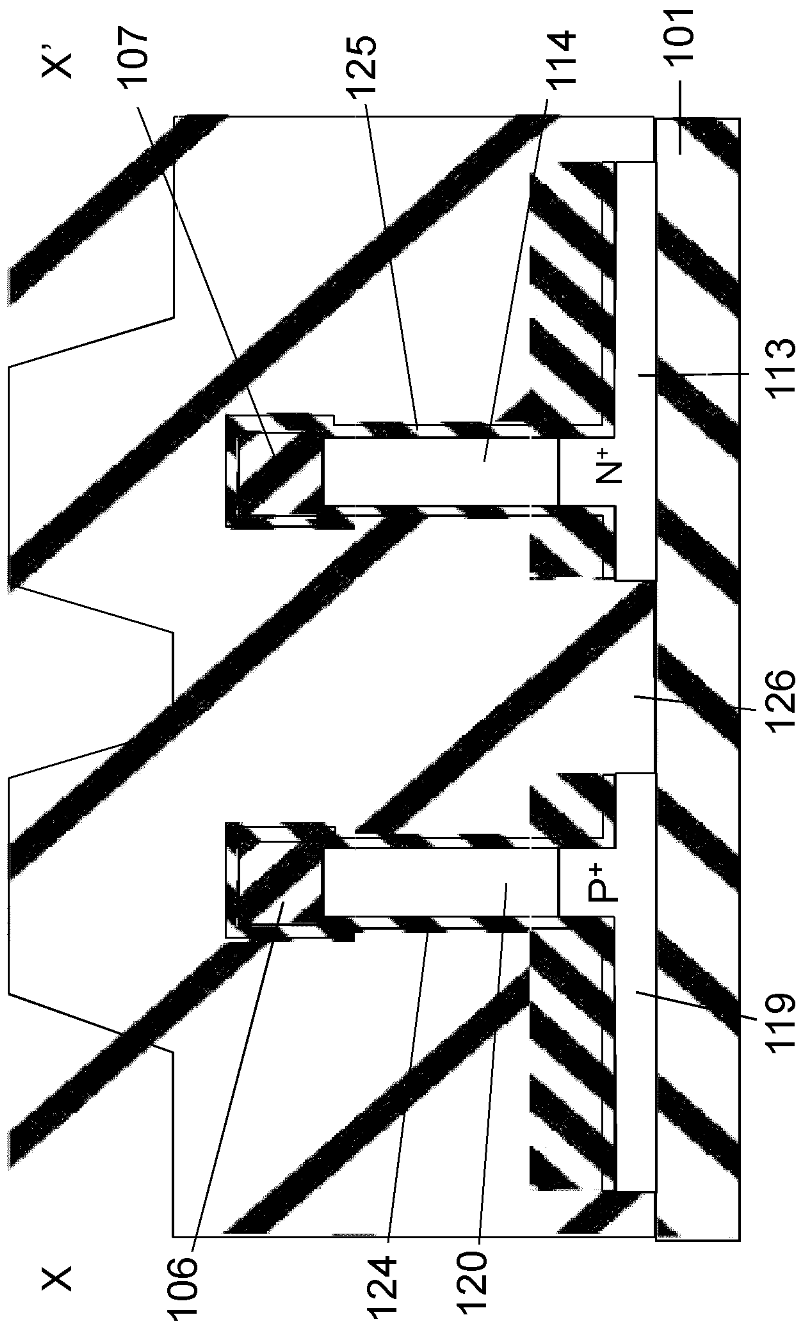
FIG. 28B is a cross-sectional view along line X-X' in FIG. 28A.
Figure 28C:
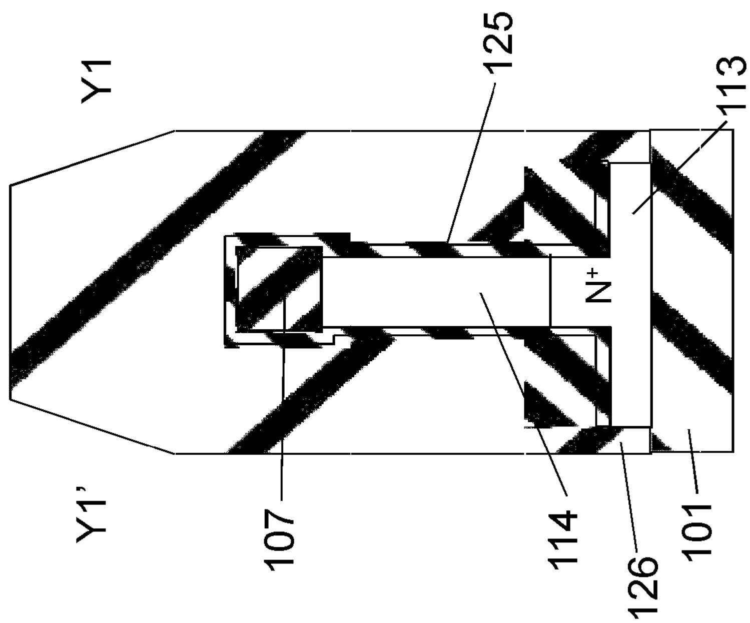
FIG. 28C is a cross-sectional view along line Y1-Y1' in FIG. 28A.
Figure 28D:
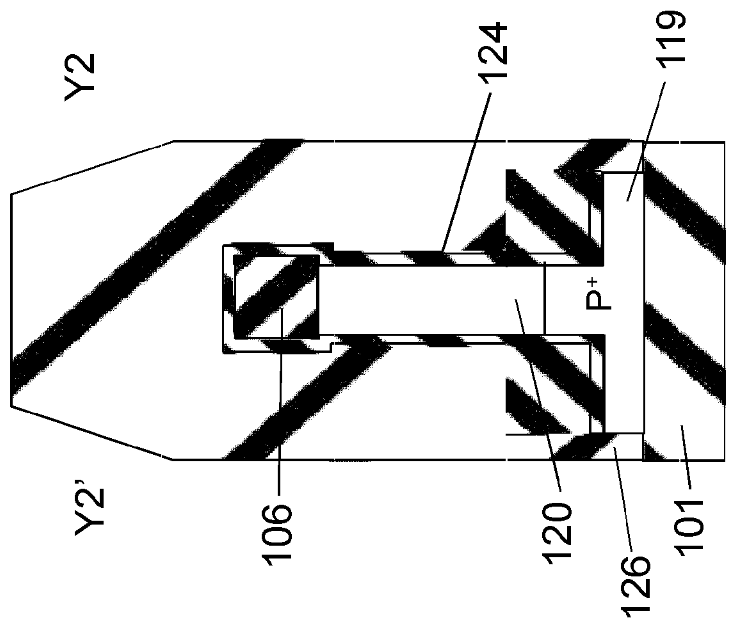
FIG. 28D is a cross-sectional view along line Y2-Y2' in FIG. 28A.
Figure 29A:
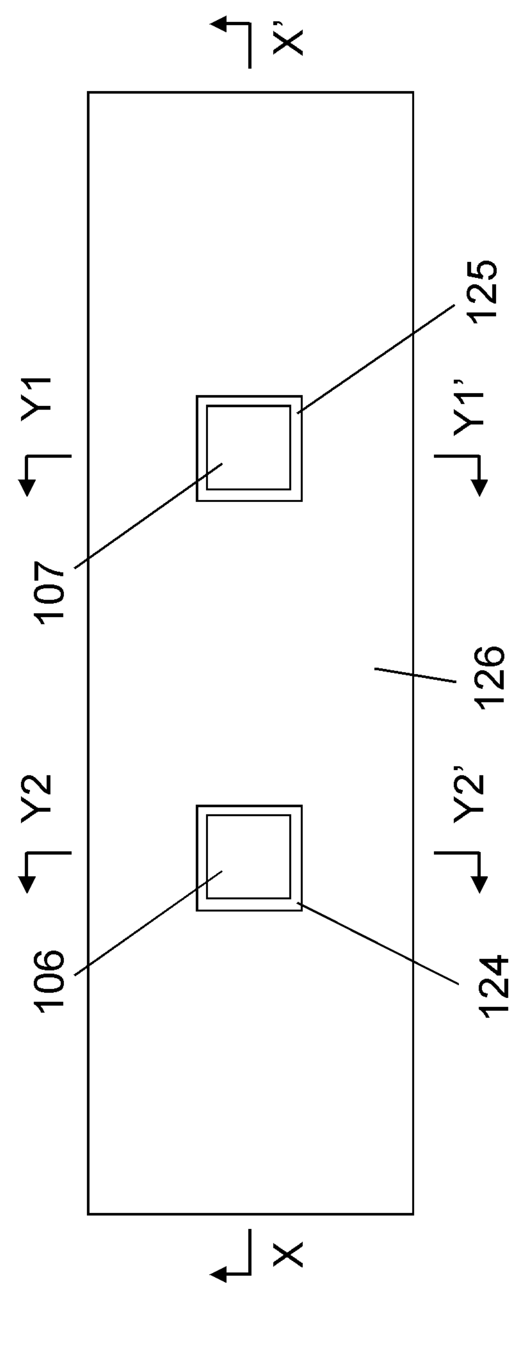
FIG. 29A is a planar view of the semiconductor device during production, showing the method of producing the semiconductor device according to an embodiment of the present invention.
Figure 29B:
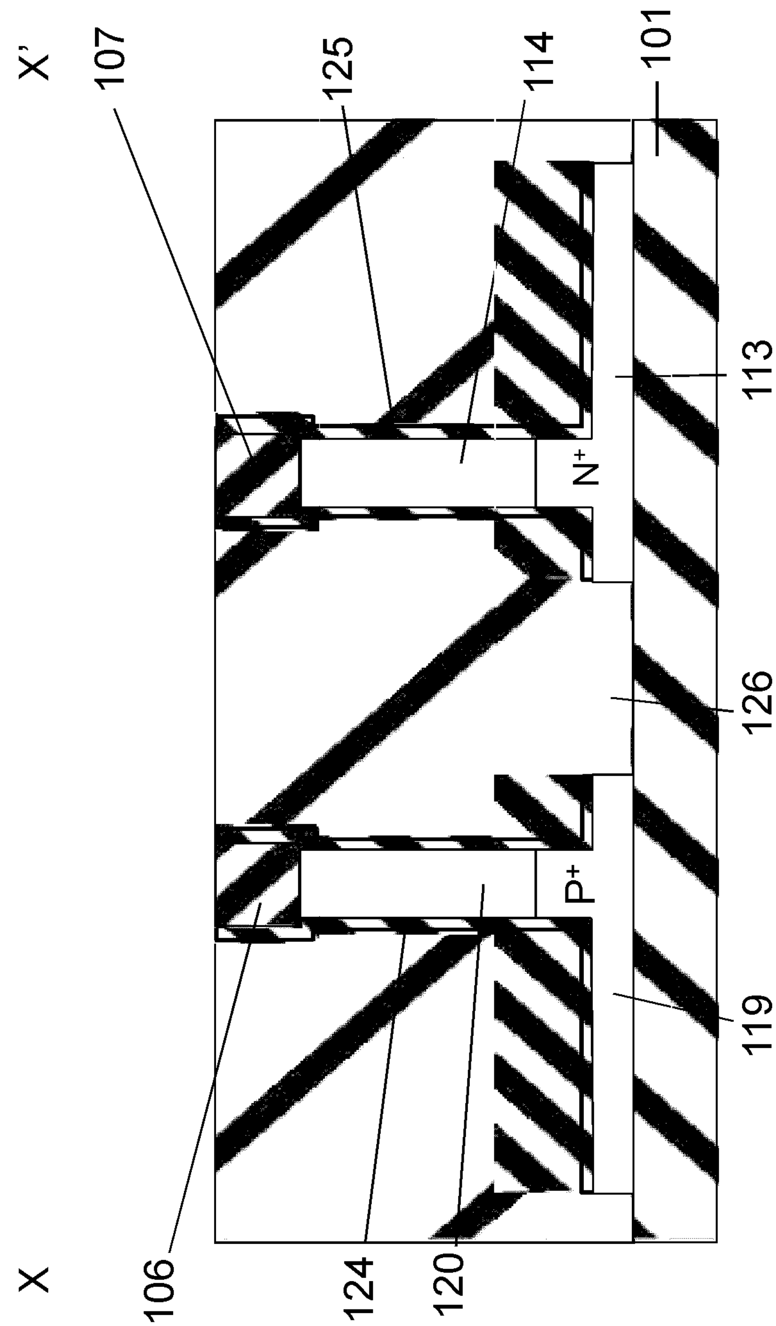
FIG. 29B is a cross-sectional view along line X-X' in FIG. 29A.
Figure 29C:
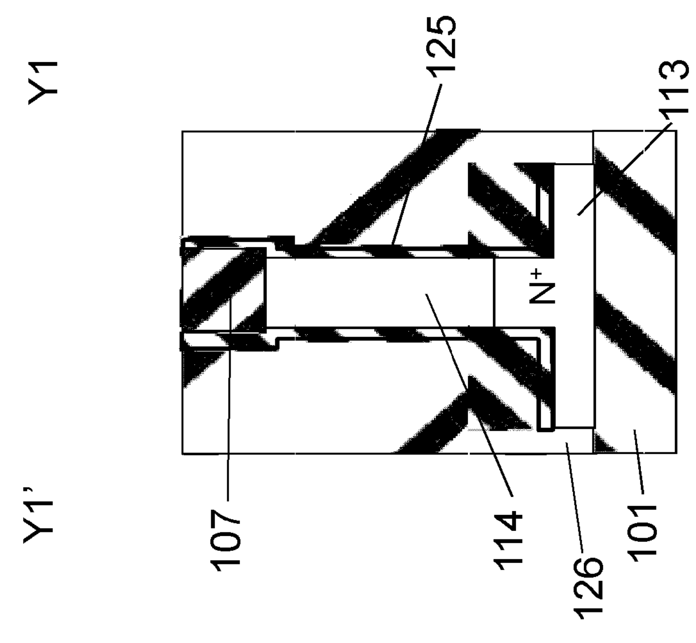
FIG. 29C is a cross-sectional view along line Y1-Y1' in FIG. 29A.
Figure 29D:
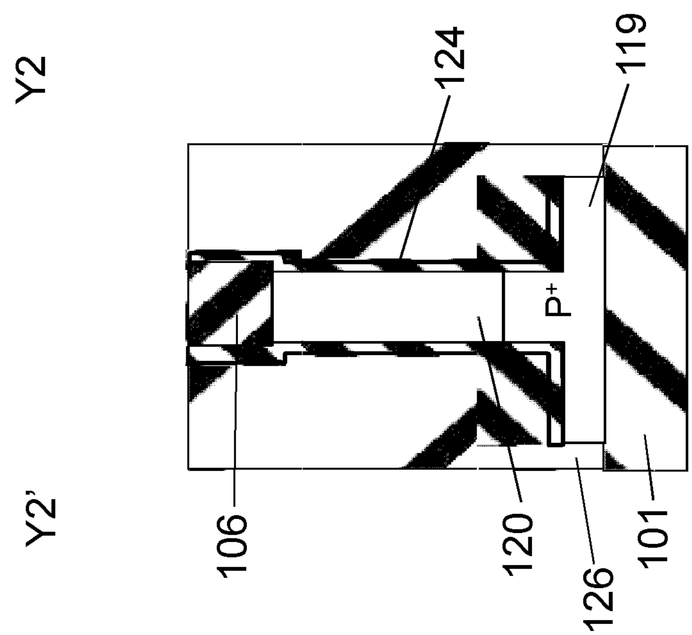
FIG. 29D is a cross-sectional view along line Y2-Y2' in FIG. 29A.
Figure 30A:
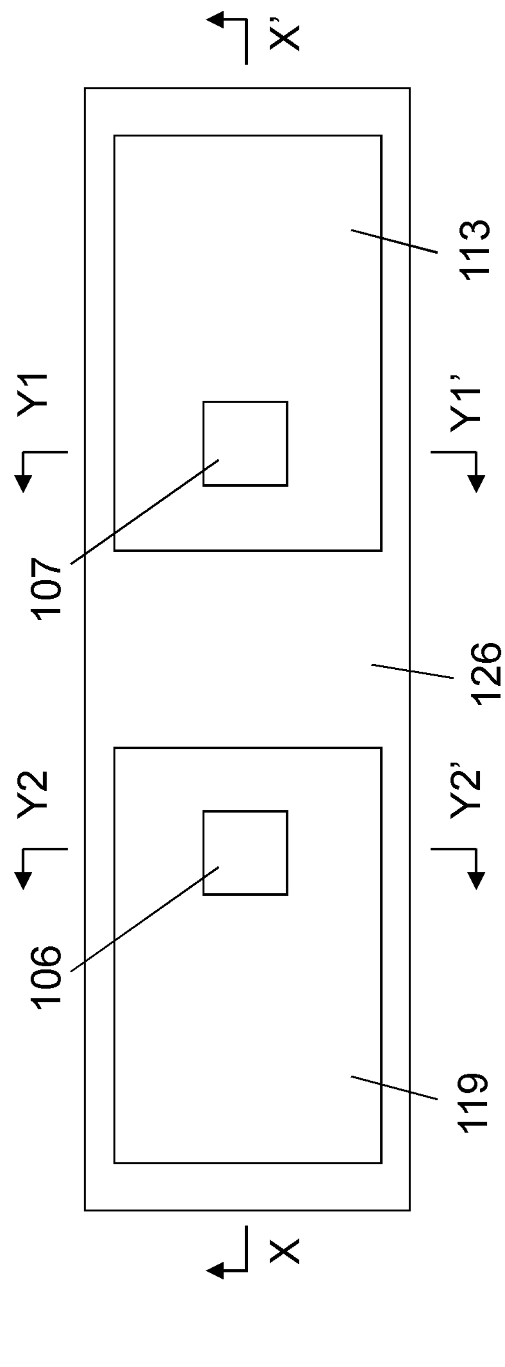
FIG. 30A is a planar view of the semiconductor device during production, showing the method of producing the semiconductor device according to an embodiment of the present invention.
Figure 30B:
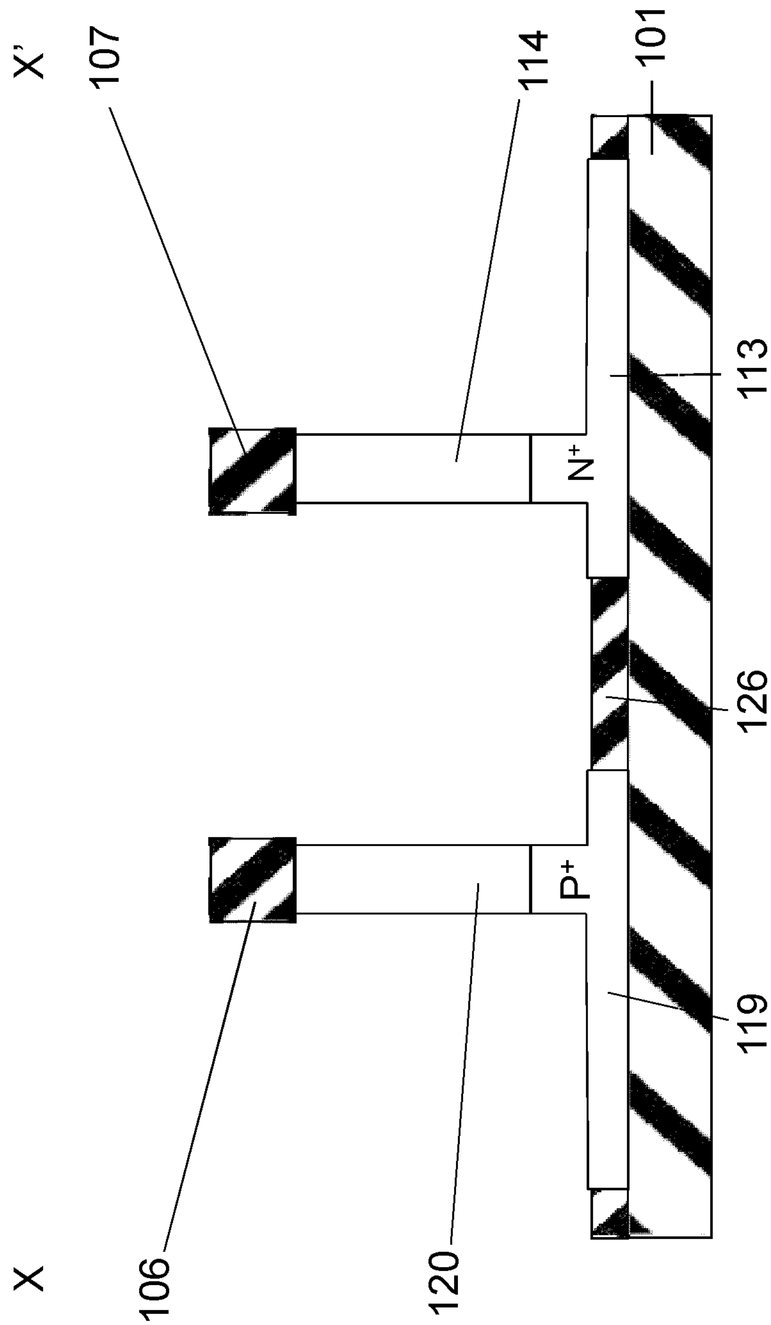
FIG. 30B is a cross-sectional view along line X-X' in FIG. 30A.
Figure 30C:
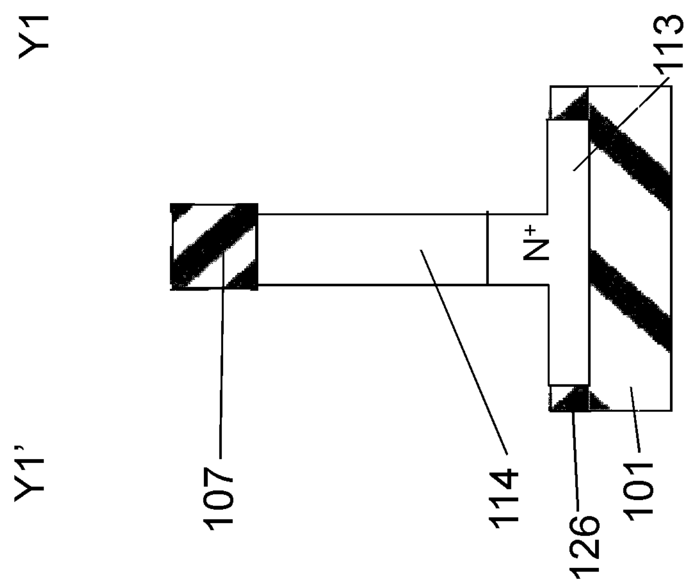
Figure 30D:
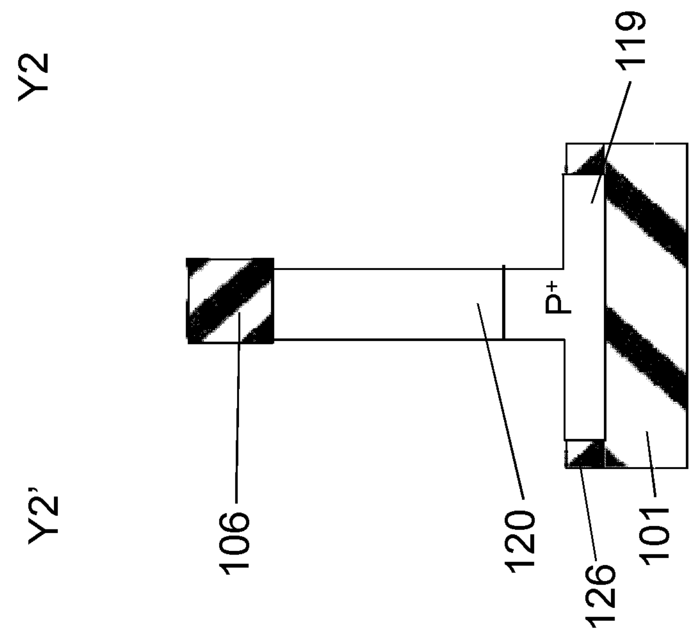
Figure 31A:
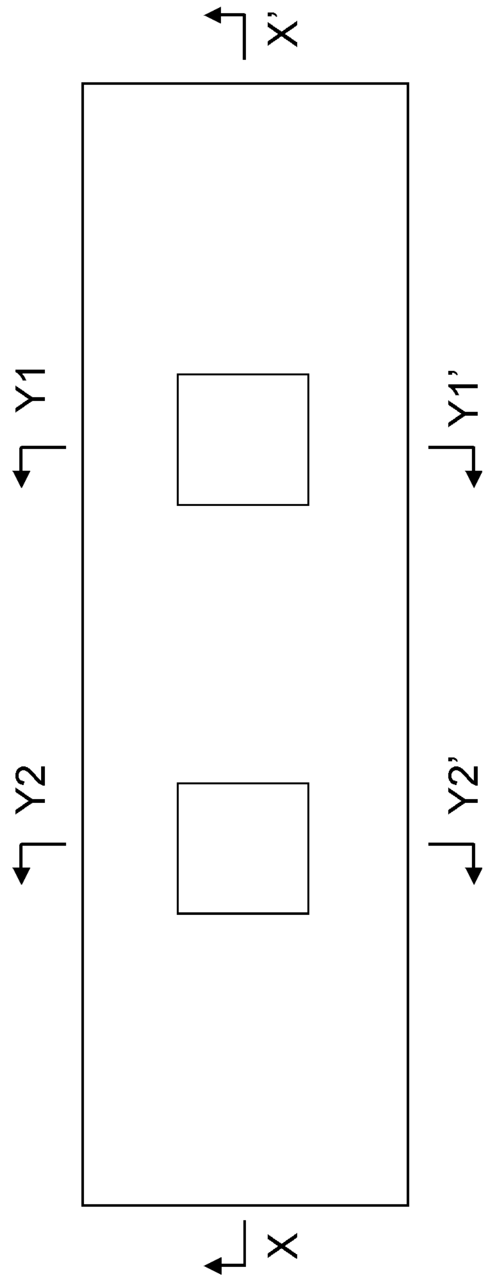
Figure 31B:
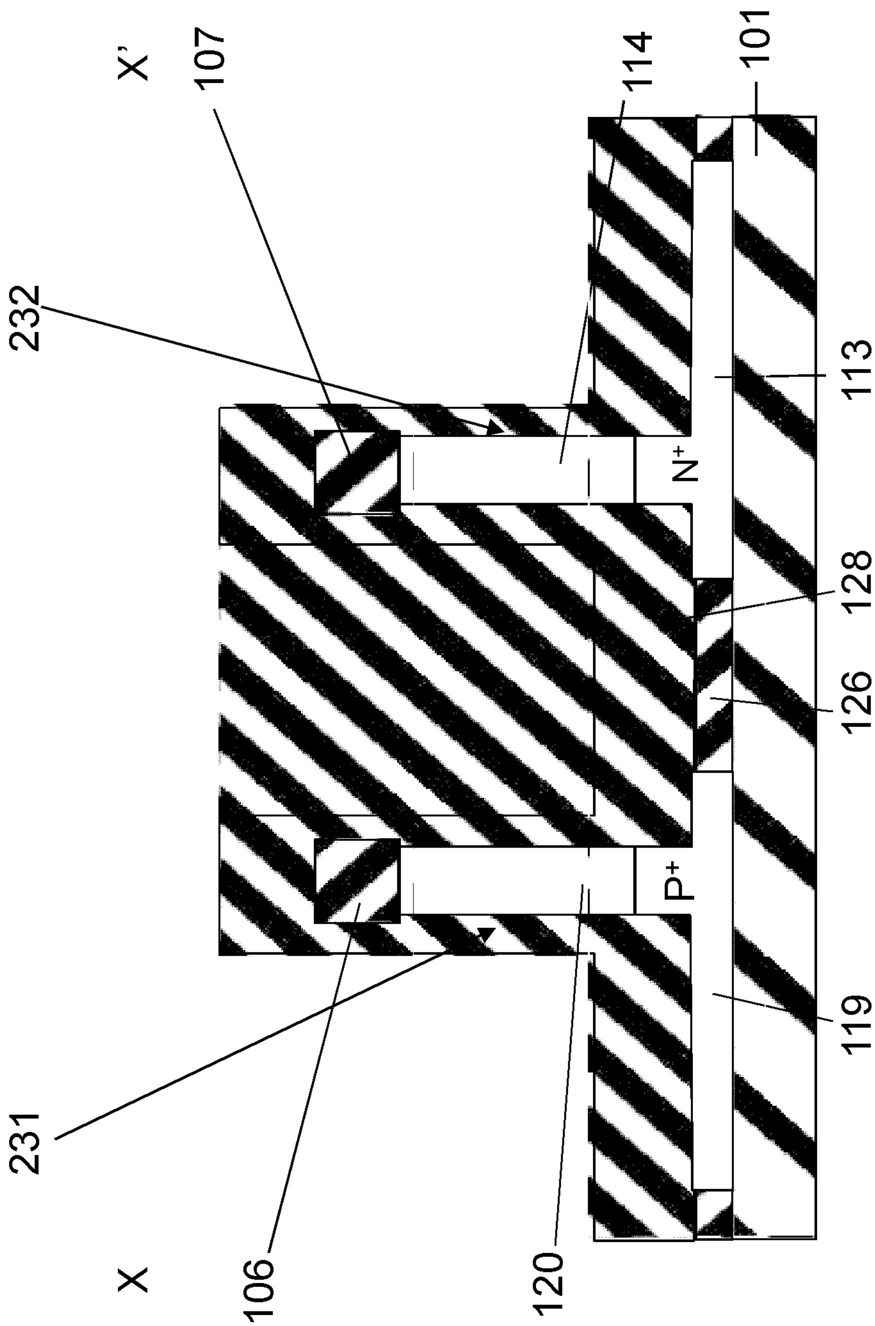
Figure 31C:
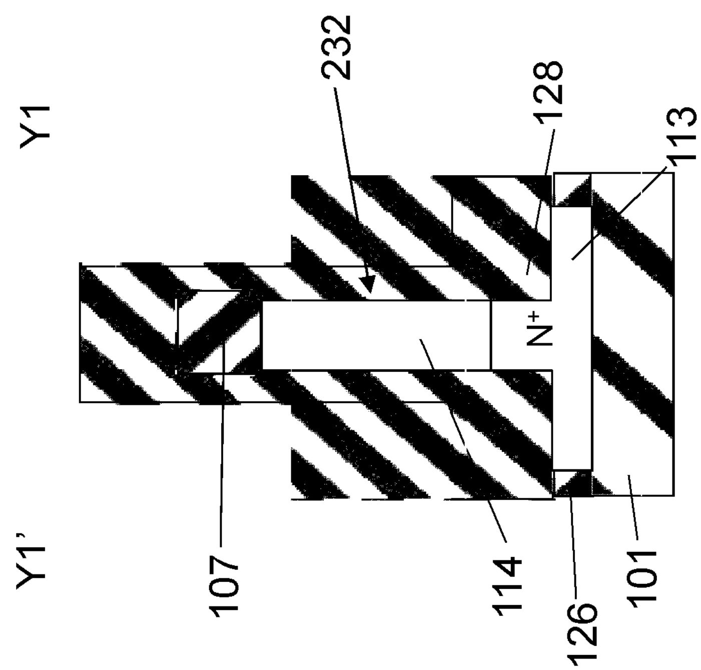
Figure 31D:
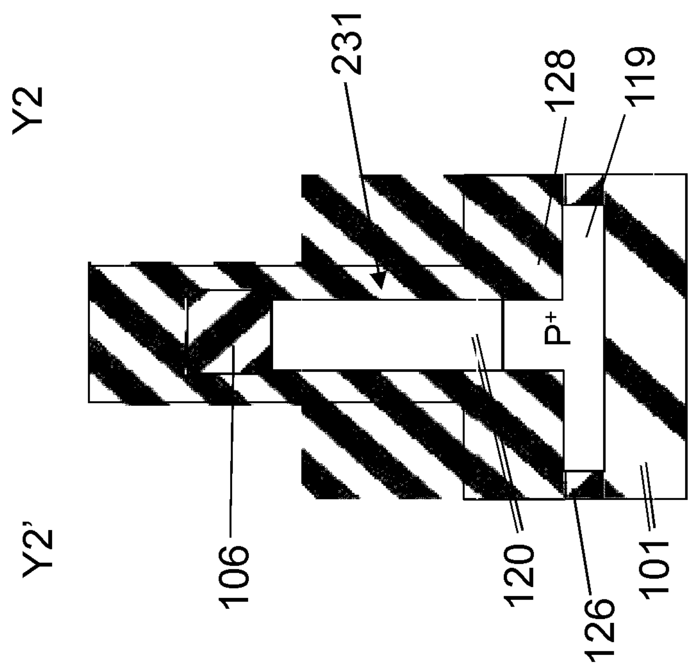
Figure 32A:
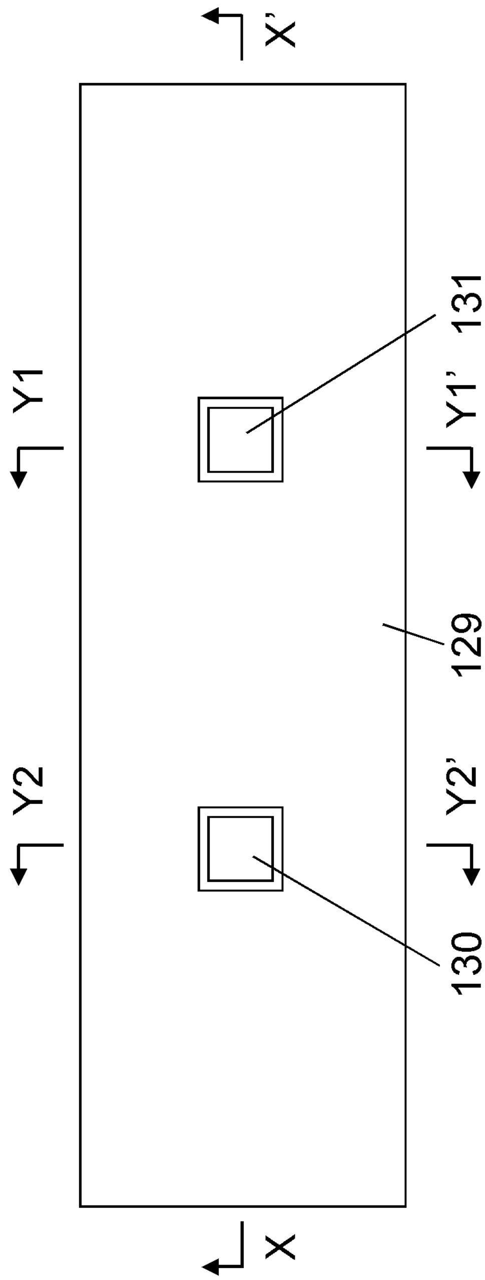
Figure 32B:
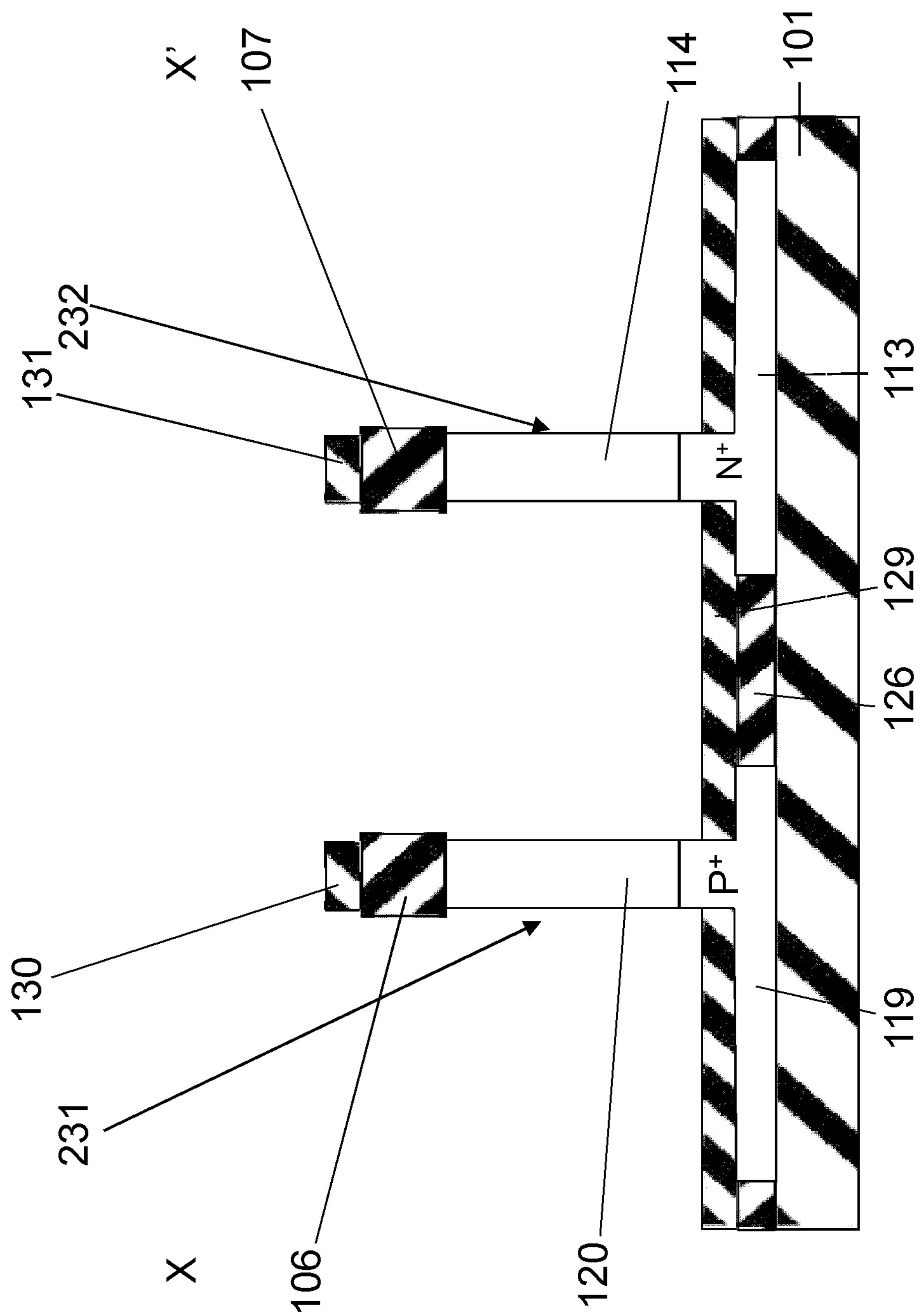
Figure 32C:
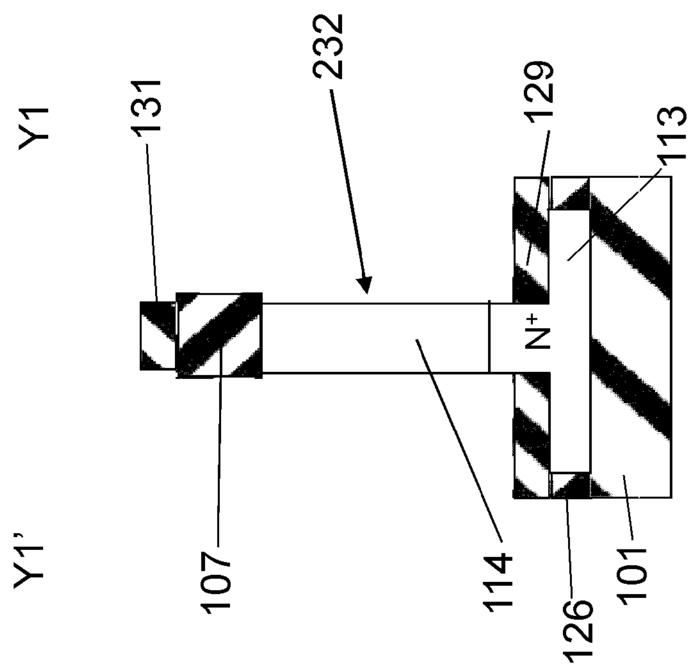
Figure 32D:
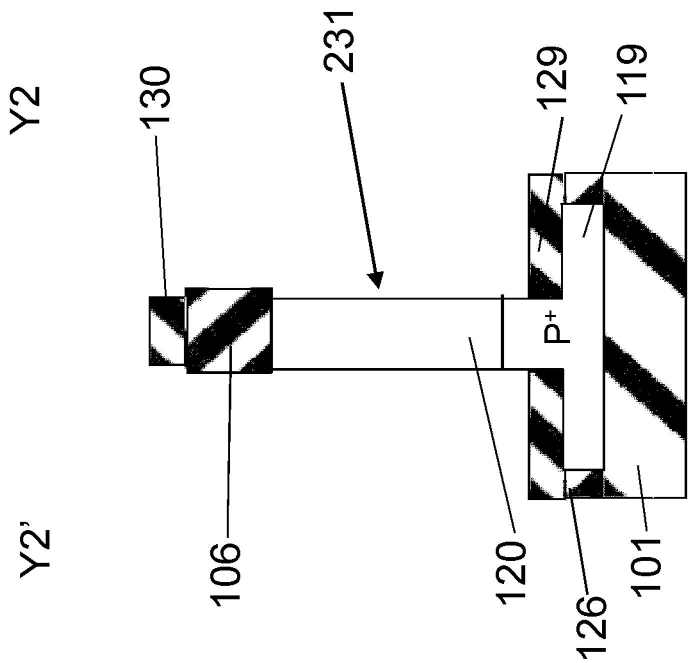

Portions of the p+ type silicon layer 119 and of the n+ type silicon layer 113 are etched to form planar silicon layers 233 and 234, as shown in FIGS. 26A and 26D. The planar silicon layer 233 is the planar portion of the p+ type silicon layer 119 arranged surrounding the area immediately below the second silicon layer 120. In addition, the planar silicon layer 234 is the planar portion of the n+ type silicon layer 113 arranged surrounding the area immediately below the first silicon layer 114.

The resists 122 and 123 are removed. Conditions on the substrate following removal are shown in FIGS. 27A to 27D.

An oxide film 123 is formed on the surface of the resists 122 and 123 and the planar silicon layers 233 and 244, as shown in FIGS. 28A to 28D.

CMP (Chemical Mechanical Polishing) is accomplished, the oxide film 126 is planarized and the hard masks 106 and 107 are exposed, as shown in FIGS. 29A to 29D.

The oxide films 126, 124 and 125 are etched to form an oxide film 126 buried between the planar silicon layers 119 and 133, as shown in FIGS. 30A to 30D.

An oxide film 128 is formed on the result of the above processes. At this time, the oxide film 128 is formed thickly on the n+ type silicon layer 113, the p+ type silicon layer 119, the oxide film 126 and the hard masks 106 and 107, and the oxide film 128 is formed thinly on the sidewalls of the columnar silicon layers 231 and 232, as shown in FIGS. 31A to 31D.

The oxide film 128 formed on the sidewalls of the columnar silicon layers 231 and 232 is removed through etching. The etching is preferably isotropic etching. The oxide film 128 is formed thickly on the n+ type silicon layer 113, the p+ type silicon layer 119, the oxide film 126 and the hard masks 106 and 107 and the oxide film 128 is formed thinly on the sidewalls of the columnar silicon layers 213 and 232, and consequently, the oxide film 128 remains on the n+ type silicon layer 113, the p+ type silicon layer 119 and the oxide film 126, forming an insulating film 129, as shown in FIGS. 32A to 32D. In addition, in this case oxide films 130 and 131 remain on the hard masks 106 and 107 as well.

By means of the insulating film 129, it is possible to reduce the parasitic capacitance between the gate electrode and the planar silicon layer.

A gate insulating film 132 is formed so as to cover at least the first silicon layer 114 and the surface of the surroundings of the bottom thereof and the second silicon layer 120 and the surface of the surroundings of the bottom thereof, as shown in FIGS. 33A to 33D. The gate insulating film 132 is a film containing at least one out of an oxide film, a nitride film and a high-k film. In addition, prior to forming the gate insulating film, hydrogen atmosphere annealing or epitaxial growth may be accomplished on the columnar silicon layers 231 and 232.

A metal film 133 is formed on the surface of the gate insulating film 132, as shown in FIGS. 34A to 34D. The metal film is preferably a film containing titanium, titanium nitride, tantalum or tantalum nitride. By using the metal film, it is possible to control depletion of the channel region and it is also possible to lower the resistance of the gate electrode. It is necessary to use a manufacturing process for later processes so as to control metal contamination by the metal gate electrode.

A polysilicon film 134 is formed on the surface of the metal film 133, as shown in FIGS. 35A to 35D. In order to control metal contamination, it is preferable to form the polysilicon film 134 using normal-pressure CVD.

The polysilicon film 134 is etched to form polysilicon films 135 and 136 remaining in sidewall shape, as shown in FIGS. 36A to 36D.

The metal film 133 is etched. The metal film on the sidewalls of the columnar silicon layers 231 and 232 is protected by the polysilicon films 135 and 136 and thus is not etched, and becomes the metal films 137 and 138 remaining in sidewall shape, as shown in FIGS. 37A to 37D.

The gate insulating film 132 is etched. The gate insulating film on the sidewalls of the columnar silicon layers 231 and 232 is protected by the polysilicon films 135 and 136 and thus is not etched, and becomes the gate insulating film 140 remaining in sidewall shape, as shown in FIGS. 38A to 38D.

A polysilicon film 141 is formed on the surface where circuits are formed, as shown in FIGS. 39A to 39D. In order to control metal contamination, the polysilicon film 141 is preferably formed using normal-pressure CVD.

When a high-k film is used in the gate insulating films 134 and 140, this high-k film can be the source of metal contamination.

Through this polysilicon film 141, the gate insulating film 139 and the metal film 137 are covered by the columnar silicon layer 231, the polysilicon films 135 and 141, the insulating film 129 and the hard mask 106.

In addition, the gate insulating film 140 and the metal film 138 are covered by the columnar silicon layer 232, the polysilicon films 136 and 141, the insulating film 129 and the hard mask 107.

That is to say, the gate insulating films 139 and 140 and the metal films 137 and 138, which are all sources of contamination, are covered by the columnar silicon layers 231 and 232, the polysilicon layers 135, 136 and 141, the insulating film 129 and the hard masks 106 and 107, so it is possible to control metal contamination by metal contained in the gate insulating films 139 and 140 and the metal films 137 and 138.

In order to achieve the aforementioned objectives, it would be fine to form a structure in which the metal film is thickly formed, etching is accomplished to leave a sidewall shape and the gate insulating film is etched, following which a polysilicon film is formed and the gate insulating film and the metal film are covered by the columnar silicon layer, the polysilicon layer, the insulating film and the hard mask.

A polysilicon film 142 is formed on the surface where the circuits are formed, as shown in FIGS. 40A to 40D. In order to bury the columnar silicon 231 and 232, the polysilicon film is preferably formed using low-pressure CVD. The gate insulating film and the metal film that are the source of contamination are covered by the columnar silicon layers 231 and 232, the polysilicon layers 135, 136 and 141, the insulating film 129 and the hard masks 106 and 107, so it is possible to use low-pressure CVD.

CMP (chemical mechanical polishing) is accomplished with the oxide films 130 and 131 and polishing steppers, as shown in FIGS. 41A to 41D, and the polysilicon film 142 is planarized, as shown in FIGS. 41A to 41D. Because the polysilicon film is planarized, it is possible to control metal contamination of the CMP device.

The oxide films 130 and 131 are removed through etching. Conditions on the substrate following etching are shown in FIGS. 42A to 42D The polysilicon film 142 is etched and the polysilicon film 142 is removed to the top edge of the region where the gate electrode and the gate insulating films 139 and 140 are to be formed, as shown in FIGS. 43A to 43D. Through this etching, the gate length of the SGT is determined.

The metal films 137 and 138 on the upper sidewalls of the columnar silicon layers 231 and 232 are removed through etching. Conditions on the substrate following etching are shown in FIGS. 44A to 44D.

The gate insulating films 139 and 140 on the upper sidewalls of the columnar silicon layers 231 and 232 are removed through etching. Conditions on the substrate following etching are shown in FIGS. 45A to 45D An oxide film 144 is formed on the surface where the circuits are formed, as shown in FIGS. 46A to 46D. Because the gate electrode top surface is protected by this oxide film 144 from the wet treatment or dry treatment accomplished in later processes, it is possible to control fluctuations in gate length, that is to say variance in gate length, and damage to the gate insulating films 139 and 140 and the metal films 137 and 138 from the gate electrode top surface.

A nitride film 145 is formed on the surface of the oxide film 144, as shown in FIGS. 47A to 47D.

The nitride film 145 and the oxide film 144 are etched to form the oxide films 148 and 149 and the nitride films 146 and 147 remaining in a sidewall shape, as shown in FIGS. 48A to 48D.

The sum of the film thicknesses of the oxide film 148 and the nitride film 146 remaining in sidewall shape is the film thickness of the gate electrode 235 later, and the film thickness of the oxide film 149 and the nitride film 147 remaining in sidewall shape is the film thickness of the gate electrode 236 later, so by adjusting the film formation thicknesses and etching conditions of the oxide film 144 and the nitride film 145, it is possible to form a gate electrode of the desired film thickness.

In addition, it is preferable for the sum of the radius of the columnar silicon layer 231 and the sum of the film thicknesses of the oxide film 148 and the nitride film 146 remaining in sidewall shape to be greater than the radius of the outer circumference of the cylinder composed by the gate insulating film 139 and the metal film 137, and for the sum of the radius of the columnar silicon layer 232 and the sum of the film thicknesses of the oxide film 149 and the nitride film 147 remaining in sidewall shape to be larger than the diameter of the outer circumference of the cylinder composed by the gate insulating film 140 and the metal film 138. At this time, because the metal films 137 and 138 are covered by the polysilicon film after gate etching, it is possible to control metal contamination.

A resist 150 for forming a gate wire 221 is formed on the polysilicon layer 142 at least between the first silicon layer 114 and the second silicon layer 120, as shown in FIGS. 49A to 49D.

The polysilicon films 142, 141, 135 and 136 are etched to form gate electrodes 235 and 236 and the gate wire 221, as shown in FIGS. 50A to 50D.

The gate electrode 235 is composed of the metal film 137 and the polysilicon films 135 and 151, and the gate electrode 236 is composed of the metal film 138 and the polysilicon films 136 and 152.

The gate wire 221 connecting the gate electrodes 235 and 236 is composed of the polysilicon films 135, 151, 142, 152 and 136.

The insulating film 129 is etched and the surfaces of the p+ type silicon layer 119 and the n+ type silicon layer 113 are exposed, as shown in FIGS. 51A to 51D.

The resist 150 is removed. Conditions on the substrate following removal are shown in FIGS. 52A to 52D.

Oxidation is accomplished to form oxide films 153, 154 and 155, as shown in FIGS. 53A to 53D. The p+ type silicon layer 159, the n+ type silicon layer 157, the gate electrodes 235 and 236 and the gate wire 221 are protected by these nitride films from etching through wet treatment or dry treatment during etching of the hard masks 106 and 107 and the nitride films 146 and 147 performed later.

The hard masks 106 and 107 and the nitride films 146 and 147 are removed by etching through a wet treatment or dry treatment. Conditions on the substrate following etching are shown in FIGS. 54A to 54D. Because the top surface of the gate electrodes is protected from the wet treatment or dry treatment by the oxide films 148 and 149, it is possible to control fluctuations in gate length, that is to say variances in gate length, and to control damage to the gate insulating films 139 and 140 and the metal films 137 and 138 from the top surface of the gate electrode. At this time, the gate insulating films 139 and 140 and metal films 137 and 138 are covered by the polysilicon 135, 136, 151 and 152, the nitride films 148 and 149, the columnar silicon layers 231 and 232 and the insulating film 129, so metal contamination of the nitride film wet etching device is controlled.

The oxide films 148, 149, 153, 154 and 155 are removed by etching. Conditions on the substrate following etching are shown in FIGS. 55A to 55D.

A resist 156 for forming an n+ type silicon layer on the columnar silicon layer 232 through dopant injection is formed surrounding the columnar silicon layer 231, as shown in FIGS. 56A to 56D. In advance of this process, a thin oxide film may be formed as a through (?) oxide film for dopant injection.

As indicated by the arrows in FIGS. 57B and 57C, arsenic, for example, is injected into the top of the columnar silicon layer 232 to form an n+ type silicon layer 157. The angle of injecting the arsenic is preferably 10 degrees to 60 degrees, and more preferably the large angle of 60 degrees, where a line orthogonal to the substrate is taken as 0 degrees. By injecting the arsenic at a large angle, the n+ type silicon layers 157 and the gate electrode 236 are given an overlap and it is possible to minimize this overlap.

The resist 156 is removed. Conditions on the substrate following removal are shown in FIGS. 58A to 58D.

Heat treatment is accomplished and the arsenic is activated. Conditions on the substrate following activation is shown in FIGS. 59A to 59D.

A resist 158 for forming a p+ type silicon layer on the upper part of the columnar silicon layer 231 through dopant injection is formed surrounding the columnar silicon layer 232, as shown by FIGS. 60A to 60D.

As indicated by FIGS. 61B and 61D, boron, for example, is injected into the upper part of the columnar silicon layer 231 to form a p+ type silicon layer 159. The angle of injecting the boron is preferably 10 degrees to 60 degrees, and more preferably the large angle of 60 degrees, where a line orthogonal to the substrate is taken as 0 degrees. By injecting the boron at a large angle, the p+ type silicon layers 159 and the gate electrode 235 are given an overlap and it is possible to minimize this overlap.

The resist 158 is removed. Conditions on the substrate following removal are shown in FIGS. 62A to 62D.

Heat treatment is accomplished and the boron is activated. Conditions on the substrate following activation is shown in FIGS. 63A to 63D. By separately undertaking heat treatment of the n+ type silicon layer 157 and heat treatment of the p+ type silicon layer 159, it is possible to easily optimize heat treatment conditions for each, so it is possible to control the short channel effect and to control leak current.

A nitride film 160 is formed on the surface where the circuits are formed, as shown in FIGS. 64A to 64D.

The nitride film 160 is etched to form an insulating film 161 composed of nitride film formed in a sidewall shape on the upper sidewall of the columnar silicon layer 231 and the upper part of the gate electrode 235, an insulating film 162 composed of a nitride film formed in a sidewall shape on the upper sidewall of the columnar silicon layer 232 and the upper part of the gate electrode 236, an insulating film 164 composed of a nitride film formed in a sidewall shape on the sidewalls of the insulating film 129 and the gate electrodes 235 and 236, an insulating film 163 composed of a nitride film formed in a sidewall shape on the sidewall of the p+ type silicon layer 119 and an insulating film 165 composed of a nitride film formed in a sidewall shape on the sidewall of the n+ type silicon layer 113, as shown in FIGS. 65A to 65D.

By making the thicknesses of the insulating films 161 and 162 formed in a sidewall shape on the upper sidewalls of the columnar semiconductor layers and the upper parts of the gate electrodes thicker than the sum of the thicknesses of the gate insulating films 139 and 140 and the thicknesses of the metal films 137 and 138, the gate insulating film 140 and the metal film 138 are covered by the columnar silicon layer 232, the polysilicon layers 136 and 152, the insulating film 129 and the insulating film 162, and in addition, the gate insulating film 129 and the metal film 137 are covered by the columnar silicon layer 231, the polysilicon layers 135 and 151, the insulating film 129 and the insulating film 161.

A resist 166 for forming a deep n+ type silicon layer in the direction orthogonal to the substrate on the upper part of the columnar silicon layer 232 through dopant injection is formed surrounding the columnar silicon layer 231, as shown in FIGS. 66A to 66D. By making this an n+ type silicon layer deep in the direction orthogonal to the substrate, it is possible to form a metal-silicon compound later on the n+ type silicon layer. If this were an n+ type silicon layer shallow in the direction orthogonal to the substrate, the metal-silicon compound formed later would be formed on the n+ type silicon layer and the first silicon layer and would become a source of leak current.

As shown in FIGS. 67B and 67C, arsenic, for example, is injected into the upper part of the columnar silicon layer 232 and the n+ type silicon layer 157 is made deep in the direction orthogonal to the substrate. The angle of injecting the arsenic is preferably a low angle of 0 degrees to 7 degrees, where the line orthogonal to the substrate is taken to be 0 degrees. By injecting the arsenic at a low angle, it is possible to form an n+ type silicon layer deep in the direction orthogonal to the substrate on the upper part of the columnar silicon layer of the nMOS SGT.

The resist 166 is removed. Conditions on the substrate following removal are shown in FIGS. 68A to 68D.

A resist 167 for forming a deep p+ type silicon layer in the direction orthogonal to the substrate on the upper part of the columnar silicon layer 231 through dopant injection is formed surrounding the columnar silicon layer 232, as shown in FIGS. 69A to 69D. By making this a p+ type silicon layer deep in the direction orthogonal to the substrate, it is possible to form a metal-silicon compound later on the p+ type silicon layer. If this were a p+ type silicon layer shallow in the direction orthogonal to the substrate, the metal-silicon compound formed later would be formed on the p+ type silicon layer and the second silicon layer and would become a source of leak current.

As shown in FIGS. 70B and 70D, boron, for example, is injected into the upper part of the columnar silicon layer 231 and the p+ type silicon layer 159 is made deep in the direction orthogonal to the substrate. The angle of injecting the boron is preferably a low angle of 0 degrees to 7 degrees, where the line orthogonal to the substrate is taken to be 0 degrees. By injecting the boron at a low angle, it is possible to form a p+ type silicon layer deep in the direction orthogonal to the substrate on the upper part of the columnar silicon layer of the pMOS SGT.

The resist 167 is removed. Conditions on the substrate following removal are shown in FIGS. 71A to 71D.

Heat treatment is accomplished in order to activate the dopant. Conditions following activation are shown in FIGS. 72A to 72D.

By sputtering a metal such as Ni or Co and adding heat treatment, a metal-silicon compound is formed on the surface of the p+ type silicon layer 119, the p+ type silicon layer 159, the gate electrode 235, the n+ type silicon layer 113, the n+ type silicon layer 157 and the gate electrode 236, and by removing the unreacted metal film using a sulfuric acid hydrogen peroxide mixture or an ammonia hydrogen peroxide mixture, a metal-silicon compound 168 is formed on the surface of the p+ type silicon layer 119, a metal-silicon compound 169 is formed on the surface of the p+ type silicon layer 159, a metal-silicon compound 170 is formed on the surface of the gate electrode 235, the gate wire 221 and the gate electrode 236, a metal-silicon compound 172 is formed on the surface of the n+ type silicon layer 113, and a metal-silicon compound 171 is formed on the surface of the n+ type silicon layer 157.

The gate insulating film 140 and the metal film 138 are covered by the columnar silicon layer 232, the polysilicon films 136 and 152, the insulating film 129 and the insulating film 162, and in addition, the gate insulating film 139 and the metal film 137 are covered by the columnar silicon layer 231, the polysilicon films 135 and 151, the insulating film 129 and the insulating film 161, so the metal films 137 and 138 are not etched by the sulfuric acid hydrogen peroxide mixture or ammonia hydrogen peroxide mixture.

In other words, by using the structure of the present invention, it is possible to use metal in the gate electrode, it is possible to control depletion of the channel region, it is possible to lower the resistance of the gate electrode and it is possible to lower the resistance of the gate, source and drain through a metal-silicon compound.

Normally, the natural oxide film on the surface of the silicon layer is removed by hydrofluoric acid as a pre-treatment prior to sputtering the metal such as Ni or Co. At this time, the insulating film 129 composed of an oxide film is protected from the hydrofluoric acid by the insulating film 164 composed of a nitride film formed in a sidewall shape on the sidewall.

A contact stopper 173 of nitride film is formed, an interlayer insulating film 174 is deposited and planarization is undertaken, as shown in FIGS. 74A to 74D.

A resist 175 for forming contact holes is formed above the columnar silicon layers 231 and 232, as shown in FIGS. 75A to 75D.

The interlayer insulating film 174 is etched to form contact holes 176 and 177 above the columnar silicon layer 232, as shown in FIGS. 76A to 76D.

The resist 175 is removed. Conditions on the substrate following removal are shown in FIGS. 77A to 77D.

A resist 178 for forming contact holes above the planar silicon layers 233 and 234 and above the gate wire 221 is formed, as shown in FIGS. 78A to 78D.

The interlayer insulating film 174 is etched to form contact holes 179, 180 and 181 above the planar silicon layers 233 and 234 and above the gate wire 221, respectively, as shown in FIGS. 79A to 79D.

Because the contact holes 176 and 177 above the columnar silicon 231 and 232 and the contact holes 179, 180 and 181 above the planar silicon layers 233 and 234 and above the gate wire 221 are formed through different processes, the etching conditions for forming the contact holes 176 and 177 above the columnar silicon 231 and 232 and the etching conditions for forming the contact holes 179, 180 and 181 above the planar silicon layers 233 and 234 and above the gate wire 221 can each be optimized.

The resist 178 is removed. Conditions on the substrate following removal are shown in FIGS. 80A to 80D.

A contact stopper 173 is etched below the contact holes 179, 176, 180, 177 and 181. Conditions on the substrate following etching are shown in FIGS. 81A to 81D.

After a barrier metal layer 182 is deposited on the surface where the circuits are formed, a metal 183 is deposited on the top thereof, as shown in FIGS. 82A to 82D.

A metal 184 is deposited to bury the gap, as shown in FIGS. 83A to 83D.

The metals 184 and 183 and the barrier metal layer 182 are planarized and etched to form contacts 226, 227, 228, 229 and 230, as shown in FIGS. 84A to 84D. The contact 226 is composed of a barrier metal layer 185 and metal layers 190 and 195. The contact 227 is composed of a barrier metal layer 186 and metal layers 191 and 196. The contact 228 is composed of a barrier metal layer 187 and metal layers 192 and 197. The contact 229 is composed of a barrier metal layer 188 and metal layers 193 and 198. The contact 230 is composed of a barrier metal layer 189 and metal layers 194 and 199.

A barrier metal layer 200, a metal layer 201 and a barrier metal layer 202 are deposited in this order on the planarized surface, as shown in FIGS. 85A to 85D.

Resists 203, 204, 205 and 206 for forming a power source wire, an input wire and an output wire are formed, as shown in FIGS. 86A to 86D.

The barrier metal layer 202, the metal 201 and the barrier metal layer 200 are etched to form power source wires 222 and 225, an input wire 224 and an output wire 223, as shown in FIGS. 87A to 87D. The power source wire 222 is composed of a barrier metal layer 207, a metal layer 208 and a barrier metal layer 209. The power source wire 225 is composed of a barrier metal layer 216, a metal layer 217 and a barrier metal layer 218. The input wire 224 is composed of a barrier metal layer 213, a metal layer 214 and a barrier metal layer 215. The output wire 223 is composed of a barrier metal layer 210, a metal layer 211 and a barrier metal layer 212.

The resists 203, 204, 205 and 206 are removed. Conditions on the substrate following removal are shown in FIGS. 88A to 88D.

With the above production method, it is possible to produce a semiconductor device with a small parasitic capacitance between the gate electrode and the planar silicon layers because of the first and fourth insulating films.

Having described and illustrated the principles of this application by reference to one (or more) preferred embodiment(s), it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor device provided with:

a first planar layer comprising a first planar semiconductor layer, a second planar semiconductor layer, and a planar insulating layer separating the first and second planar semiconductor layers;

a first columnar semiconductor layer on the first planar semiconductor layer;

a first semiconductor layer in the first planar semiconductor layer and in a lower region of the first columnar semiconductor layer;

a second semiconductor layer of a same conductive type as the first semiconductor layer in an upper region of the first columnar semiconductor layer;

a first gate insulating film on a sidewall of the first columnar semiconductor layer between the first semiconductor layer and the second semiconductor layer and surrounding the first columnar semiconductor layer;

a first gate electrode comprising a first metal film on the first gate insulating film and surrounding the first gate insulating film, and a first semiconductor film on the first metal film and surrounding the first metal film;

a first insulating film overlying the planar insulating layer and between the first gate electrode and the first planar semiconductor layer, the first insulating film comprising an insulating material different from the first gate insulating film;

a second insulating film having a sidewall shape and contacting an upper sidewall of the first columnar semiconductor layer and a top surface of the first gate electrode so as to surround the upper region of the first columnar semiconductor layer;

a third insulating film having a sidewall shape and contacting a sidewall of the first insulating film and the first gate electrode so as to surround the first gate electrode and the first insulating film, the third insulating film separated from the second insulating film by the first gate electrode;

a first contact above the first columnar semiconductor layer;

a second contact above the first planar semiconductor layer; and a third contact coupled to the first gate electrode;

wherein the first gate insulating film and the first metal film are surrounded by the first columnar semiconductor layer, the first semiconductor layer, the first insulating film and the second insulating film.

2. The semiconductor device according to claim 1, wherein a thickness of the second insulating film is greater than a sum of a thickness of the first gate insulating film and a thickness of the first metal film.

3. The semiconductor device according to claim 1, further comprising a first metal-semiconductor compound on an upper surface of the first semiconductor layer.

4. The semiconductor device according to claim 1, wherein a length from a center of the first columnar semiconductor layer to an edge of the first planar semiconductor layer is larger than a combined sum of a length from the center to the sidewall of the first columnar semiconductor layer, a thickness of the first gate insulating film, a thickness of the first gate electrode and a thickness of the third insulating film.

5. The semiconductor device according to claim 1, further comprising a third metal-semiconductor compound on a top surface of the first gate electrode.

6. The semiconductor device according to claim 1, further comprising a second metal-semiconductor compound on a top surface of the second semiconductor layer.

7. A semiconductor device comprising a first transistor and a second transistor, and a first planar layer comprising a first planar semiconductor layer, a second planar semiconductor layer, and a planar insulating layer separating the first and second planar semiconductor layers, wherein, the first transistor comprises:

the first planar semiconductor layer;

a first columnar semiconductor layer on the first planar semiconductor layer;

a first semiconductor layer of a second conductive type in a lower region of the first columnar semiconductor layer and in a region of the first planar semiconductor layer below the first columnar semiconductor layer;

a second semiconductor layer of the second conductive type in an upper region of the first columnar semiconductor layer;

a first gate insulating film on a sidewall of the first columnar semiconductor layer between the first semiconductor layer and the second semiconductor layer, and surrounding the first columnar semiconductor layer;

a first gate electrode comprising a first metal film on the first gate insulating film and surrounding the first gate insulating film and a first semiconductor film on the first metal film and surrounding the first metal film;

a first insulating film overlying the planar insulating layer and between the first gate electrode and the first planar semiconductor layer, the first insulating film comprising an insulating material different from the first gate insulating film;

a second insulating film having a sidewall shape and contacting an upper sidewall of the first columnar semiconductor layer and a top surface of the first gate electrode so as to surround the upper region of the first columnar semiconductor layer;

a third insulating film having a sidewall shape and contacting a sidewall of the first insulating film and the first gate electrode so as to surround the first gate electrode and the first insulating film, the third insulating film separated from the second insulating film by the first gate electrode;

a first metal-semiconductor compound on a top surface of a portion of the first semiconductor layer in a region below the first columnar semiconductor layer;

a third metal-semiconductor compound on a top surface of the first gate electrode; and, a second metal-semiconductor compound on a top surface of the second semiconductor layer; and wherein the second transistor comprises:

the second planar semiconductor layer;

a second columnar semiconductor layer on the second planar semiconductor layer;

a third semiconductor layer of a first conductive type in a lower region of the second columnar semiconductor layer and in a region of the second planar semiconductor layer below the second columnar semiconductor layer;

a fourth semiconductor layer of the first conductive type in an upper region of the second columnar semiconductor layer;

a second gate insulating film on a sidewall of the second columnar semiconductor layer between the third semiconductor layer and the fourth semiconductor layer and surrounding the second columnar semiconductor layer;

a second gate electrode comprising a second metal film on the second gate insulating film and surrounding the second gate insulating film and a second semiconductor film on the second metal film and surrounding the second metal film;

a fourth insulating film overlying the planar insulating layer and between the second gate electrode and the second planar semiconductor layer, the fourth insulating film comprising an insulating material different from the second gate insulating film;

a fifth insulating film having a sidewall shape and contacting an upper sidewall of the second columnar semiconductor layer and a top surface of the second gate electrode so as to surround a top region of the second columnar semiconductor layer;

a sixth insulating film having a sidewall shape and contacting a sidewall of the fourth insulating film and the second gate electrode so as to surround the second gate electrode and the fourth insulating film;

a fourth metal-semiconductor compound on a top surface of a portion of the third semiconductor layer in a region below the second columnar semiconductor layer;

a fifth metal-semiconductor compound on a top surface of the second gate electrode; and, a sixth metal-semiconductor compound on a top surface of the fourth semiconductor layer;

wherein the first gate insulating film and the first metal film are surrounded by the first columnar semiconductor layer, the first semiconductor film, the first insulating film and the second insulating film, and wherein the second gate insulating film, and the second metal film are surrounded by the second columnar semiconductor layer, the second semiconductor layer, the fourth insulating film and the fifth insulating film.

8. The semiconductor device according to claim 7, wherein the first gate insulating film and the first metal film comprise materials that make the first transistor an enhancement-type transistor, and the second gate insulating film and the second metal film comprise materials that make the second transistor an enhancement-type transistor.

9. The semiconductor device according to claim 7, wherein a thickness of the second insulating film is greater than a sum of a thickness of the first gate insulating film and a thickness of the first metal film.

10. The semiconductor device according to claim 7, wherein a length from a center of the first columnar semiconductor layer to an edge of the first planar semiconductor layer is larger than a sum of a length from the center to a sidewall of the first columnar semiconductor layer, a thickness of the first gate insulating film, a thickness of the first gate electrode, and a thickness of the third insulating film.

11. The semiconductor device according to claim 7, wherein: the first conductive type is n+ type, the second conductive type is p+ type, and the first and second columnar semiconductor layers and the first and second planar semiconductor layers comprise silicon.

* * * * *